(12) United States Patent
Mark et al.

(10) Patent No.: US 10,696,039 B2
(45) Date of Patent: *Jun. 30, 2020

(54) MULTILAYER FIBER REINFORCEMENT DESIGN FOR 3D PRINTING

(71) Applicant: MARKFORGED, INC., Watertown, MA (US)

(72) Inventors: Gregory Thomas Mark, Brookline, MA (US); Rick Bryan Woodruff, Somerville, MA (US); Abraham Lawrence Parangi, Lincoln, MA (US); David Steven Benhaim, Cambridge, MA (US); Benjamin Tsu Sklaroff, Somerville, MA (US)

(73) Assignee: MARKFORGED, INC., Watertown, MA (US)

( * ) Notice: Subject to any disclaimer, the term of this patent is extended or adjusted under 35 U.S.C. 154(b) by 241 days.

This patent is subject to a terminal disclaimer.

(21) Appl. No.: 15/808,081

(22) Filed: Nov. 9, 2017

(65) Prior Publication Data
US 2018/0072040 A1    Mar. 15, 2018

Related U.S. Application Data

(60) Division of application No. 15/174,645, filed on Jun. 6, 2016, now Pat. No. 9,815,268, which is a
(Continued)

(51) Int. Cl.
*G05B 19/4099* (2006.01)
*G06F 17/50* (2006.01)
(Continued)

(52) U.S. Cl.
CPC ............ *B33Y 70/00* (2014.12); *B29C 64/106* (2017.08); *B29C 64/386* (2017.08); *B29C 70/16* (2013.01);
(Continued)

(58) Field of Classification Search
CPC ..... B29C 64/10; B29C 64/106; B29C 64/118; B29C 64/386; B29C 70/16
See application file for complete search history.

(56) References Cited

U.S. PATENT DOCUMENTS

| 4,291,841 A | 9/1981 | Dalrymple et al. |
| 4,720,251 A | 1/1988 | Mallay et al. |
| (Continued) | | |

FOREIGN PATENT DOCUMENTS

| CN | 1659320 A | 8/2005 |
| CN | 101133107 A | 2/2008 |
| (Continued) | | |

OTHER PUBLICATIONS

"List of thermal conductives" https://en.wikipedia.org/wiki/List_of_thermal_conductivities, accessed Mar. 27, 2019 (Year: 2019).
(Continued)

*Primary Examiner* — James P Mackey
*Assistant Examiner* — Emmanuel S Luk
(74) *Attorney, Agent, or Firm* — Lando & Anastasi, LLP

(57) ABSTRACT

A method comprising receiving a first 3D toolpath defining a fill material curved shell, receiving first 2D toolpaths defining support material flat shells, receiving a second 3D toolpath defining a long fiber composite material curved shell, the long fiber composite material including a filament having a matrix embedding fibers having a length longer than two times a diameter of the filament, actuating a fill material deposition head to trace the first 3D toolpath to deposit the fill material curved shell non-parallel to a printing substrate, actuating a support material deposition head to trace the first 2D toolpaths to deposit support material in a succession of substantially flat shells, and actuating a long fiber deposition head to trace the second 3D toolpath non-parallel to the printing substrate to deposit the long fiber
(Continued)

composite material curved shell to enclose at least a portion of the fill material curved shell.

7 Claims, 61 Drawing Sheets

Related U.S. Application Data continuation-in-part of application No. 14/944,093, filed on Nov. 17, 2015, which is a continuation-in-part of application No. 14/491,439, filed on Sep. 19, 2014, now Pat. No. 9,694,544, which is a continuation-in-part of application No. 14/333,881, filed on Jul. 17, 2014, now Pat. No. 9,149,988, which is a continuation-in-part of application No. 14/297,437, filed on Jun. 5, 2014, now Pat. No. 9,370,896, which is a continuation-in-part of application No. 14/222,318, filed on Mar. 21, 2014, now abandoned, said application No. 14/333,881 is a continuation-in-part of application No. 14/222,318, said application No. 14/491,439 is a continuation-in-part of application No. 14/297,437, and a continuation-in-part of application No. 14/222,318, said application No. 15/174,645 is a continuation-in-part of application No. 14/944,088, filed on Nov. 17, 2015, now Pat. No. 9,688,028, which is a continuation-in-part of application No. 14/491,439, said application No. 15/174,645 is a continuation-in-part of application No. 14/876,073, filed on Oct. 6, 2015, now Pat. No. 10,016,942, which is a continuation of application No. 14/333,881.

(60) Provisional application No. 62/172,021, filed on Jun. 5, 2015, provisional application No. 62/080,890, filed on Nov. 17, 2014, provisional application No. 61/907,431, filed on Nov. 22, 2013, provisional application No. 61/902,256, filed on Nov. 10, 2013, provisional application No. 61/883,440, filed on Sep. 27, 2013, provisional application No. 61/881,946, filed on Sep. 24, 2013, provisional application No. 61/880,129, filed on Sep. 19, 2013, provisional application No. 61/878,029, filed on Sep. 15, 2013, provisional application No. 61/847,113, filed on Jul. 17, 2013, provisional application No. 61/831,600, filed on Jun. 5, 2013, provisional application No. 61/815,531, filed on Apr. 24, 2013, provisional application No. 61/804,235, filed on Mar. 22, 2013.

(51) Int. Cl.

| | | |
|---|---|---|
| *B29C 70/16* | (2006.01) | |
| *B33Y 70/00* | (2020.01) | |
| *B33Y 10/00* | (2015.01) | |
| *B33Y 50/02* | (2015.01) | |
| *B29C 64/106* | (2017.01) | |
| *B29C 64/386* | (2017.01) | |
| *G06F 30/00* | (2020.01) | |
| *B29K 101/12* | (2006.01) | |
| *B29K 105/08* | (2006.01) | |
| *B29C 64/118* | (2017.01) | |
| *B29K 63/00* | (2006.01) | |
| *B29K 71/00* | (2006.01) | |
| *B29K 77/00* | (2006.01) | |
| *B29K 79/00* | (2006.01) | |
| *B29K 25/00* | (2006.01) | |

(52) U.S. Cl.
CPC .............. *B33Y 10/00* (2014.12); *B33Y 50/02* (2014.12); *G05B 19/4099* (2013.01); *G06F 30/00* (2020.01); *B29C 64/118* (2017.08); *B29K 2025/08* (2013.01); *B29K 2063/00* (2013.01); *B29K 2071/00* (2013.01); *B29K 2077/00* (2013.01); *B29K 2079/085* (2013.01); *B29K 2101/12* (2013.01); *B29K 2105/08* (2013.01); *G05B 2219/35134* (2013.01); *G05B 2219/49007* (2013.01); *Y02P 90/265* (2015.11)

(56) References Cited

U.S. PATENT DOCUMENTS

| | | |
|---|---|---|
| 5,002,712 A | 3/1991 | Goldmann et al. |
| 5,037,691 A | 8/1991 | Medney et al. |
| 5,121,329 A | 6/1992 | Crump |
| 5,155,324 A | 10/1992 | Deckard et al. |
| 5,340,433 A | 8/1994 | Crump |
| 5,447,793 A | 9/1995 | Montsinger |
| 5,764,521 A | 6/1998 | Batchelder et al. |
| 5,866,058 A | 2/1999 | Batchelder et al. |
| 5,885,316 A | 3/1999 | Sato et al. |
| 5,906,863 A | 5/1999 | Lombardi et al. |
| 5,936,861 A | 8/1999 | Jang et al. |
| 5,955,119 A | 9/1999 | Andris et al. |
| 6,054,077 A | 4/2000 | Comb et al. |
| 6,080,343 A | 6/2000 | Kaufman et al. |
| 6,085,957 A | 7/2000 | Zinniel et al. |
| 6,099,783 A | 8/2000 | Scranton et al. |
| 6,129,872 A | 10/2000 | Jang |
| 6,153,034 A | 11/2000 | Lipsker |
| 6,214,279 B1 | 4/2001 | Yang et al. |
| 6,363,606 B1 | 4/2002 | Johnson, Jr. et al. |
| 6,372,178 B1 | 4/2002 | Tseng |
| 6,421,820 B1 | 7/2002 | Mansfield et al. |
| 6,547,210 B1 | 4/2003 | Marx et al. |
| 6,823,230 B1 | 11/2004 | Jamalabad et al. |
| 6,859,681 B1 | 2/2005 | Alexander |
| 6,934,600 B2 | 8/2005 | Jang et al. |
| 6,986,739 B2 | 1/2006 | Warren et al. |
| 7,020,539 B1 | 3/2006 | Kovacevic et al. |
| 7,083,697 B2 | 8/2006 | Dao et al. |
| 7,127,309 B2 | 10/2006 | Dunn et al. |
| 7,625,200 B2 | 12/2009 | Leavitt |
| 8,050,786 B2 | 11/2011 | Holzwarth |
| 8,066,842 B2 | 11/2011 | Farmer et al. |
| 8,221,669 B2 | 7/2012 | Batchelder et al. |
| 8,295,972 B2 | 10/2012 | Coleman et al. |
| 8,815,141 B2 | 8/2014 | Swanson et al. |
| 8,827,684 B1* | 9/2014 | Schumacher .......... B29C 64/20 425/375 |
| 8,916,085 B2 | 12/2014 | Jackson et al. |
| 8,920,697 B2 | 12/2014 | Mikulak et al. |
| 9,126,365 B1 | 9/2015 | Mark et al. |
| 9,126,367 B1 | 9/2015 | Mark et al. |
| 9,156,205 B2 | 10/2015 | Mark et al. |
| 9,207,540 B1 | 12/2015 | Bhargava et al. |
| 9,327,453 B2 | 5/2016 | Mark et al. |
| 9,370,896 B2 | 6/2016 | Mark |
| 9,427,399 B2 | 8/2016 | Adams et al. |
| 9,511,544 B2 | 12/2016 | Hemingway et al. |
| 9,579,851 B2 | 2/2017 | Mark et al. |
| 9,694,544 B2 | 7/2017 | Mark et al. |
| 9,849,631 B1* | 12/2017 | Goss .................... B29C 64/241 |
| 10,029,415 B2 | 7/2018 | Swanson et al. |
| 10,059,057 B2 | 8/2018 | Schirtzinger et al. |
| 10,061,301 B2 | 8/2018 | Burton |
| 10,076,876 B2 | 9/2018 | Mark et al. |
| 10,118,375 B2 | 11/2018 | Hickman et al. |
| 10,131,088 B1 | 11/2018 | Tyler et al. |
| 10,160,193 B2 | 12/2018 | Nielsen-Cole et al. |
| 10,254,499 B1 | 4/2019 | Cohen et al. |
| 10,293,594 B2 | 5/2019 | Gardiner |
| 10,414,147 B2 | 9/2019 | Sweeney et al. |
| 2002/0009935 A1 | 1/2002 | Hsiao et al. |

(56) References Cited

U.S. PATENT DOCUMENTS

| | | |
|---|---|---|
| 2002/0062909 A1 | 5/2002 | Jang et al. |
| 2002/0079607 A1 | 6/2002 | Hawley et al. |
| 2002/0102322 A1 | 8/2002 | Gunther |
| 2002/0113331 A1 | 8/2002 | Zhang et al. |
| 2002/0165304 A1 | 11/2002 | Mulligan et al. |
| 2002/0172817 A1 | 11/2002 | Owens |
| 2003/0044593 A1 | 3/2003 | Vaidyanathan et al. |
| 2003/0056870 A1 | 3/2003 | Comb et al. |
| 2003/0090034 A1 | 5/2003 | Mulhaupt et al. |
| 2003/0186042 A1 | 10/2003 | Dunlap et al. |
| 2003/0236588 A1 | 12/2003 | Jang et al. |
| 2004/0067711 A1 | 4/2004 | Bliton et al. |
| 2004/0140078 A1 | 7/2004 | Liu et al. |
| 2004/0166140 A1 | 8/2004 | Santini et al. |
| 2004/0253365 A1 | 12/2004 | Warren et al. |
| 2005/0061422 A1 | 3/2005 | Martin |
| 2005/0104257 A1 | 5/2005 | Gu et al. |
| 2005/0109451 A1 | 5/2005 | Rauber et al. |
| 2005/0156352 A1 | 7/2005 | Burkle et al. |
| 2005/0230029 A1 | 10/2005 | Vaidyanathan et al. |
| 2005/0279185 A1 | 12/2005 | Cook et al. |
| 2006/0047052 A1 | 3/2006 | Barrera et al. |
| 2007/0003650 A1 | 1/2007 | Schroeder |
| 2007/0151167 A1 | 7/2007 | Cook et al. |
| 2007/0225856 A1 | 9/2007 | Slaughter et al. |
| 2007/0228592 A1 | 10/2007 | Dunn et al. |
| 2007/0252871 A1 | 11/2007 | Silverbrook |
| 2008/0176092 A1 | 7/2008 | Owens |
| 2008/0206394 A1 | 8/2008 | Bouti |
| 2008/0251975 A1 | 10/2008 | Gallagher et al. |
| 2008/0274229 A1 | 11/2008 | Barnett |
| 2009/0022615 A1 | 1/2009 | Entezarian |
| 2009/0054552 A1 | 2/2009 | Yano et al. |
| 2009/0065965 A1 | 3/2009 | Bowen |
| 2009/0095410 A1 | 4/2009 | Oldani |
| 2009/0174709 A1 | 7/2009 | Kozlak et al. |
| 2009/0199948 A1 | 8/2009 | Kisch |
| 2009/0220632 A1 | 9/2009 | Haque |
| 2009/0234616 A1 | 9/2009 | Perkins |
| 2010/0024987 A1 | 2/2010 | Saine et al. |
| 2010/0028641 A1 | 2/2010 | Zhu et al. |
| 2010/0151072 A1 | 6/2010 | Scheurich |
| 2010/0191360 A1 | 7/2010 | Napadensky et al. |
| 2010/0203351 A1 | 8/2010 | Nayfeh |
| 2010/0243764 A1 | 9/2010 | Okesaku et al. |
| 2011/0001264 A1 | 1/2011 | Minoura et al. |
| 2011/0032301 A1 | 2/2011 | Fienup et al. |
| 2011/0143108 A1 | 6/2011 | Fruth et al. |
| 2011/0178621 A1 | 7/2011 | Heide |
| 2011/0222081 A1 | 9/2011 | Yi et al. |
| 2011/0230111 A1 | 9/2011 | Weir et al. |
| 2011/0289791 A1 | 12/2011 | Menchik et al. |
| 2012/0060468 A1 | 3/2012 | Dushku et al. |
| 2012/0070523 A1 | 3/2012 | Swanson et al. |
| 2012/0092724 A1 | 4/2012 | Pettis |
| 2012/0140041 A1 | 6/2012 | Burgunder et al. |
| 2012/0156445 A1 | 6/2012 | Schmidt et al. |
| 2012/0231225 A1 | 9/2012 | Mikulak et al. |
| 2012/0247655 A1 | 10/2012 | Erb et al. |
| 2013/0004610 A1 | 1/2013 | Hartmann et al. |
| 2013/0075952 A1 | 3/2013 | Seman, Sr. et al. |
| 2013/0164498 A1 | 6/2013 | Langone et al. |
| 2013/0205920 A1 | 8/2013 | Tow |
| 2013/0209600 A1 | 8/2013 | Tow |
| 2013/0221192 A1 | 8/2013 | Rocco et al. |
| 2013/0233471 A1 | 9/2013 | Kappesser et al. |
| 2013/0241102 A1 | 9/2013 | Rodgers et al. |
| 2013/0320467 A1 | 12/2013 | Buchanan et al. |
| 2013/0327917 A1 | 12/2013 | Steiner et al. |
| 2013/0337256 A1 | 12/2013 | Farmer et al. |
| 2013/0337265 A1 | 12/2013 | Farmer |
| 2014/0034214 A1 | 2/2014 | Boyer et al. |
| 2014/0036035 A1 | 2/2014 | Buser et al. |
| 2014/0039663 A1 | 2/2014 | Boyer et al. |
| 2014/0044822 A1 | 2/2014 | Mulliken |
| 2014/0048969 A1 | 2/2014 | Swanson et al. |
| 2014/0048970 A1 | 2/2014 | Batchelder et al. |
| 2014/0061974 A1 | 3/2014 | Tyler |
| 2014/0065847 A1 | 3/2014 | Salmon et al. |
| 2014/0090528 A1 | 4/2014 | Graf |
| 2014/0120197 A1 | 5/2014 | Swanson et al. |
| 2014/0121813 A1 | 5/2014 | Schmehl |
| 2014/0154347 A1 | 6/2014 | Dilworth et al. |
| 2014/0159284 A1 | 6/2014 | Leavitt |
| 2014/0175706 A1 | 6/2014 | Kritchman |
| 2014/0210137 A1* | 7/2014 | Patterson ............ B29C 64/106 264/401 |
| 2014/0232035 A1 | 8/2014 | Bheda |
| 2014/0265037 A1 | 9/2014 | Stirling et al. |
| 2014/0268604 A1 | 9/2014 | Wicker et al. |
| 2014/0277661 A1 | 9/2014 | Amadio et al. |
| 2014/0287139 A1 | 9/2014 | Farmer et al. |
| 2014/0291886 A1 | 10/2014 | Mark et al. |
| 2014/0322383 A1 | 10/2014 | Rutter |
| 2014/0328963 A1 | 11/2014 | Mark et al. |
| 2014/0328964 A1 | 11/2014 | Mark et al. |
| 2014/0361460 A1 | 12/2014 | Mark |
| 2015/0014885 A1 | 1/2015 | Hofmann et al. |
| 2015/0037446 A1 | 2/2015 | Douglass et al. |
| 2015/0165666 A1 | 6/2015 | Butcher et al. |
| 2015/0165690 A1 | 6/2015 | Tow |
| 2015/0165691 A1 | 6/2015 | Mark et al. |
| 2015/0197063 A1 | 7/2015 | Shinar et al. |
| 2015/0201499 A1 | 7/2015 | Shinar et al. |
| 2015/0239178 A1 | 8/2015 | Armstrong |
| 2015/0242737 A1 | 8/2015 | Glazberg et al. |
| 2015/0266243 A1 | 9/2015 | Mark et al. |
| 2015/0266244 A1 | 9/2015 | Page |
| 2015/0287247 A1 | 10/2015 | Willis et al. |
| 2015/0290875 A1 | 10/2015 | Mark et al. |
| 2015/0298393 A1* | 10/2015 | Suarez .................. B33Y 70/00 425/3 |
| 2015/0321427 A1 | 11/2015 | Gunnarsson et al. |
| 2015/0342720 A1 | 12/2015 | Koc et al. |
| 2016/0067927 A1 | 3/2016 | Voris et al. |
| 2016/0068678 A1 | 3/2016 | Luo et al. |
| 2016/0075089 A1 | 3/2016 | Duro Royo et al. |
| 2016/0120040 A1 | 4/2016 | Elmieh et al. |
| 2016/0129634 A1 | 5/2016 | Keicher et al. |
| 2016/0179064 A1 | 6/2016 | Arthur et al. |
| 2016/0192741 A1 | 7/2016 | Mark |
| 2016/0221259 A1 | 8/2016 | Kobida et al. |
| 2016/0257033 A1 | 9/2016 | Jayanti et al. |
| 2016/0263832 A1 | 9/2016 | Bui et al. |
| 2016/0290880 A1 | 10/2016 | Lewis et al. |
| 2016/0303794 A1 | 10/2016 | Atwood et al. |
| 2016/0325491 A1 | 11/2016 | Sweeney et al. |
| 2016/0346997 A1 | 12/2016 | Lewis et al. |
| 2016/0361873 A1 | 12/2016 | Maier |
| 2017/0021564 A1 | 1/2017 | Ooba et al. |
| 2017/0057164 A1 | 3/2017 | Hemphill et al. |
| 2017/0080642 A1 | 3/2017 | Tyler |
| 2017/0106594 A1 | 4/2017 | Gardiner |
| 2017/0129170 A1 | 5/2017 | Kim et al. |
| 2017/0129171 A1 | 5/2017 | Gardner et al. |
| 2017/0136703 A1 | 5/2017 | Hayes et al. |
| 2017/0136707 A1 | 5/2017 | Batchelder et al. |
| 2017/0137955 A1 | 5/2017 | Hofmann et al. |
| 2017/0151713 A1* | 6/2017 | Steele ................. B29C 67/0055 |
| 2017/0173889 A1 | 6/2017 | Thomas-Lepore et al. |
| 2017/0255183 A1 | 9/2017 | Clement et al. |
| 2017/0259502 A1 | 9/2017 | Chapiro et al. |
| 2017/0361497 A1 | 12/2017 | Crescenti Savall et al. |
| 2019/0022922 A1 | 1/2019 | Swanson et al. |

FOREIGN PATENT DOCUMENTS

| | | |
|---|---|---|
| CN | 101193953 A | 6/2008 |
| CN | 101300299 A | 11/2008 |
| CN | 101484397 A | 7/2009 |
| CN | 101689229 A | 3/2010 |
| CN | 101801647 A | 8/2010 |
| CN | 102548737 A | 7/2012 |
| CN | 104149339 A | 11/2014 |

(56) References Cited

FOREIGN PATENT DOCUMENTS

| | | |
|---|---|---|
| DE | 4102257 A1 | 7/1992 |
| EP | 2762520 A1 | 8/2014 |
| JP | S58-122116 A | 7/1983 |
| JP | 1-266231 A | 10/1989 |
| JP | H7-117141 A | 5/1995 |
| JP | 2003-534159 A | 11/2003 |
| JP | 2004-331706 A | 11/2004 |
| JP | 2010535117 A | 11/2010 |
| JP | 2012-97449 A | 5/2012 |
| KR | 20100004475 A | 1/2010 |
| KR | 100995983 B1 | 11/2010 |
| KR | 101172859 B1 | 8/2012 |
| WO | 0189714 A1 | 11/2001 |
| WO | 2004050323 A1 | 6/2004 |
| WO | 2009009137 A1 | 1/2009 |
| WO | 2013017284 A2 | 2/2013 |
| WO | 2014028826 A1 | 2/2014 |
| WO | 2014193505 A1 | 12/2014 |
| WO | 2015042422 A1 | 3/2015 |
| WO | 2015077262 A1 | 5/2015 |
| WO | 2015120429 A1 | 8/2015 |

OTHER PUBLICATIONS

Gray IV, R.W., Baird, D.G. and Bohn, J.H., 1998. Thermoplastic composites reinforced with long fiber thermotropic liquid crystalline polymers for fused deposition modeling. Polymer composites, 19(4), pp. 383-394. (Year: 1998).

Gray, R.W. IV et al., 1997, Effects ofProcessing Conditions on Prototypes Reinforced with TLCPs for Fused Deposition Modeling, In 1997 International Solid Freeform Fabrication Symposium (Year: 1998).

https://community.ultimaker.com/topic/3248-some-questions-on-perimeters-100-infill-extrusion-width/ (Year: 2013).

Lantern Robotics (https://www.fabbaloo.com/blog/2014/4/18/how-to-make-any-3d-printed-part-much-stronger and see https://imgur.com/a/EHxkE & https://www.reddit.com/r/3Dprinting/comments/22jwlm/injecting_hot_melt_adhesive_for_100_solid_faster/ (Year: 2014).

Shofner, M.L. et al., 2003, Nanofiber-reinforced polymers prepared by fused deposition modeling, Journal of applied Polymer science, 89(11), pp. 3081-3090 (Year: 2003).

Shofner, M.L. et al., 2003, Single wall nanotube and vapor grown carbon fiber reinforced polymers processed by extrusion freeform fabrication. Composites Part A: Applied Science and Manufacturing, 34( 12), pp. 1207-1217 (Year: 2003).

"Thermal Conductivity of Metals", The Engineering Toolbox, http://www.engineeringtoolbox.com/thermal-conductivity-metalsd_858.html, Sep. 15, 2017, 6 pages.

Ahn et al., Anisoptropic material properties of fused deposition modeling ABS, Rapid Prororyping vol. 8, No. 4, 2002, pp. 248-257.

August et al., Recent Developments in Automated Fiber Placement of Thermoplastic Composites, SAMPE Technica Conference Proceedings, Wichita, KS, Oct. 23, 2013.

Bales, Steven, "Know Your Mold Coatings", Plastics Technology, http://www.ptonlinecom/articles/know-your-mold-coatings, Dec. 1, 2004, 8 pages.

Brett Compton, "3D printing of composites with controlled architecture," Engineering Conferences International, ECI Digital Archives, Composites at Lake Louise (CALL 2015), Fall Nov. 9, 2015, pp. 30.

Brett G. Compton and Jennifer A. Lewis, "3D-Printing of Lighweight Cellular Campsites," Advanced Materials 2014, 26, pp. 5930-5935.

Compton, B.G. et al., "3D-Printing of Lightweight Cellular Composites," Advanced Materials 2014, vol. 26, pp. 5930-5935.

Dell'Anno et al., Automated Manufacture of 3D Reinforced Aerospace Composite Structures, International Journal of Structural Integrity, 2012, vol. 3, Iss 1, pp. 22-40.

Devleig et al., High-Speed Fiber Placement on Large Complex Structures, No. 2007-1-3843. SAE International 2007.

Geek magazine—hacker daily blog "To Skolkovo created the Russia's first composite 3D-printer", Feb. 24, 2015, Retreived from the internet: <http://geek-mag.com/posts/246332/>.

Hasenjaeger, Programming and Simulating Automated Fiber Placement (AFP) CNC Machines, SAMPE Journal, vol. 49, No. 6, Nov./Dec. 2013.

Hossain et al, Improving Tensile Mechanical Properties of FDM-Manufactured Specimens via Modifying Build Parameters, Proceedings of Solid Freeform Fabrication Symposium, Austin, Texas, Aug. 16, 2013.

International Search Report and Written Opinion for PCT/US2015/061147 dated Mar. 3, 2016.

Lamontia et al, "Contoured Tape Laying and Fiber Placement Heads for Automated Fiber Placement of Large Composite Aerospace Structures," 34th ISTC, Baltimore, Md, Nov. 4-7, 2002.

Liu et al., "Wear of Materials", 2003, p. 1345.

Mondo et al., Overview of Thermoplastic Composite ATL and AFP Technologies, ITHEC 2012, Oct. 30, 2012, Messe Bremen, Germany.

Rower, Robot Driven Automatic Tapehead for Complex Composite Lay-ups, No. 10AMAF-0066, SAE International 2010, Aerospace Manufacturing and Automated Fastening Conference & Exhibition, Sep. 28, 2010.

Slocum, Alexander: "Kinematic Couplings: A Review of Design Principles and Applications", International Journal of Machine Tools and Manufacture 50.4 (2010): 310-327.

This 3D printer could allow ISS components to be created in space—YouTube. Published on May 20, 2016. Retreived from the internet: <URL:<https://www.youtube.com/watch?v=YwrTfOjEFtw>.

Zieman et al., Anisotropic Mechanical Properties of ABS Parts Fabricated by Fused Deposition Modelling, INTECH Open Access Publisher, 2012.

ATI technical data sheet, ATI metals, Allegheny Technologies Incorporated, https://www.atimetals.com/Products/Documents/ <http://www.atimetals.com/Products/Documents/ datasheets/stainless-specialty-steel/martensitic/ati_410_420_425_mod_440a_440c_tds_en2_v2.pdf (Year: 2014).

Donghong, Ding et al: "A tool-path generation strategy for wire and arc additive manufacturing," The International Journal of Advanced Manufacturing Technology, vol. 73, No. 1-4, Apr. 11, 2014 (Apr. 11, 2014), pp. 173-183, XP055472255, London, ISSN: 0268-3768, DOI: 10.1007/s00170-014-5808-5.

Extended European Search Report from corresponding European Application No. 15860348.0 dated Sep. 3, 2018.

"Sandwich-structured Composite", wikipedia.com, Dec. 29, 2009 version, accessed Apr. 18, 2018 at https://en.wikipedia.org/w/index.php?title=Sandwich-structured_composite&oldid=334666649 (Year: 2009).

Extended European Search Report from corresponding European Application No. 17207684.6 dated Jun. 13, 2018.

"Printed strain gauges for aircraft load detection using Aerosol Jet printing", Fraunhofer, 39 pages (Year: 2011).

\* cited by examiner

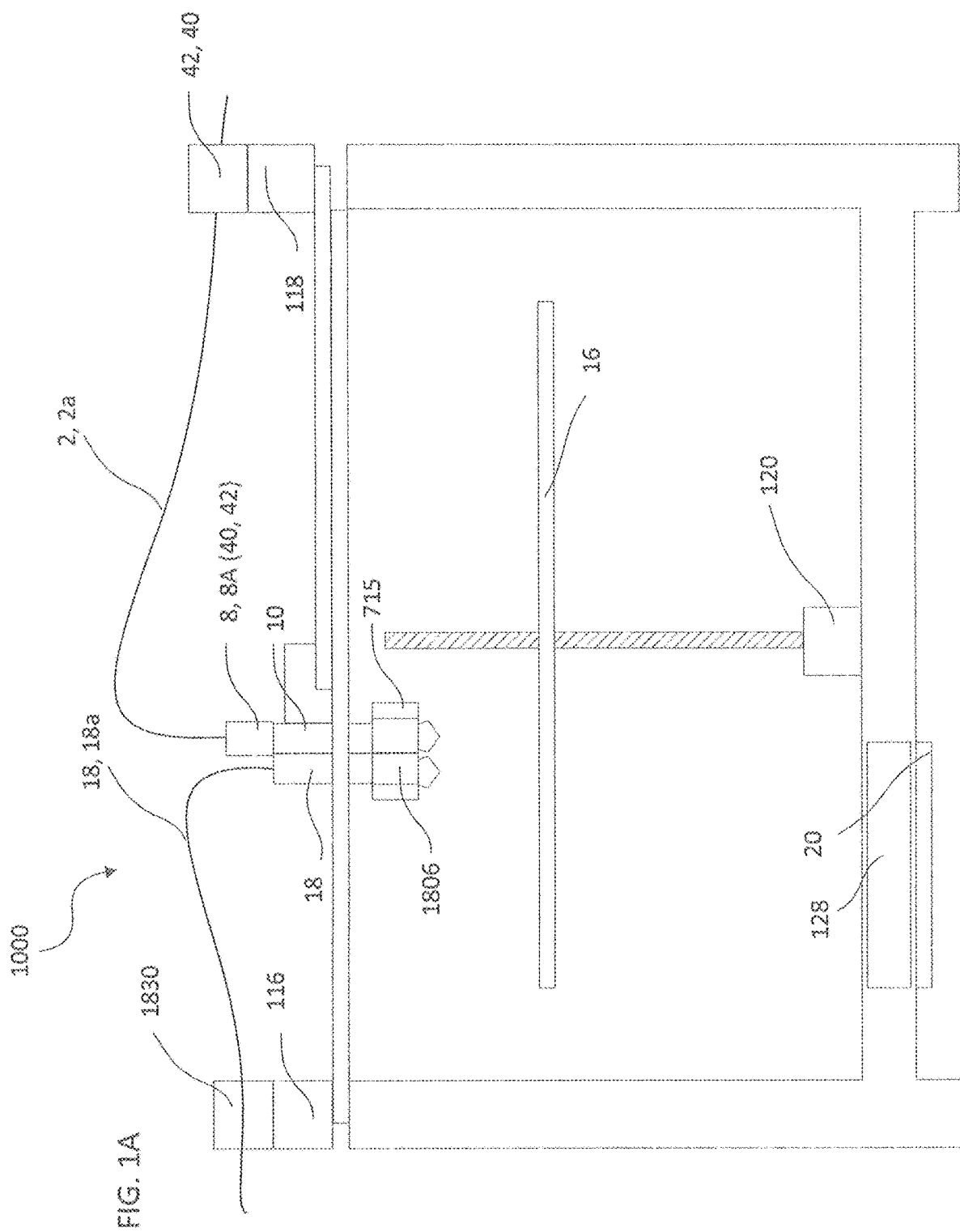

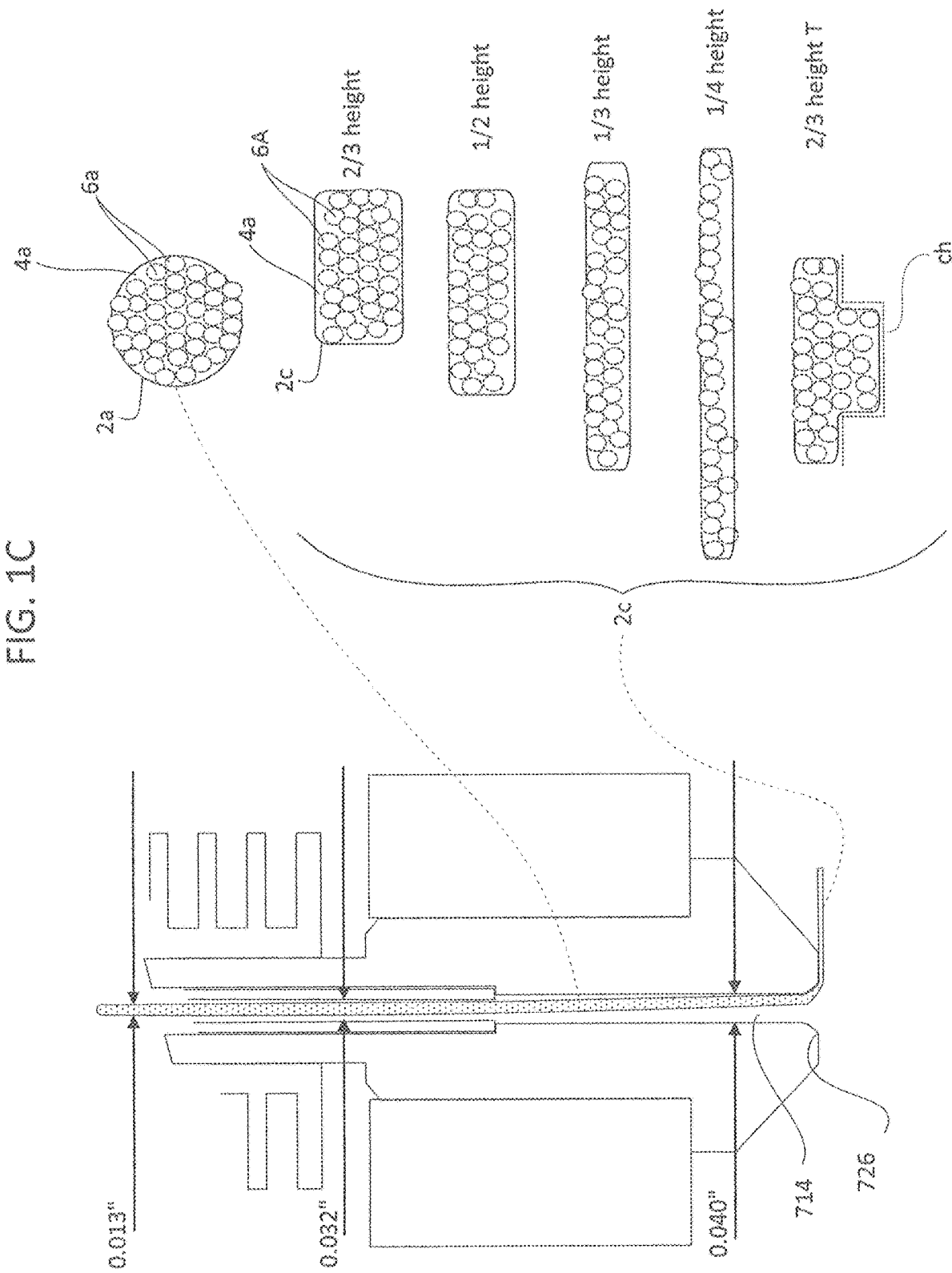

FIG. 1D    FFF CROSS SECTIONS
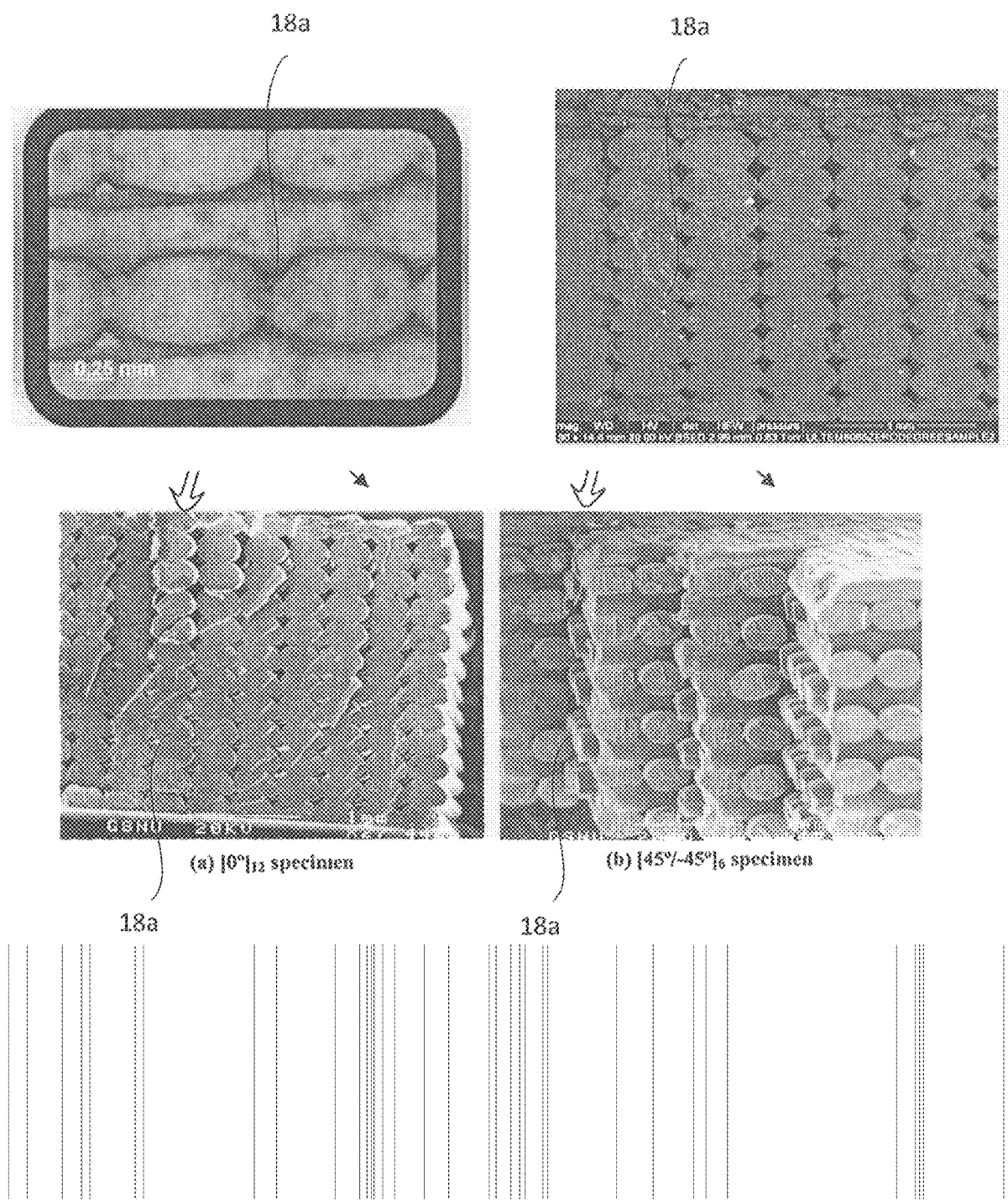

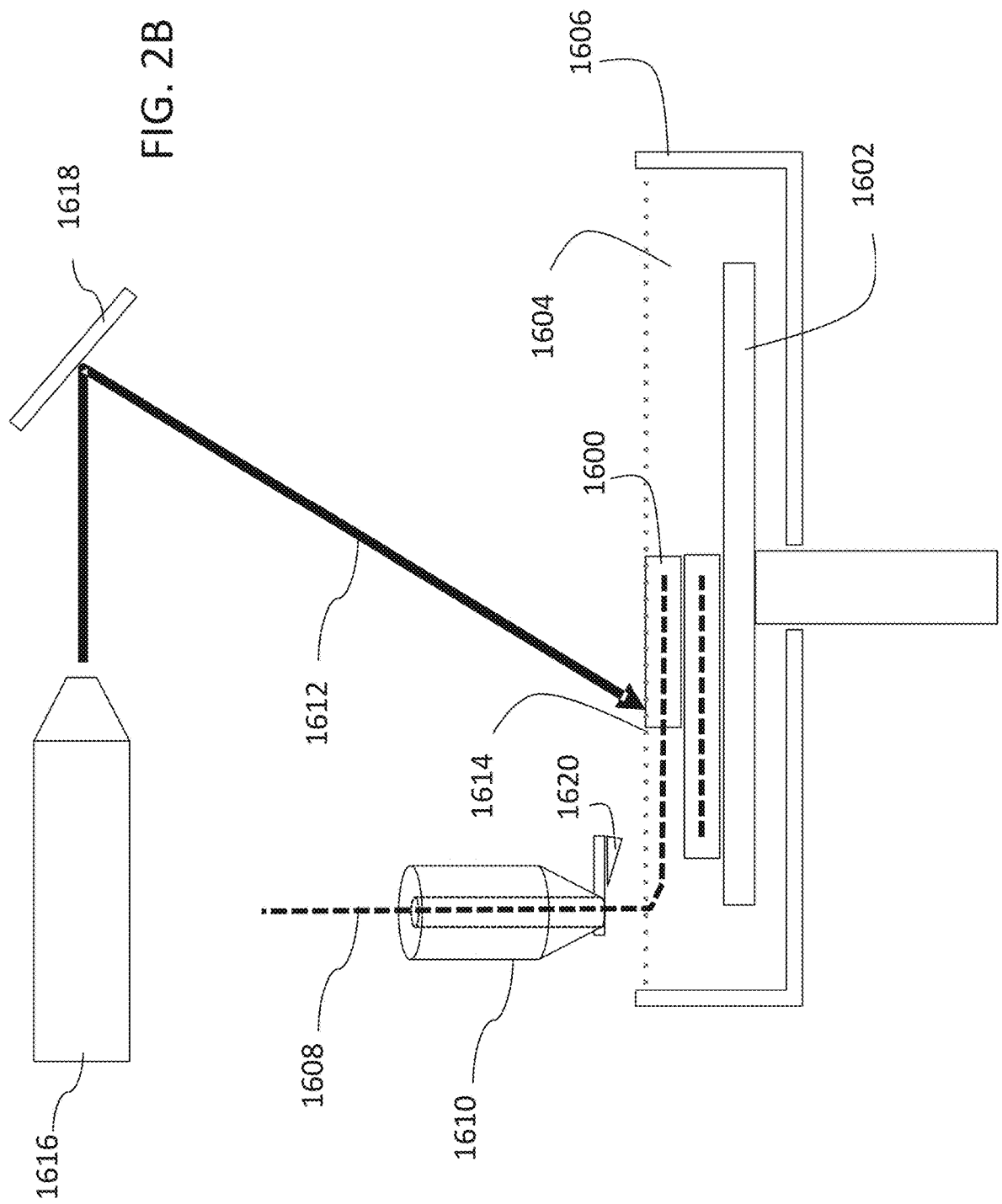

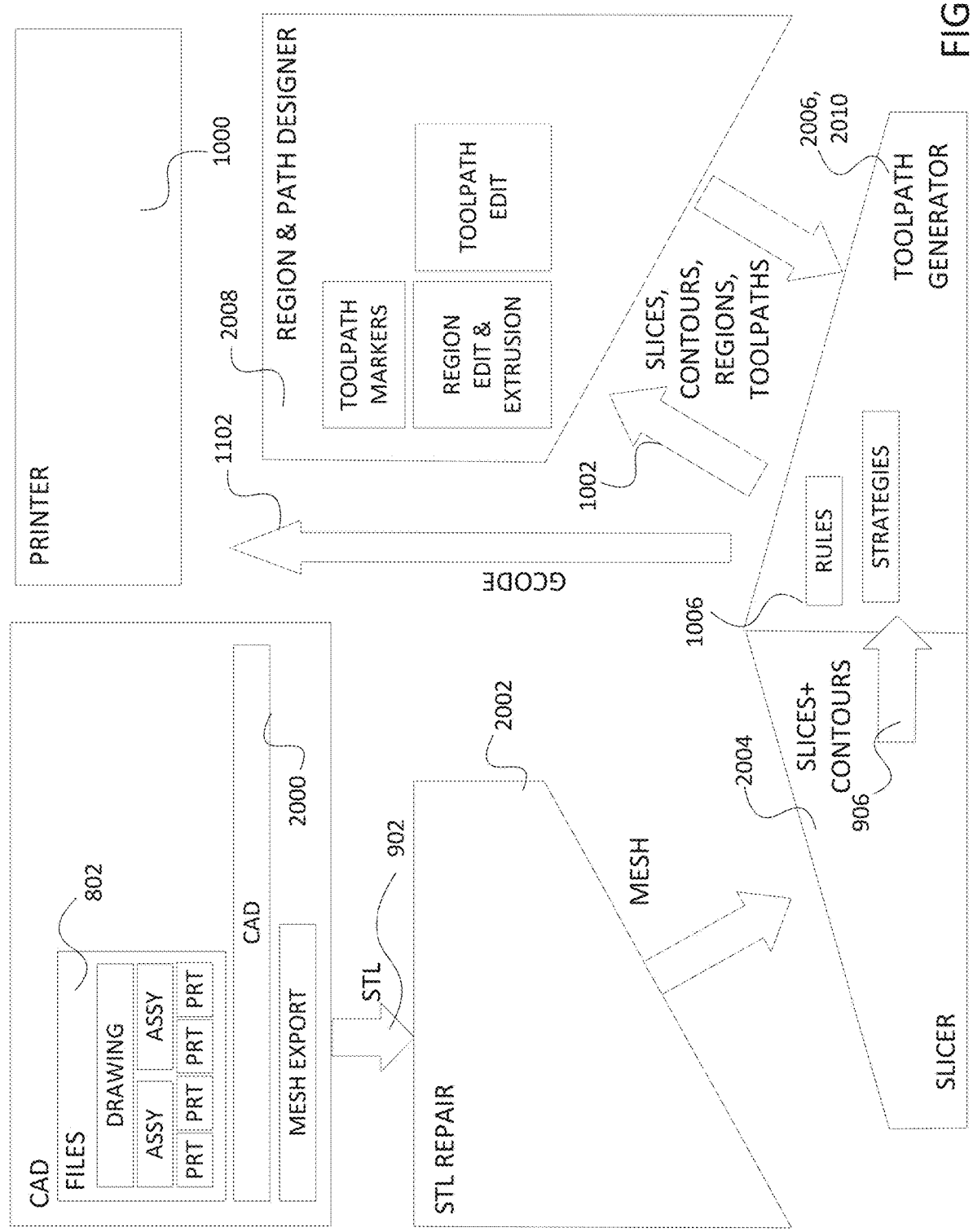

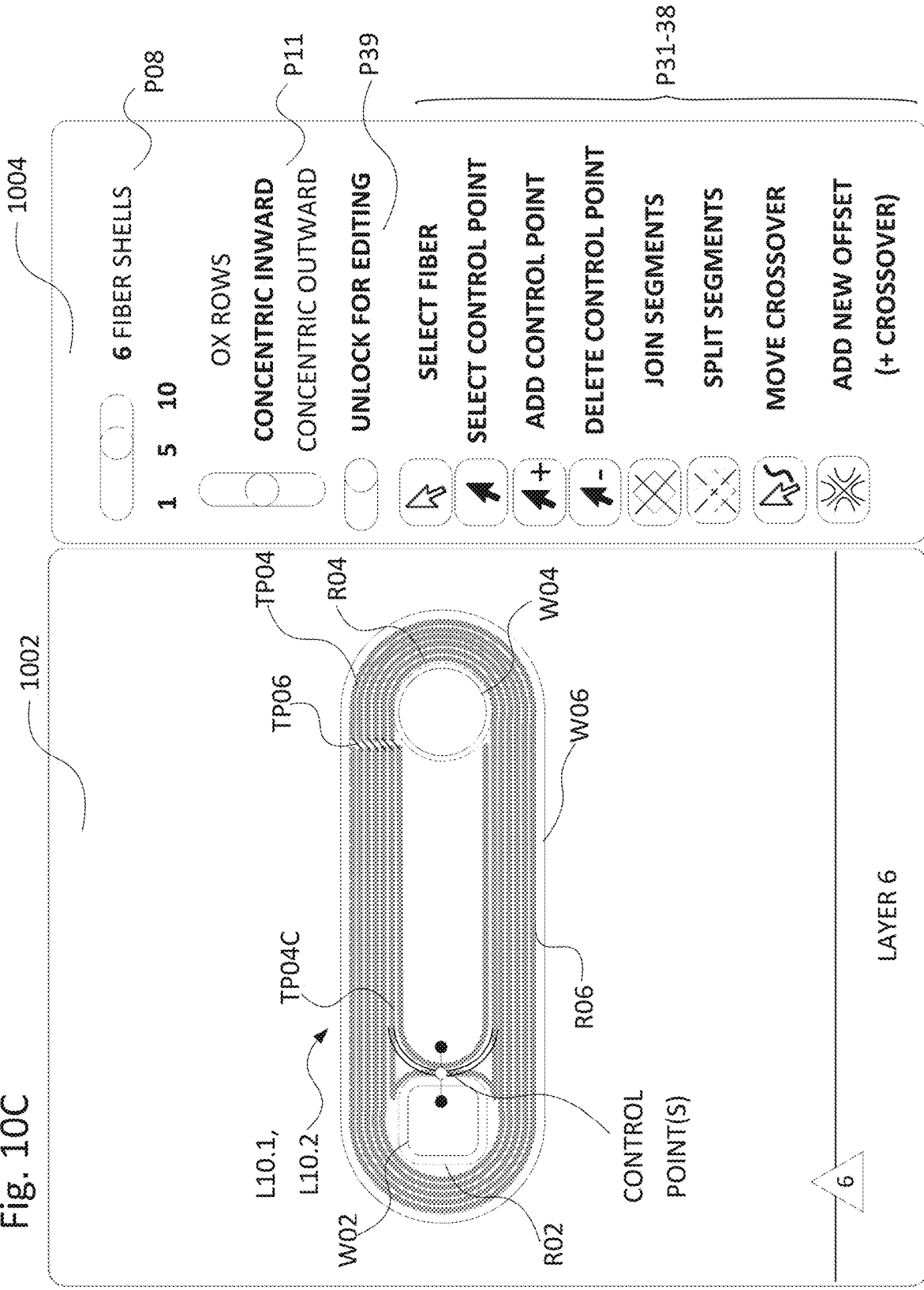

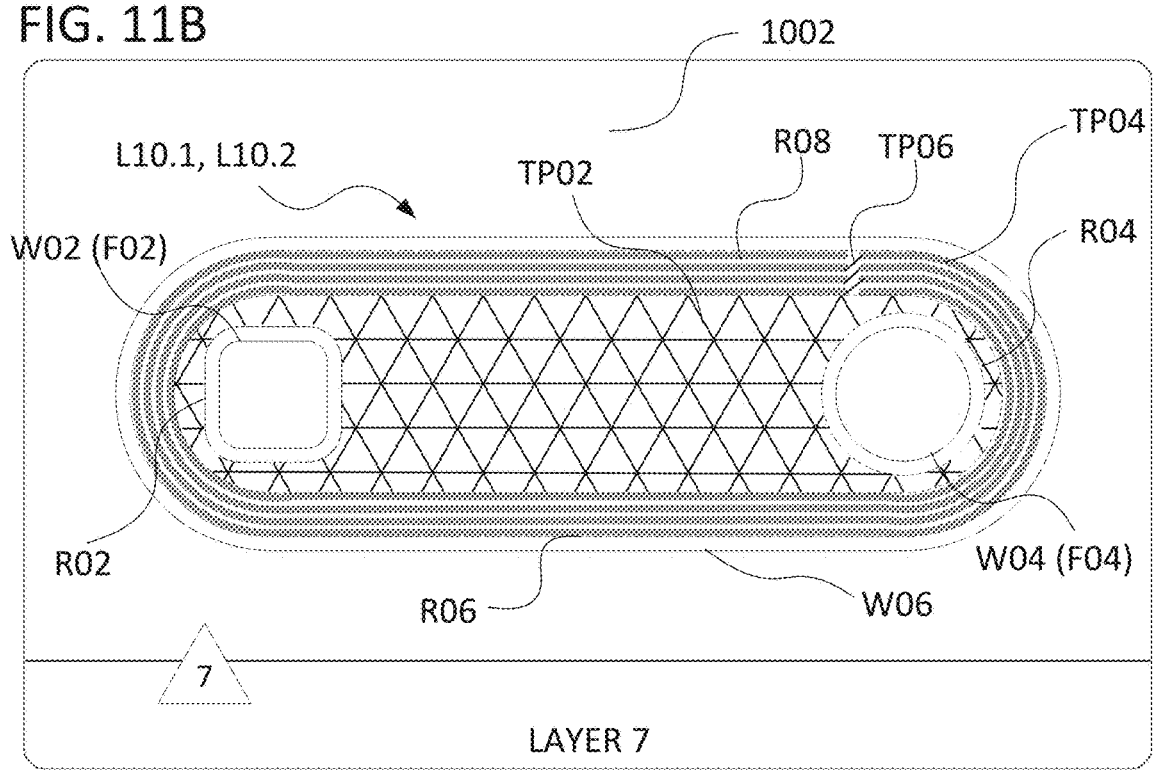
FIG. 11B — LAYER 7
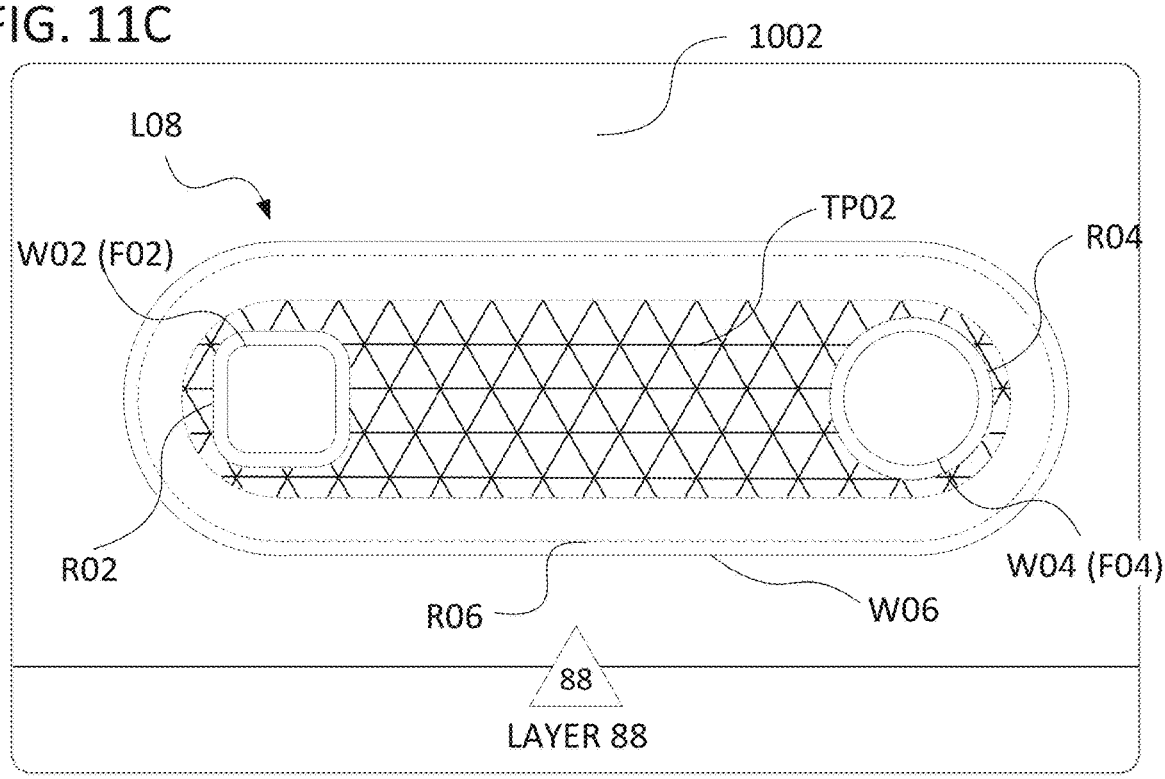
FIG. 11C — LAYER 88

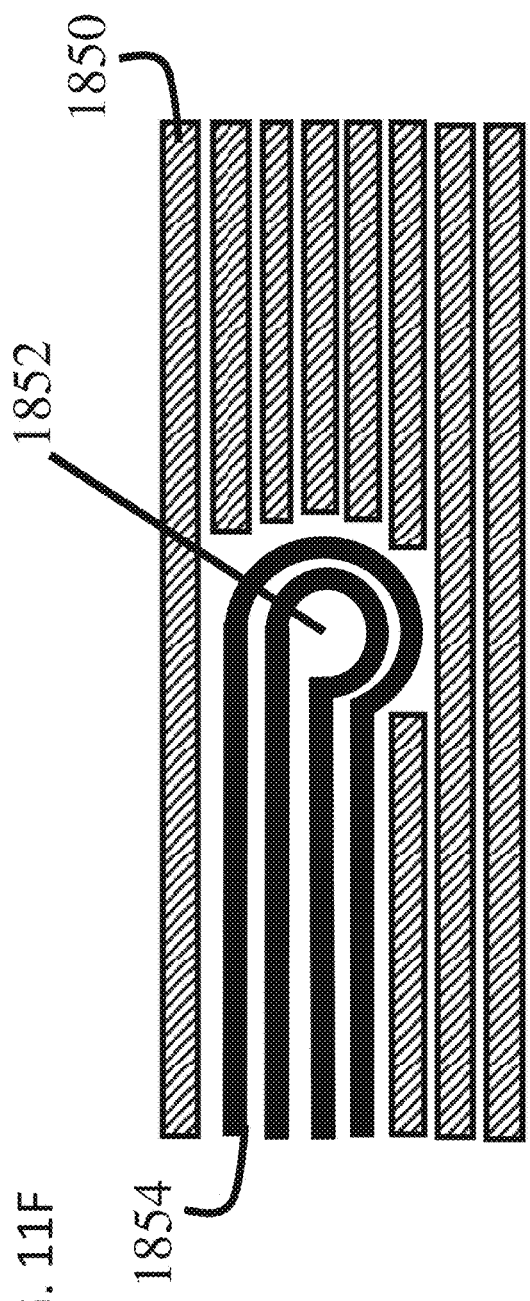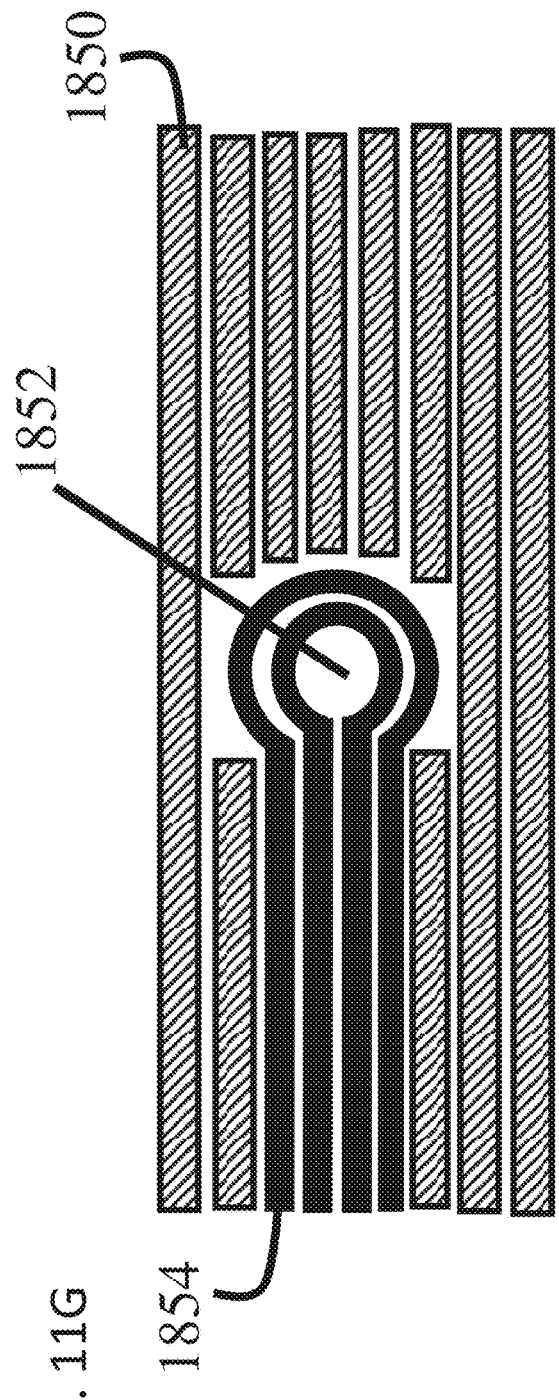

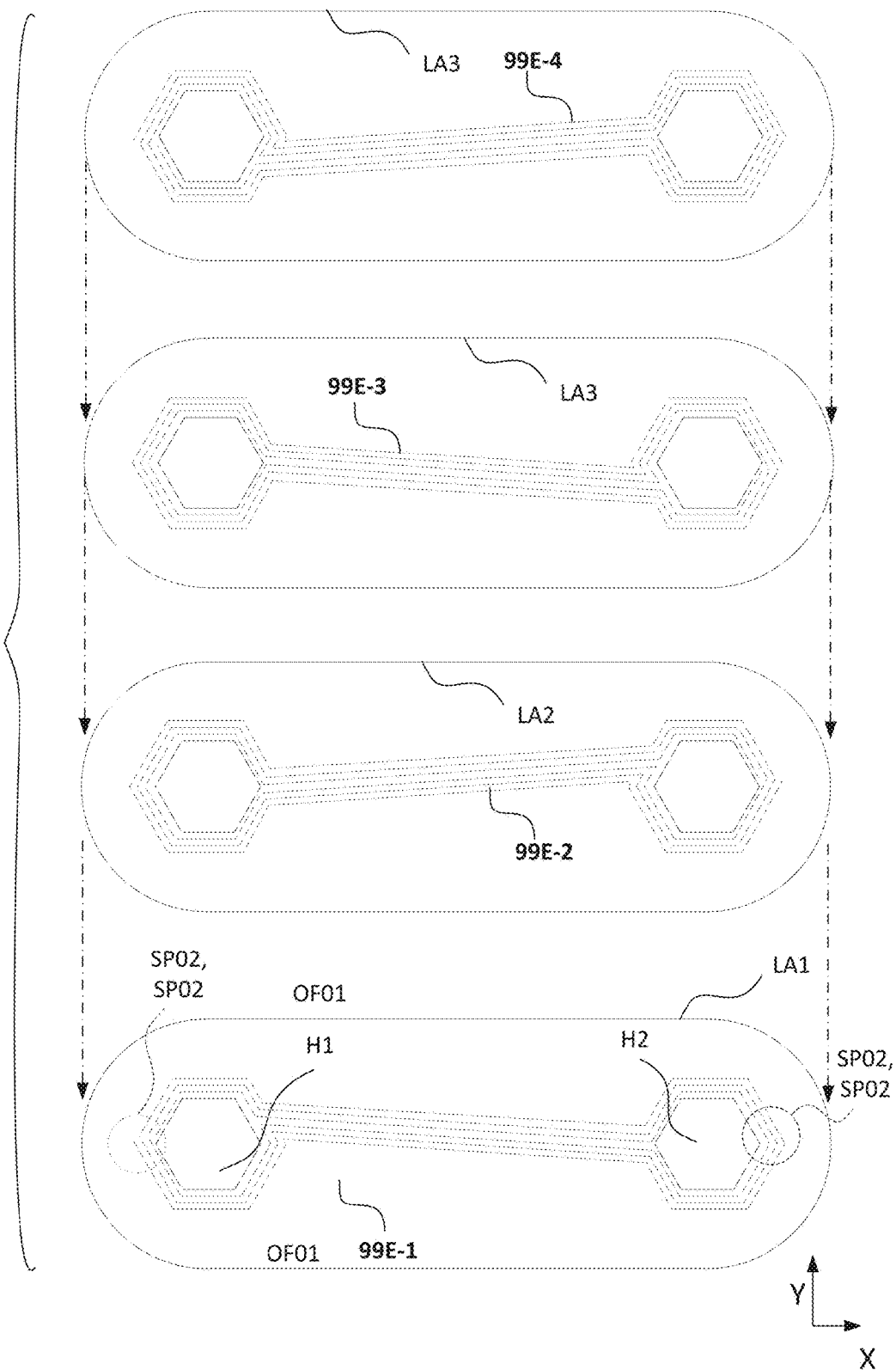

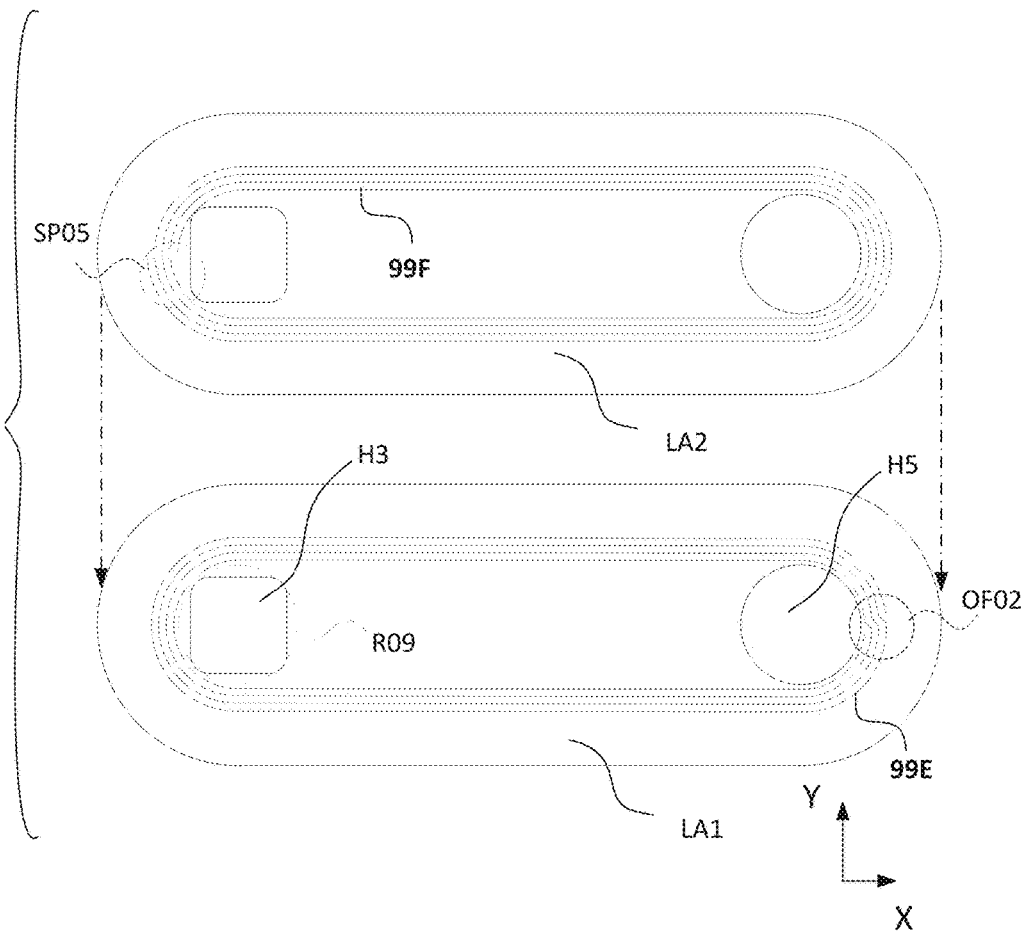

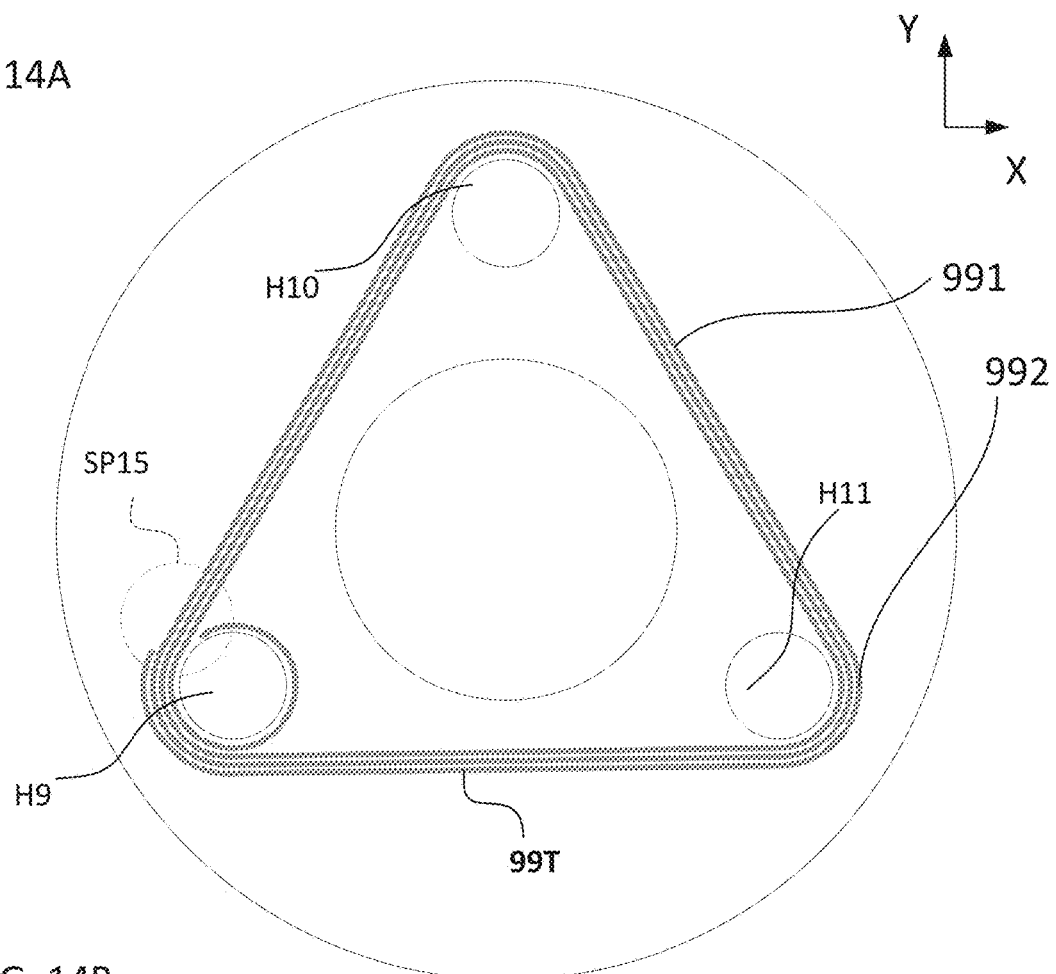
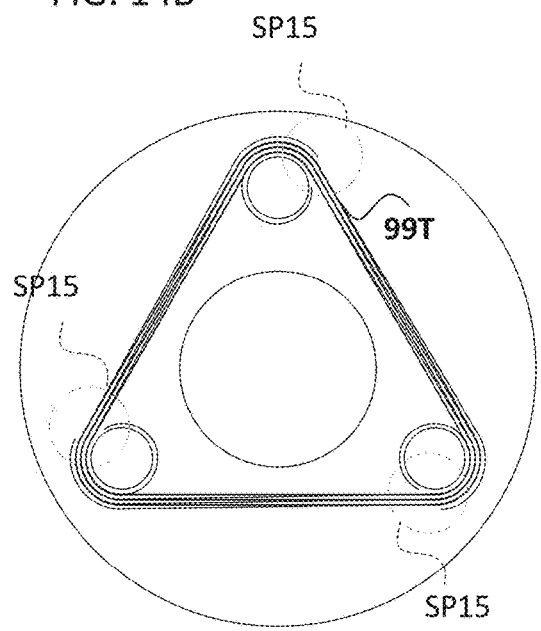
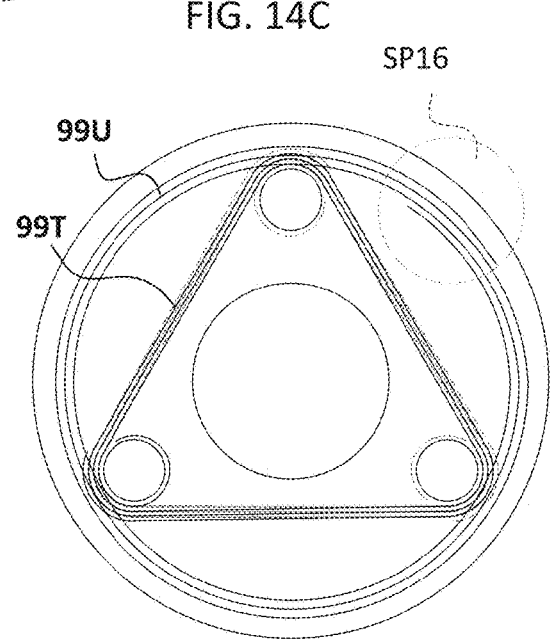
FIG. 14A
FIG. 14B
FIG. 14C

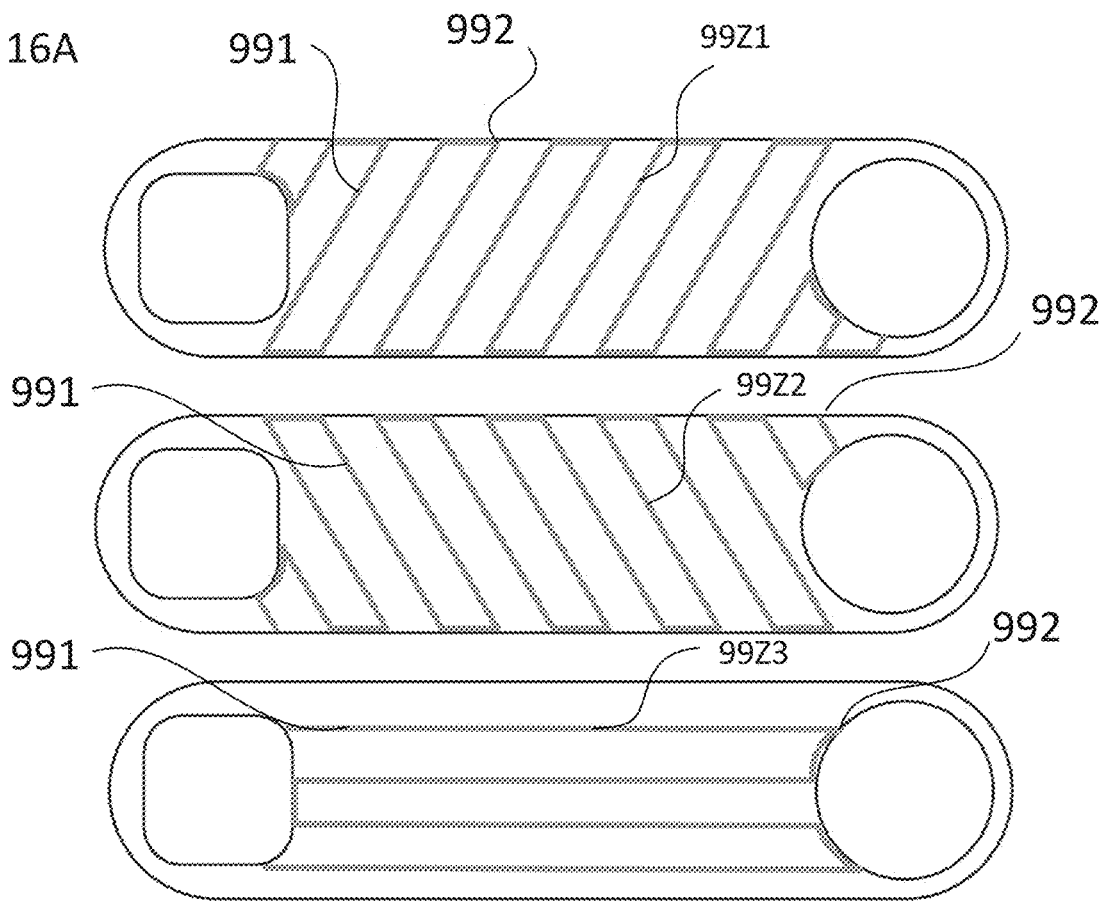
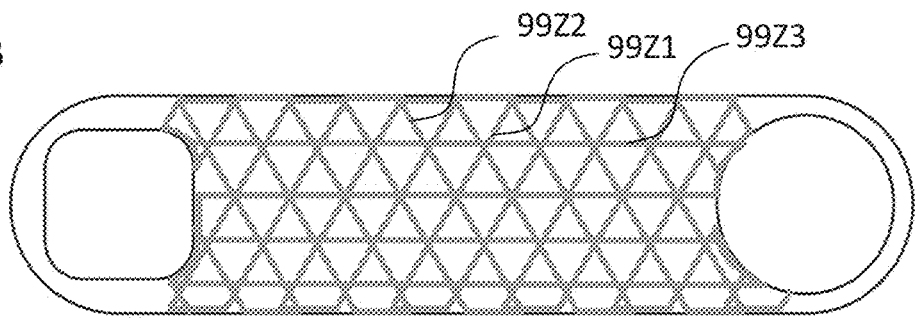
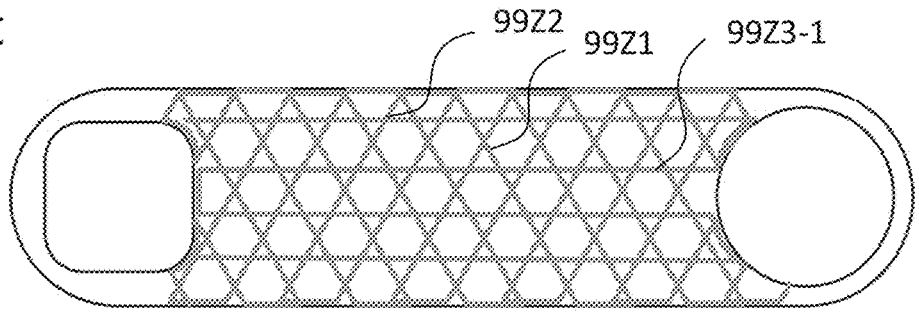

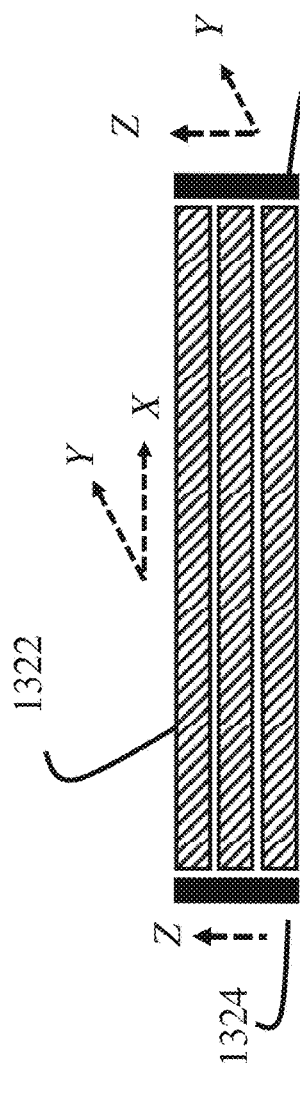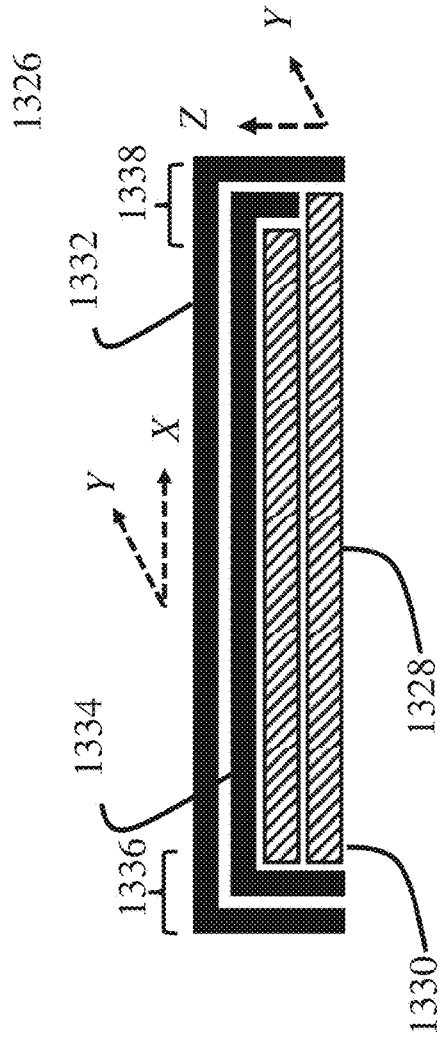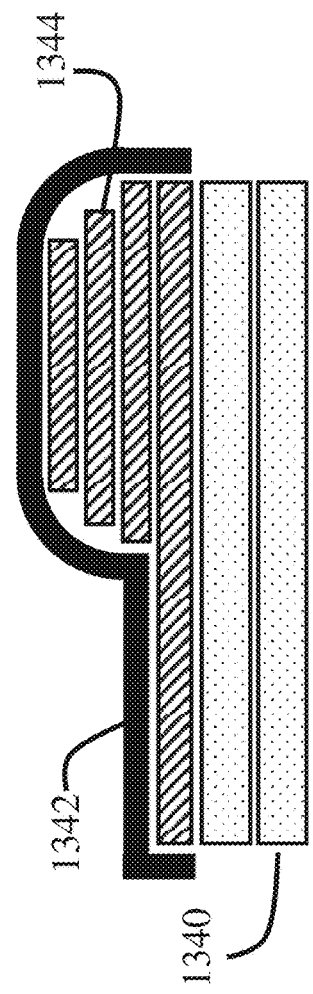

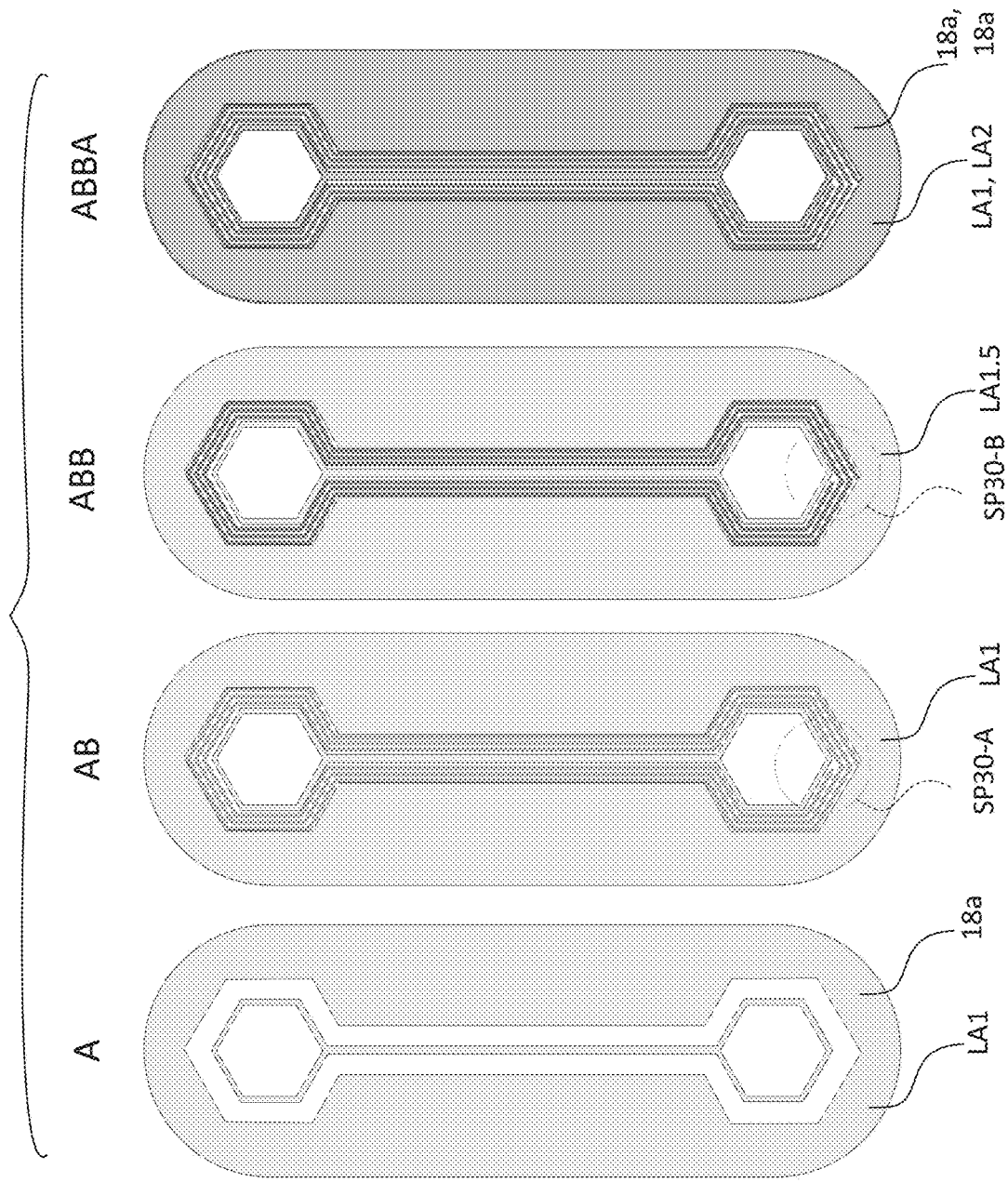

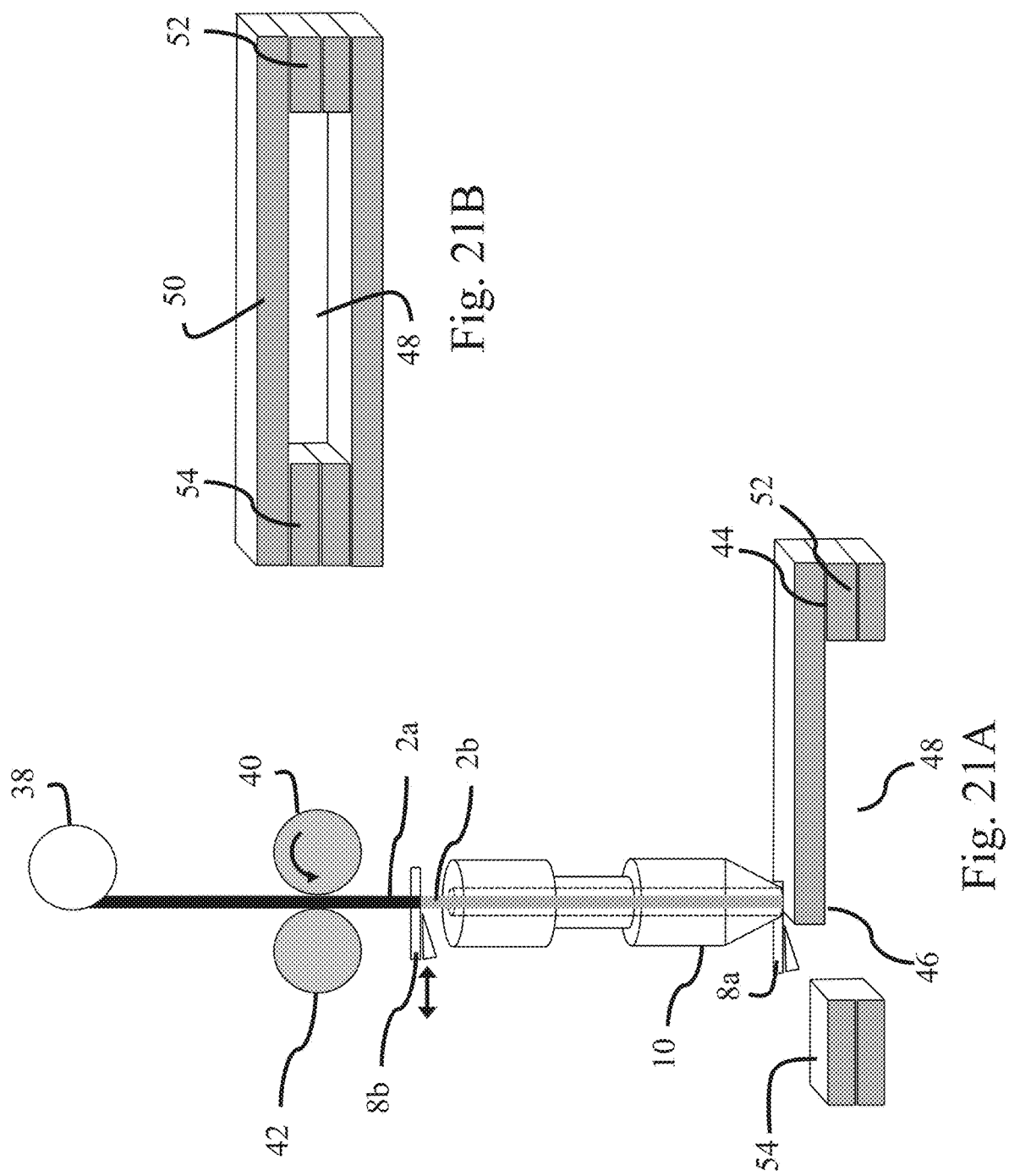

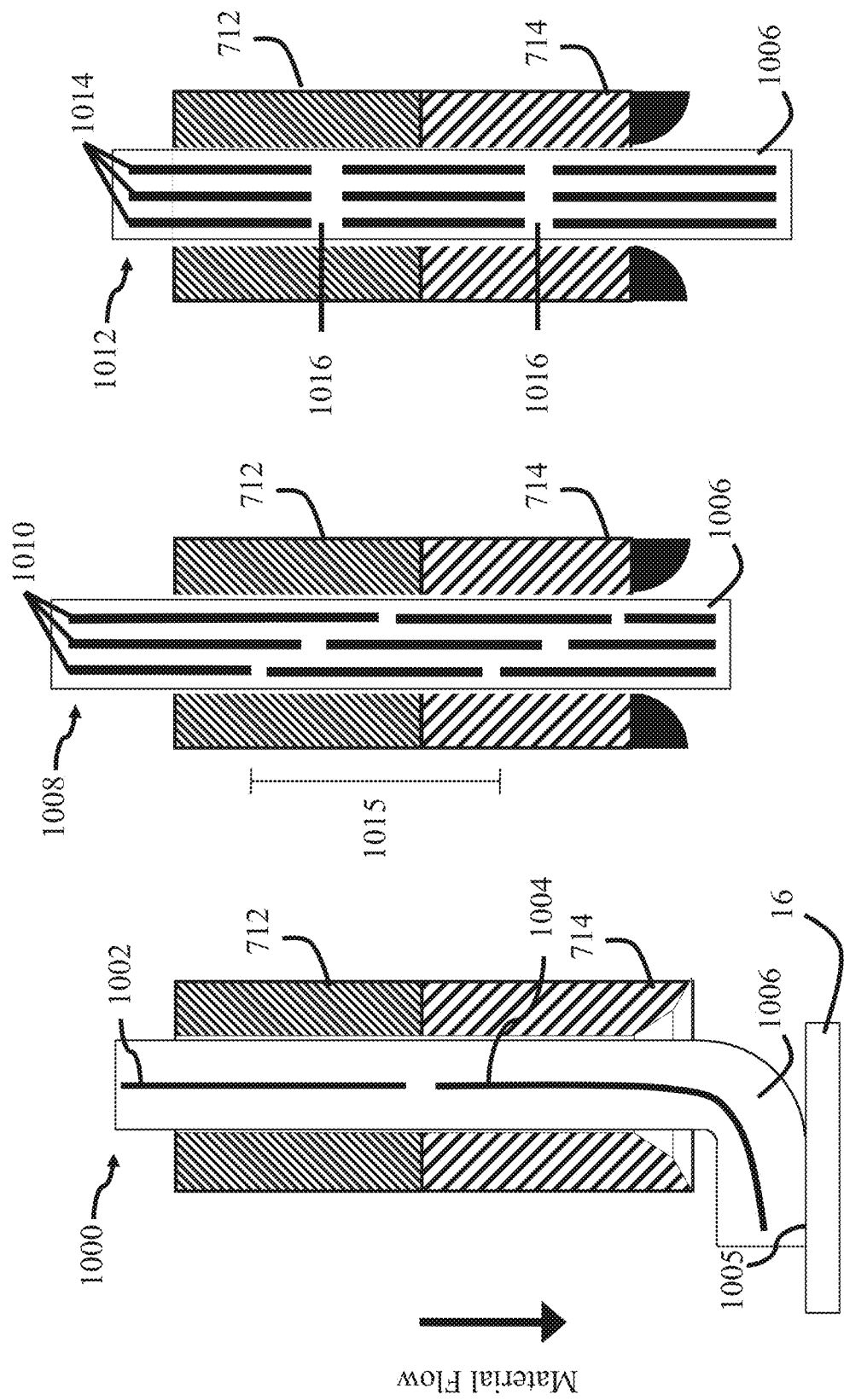

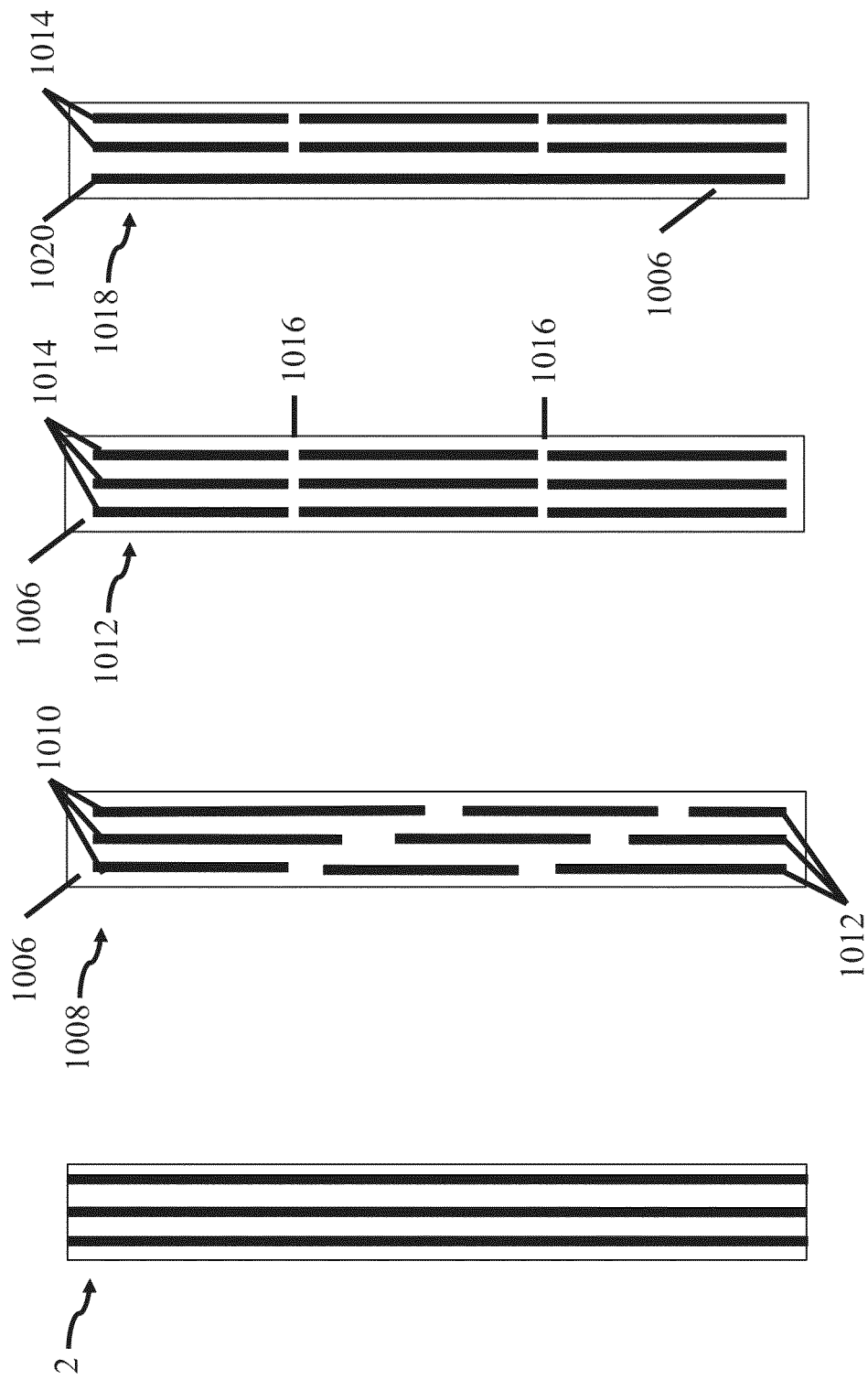

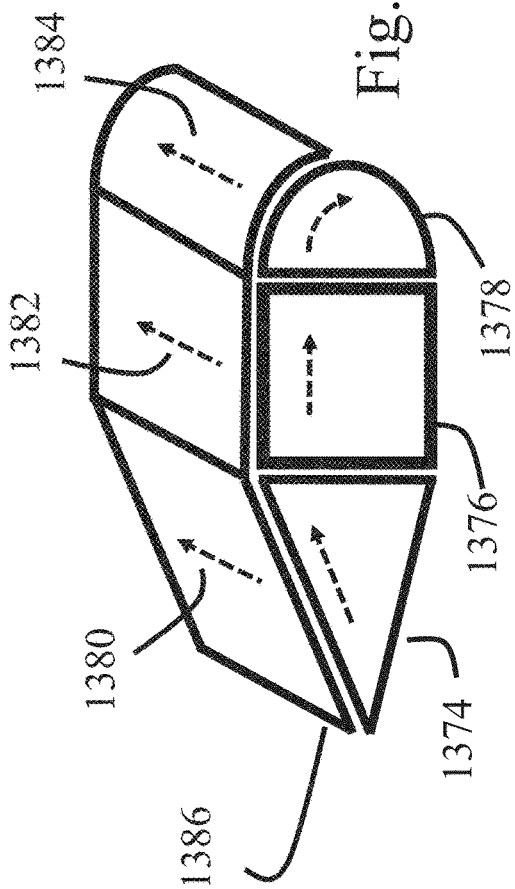
Fig. 27C
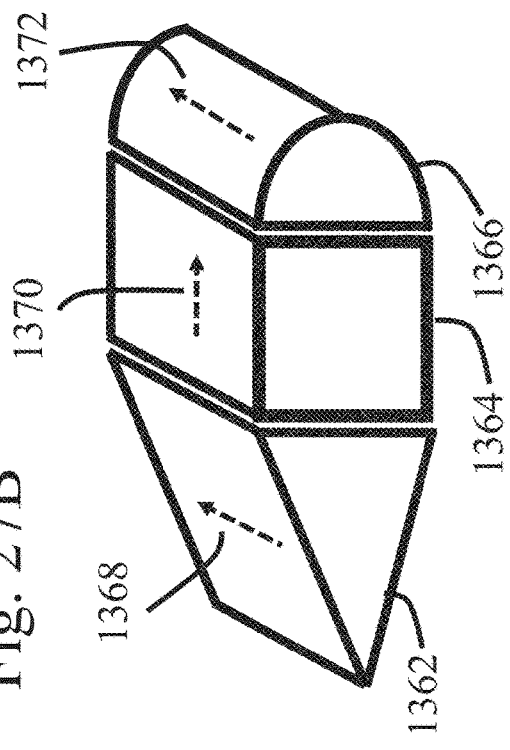
Fig. 27B
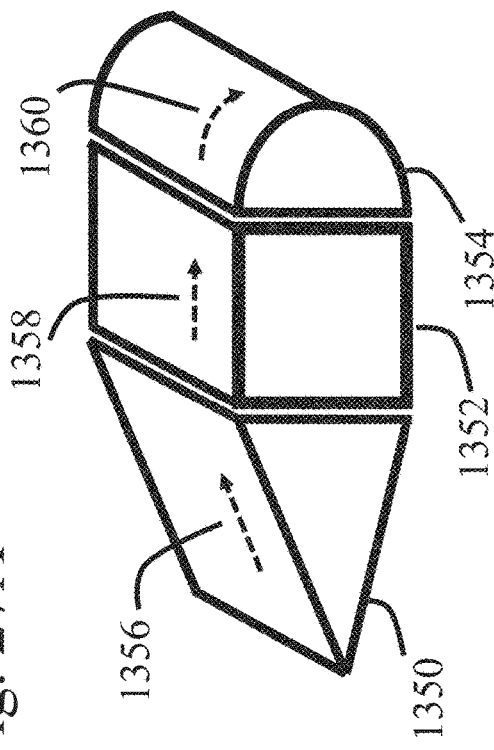
Fig. 27A
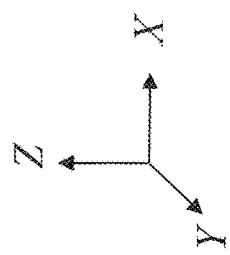

MULTILAYER FIBER REINFORCEMENT DESIGN FOR 3D PRINTING

CROSS-REFERENCE TO RELATED APPLICATIONS

This application is a divisional of pending U.S. patent application Ser. No. 15/174,645, filed Jun. 6, 2016 [now U.S. Pat. No. 9,815,268], entitled MULTIAXIS FIBER REINFORCEMENT FOR 3D PRINTING, which is herein incorporated by reference in its entirety. U.S. patent application Ser. No. 15/174,645 claims the benefit under 35 U.S.C. § 119(e) of U.S. provisional application Ser. No. 62/172,021, filed Jun. 5, 2015, the disclosure of which is herein incorporated by reference in its entirety; and is a continuation in part of each of U.S. patent application Ser. No. 14/944,088, filed 11-17-15, U.S. patent application Ser. No. 14/944,093, filed 11-17-15, and U.S. patent application Ser. No. 14/876,073, filed 10-6-15, the disclosures of which are herein incorporated by reference in their entirety. U.S. patent application Ser. No. 14/944,093 claims the benefit under 35 U.S.C. § 119(e) of U.S. provisional application Ser. No. 62/172,021, filed Jun. 5, 2015, and 62/080,890, filed Nov. 17, 2014, the disclosures of which are herein incorporated by reference in their entirety; and is a continuation in part of U.S. patent application Ser. No. 14/491,439 filed Sep. 19, 2014, the disclosure of which is herein incorporated by reference herein in its entirety. U.S. patent application Ser. No. 14/944,088 claims the benefit under 35 U.S.C. § 119(e) of U.S. provisional application Ser. No. 62/172,021, filed Jun. 5, 2015, and 62/080,890 filed Nov. 17, 2014; and is a continuation in part of U.S. patent application Ser. No. 14/491,439 filed Sep. 19, 2014. U.S. patent application Ser. No. 14/491,439 is a continuation-in-part of each of U.S. patent application Ser. No. 14/222,318, filed Mar. 21, 2014; U.S. patent application Ser. No. 14/297,437, filed Jun. 5, 2014; and U.S. patent application Ser. No. 14/333,881 [now U.S. Pat. No. 9,149,988], filed Jul. 17, 2014; the disclosures of which are herein incorporated by reference in their entirety. U.S. patent application Ser. No. 14/222,318 claims the benefit under 35 U.S.C. § 119(e) of U.S. provisional application Ser. No. 61/880,129, filed Sep. 19, 2013; 61/881,946, filed Sep. 24, 2013; 61/883,440, filed Sep. 27, 2013; 61/902,256, filed Nov. 10, 2013, 61/907,431, filed Nov. 22, 2013; 61/804,235, filed Mar. 22, 2013; 61/815,531, filed Apr. 24, 2014; 61/831,600, filed Jun. 5, 2013; 61/847,113, filed Jul. 17, 2013, and 61/878,029, filed Sep. 15, 2013, the disclosures of which are herein incorporated by reference in their entirety. U.S. patent application Ser. No. 14/297,437 claims the benefit under 35 U.S.C. § 119(e) of U.S. provisional application Ser. No. 61/881,946, filed Sep. 24, 2013; 61/902,256, filed Nov. 10, 2013; 61/831,600, filed Jun. 5, 2013; 61/847,113, filed Jul. 17, 2013, and 61/878,029, filed Sep. 15, 2013. U.S. patent application Ser. No. 14/297,437 is also a continuation-in-part of U.S. patent application Ser. No. 14/222,318. U.S. patent application Ser. No. 14/333,881 is a continuation-in-part of each of U.S. patent application Ser. No. 14/222,318, filed Mar. 21, 2014 and U.S. patent application Ser. No. 14/297,437, filed Jun. 5, 2014. U.S. patent application Ser. No. 14/876,073 is a continuation of U.S. patent application Ser. No. 14/333,881 [now U.S. Pat. No. 9,149,988], filed Jul. 17, 2014.

FIELD

Aspects relate to three dimensional printing.

BACKGROUND

"Three dimensional printing" as an art includes various methods such as Stereolithography (SLA) and Fused Filament Fabrication (FFF). SLA produces high-resolution parts, typically not durable or UV-stable, and is used for proof-of-concept work; while PIT extrudes through a nozzle successive filament beads of ABS or a similar polymer.

In the art of "Composite Lay-up", preimpregnated ("prepreg") composite sheets of fabric impregnated with a resin binder are layered into a mold, heated, and cured. In "Composite Filament Winding" sticky "tows" including multiple thousands of individual carbon strands are wound around a custom mandrel to form a rotationally symmetric part.

There is no commercial or experimental technique for orienting fiber during additive manufacturing to anisotropically improve properties of the finished part.

SUMMARY

In one embodiment, or embodiment of the invention, a method for depositing a 3D printed part with a composite material 3D printer, includes receiving a first 2D toolpath defining a fill material flat shell, and receiving a second 2D toolpath defining a support material flat shell.

A first 3D toolpath defining a long fiber composite material curved shell is also received, the long fiber composite material including a filament having a matrix embedding fibers having a length longer than two times a diameter of the filament. The toolpaths include paths interpretable to actuator instructions, or include actuator instructions and/or G-code, which are interpreted by a controller to control actuators—such as motors, heaters, or sources of curing energy—to move deposition heads along the paths (i.e., "trace") and/or build platforms and/or feed material and/or melt or solidify material. The method actuates a fill material deposition head to trace the first 2D toolpath to deposit fill material to substantially parallel a flat printing substrate, and actuates a support material deposition head to trace the second 2D toolpath to deposit support material to substantially parallel the flat printing substrate. A long fiber deposition head is actuated to trace the first 3D toolpath at least partially non-parallel to the flat printing substrate (e.g., in a direction including a Z component, when the flat printing substrate is parallel to an X-Y plane) to deposit the long fiber composite material to enclose the fill material flat shell. In this manner, a high-strength composite outer shell can surround a cavity or tube (left behind when support material is dissolved or removed), and various features and internal honeycomb or lattice structures may be built of fill material within and without the composite outer shell.

Optionally, the long fiber deposition head is actuated to trace the first 3D toolpath at least partially non-parallel to the flat printing substrate to deposit the long fiber composite material to enclose the support material flat shell. Further optionally, the flat printing substrate includes a flat build platform. One of the support material deposition head and the fill material deposition head may be actuated to deposit the flat printing substrate upon a build platform.

Alternatively, or in addition, the long fiber composite material includes a prepreg (preimpregnated) filament including a matrix embedding fibers having a length of between 0.6-15 mm, and between two and ten times longer than a diameter of the prepreg filament. Further optionally, the long fiber composite material may include a semi-continuous prepreg filament including a matrix embedding fibers aligned along the lengthwise direction of the filament when the filament is in one of solidified, melted, or re-solidified form.

Further optionally, or in addition, the long fiber deposition head may include an anisotropic solidifying head that solidifies, along anisotropic fill toolpaths, fiber swaths from a supply of anisotropic fiber reinforced material including a plurality of fiber strands extending continuously within a matrix material, the fiber swaths having an anisotropic characteristic oriented relative to a trajectory of the anisotropic fill tool paths, and wherein the fill material deposition head comprises an isotropic solidifying head that solidifies, along isotropic fill toolpaths, a substantially isotropic material from a supply of solidifiable isotropic material.

In another embodiment, or embodiment of the invention, for depositing a 3D printed part with a composite material 3D printer, a first 3D toolpath is received defining a fill material curved shell, and first 2D toolpaths are received defining support material flat shells. A second 3D toolpath is received defining a long fiber composite material curved shell, the long fiber composite material including a filament having a matrix embedding fibers having a length longer than two times a diameter of the filament. A fill material deposition head is actuated to trace the first 3D toolpath to deposit the fill material curved shell at least in part non-parallel to a printing substrate, and a support material deposition head is actuated to trace the second 2D toolpath to deposit support material in a succession of substantially flat shells. A long fiber deposition head is actuated to trace the second 3D toolpath at least in part non-parallel to a printing substrate to deposit the long fiber composite material curved shell to enclose at least a portion of the fill material curved shell. In this embodiment, fill material curved shells may be enclosed within long fiber composite outer shells (although fill material curved shells may still form outermost shells).

Optionally, one of the support material deposition head and the fill material deposition head may be actuated to deposit the printing substrate upon a build platform; and/or the build platform may be rotated in at least one degree of freedom additional to degrees of freedom of one of the support material deposition head and the fill material deposition head. For example, the build platform may separately rotate a spindle or mandrel build surface or printing substrate, in one or two degrees of rotational freedom, and/or be moved in 1-3 degrees of translational freedom, even as the deposition heads may themselves be independently movable in 1-3 degrees of translational freedom and 1-3 degrees of rotational freedom. Optionally, the build platform may be rotated through 180 degrees or more in at least one degree of freedom additional to degrees of freedom of one of the support material deposition head and the fill material deposition head to form at least one of a substantially rotationally symmetric printing substrate and a substantially rotationally symmetric fill material deposition.

Alternatively, or in addition, the support material deposition head may be actuated to trace the second 2D toolpath to deposit a separable or dissolvable material in a succession of shells forming a curved printing substrate; and/or the long fiber composite material may include a prepreg filament including a matrix embedding fibers having a length of between 0.6-15 mm, and between two and ten times longer than a diameter of the prepreg filament. The printing substrate may include at least one rotationally symmetric portion.

In another embodiment, or embodiment of the invention, for depositing a 3D printed part with a composite material 3D printer, a first toolpath defining a fill material shell is received, as is a second toolpath defining a support material shell. A first set of 3D toolpaths defining a first long fiber composite material curved quasi-isotropic laminate is also received, the long fiber composite material including a filament having a matrix filament enclosing fibers having a length two or more times longer than a diameter of the filament. A second set of 3D toolpaths defining a second long fiber composite material curved quasi-isotropic laminate is received. A support material deposition head is actuated to trace the second toolpath to deposit support material upon a build platform to generate at least a portion of a printing substrate, and a long fiber deposition head is actuated to trace the first set of 3D toolpaths at least partially parallel to the printing substrate to deposit the first curved quasi-isotropic laminate. A fill material deposition head is actuated to trace the first toolpath to deposit a fill material sandwich core adjacent the first curved quasi-isotropic laminate, and the long fiber deposition head is actuated to trace the second set of 3D toolpaths adjacent the fill material sandwich core to deposit a second curved quasi-isotropic laminate displaced from the first curved quasi-isotropic laminate.

Alternatively, or in addition, the fill material deposition head is actuated to trace the first toolpath to deposit the fill material sandwich core to form a surface substantially parallel to a surface of the first curved quasi-isotropic laminate, and the long fiber deposition head is actuated to trace the second set of 3D toolpaths at least in part substantially parallel to the fill material sandwich core surface, and displaced from the first curved quasi-isotropic laminate.

Optionally, a third toolpath defining a second fill material shell is received, and the fill material deposition head is actuated to trace the third toolpath to deposit fill material to encapsulate the first and second curved quasi-isotropic laminates and the fill material sandwich core.

Further optionally, the fill material deposition head may be actuated to trace the first toolpath to deposit the fill material sandwich core to forming a surface curved and at least in part non-parallel with respect to a surface of the first curved quasi-isotropic laminate, and/or the long fiber deposition head may be actuated to trace the second set of 3D toolpaths at least in part substantially parallel to the fill material sandwich core surface, and displaced from the first curved quasi-isotropic laminate.

The matrix material may include a thermoplastic resin having an unmelted ultimate tensile strength of approximately 10 through 100 MPa and a melted ultimate tensile strength of less than 10 MPa, and the fibers are formed from includes a stranded material having an ultimate tensile strength of approximately 200-100000 MPa. Optionally, the long fiber composite material may be supplied as a filament having a cross sectional area greater than 1×10E-5 square inches and less than 2×10E-3 square inches, and including includes, in any cross-sectional area, between 100 and 6000 parallel continuous axial strands. The long fiber composite material may include a prepreg filament including a matrix embedding fibers having a length of between 0.6-15 mm, and between two and ten times longer than a diameter of the prepreg filament.

Alternatively, or in addition, the build platform may be actuated to rotate through 180 degrees or more in at least one degree of freedom additional to degrees of freedom of one of the support material deposition head and the fill material deposition head to form at least one of a printing substrate curved about the axis of rotation of the build platform and a fill material deposition curved about the axis of rotation of the build platform.

In another embodiment, or embodiment of the invention, for depositing a 3D printed part with a composite material 3D printer, a first set of toolpaths defining support material shells is received, and a second set of toolpaths defining fill material shells is received. A first set of 3D toolpaths defining curved contour shells of a long fiber composite material is also received, the long fiber composite material including a filament having a matrix embedding fibers having a length longer than two times a diameter of the filament. A support material deposition head is actuated to trace the first set of toolpaths to deposit the support material shells to support a surface of a part, and a fill material deposition head is actuated to trace the second set of toolpaths to deposit the fill material shells partially forming the part; a long fiber deposition head is actuated to trace the first set of 3D toolpaths to deposit the long fiber composite material shells at least partially tracing non-parallel to a printing substrate (e.g., in a trajectory or succession of trajectories including a Z component, where the build platform or printing substrate are in an X-Y plane, or in a trajectory or succession of trajectories including a component normal to a surface of the build platform or an outermost surface of a printing substrate) and at least partially enclosing the support material shells.

Alternatively, or in addition, the support material shells are deposited to support a surface of the part with reference to one of a direction of gravity or a direction of ironing of the depositing of the long fiber composite material shells by an ironing surface moved together with the long fiber deposition head; and/or the support material shells are deposited to support a contour of an interior wall of the part.

Optionally, the matrix material may include a thermoplastic resin having an unmelted ultimate tensile strength of approximately 10 through 100 MPa and a melted ultimate tensile strength of less than 10 MPa, and the fibers are formed from includes a stranded material having an ultimate tensile strength of approximately 200-100000 MPa. The long fiber composite material may be supplied as a filament having a cross sectional area greater than 1×10E-5 square inches and less than 2×10E-3 square inches, and including includes, in any cross-sectional area, between 100 and 6000 parallel continuous axial strands.

Alternatively, or in addition, the embodiment may include ironing the matrix material and the long fiber composite filament by applying an ironing force with a heated ironing surface heated as the fiber reinforced composite filament is supported by at least one of the support material shells, the fill material shells, or the long fiber composite material shells. The embodiment may further optionally include pressing the fiber reinforced composite filament into the part to form bonded ranks, and flattening the bonded ranks on at least two sides by applying an ironing force to the fiber reinforced composite filament with a heated ironing surface force that applies a reshaping force to the fiber reinforced composite filament as a normal reaction force at least one of the support material shells, the fill material shells, or the long fiber composite material shells. Optionally, the long fiber composite material comprises a prepreg filament including a matrix embedding fibers having a length of between 0.6-15 mm, and between two and ten times longer than a diameter of the prepreg filament.

As an apparatus, the processes described may be carried out by any device or apparatus disclosed herein, including but not limited to each deposition head and/or the build plate being associated with motorized drive for relatively moving at least the deposition heads and a build plate and/or printing substrate supporting a 3D printed part in at least three degrees of freedom, and a controller, wherein the controller is configured to control the motorized drives and the deposition heads and the isotropic solidifying head, to which the controller is operatively connected, to build the 3D printed part by solidifying the materials along the tool paths. The build plate may be a plate; or a ball; or a rod, or a ring or tube or other geometric shape, connected to actuators and/or motorized drives to be articulated in 2-6 degrees of freedom. A printing substrate may be deposited on a build plate that is a plate; or a ball; or a rod, ring or tube; and may be built up of support material and/or fill material to form a printing substrate formed as a plate; or a ball; or a rod, ring or tube.

In a further embodiment, in a machine implemented method for generating three-dimensional toolpath instructions for a three dimensional printer, a three-dimensional solid model is received, and a flat printing substrate is defined, e.g., within the slicing and layer editing executable code and interface described herein. Based on the three-dimensional solid model and the flat printing substrate, a first 2D toolpath defining a fill material flat shell and a second 2D toolpath defining a support material flat shell are generated, and a first 3D toolpath defining a long fiber composite material curved shell is generated. Actuator instructions are generated to trace the first 2D toolpath and the second 2D toolpath to deposit support material and fill material to substantially parallel the flat printing substrate. Further actuator instructions are generated to trace the first 3D toolpath at least partially non-parallel to the flat printing substrate to deposit the long fiber composite material to enclose at least one of the support material and the fill material.

The three-dimensional solid model may comprise any individual one of, or any combination or fusion of, constructive solid geometry; enumerated occupied cells or voxels; cell decomposition; boundary representation including planes, quadrics, and/or NURBS; a surface mesh or surface mesh modeling; sweeps of sets or positive or negative solids; polygonalization algorithms; or parametric or feature-based modeling.

In another embodiment, in a machine implemented method for generating three-dimensional toolpath instructions for a three dimensional printer, a three-dimensional solid model is received and a printing substrate is defined. Based on the three-dimensional solid model and the flat printing substrate, a first 2D toolpath is generated defining a support material shell, a first 3D toolpath is generated defining a fill material curved shell and a second 3D toolpath is generated defining a long fiber composite material curved shell. Actuator instructions are generated to trace the first 2D toolpaths to deposit support material substantially parallel the printing substrate in a succession of substantially flat shells. Further, actuator instructions are generated to trace the first 3D toolpath at least in part non-parallel to the printing substrate to deposit the fill material curved shell and to trace the second 3D toolpath at least in part non-parallel to the printing substrate to enclose at least a portion of the fill material curved shell.

In an additional embodiment, in a machine implemented method for generating three-dimensional toolpath instructions for a three dimensional printer, a three-dimensional solid model is received and a printing substrate (e.g., a build platform, and/or a support material structure to be formed upon the build platform, and/or a combination of these) is defined. Based on the three-dimensional solid model and the flat printing substrate, a first toolpath defining a fill material shell and a second toolpath defining a support material shell are generated. A first set of 3D toolpaths defining a first long fiber composite material curved quasi-isotropic laminate and a second set of 3D toolpaths defining a second long fiber composite material curved quasi-isotropic laminate are also generated. Actuator instructions are generated to trace the first 2D toolpaths to deposit support material upon a build platform to generate at least a portion of the printing substrate, and to trace the first set of 3D toolpaths at least in part parallel to the printing substrate to deposit the first curved quasi-isotropic laminate. Actuator instructions are generated to trace the first toolpath to deposit a fill material sandwich core adjacent the first curved quasi-isotropic laminate, and to trace the second set of 3D toolpaths adjacent the fill material core to deposit a second curved quasi-isotropic laminate displaced from the first curved quasi-isotropic laminate.

In one further embodiment, in a machine implemented method for generating three-dimensional toolpath instructions for a three dimensional printer, a three-dimensional solid model is received, and a printing substrate is defined. Based on the three-dimensional solid model and the flat printing substrate, a first set of toolpaths is generated defining a support material shells, a second set of toolpaths is generated defining fill material shells, and a first set of 3D toolpaths is generated defining a curved contour shells of a long fiber composite material. Actuator instructions are generated to trace the first set of toolpaths to deposit the support material shells to support a surface of a part; to trace the second set of toolpaths to deposit the fill material shells partially forming the part; and to trace the first set of 3D toolpaths to deposit the long fiber composite material shells at least partially tracing non-parallel to a printing substrate and at least partially enclosing the support material shells.

BRIEF DESCRIPTION OF THE DRAWINGS

FIG. 1A is a schematic view of a continuous core reinforced filament deposition and fill material filament extrusion printer.

FIG. 1C is a close-up cross-section of a fiber printhead assembly and a set of different possible compression/consolidation shapes.

FIG. 1D is a set of photographs of exemplary cross sections of extruded, non-compressed "FDM" or "FFF" depositions.

FIGS. 2A through 2C are schematic representations of a three dimensional printing system using a continuous core reinforced filament together with stereolithography or selective laser sintering in which FIGS. 2A and 2B are schematic views of a continuous core reinforced filament-SLA/SLS printer and FIG. 2C is a schematic view of a tacking process.

FIG. 5A is a block diagram and schematic representation of a three dimensional printer system, including a CAD station, a slicer and path generator, a region and path designer, and the three dimensional printer.

FIG. 10C shows an exemplary on-screen part rendering and logic structure for the region and/or rule processing of FIG. 9C.

FIGS. 11A-11E show models, renderings, representations of toolpaths, and data structures as carried out by the part rendering and logic structure of FIGS. 10A-10K, for a sandwich panel rule example, a crossover movement example, and a region extrusion example;

FIGS. 11F-11G show schematic representations of a printed part including a reinforced holes formed therein;

FIGS. 12A-12J show composite swaths and/or path planning for layers of linkage arms or base plates.

FIGS. 14A-14C show the principles of complementary toolpaths in a trilaterally symmetric (three sided) context.

Each of FIGS. 16A-16D shows reinforcement formations 99 within single or multiple layers $LA_n$, $LA_{n+1}$, $LA_{n+2}$, etc.

Figure 17:
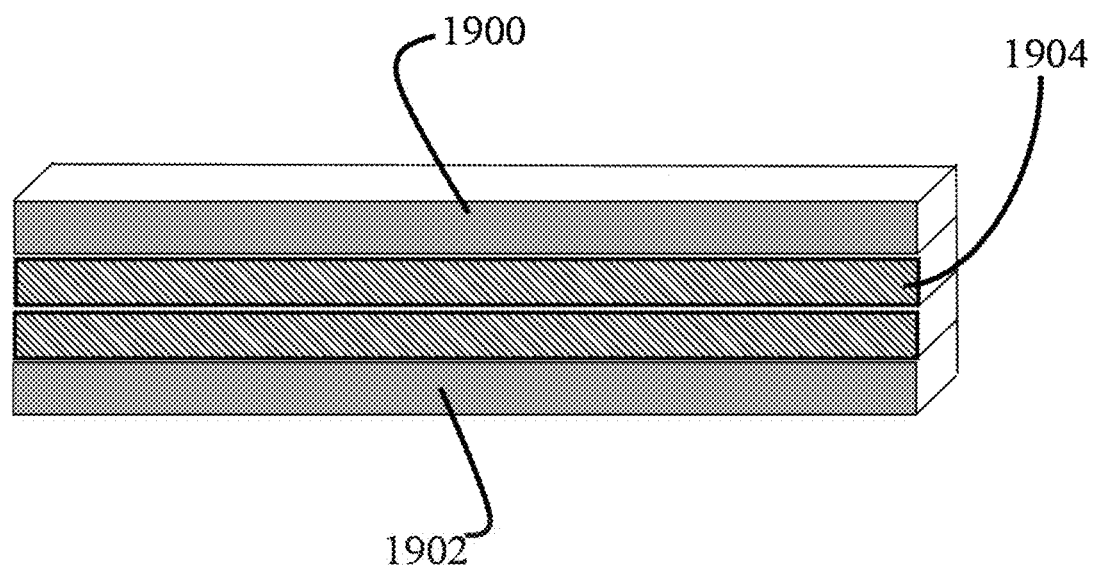
Figure 18:
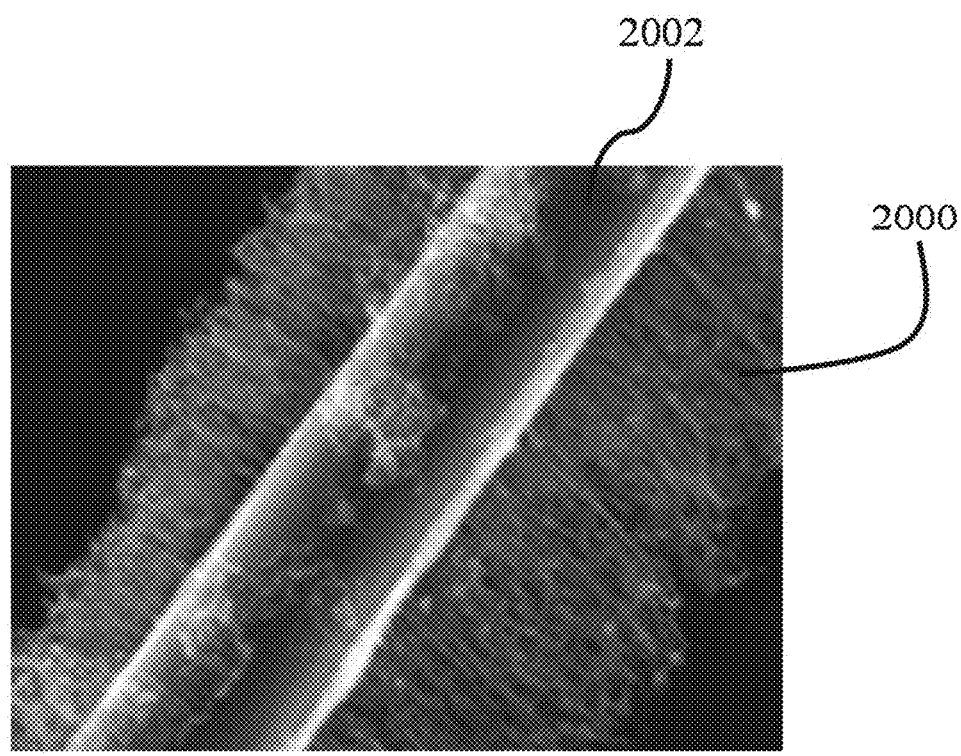
Figure 19D:
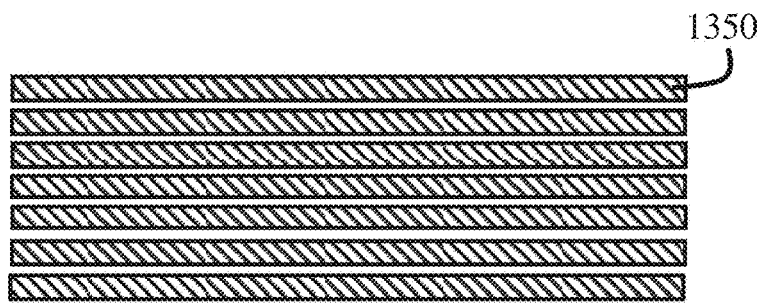
Figure 19E:
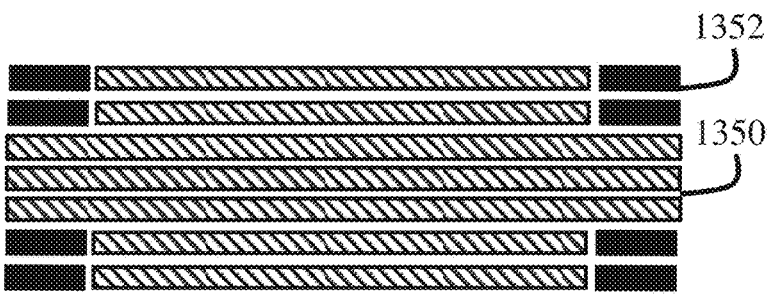
Figure 19F:
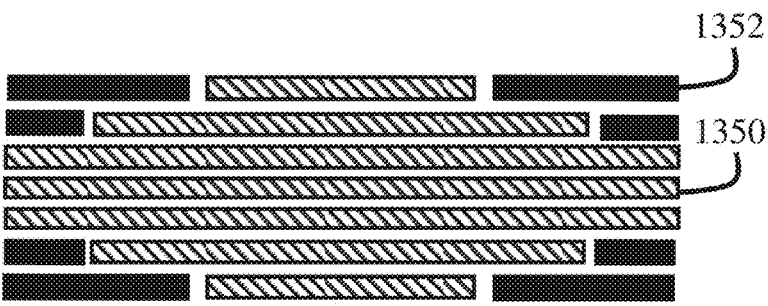
Figure 19G:
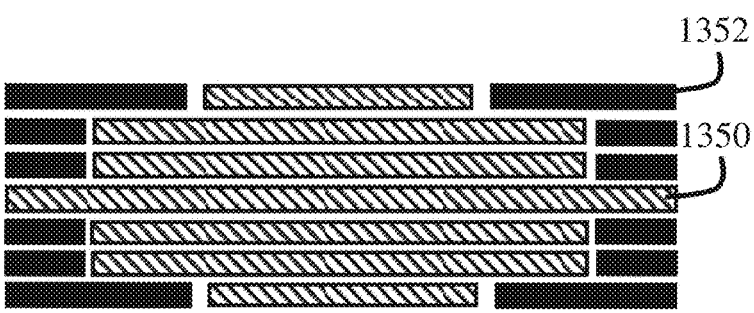
Figure 19H:
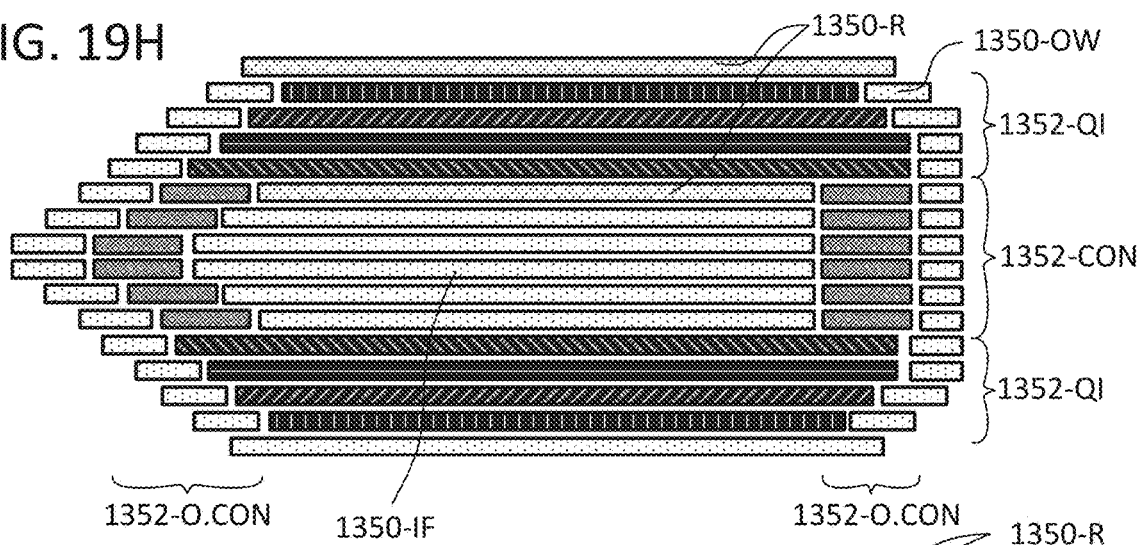
Figure 19I:
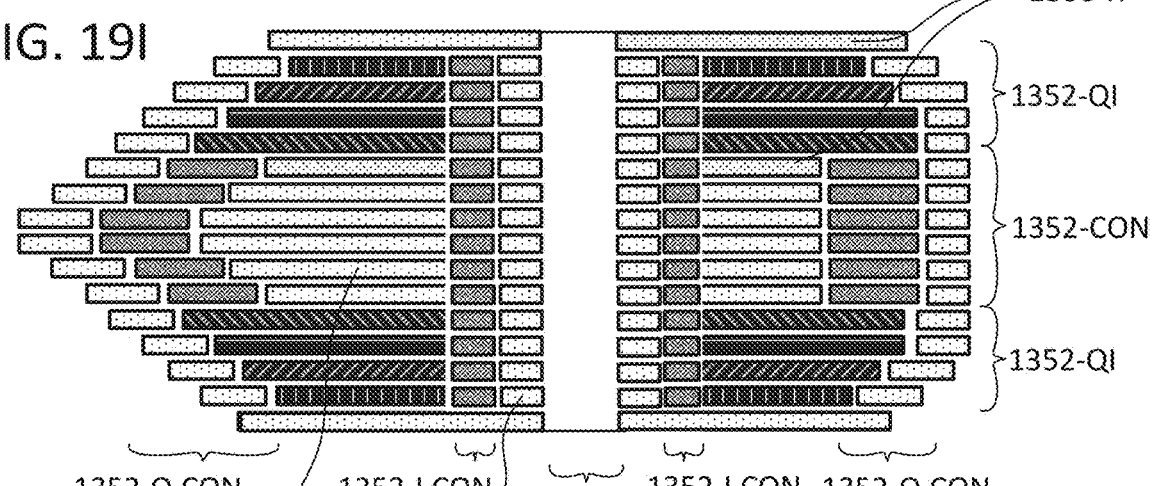
Figure 19J:
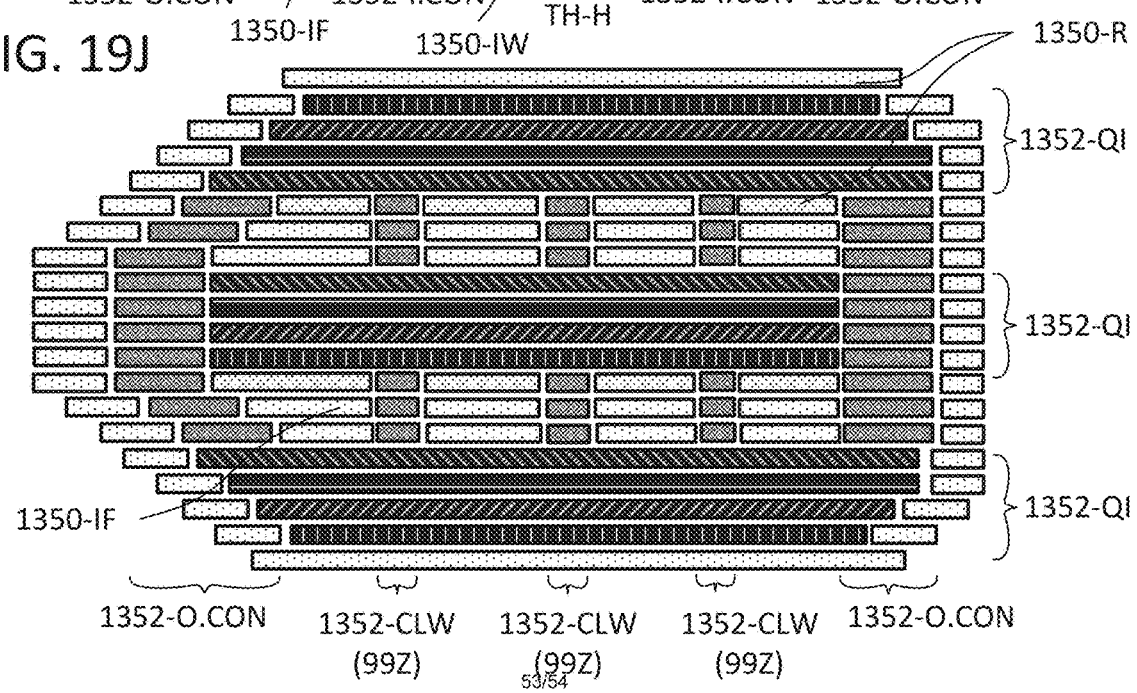
Figure 22:
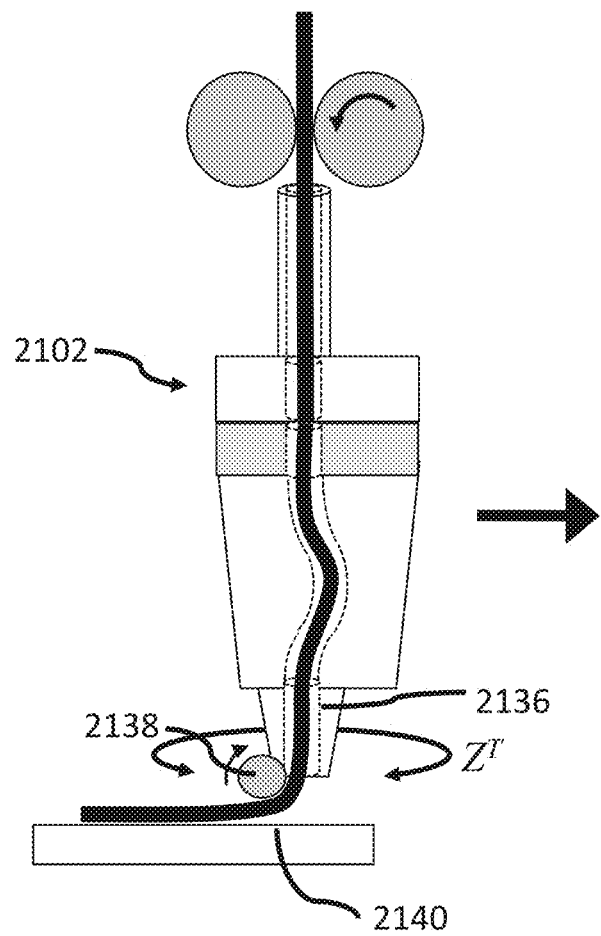
Figures 25A, 25B:
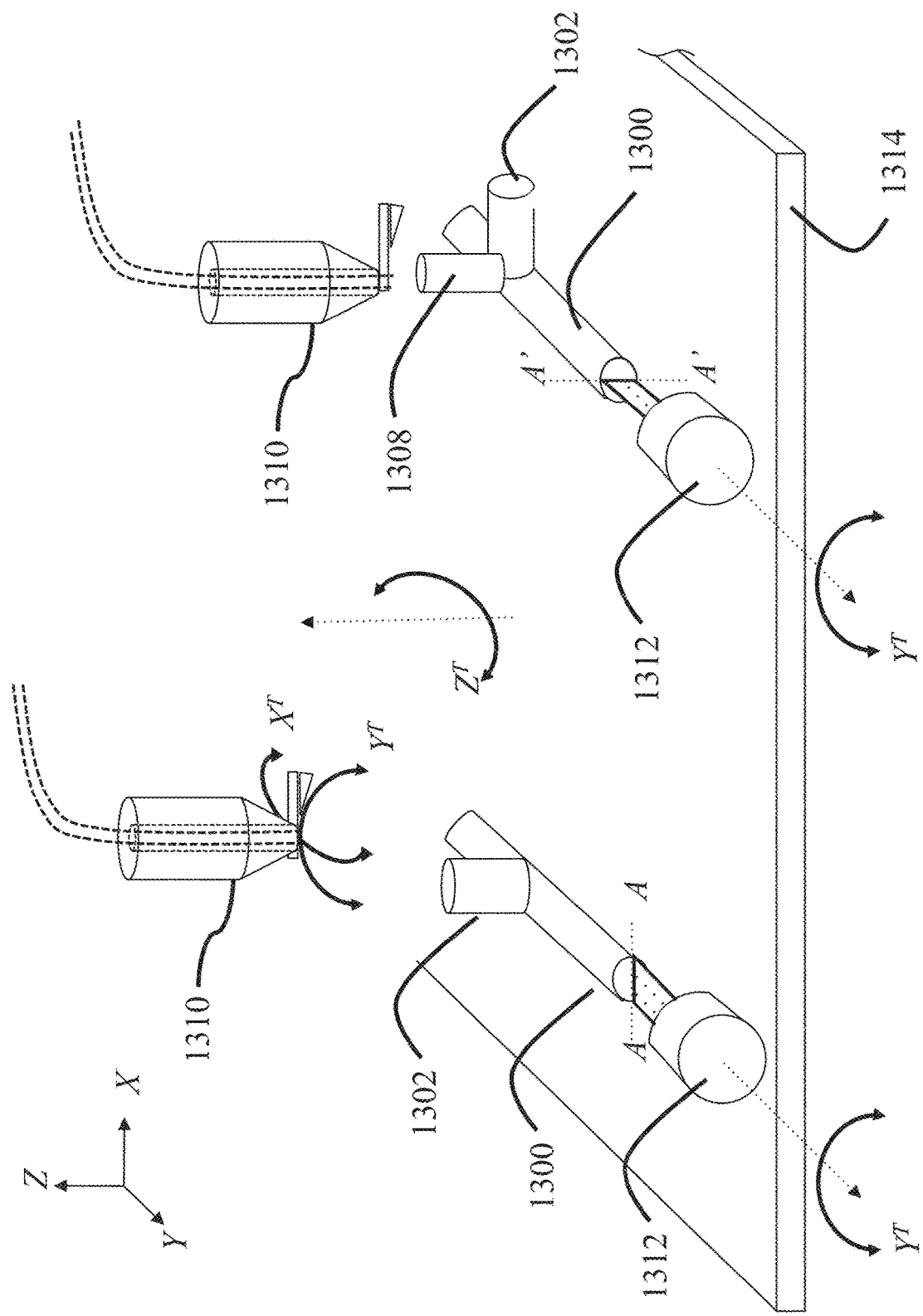
Figure 26:
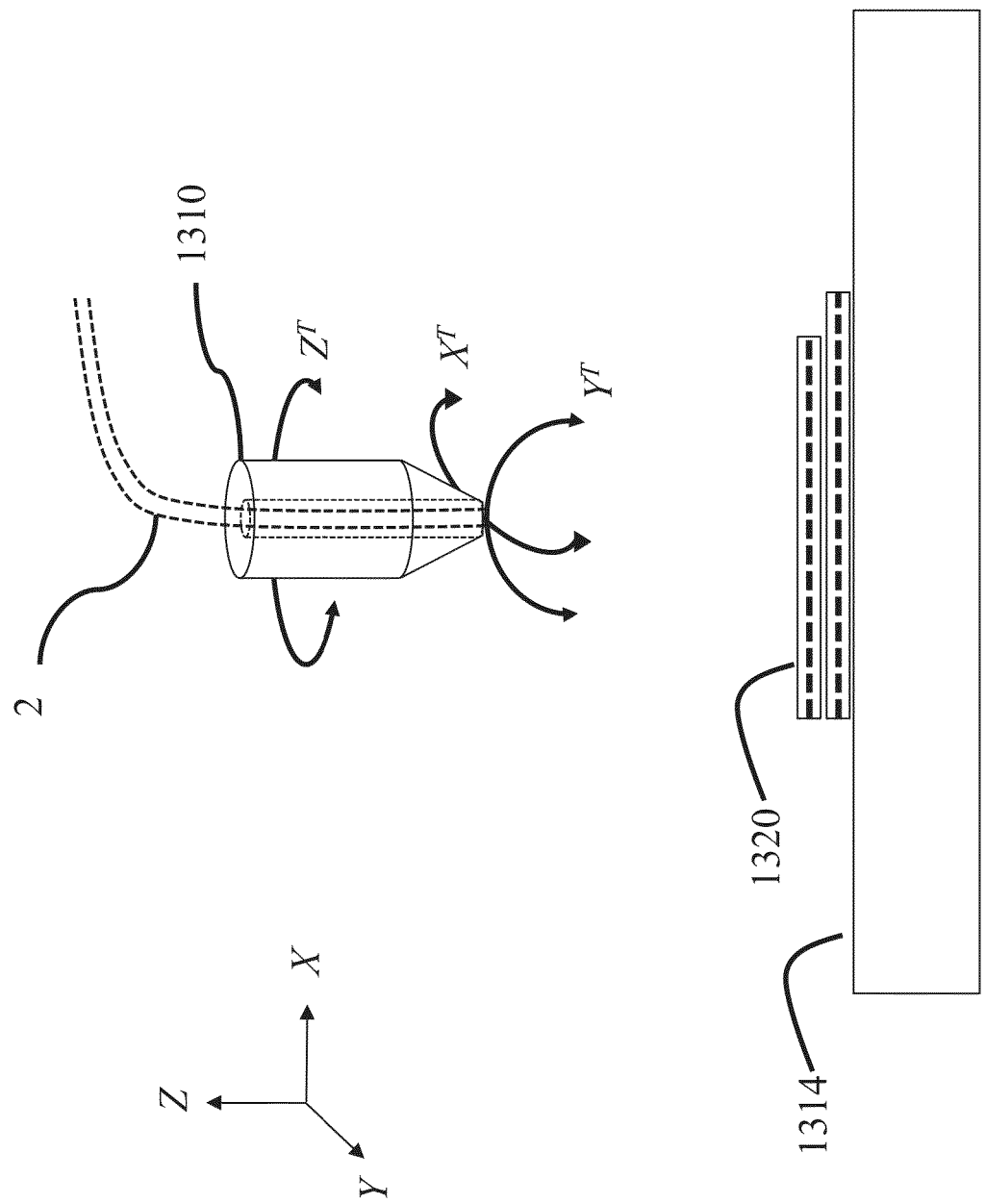

FIG. 17 is a schematic representation of a composite part formed using three-dimensional printing methods; and FIG. 18 is a scanning electron microscope image of a reinforcing carbon fiber and perpendicularly arranged carbon nanotubes;

FIGS. 19A-19C show exemplary six-axis shell layup in contrasting directions;

FIGS. 19D-19G show exemplary weighted distributions of 3D printed composite lay-up according to the present embodiments, e.g., to form sandwich panel structures, to increase effective moment of inertia;

FIGS. 19H-19J show exemplary weighted distributions of 3D printed composite lay-up according to the present embodiments, e.g., to form sandwich panel shell and fiber cellular interior structures, using both quasi-isotropic sets of shells or layers and concentrically reinforced shells or layers, to increase effective moment of inertia about the entire surface of the part as well as increase crushing and torsional resistance;

FIG. 20 shows a composite swath $2c$ of a reinforcement formation in a layer $LA_n$ continuously deposited end-to-end with an adjacent reinforcement formation continuing into the next layer $LA_{n+1}$, i.e., without cutting the composite swath $2c$ as the part 14 is indexed to the next layer;

FIG. 21A is a schematic representation of a three dimensional printing system including a cutting mechanism and a printing process bridging an open space;

FIG. 21B is a schematic representation of a part formed by the three-dimensional printing system and/or process that includes an enclosed open space;

FIG. 22 is a schematic representation of a printing nozzle including a circuitous path impregnation system;

FIG. 23A is a schematic representation of a semi-continuous core filament positioned within a nozzle;

FIG. 23B is a schematic representation of a semi-continuous core filament with overlapping strands positioned within a nozzle;

FIG. 23C is a schematic representation of a semi-continuous core filament with aligned strands and positioned within a nozzle;

FIG. 24A is a schematic representation of a multifilament long fiber or continuous core;

FIG. 24B is a schematic representation of a long fiber semi-continuous core filament with offset strands;

FIG. 24C is a schematic representation of a long fiber semi-continuous core filament with aligned strands;

FIG. 24D is a schematic representation of a long fiber semi-continuous core filament with aligned strands and one or more continuous strands;

FIG. 25A is a schematic representation of a three dimensional printing process using a multiaxis system in a first orientation;

FIG. 25B is a schematic representation of forming a component in another orientation on the part of FIG. 25A;

FIG. 26 is a schematic representation of a three dimensional printing system using a continuous core reinforced filament;

FIG. 27A is a schematic representation of an airfoil formed with discrete subsections including fiber orientations in the same direction;

FIG. 27B is a schematic representation of an airfoil formed with discrete subsections including fiber orientations in different directions; and FIG. 27C is a schematic representation of an airfoil formed with discrete subsections and a shell formed thereon.

DETAILED DESCRIPTION

This patent application incorporates the following disclosures by reference in their entireties: U.S. Patent Application Ser. Nos. 61/804,235; 61/815,531; 61/831,600; 61/847,113; 61/878,029; 61/880,129; 61/881,946; 61/883,440; 61/902,256; 61/907,431; and 62/080,890; 14/222,318; 14/297,437; and 14/333,881, which may be referred to herein as "Composite Filament Fabrication patent applications" or "CFF patent applications".

Definitions

In the present disclosure, "3D printer" is inclusive of both discrete printers and/or toolhead accessories to manufacturing machinery which carry out an additive manufacturing sub-process within a larger process. With reference to FIGS. 1-5, 3D printer is controlled by a motion controller 20 which interprets dedicated G-code 1102 and drives various actuators of the 3D printer in accordance with the G-code 1102.

As used herein, "extrusion" shall have its conventional meaning, e.g., a process in which a stock material is pressed through a die to take on a specific shape of a lower cross-sectional area than the stock material. Fused Filament Fabrication (FFF) is an extrusion process. Similarly, "extrusion nozzle" shall have its conventional meaning, e.g., a device designed to control the direction or characteristics of an extrusion fluid flow, especially to increase velocity and/or restrict cross-sectional area, as the fluid flow exits (or enters) an enclosed chamber. The present disclosure shall also use the coined word "conduit nozzle" or "nozzlet" to describe a terminal printing head, in which unlike a FFF nozzle, there is no significant back pressure, or additional velocity created in the printing material, and the cross sectional area of the printing material, including the matrix and the embedded fiber(s), remains substantially similar throughout the process (even as deposited in bonded ranks to the part). As used herein, "deposition head" shall include extrusion nozzles, conduit nozzles, and/or hybrid nozzles. Also as used herein, a reference to a Figure numbers with no following letter suffix shall refer also to all letter suffixes of the same Figure number, e.g., a reference to "FIG. 1" refers to all of FIGS. 1A, 1B, 1C, and 1D.

Lastly, in the three-dimensional printing art, "filament" typically refers to the entire cross-sectional area of a spooled build material, while in the composites art, "filament" refers to individual fibers of, for example, carbon fiber (in which, for example, a "1K tow" will have 1000 individual strands). For the purposes of the present disclosure, "filament" shall retain the meaning from three-dimensional printing, and "strand" shall mean individual fibers that are, for example, embedded in a matrix, together forming an entire composite "filament".

3D Printing System

Figure 1B:
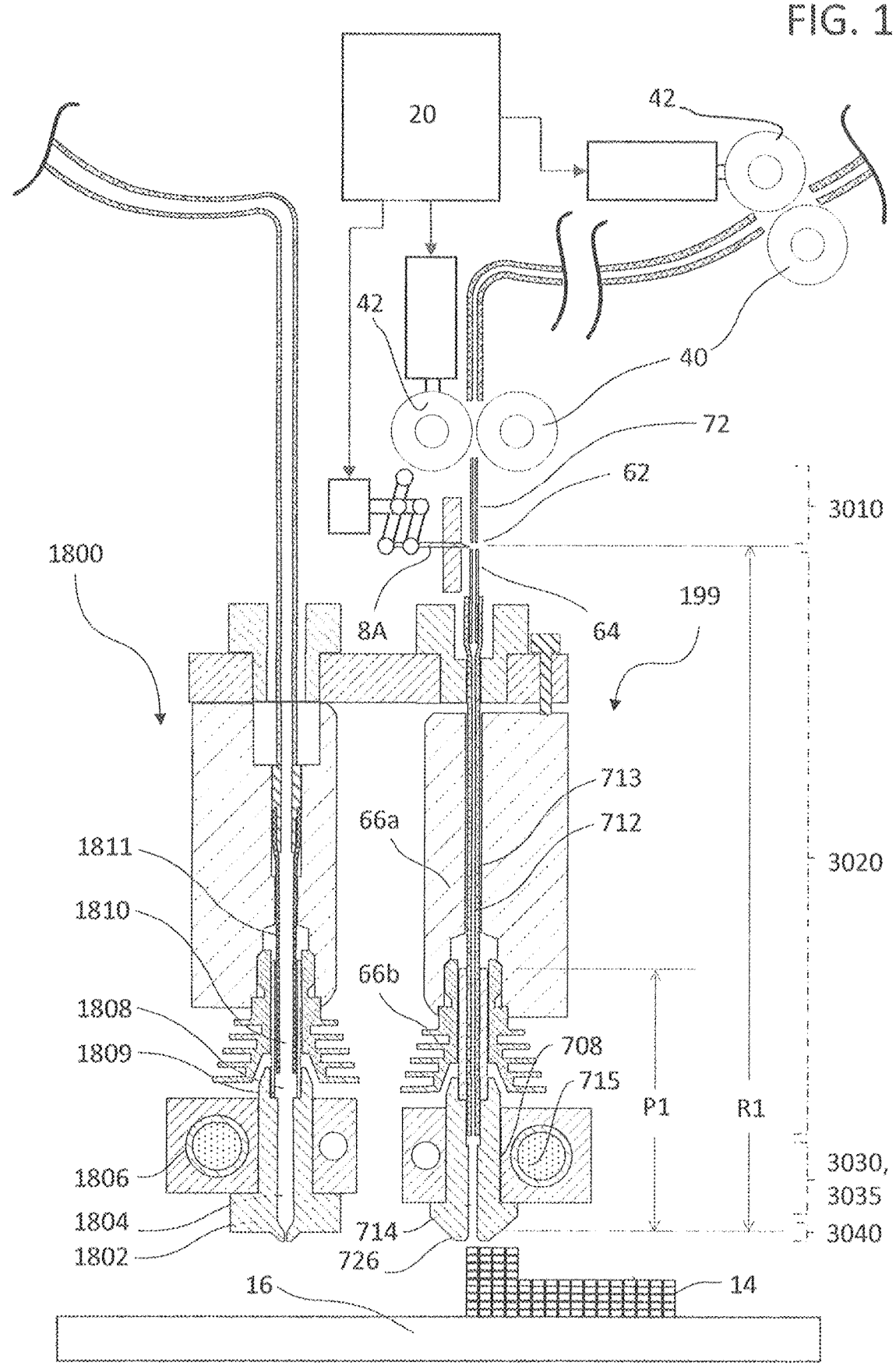
FIG. 1B is a cross-sectional and schematic view of a compound extrusion and fiber printhead assembly.

The printer(s) of FIGS. 1A-1C, with at least two print heads 18, 10 and/or printing techniques, deposit with one head a fiber reinforced composite filament, and with a remaining head apply pure or neat matrix resin 18a (thermoplastic or curing). The fiber reinforced composite filament 2 (also referred to herein as continuous core reinforced filament) may be substantially void free and include a polymer or resin that coats, permeates or impregnates an internal continuous single core or multistrand core. It should be noted that although the print head 18 is shown as an extrusion print head, "fill material print head" 18 as used herein includes optical or UV curing, heat fusion or sintering, or "polyjet", liquid, colloid, suspension or powder jetting devices (not shown) for depositing fill material.

Although FIGS. 1A-1C in general show a Cartesian arrangement for relatively moving the print-heads in 3 orthogonal translation directions, other arrangements are considered within the scope of, and expressly described by, a drive system or drive or motorized drive that may relatively move a print head and a build plate supporting a 3D printed part in at least three degrees of freedom (i.e., in four or more degrees of freedom as well). For example, for three degrees of freedom, a delta, parallel robot structure may use three parallelogram arms connected to universal joints at the base, optionally to maintain an orientation of the print head (e.g., three motorized degrees of freedom among the print head and build plate) or to change the orientation of the print head (e.g., four or higher degrees of freedom among the print head and build plate). As another example, the print head may be mounted on a robotic arm having three, four, five, six, or higher degrees of freedom; and/or the build platform may rotate, translate in three dimensions, or be spun.

The fiber reinforced composite filament 2, 2a is fed, dragged, and/or pulled through a conduit nozzle 10, 199 optionally heated to a controlled temperature selected for the matrix material to maintain a predetermined viscosity, force of adhesion of bonded ranks, melting properties, and/or surface finish.

After the matrix material or polymer 4, 4a is substantially melted, the continuous core reinforced filament 2 is applied onto a build platen 16 to build successive layers 14 to form a three dimensional structure. The relative position and/or orientation of the build platen 16 and conduit nozzle 10 are controlled by a controller 20 to deposit the continuous core reinforced filament 2 in the desired location and direction.

A cutter 8 controlled by the controller 20 may cut the continuous core reinforced filament during the deposition process in order to (i) form separate features and components on the structure as well as (ii) control the directionality or anisotropy of the deposited material and/or bonded ranks in multiple sections and layers. At least one secondary print head 18 may print fill material 18a to form walls, infill, UV resistant and/or scratch resistant protective coatings, and/or removable, dissolvable, or soluble support material.

The supplied filament includes at least one axial fiber strand 6, 6a extending within a matrix material 4, 4a of the filament, for example a nylon matrix 4a that impregnates hundreds or thousands of continuous carbon, aramid, glass, basalt, or UHMWPE fiber strands 6a. The fiber strand material has an ultimate tensile strength of greater than 300 MPa.

The driven roller set 42, 40 push the unmelted filament 2 along a clearance fit zone that prevents buckling of filament 2. In a threading or stitching process, the melted matrix material 6a and the axial fiber strands 4a of the filament 2 are pressed into the part 14 and/or into the swaths below 2d, at times with axial compression. As the build platen 16 and print head(s) are translated with respect to one another, the end of the filament 2 contacts the ironing lip 726 and is subsequently continually ironed in a transverse pressure zone 3040 to form bonded ranks or composite swaths in the part 14.

FIG. 1B depicts a cross section of a compound (e.g., at least dual) print head with an extrusion printhead 1800 (as head 18) and extrusion nozzle 1802 for FFF and a fiber deposition printhead 199 (as head 10) and conduit nozzle 708 for continuous fiber reinforced thermoplastic deposition. Like numbered features are similar to those described with respect to FIG. 1A.

The feed rate (the tangential or linear speed of the drive 42, 40) and/or printing rate (e.g., the relative linear speed of the platen/part and print head) may be monitored or controlled to maintain compression, neutral tension, or positive tension within the unsupported zone as well as primarily via axial compressive or tensile force within fiber strand(s) 6a extending along the filament 2.

As shown in FIGS. 1B and 1C, a transverse pressure zone 3040 includes an ironing lip 726 that reshapes the filament 2. This ironing lip 726 compacts or presses the filament 2 into the part and may also melt, heat to cross glass transition into a non-glassy state, and/or liquefy the matrix material 4a in the transverse pressure zone 3040. Optionally, the ironing lip 726 in the transverse pressure zone 3040 flattens the melted filament 2 on the "top" side (i.e., the side opposite the part 14), applying an ironing force to the melted matrix material 4a and the axial fiber strands 6a as the filament 2 is deposited in bonded ranks or composite swaths 2c. For example, the controller 20 maintains the height of the bottom of the ironing lip 726 to the top of the layer below as less than the diameter of the filament (e.g., to compress to ½ the height of the filament, at least at ½ the filament height; to compress to ⅓ the height of the filament, at least at ⅓ the filament height, and so on). The controller 20 may maintain the height at of the bottom of the ironing lip 726 to the layer below at zero (e.g., in which case the amount of consolidation/compression and the fiber swath 2c height may be a function of system stiffness). Another reshaping force is applied as a normal reaction force from the platen 16 or part 14 itself, which flattens the bonded ranks or composite swaths 2c on at least two sides as the melted matrix material 4a and the axial fiber strands 6a are ironed to form laterally and vertically bonded ranks (i.e., the ironing also forces the bonded ranks 2c into adjacent ranks).

As shown in FIG. 1C, if the underlying layer or swaths 2d includes channels, the normal reaction force from the part 14 may create T-shapes instead. The pressure and heat applied by ironing improves diffusion and fiber penetration into neighboring ranks or swaths (laterally and vertically).

As shown in FIG. 1B, unmelted fiber reinforced filament may be severed in a gap 62 between a guide tube 72 (having a clearance fit) and the conduit nozzle 708; or within the conduit nozzle 708, e.g., upstream of the non-contact zone 3030; and/or at the clearance fit zone 3010, 3020 or at the ironing lip 726.

After the matrix material 6a is melted by the ironing lip or tip 726, the feed and/or printing rate can be controlled by the controller 20 to maintain neutral to positive tension in the composite filament 2 between the ironing lip 726 and the part 14 primarily via tensile force within the fiber strands 4a extending along the filament 2. A substantially constant cross sectional area of the fiber reinforced composite filament is maintained in the clearance fit zone, the unsupported zone, the transverse pressure zone, and also as a bonded rank is attached to the workpiece or part 14.

With reference to FIG. 1B, each of the printheads 1800 and 199 may be mounted on the same linear guide or different linear guides or actuators such that the X, Y motorized mechanism of the printer moves them in unison. As shown, FFF printhead 1800 includes an extrusion nozzle 1802 with melt zone or melt reservoir 1804, a heater 1806, a high thermal gradient zone 1808 formed by a thermal resistor or spacer 1809 (optionally an air gap), and a Teflon or PTFE tube 1811. A 1.75-1.8 mm; 3 mm; or larger or smaller thermoplastic filament is driven through, e.g., direct drive or a Bowden tube provides extrusion back pressure in the melt reservoir 1804.

The companion continuous fiber embedded filament printhead 199, as shown, includes the conduit nozzle 708, the composite ironing tip 728, and the limited contact cavity 714, in this example each within a heating block heated by a heater 715. A cold feed zone 712 may be formed within a receiving tube 64, including a capillary-like receiving tube of rigid material and a small diameter (e.g. inner diameter of 32 thou) Teflon/PTFE, tube extending into the nozzle 708. The cold feed zone is surrounded in this case by an insulating block 66a and a heat sink 66b, but these are fully optional. In operation, an unattached terminal end of the fiber-embedded filament may be held in the cold feed zone, e.g., at height P1. Height P1, as well as cutter-to-tip distance R1, are retained in a database for permitting the controller 20 to thread and advance the fiber-embedded filament as discussed herein. If P1 and R1 are very similar (e.g., if the cutter location is near or within the cold feed zone), P1 may be set to be the same or similar to R1. Further as shown, the controller 20 is operatively connected to the cutter 8, 8A, and feed rollers 42 facing idle rollers 40.

FIG. 1C shows a schematic close-up cross section of the conduit nozzle 708. As shown in FIG. 1C, the inner diameter of the receiving tube 64 (in this case, at a position where a Teflon/PTFE inner tube forms the inner diameter) may be approximately 1½ to 2½ times (at, e.g., 32 thou) the diameter of the filament 2 (at, e.g., 12-15, or 13 thou) shown therewithin. The inner diameter or inner width of the terminal cavity 714 (at, e.g., 40 thou) is from two to six times the diameter of the filament 2 shown therein. These are preferred ranges, it is considered the diameter of the receiving tube may be from 1 1/10 to 3 times the diameter of the filament, and the inner diameter of the terminal cavity from two to 12 times the diameter of the filament. The terminal cavity is preferably of larger diameter than the receiving tube.

In addition, as shown in FIG. 1C, the heated composite filament ironing tip 726 is moved relative to the part, at a height above the part of less than the filament diameter and scaled according to a desired proportion of composite swath, to iron the fiber reinforced composite filament 2 as it is deposited to reshape a substantially oval or circular bundle of inelastic axial fiber strands 6a within the fiber reinforced composite filament to a substantially flattened block of inelastic fibers strands within a bonded rank 2c of the part. Axial compression and/or laterally pressing the melted matrix filament 2 into bonded ranks may enhance final part properties. For example, FIG. 1C shows a composite fiber reinforced filament 2 applied with a compaction force, axial compression, or lateral pressure 62. The compaction pressure from axial compression and flattening from the ironing lip, compresses or reshapes the substantially circular cross-section filament 2a into the preceding layer below and into a second, substantially rectangular cross-section compacted shape 2c. The entire filament 2a forms a bonded rank 2c (i.e., bonded to the layer below 2d and previous ranks on the same layer) as it is shaped.

The filament 2c and/or interior strands 6a of the filament 2c both spread and intrude into adjacent bonded ranks 2c or 2d on the same layer and the matrix material 4a and strands 6a are compressed into the underlying shaped filament or bonded rank of material 2d. This pressing, compaction, or diffusion of shaped filaments or bonded ranks 2c, 2d reduces the distance between reinforcing fibers, and increases the strength of the resultant part (and replaces techniques achieved in composite lay-up using post-processing with pressure plates or vacuum bagging). Accordingly, in some embodiments or aspect of the invention discussed herein, the axial compression of the filament 2 and/or especially the physical pressing by the printer head 70, conduit nozzle or ironing lip 726 in zone 3040 may be used to apply a compression/compaction/consolidation pressure directly to the deposited material or bonded ranks or composite swaths 2c to force them to spread or compact or flatten into the ranks beside and/or below. Cross-sectional area is substantially or identically maintained.

Alternatively or in addition, pressure may be applied through a trailing pressure plate behind the print head; a full width pressure plate and/or roller 2138 (see, e.g., FIG. 2E) spanning the entire part that applies compaction pressure to an entire layer at a time; and/or heat, pressure, or vacuum may be applied during printing, after each layer, or to the part as a whole to reflow the resin in the layer and achieve the desired amount of compaction (forcing of walls together and reduction and elimination of voids) within the final part.

FIGS. 2A-2H depict embodiments of a three dimensional printer in applying a fiber reinforced composite filament 2 together with DLP-SLA, SLA, SLS, "polyjet" or other techniques to build a structure. Like numbered or like appearance features may be similar to those described with respect to FIG. 1A.

Although one embodiment or aspect of the invention uses thermoplastic matrix, hybrid systems are possible. A reinforced filament may employ a matrix that is finished by a curing cycle, e.g., using heat, light, lasers, and/or radiation. For example, continuous carbon fibers are embedded in a partially cured epoxy such that the extruded component sticks together, but requires a post-cure to fully harden. Similarly, while one embodiment or aspect of the invention use preformed continuous core reinforced filaments, in some embodiments, the continuous core reinforced filament may be formed by combining a resin matrix and a solid continuous core in a heated extrusion nozzle. The resin matrix and the solid continuous core are able to be combined without the formation of voids along the interface due to the ease with which the resin wets the continuous perimeter of the solid core as compared to the multiple interfaces in a multistrand core. Therefore, such an embodiment may be of particular use where it is desirable to alter the properties of the deposited material.

Figure 2A:
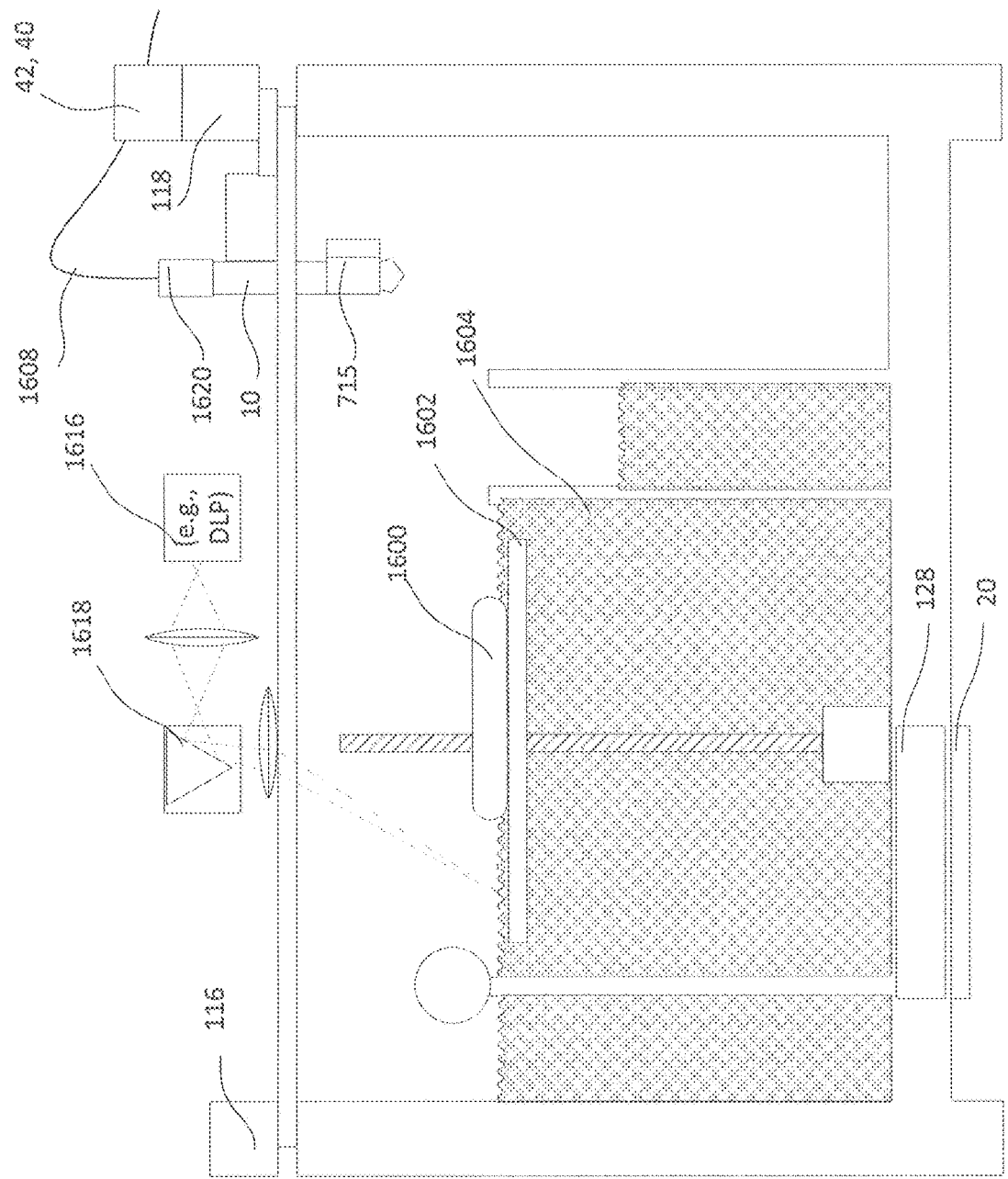

FIGS. 2A and 2B depict a hybrid system employing stereolithography (and/or selective laser sintering) to provide the matrix about the embedded fiber, i.e. processes in which a continuous resin in liquid or powder form is solidified layer by layer by sweeping a focused radiation curing or melting beam (laser, UV) in desired layer configurations. In order to provide increased strength as well as the functionalities associated with different types of continuous core filaments including both solid and multistrand materials, the stereolithography process associated with the deposition of each layer can be modified into a two-step process that enables construction of composite components including continuous core filaments in desired locations and directions. A continuous core or fiber may be deposited in a desired location and direction within a layer to be printed, either completely or partially submerged in the resin. After the continuous fiber is deposited in the desired location and direction, the adjoining resin is cured to harden around the fiber. This may either be done as the continuous fiber is deposited, or it may be done after the continuous fiber has been deposited. In one embodiment, the entire layer is printed with a single continuous fiber without the need to cut the continuous fiber. In other embodiments, reinforcing fibers may be provided in different sections of the printed layer with different orientations. In order to facilitate depositing the continuous fiber in multiple locations and directions, the continuous fiber may be terminated using a cutter as described herein, or by the laser that is used to harden the resin.

FIG. 2B depicts a part 1600 being built on a platen 1602 using stereolithography or selective layer sintering. The part 1600 is immersed in a liquid resin (photopolymer) material or powder bed 1604 contained in a tray 1606. During formation of the part 1600, the platen 1602 is moved by a layer thickness to sequentially lower after the formation of each layer to keep the part 1600 submerged. During the formation of each layer, a continuous core filament 1608 is fed through a conduit nozzle 1610 and deposited onto the part 1600. The conduit nozzle 1610 is controlled to deposit the continuous core filament 1608 in a desired location as well as a desired direction within the layer being formed. The feed rate of the continuous core filament 1608 may be equal to the speed of the conduit nozzle 1610 to avoid disturbing the already deposited continuous core filaments. As the continuous core filament 1608 is deposited, appropriate electromagnetic radiation (e.g., laser 1612) cures or sinters the resin surrounding the continuous core filament 1608 in a location 1614 behind the path of travel of the conduit nozzle 1610. The distance between the location 1614 and the conduit nozzle 1610 may be selected to allow the continuous core filament to be completely submerged within the liquid resin or powder prior to curing. The laser is generated by a source 1616 and is directed by a controllable mirror 1618. The three dimensional printer also includes a cutter 1620 to enable the termination of the continuous core filament as noted above.

Figure 2C:
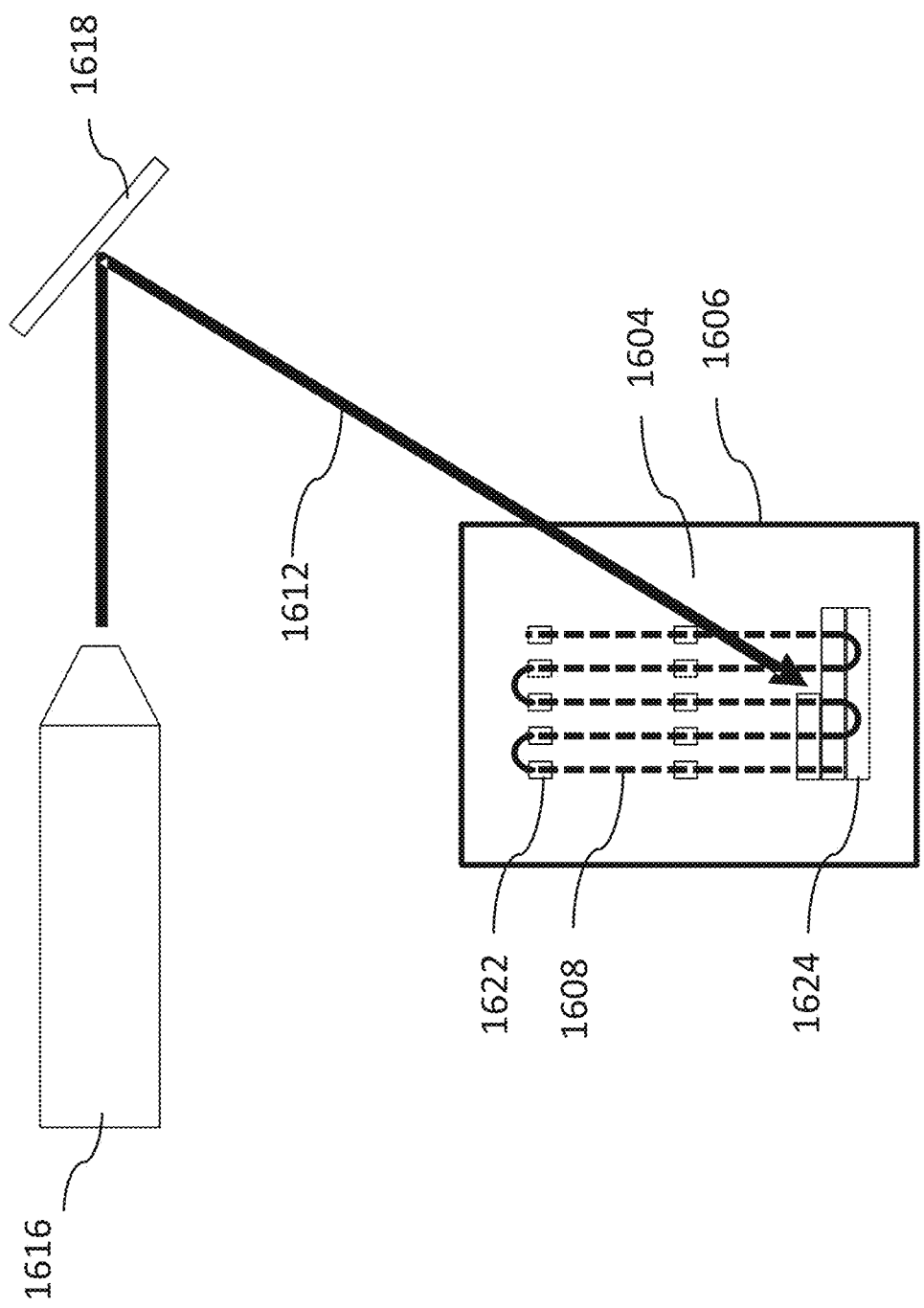

Optionally, the deposited filament is held in place by one or more "tacks", which are a sufficient amount of hardened resin material that holds the continuous core filament in position while additional core material is deposited. As depicted in FIG. 2C, the continuous core filament 1608 is tacked in place at multiple discrete points 1622 by the laser 1612 as the continuous core filament is deposited by a nozzle, not depicted. After depositing a portion, or all, of the continuous core filament 1608, the laser 1612 is directed along a predetermined pattern to cure the liquid resin material 1604 and form the current layer. Similar to the above system, appropriate electromagnetic radiation (e.g., laser 1612), is generated by a source 1616 and directed by a controllable mirror 1618. The balance of the material can be cured to maximize cross linking between adjacent strands is maximized, e.g., when a sufficient number of strands has been deposited onto a layer and tacked in place, the resin may be cured in beads that are perpendicular to the direction of the deposited strands of continuous core filament. Curing the resin in a direction perpendicular to the deposited strands may provide increased bonding between adjacent strands to improve the part strength in a direction perpendicular to the direction of the deposited strands of continuous core filament. If separate portions of the layer include strands of continuous core filament oriented in different directions, the cure pattern may include lines that are perpendicular or parallel to the direction of the strands of continuous fibers core material in each portion of the layer.

Figure 2D:
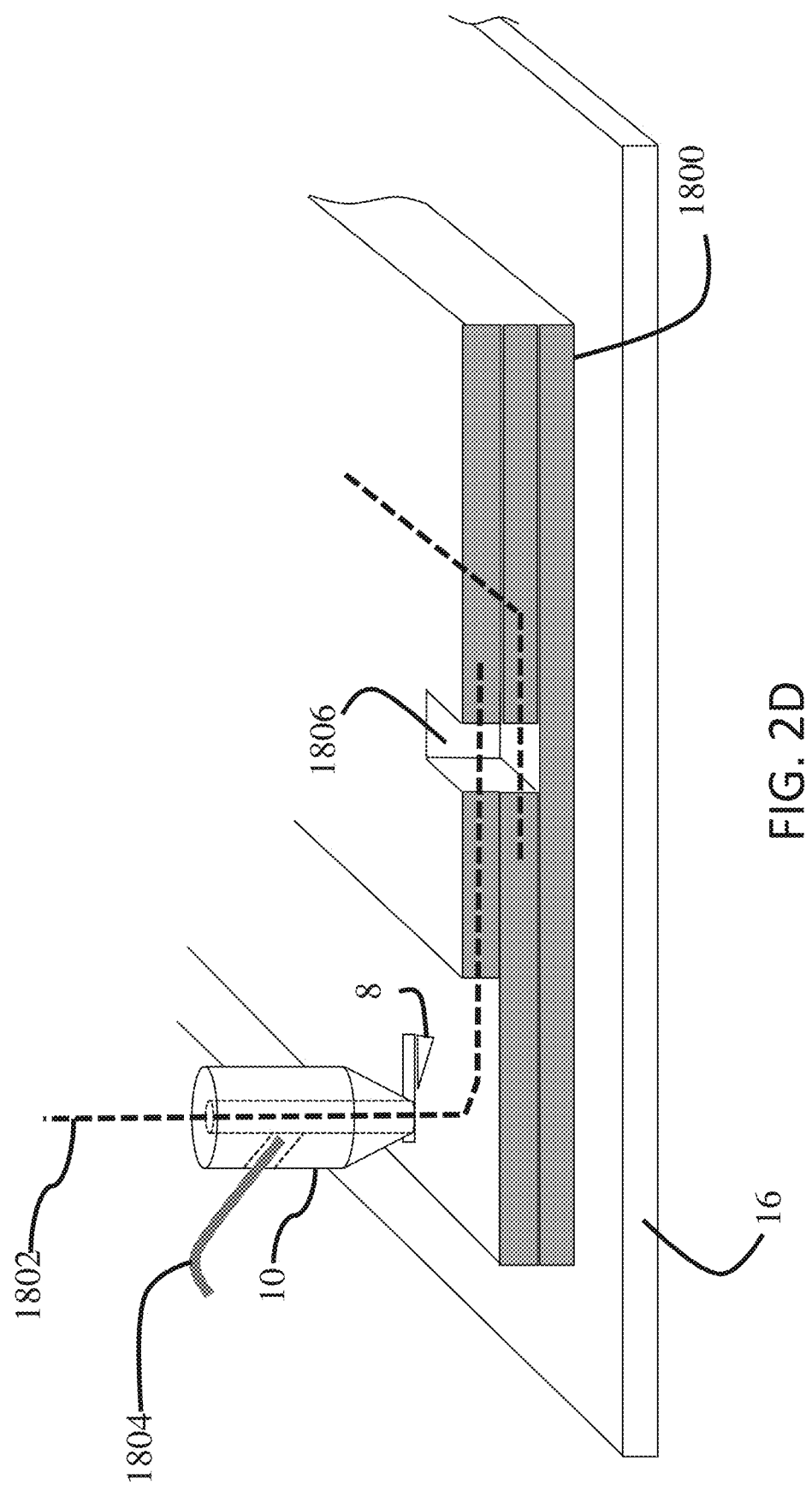
FIG. 2D is a schematic representation of a three dimensional printing system being used to form multiple layers in a printed circuit board.

FIG. 2D depicts printing of a multi-layer PCB 1800, on a build platen 16. The PCB 1800 is formed with a conductive core material 1802 and an insulating material 1804 which are deposited using a printer head including a heated extrusion nozzle 10 and cutting mechanism 8. Similar to the multielement printer head, the conductive core material 1802 and insulating material 1804 may be selectively deposited either individually or together. Further, in some embodiments the conductive core material 1802 is solid to minimize the formation of voids in the deposited composite material. When the conductive core material 1802 is printed without the insulating material 1804 a void 1806 can be formed to enable the subsequent formation of vias for use in connecting multiple layers within the PCB 1800. Depending on the desired application, the void 1806 may or may not be associated with one or more traces made from the conductive core material 1802.

Figure 2E:
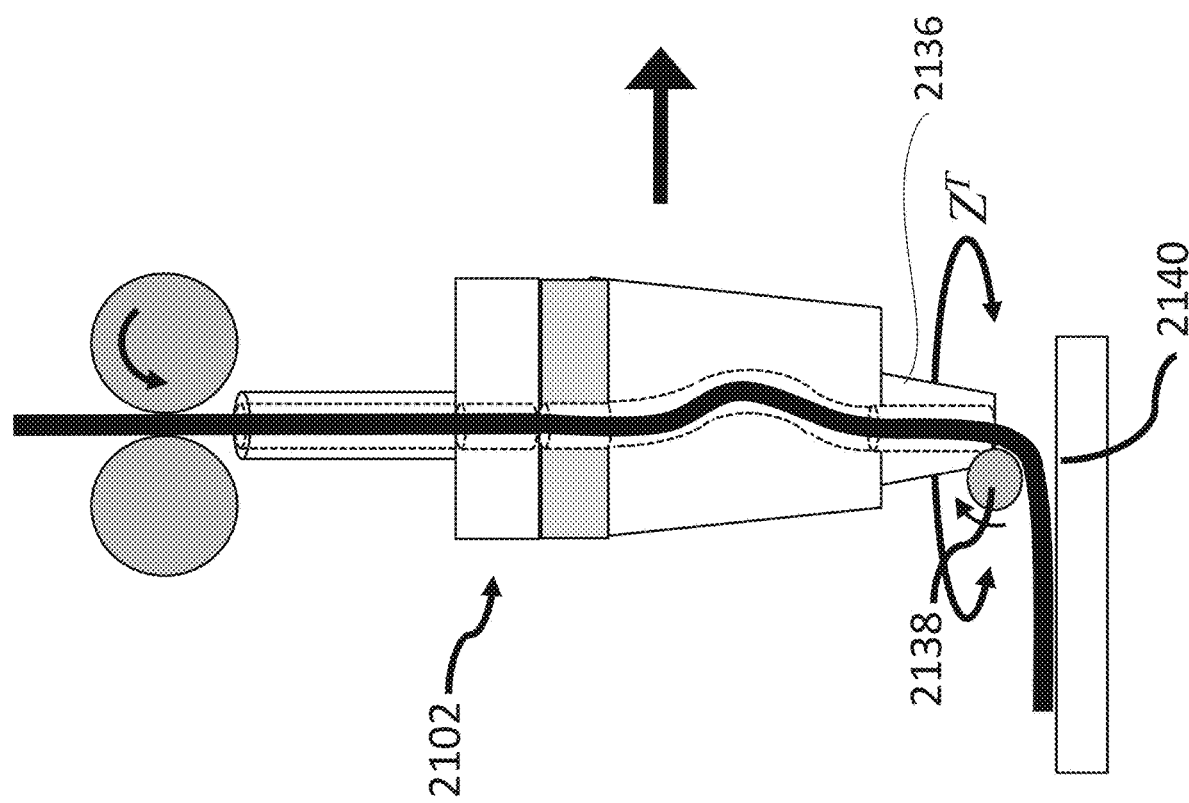
FIG. 2E is a schematic representation of a rotatable printing nozzle including a following feeding and compression roller.

When desirable, a precision roller set can be used to maintain a constant thickness along a relatively wider width of material output from a print head 2102. Such an embodiment may be of use when dealing with wider materials such as flat towpregs. FIG. 2E shows a print head 2102 translating in a first direction. A nozzle 2136 of the print head is attached to a trailing compression roller 2138. The roller 2138 imparts a compressive force to the material deposited onto print bed 2140. Depending on the embodiment, the trailing roller 2138 can articulate around the Z axis using any number of different mechanisms. For example, in one embodiment, the print head 2102 is free-rotating on a bearing (e.g., adding a fourth degree of freedom), such that the roller always trails the direction of travel of the print head. In another embodiment, the entire print head 402 is constructed to rotate (e.g., adding a fourth degree of freedom). Alternatively or in addition, the print bed 2140 may be rotated (e.g., as a fourth or fifth degree of freedom) to achieve the desired trailing and displacement.

Figure 2F:
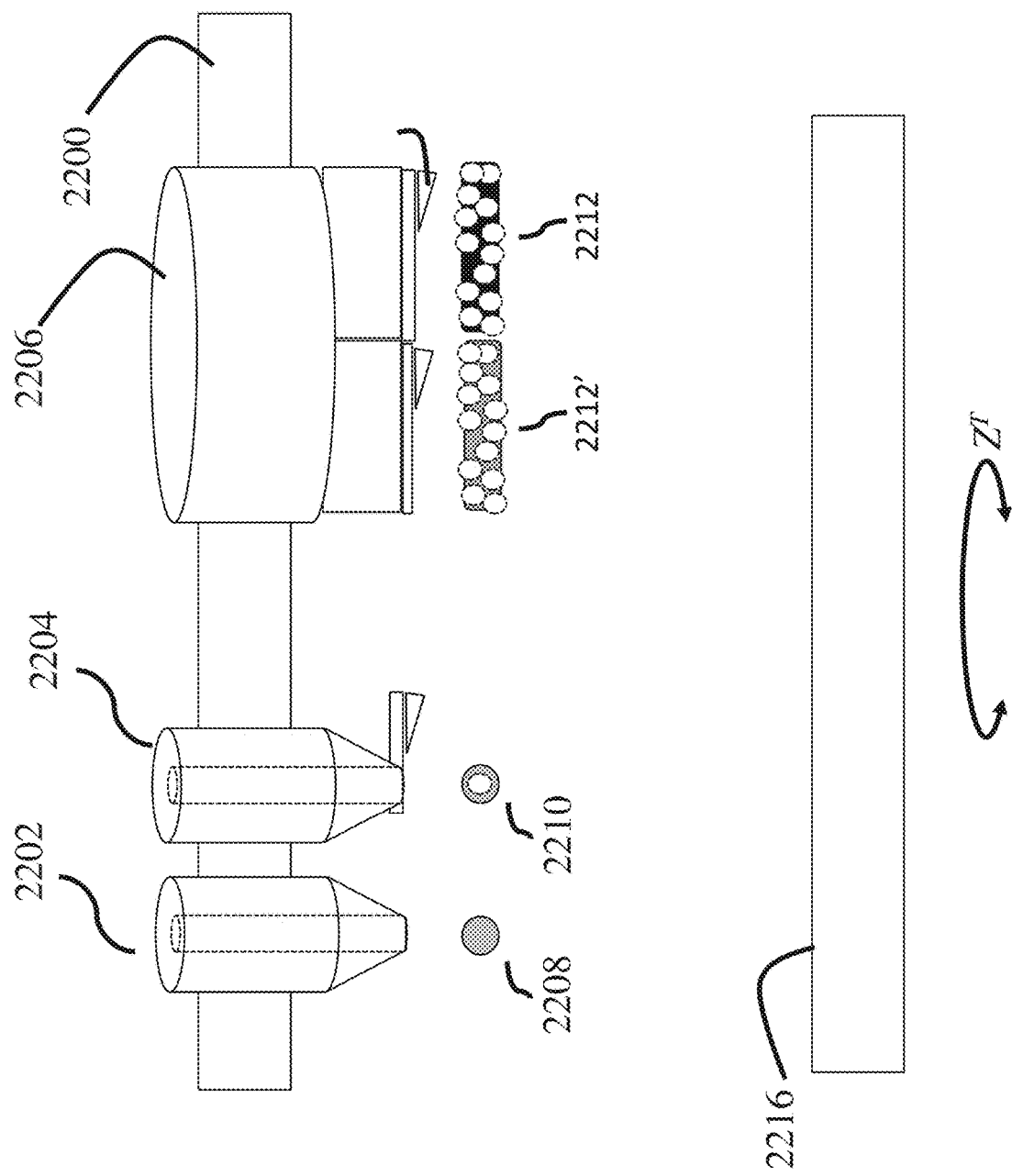
FIG. 2F is a schematic representation of a multi-nozzle three-dimensional printer.

FIG. 2F shows one embodiment of a high-speed continuous core printer capable of using the above described materials. In the depicted embodiment, the printer includes a print arm 2200 including a plurality of nozzles. The nozzles include a pure resin nozzle 2202 adapted to print pure resin (e.g., as fill material) 2208. The print arm 2200 also includes a continuous core filament nozzle 2204 adapted to print a continuous core filament 2210 for use in fine detail work. Additionally, the print arm 2200 includes a tape dispensing head 2206 capable of printing one or more printable tapes 2212. The tape dispensing head enables large infill sections to be printed quickly using the noted printable tapes. However, fine detail work and gaps that cannot be filled in by the tape can be filled by either the pure resin nozzle 2202 or continuous core filament nozzle 2204. The above noted method and system using wide tape fills greatly improves the speed of a printer, enabling higher throughput, and commensurately lower cost.

Figure 2G:
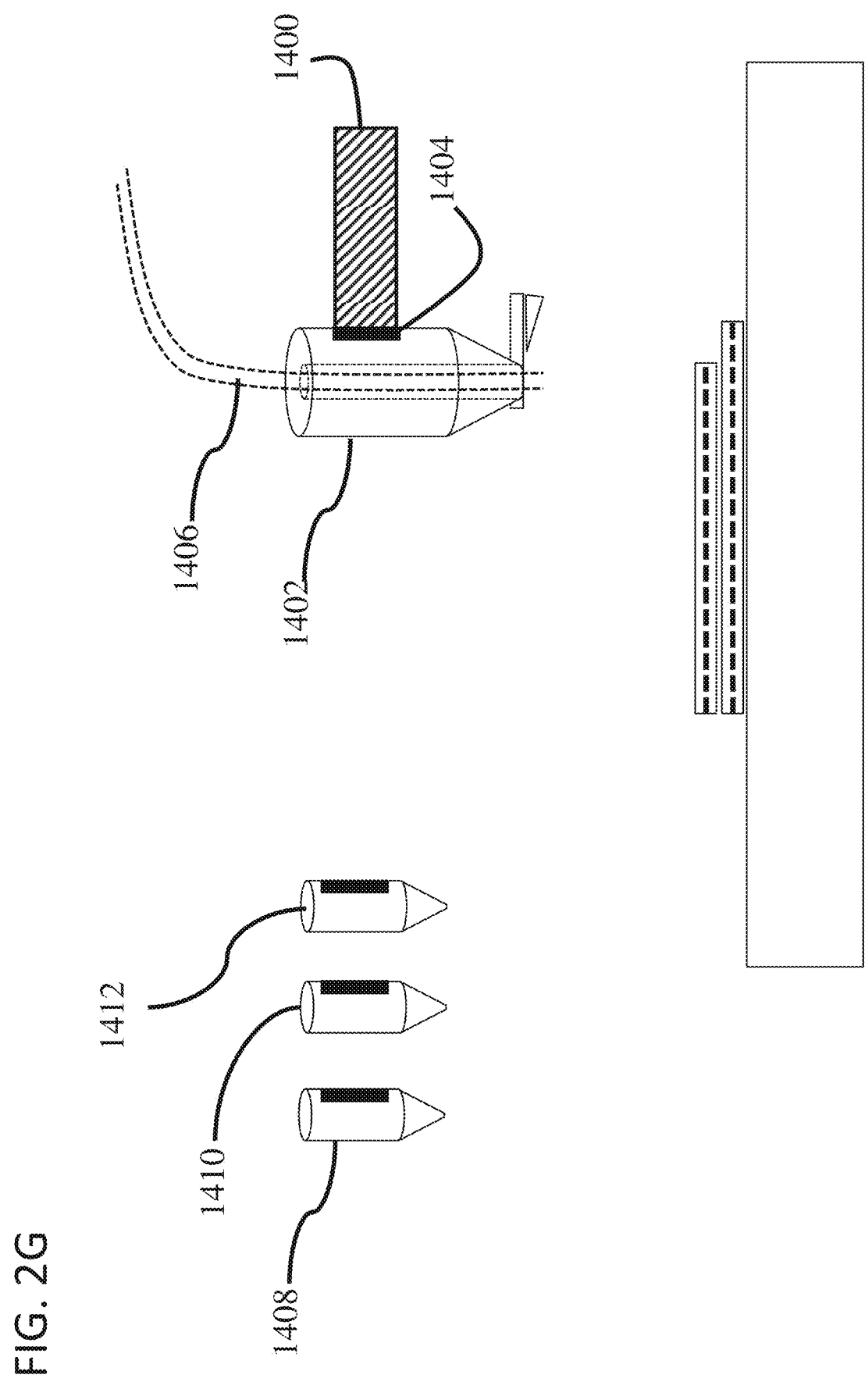
FIG. 2G is a schematic representation of a three dimensional printing system including a print arm (e.g., a robot arm having 4 or more degrees of freedom) and selectable printer heads.

In FIG. 2G, an (e.g., robot arm) print arm 1400 is capable of attaching to printer head 1402 at a universal connection 1404. A continuous core reinforced filament 1406 may be fed into the printer head 1402 before or after attachment to the printer 1400. The print arm 1400 may return the printer head 1402 to an associated holder or turret and then pick up printer head 1408 or 1410 for printing filament and other consumables different in size, material, color, coating, and/or spray; or even a vision system 1412 (e.g., camera, rangefinder) for part inspection.

Figure 2H:
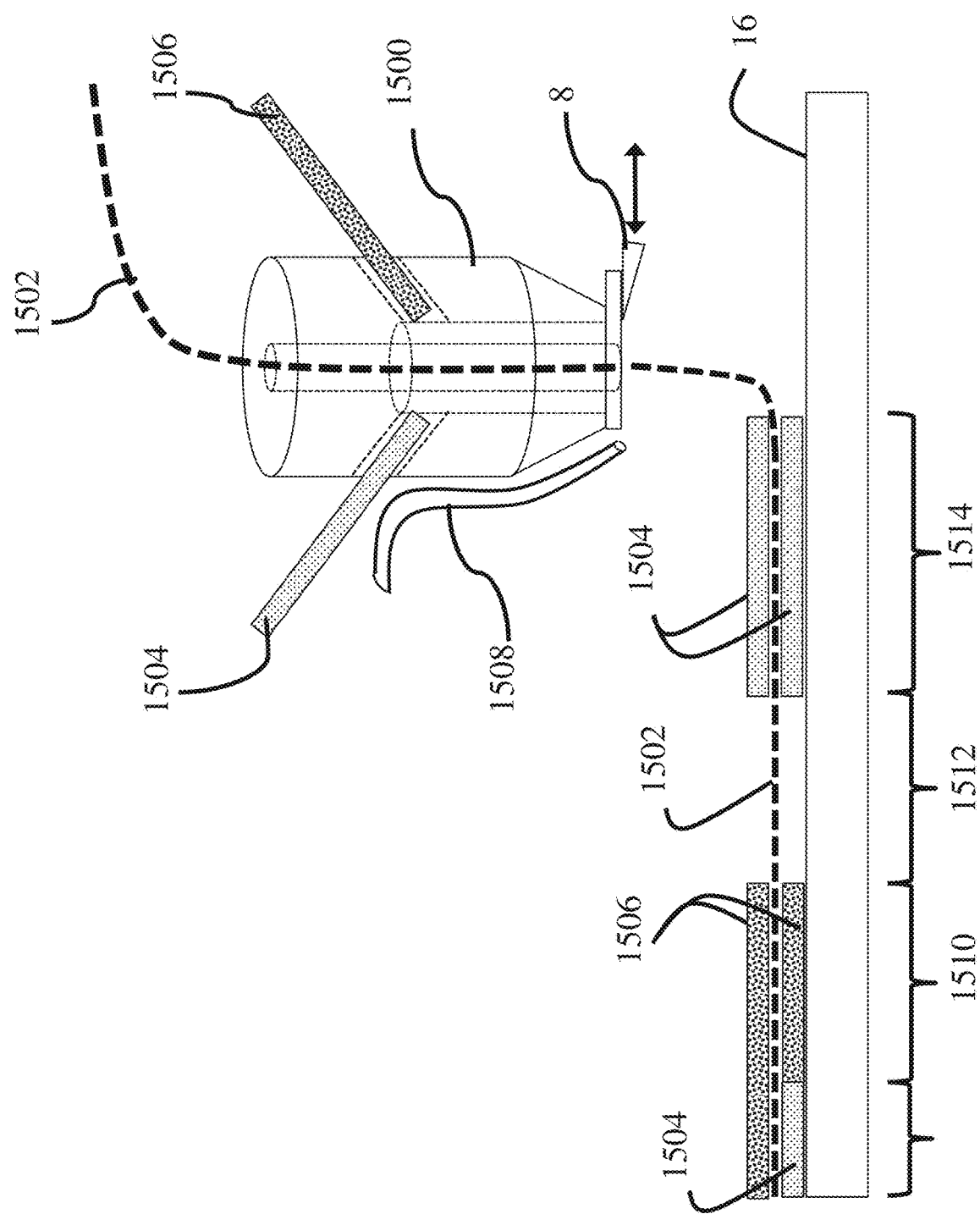
FIG. 2H is a schematic representation of a multi-element printer head for use in the printing system.

The continuous core reinforced filament may be formed by adding a resin matrix or coating to a solid continuous core or a prepreg in a heated conduit or extrusion nozzle. FIG. 2H depicts a multi-element printer head 1500 that selectively combines (in any feasible combination) and extrudes material feed options core 1502 (e.g., continuous copper wire, continuous fiber, stranded prepreg wire or fiber), matrix 1504 (e.g., binding resin such as nylon), and support 1506 (e.g., a dissolvable support material). For example, a core 1502 might be surrounded by a matrix binder 1504 on the bottom surface and a dissolvable/soluble support 1506 on the top surface (e.g., section 1508). The multi-element printer head 1500 may also deposit the core 1502 coated with either the matrix binder 1504 or soluble support 1506 separately (e.g., sections 1510 and 1514), or e.g., deposit any of the materials individually (e.g., the bare core or copper wire at section 1512).

As shown in FIG. 2H, multi-element printer head 1500 (or any other print head embodiment depicted herein) may include an air nozzle 1508 which enables pre-heating of the print area and/or rapid cooling of the extruded material to aid in forming structures such as flying leads, gap bridging, and other similar features. For example, a conductive core material may be deposited by the multi-element printer head 1500 with a co-extruded insulating plastic, to form a trace in the printed part. The end of the trace may then be terminated as a flying lead (the multi-element printer head lifts and deposits the core and jacket), optionally cooling the insulating jacket with the air nozzle 1508. The end of the wire could then be printed as a "stripped wire" where the conductive core is extruded without the insulating jacket. The cutting mechanism 8 may then terminate the conductive core. Formation of a flying, uninsulated lead in the above-noted manner may be used to eliminate a later stripping step.

Figure 3:
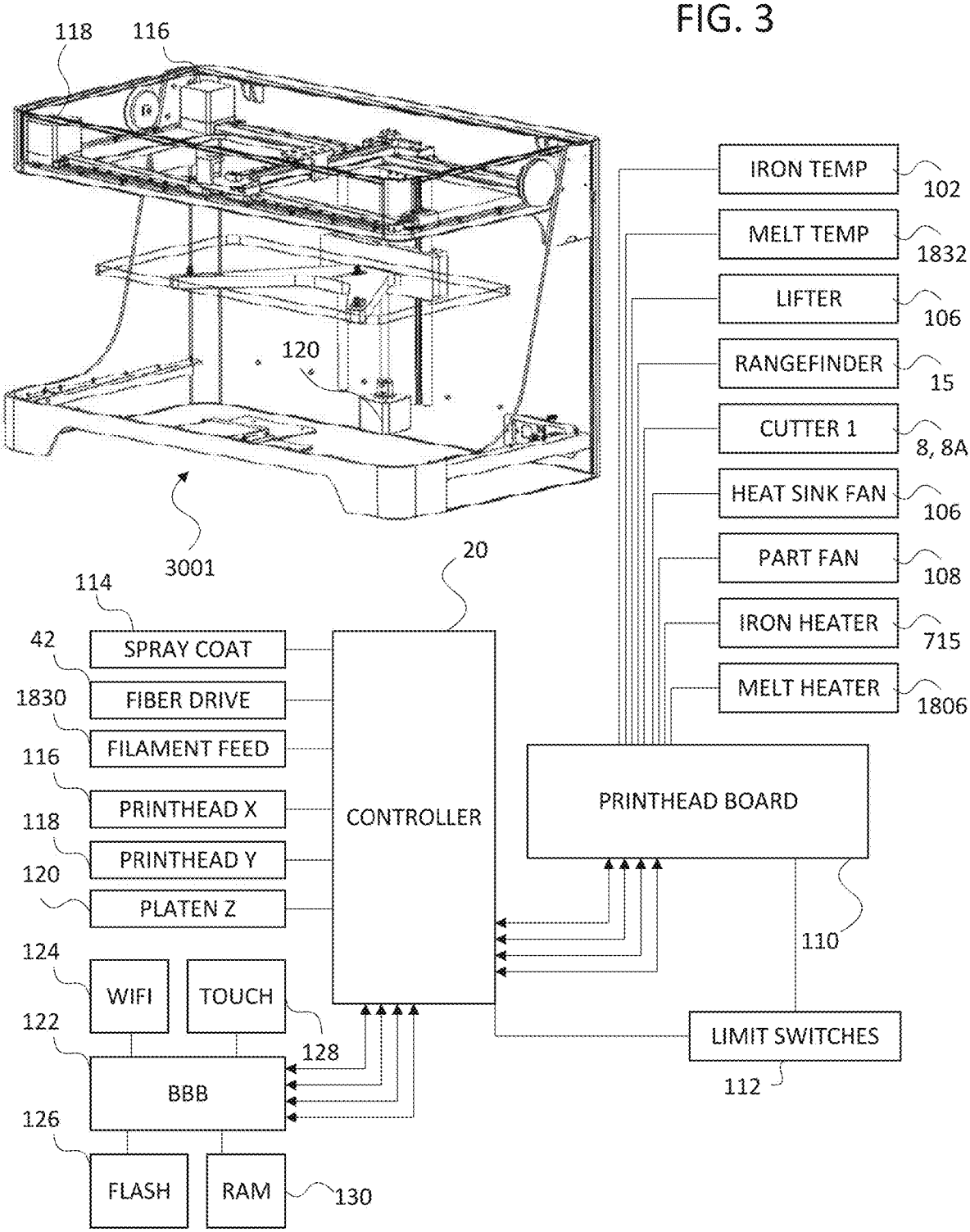
FIG. 3 is a block diagram and schematic representation of a three dimensional printer capable of printing with the compound printhead assembly of FIG. 1B.

FIG. 3 depicts a block diagram and control system of the three dimensional printer which controls the mechanisms, sensors, and actuators therein, and executes instructions to perform the control profiles depicted in and processes described herein. A printer is depicted in schematic form to show possible configurations of, for example, three commanded motors 116, 118, and 120. It should be noted that this printer may include the compound assembly of printheads 199, 1800 depicted in FIG. 1C.

As depicted in FIG. 3, the three-dimensional printer 3001 includes a controller 20 which is operatively connected to the fiber head heater 715, the fiber filament drive 42 and the plurality of actuators 116, 118, 120, wherein the controller 20 executes instructions which cause the filament drive to deposit and/or compress fiber into the part. The instructions are held in flash memory and executed in RAM (not shown; the instructions may be embedded in the controller 20). An actuator 114 for applying a spray coat, as discussed herein, may also be connected to the controller 20. In addition to the fiber drive 42, a filament feed 1830 be controlled by the controller to supply the extrusion printhead 1800. A printhead board 110, optionally mounted on the compound printhead 199, 1800 and moving therewith and connected to the main controller 20 via ribbon cable, breaks out certain inputs and outputs. The temperature of the ironing tip 726 may be monitored by the controller 20 by a thermistor or thermocouple 102; and the temperature of the heater block holding nozzle 1802 of any companion extrusion printhead 1800 may be measured by a thermistor or thermocouple 1832. A heater 715 for heating the ironing tip 726 and a heater 1806 for heating the extrusion nozzle 1802 are controlled by the controller 20. A heat sink fan 106 and a part fan 108, each for cooling, may be shared between the printheads 199, 1800 and controlled by the controller 20. Rangefinder 15 is also monitored by the controller 20. The cutter 8 actuator, which may be a servomotor, a solenoid, or equivalent, is also operatively connected. A lifter motor for lifting one or either printhead 199, 1800 away from the part (e.g., to control dripping) may also be controlled. Limit switches 112 for detecting when the actuators 116, 118, 120 have reached the end of their proper travel range are also monitored by the controller 20.

As depicted in FIG. 3, an additional breakout board 122, which may include a separate microcontroller, provides user interface and connectivity to the controller 20. An 802.11 Wi-Fi transceiver connects the controller to a local wireless network and to the Internet at large and sends and receives remote inputs, commands, and control parameters. A touch screen display panel 128 provides user feedback and accepts inputs, commands, and control parameters from the user. Flash memory 126 and RAM 130 store programs and active instructions for the user interface microcontroller and the controller 20.

Figure 4:
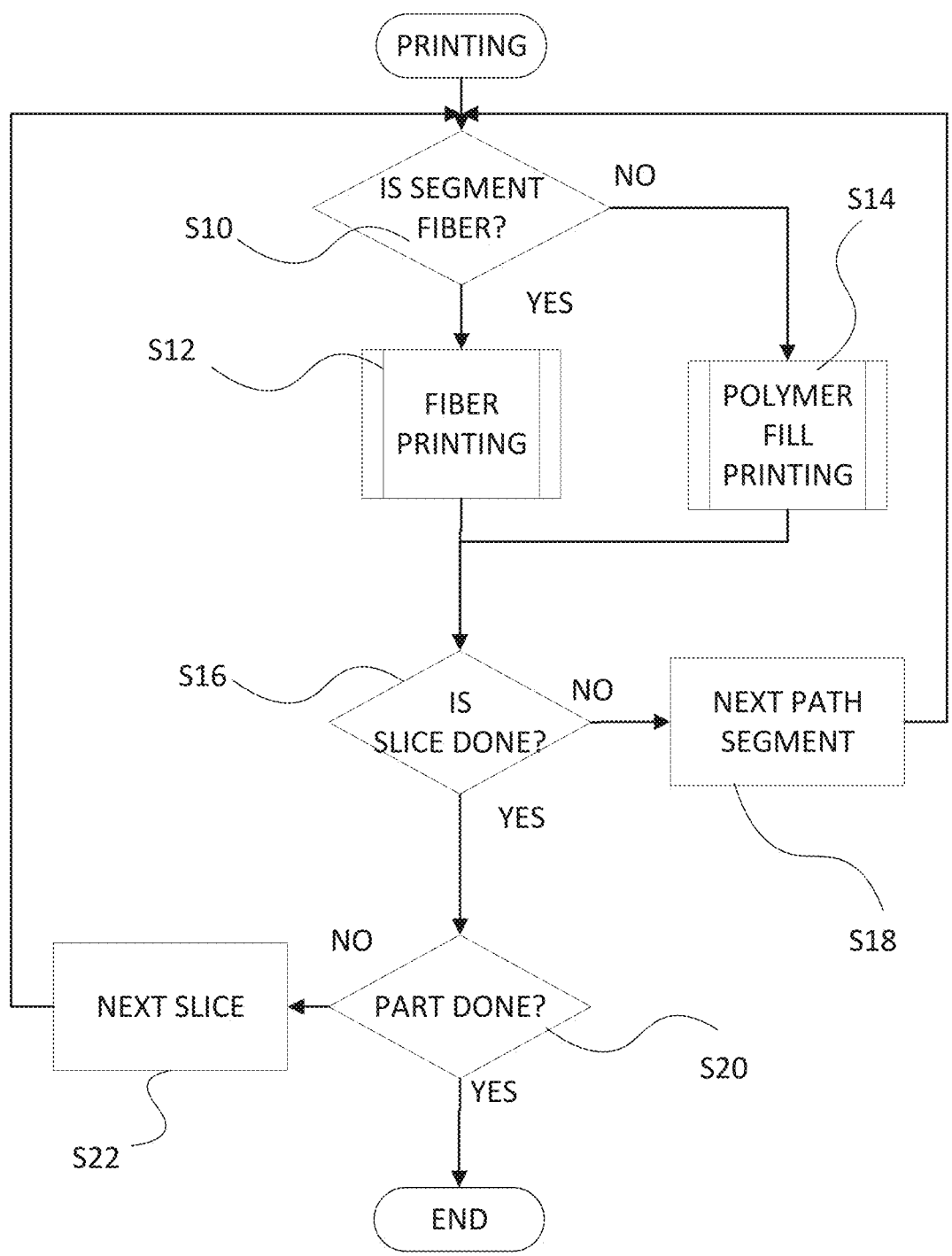
FIG. 4 is a flow chart describing the overall operation of the 3D printer of FIG. 3.

FIG. 4 depicts a flowchart showing a printing operation of the printers 1000 in FIGS. 1-3. FIG. 4 describes, as a coupled functionality, control routines that may be carried out to alternately and in combination use the co-mounted FFF extrusion head 1800 and fiber reinforced filament printing head 199 of FIG. 1C.

In FIG. 4, at the initiation of printing, the controller 20 determines in step S10 whether the next segment to be printed is a fiber segment or not, and routes the process to S12 in the case of a fiber filament segment to be printed and to step S14 in the case of other segments, including e.g., base, fill, or coatings. Step S12 is described in detail with reference to FIGS. 2 and 12. After each or either of routines S12 and S14 have completed a segment, the routine of FIG. 4 checks for slice completion at step S16, and if segments remain within the slice, increments to the next planned segment and continues the determination and printing of fiber segments and/or non-fiber segments at step S18. Similarly, after slice completion at step S16, if slices remain at step S20, the routine increments at step S22 to the next planned slice and continues the determination and printing of fiber segments and/or non-fiber segments. "Segment" as used herein corresponds to "toolpath" and "trajectory", and means a linear row, road, or rank having a beginning and an end, which may be open or closed, a line, a loop, curved, straight, etc. A segment begins when a printhead begins a continuous deposit of material, and terminates when the printhead stops depositing. A "slice" is a single layer or lamina to be printed in the 3D printer, and a slice may include one segment, many segments, lattice fill of cells, different materials, and/or a combination of fiber-embedded filament segments and pure polymer segments. A "part" includes a plurality of slices to build up the part. The control routine shown by way of example in FIG. 4 permits dual-mode printing with two different printheads, including the compound printheads 199, 1800 of FIG. 1C, and using both timing approaches of FIG. 6.

Figure 5B:
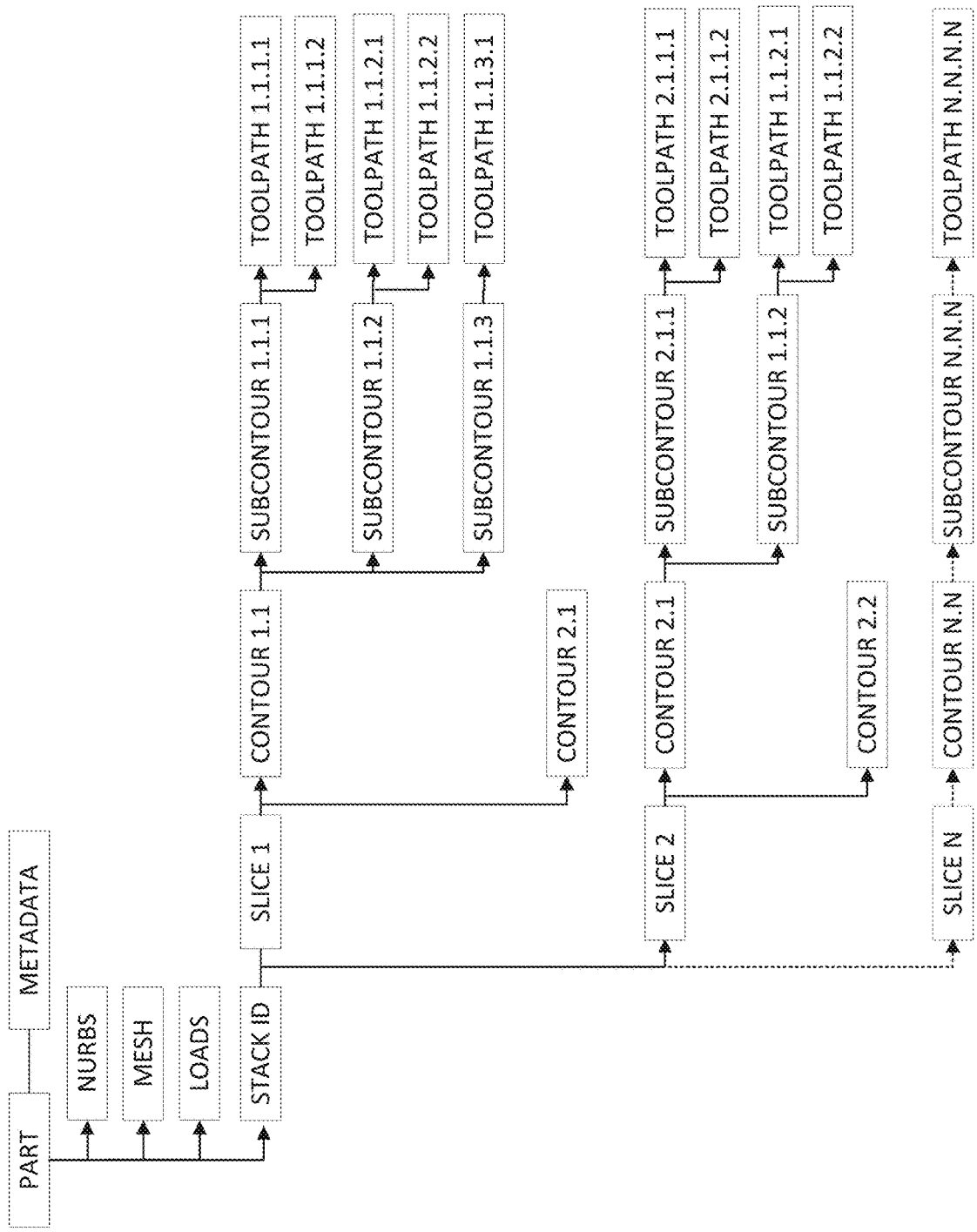
FIG. 5B shows an exemplary file or data structure format for recording a state of operation of prioritized or ordered rules and parameters for the process of FIG. 8.
Figure 6:
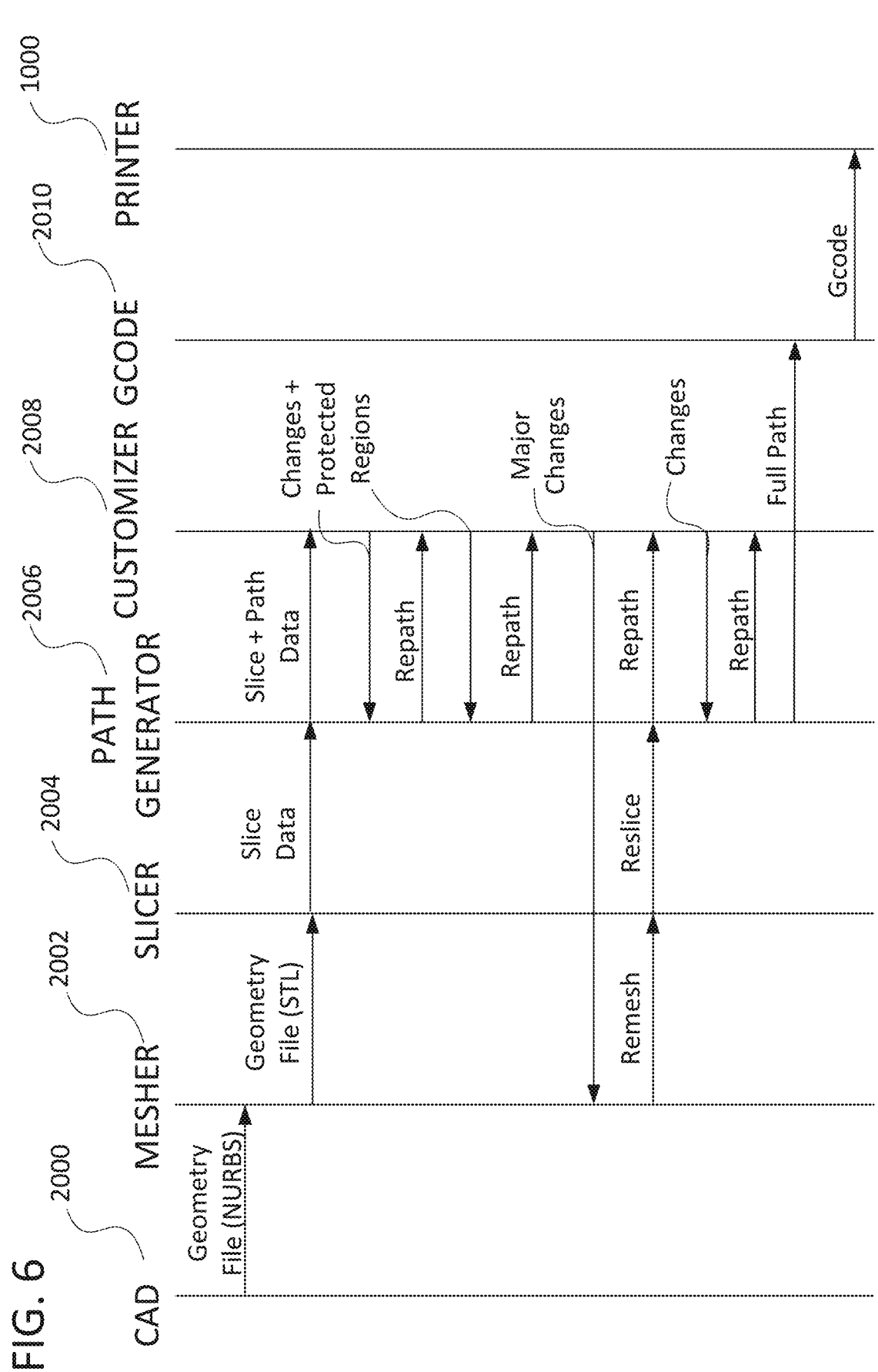
FIG. 6 is a call diagram depicting an exchange of data structures among elements of the three dimensional printer system.

FIGS. 5A and 5B depicts a block diagram of a three dimensional printer system, including devices in the system and relevant databases, data structures, control messages, and file formats which cooperate to control the printers of FIGS. 1-3 and as described throughout. FIG. 6 depicts a call diagram in which data types and operations are related and communicated between devices.

As shown in FIGS. 5A, 5B and 6, in order to construct a part using a 3D printer 1000, the process usually begins with a solid model corresponding to a part ("PRT") of interest represented by a data structure ("files" 802, having a drawing container DWG with assemblies "ASSY" comprising various parts "PRT"), but may also begin with a polygon mesh of the desired part (STL 902 in FIG. 3). As shown in FIGS. 5 and 6, the solid model may be represented by non-uniform rational b-spline NURBS data, and this may be stored and processed by a CAD program on a workstation, server, or virtualized/cloud server 2000, and communicated by file or data structure to a meshing program on the same or a different workstation, server, or virtualized/cloud server 2000. One of the data structures most amenable to division into layers for additive manufacturing is the surface mesh of cells or polygons having edges, faces and vertices stored as a geometry file (e.g., an STL, OBJ, PLY, AMF or WRL file). As used herein, "geometry file" and/or "STL" 902 are used generically and interchangeably to mean data structures (including groups of files) inclusive of both surface meshes and CAD solid model representations that use techniques other than surface meshing (e.g., a "NURBS" definition).

In preparation for 3D printing, a geometry file is "sliced" by a family of slicer routines 904 (as shown in FIGS. 5 and 6, resident on a workstation, server, or virtualized/cloud server) in a direction parallel to the expected build platen to create a series of layers or lamina ("Empty Deck" 906). Geometry files are usually without material definition, and each individual lamina would be initially treated as of homogenous or isotropic material properties. Alternatively, one embodiment of a geometry file 902 may include markers, boundaries, sub-geometries, divisions, boundary conditions, or the like specifying a different material property according to volumetric location within the geometry file.

Subsequently, for each layer, toolpaths ("layers and slices" 1002) are calculated by a path planner 1004 for controlling actuators to deposit, focus a laser or lamp or projector to cure, solidify, or otherwise apply material. As shown in FIGS. 5 and 6, the toolpath generator is also resident on a workstation, server, or virtualized/cloud server. In the present discussion, "toolpath" encompasses both moving a tool through space and pure electromagnetic paths (e.g., optical, radiation) "moved" with mirrors and lenses. Toolpaths may be arranged within contours, which may subdivide a layer perimeter into areas of different attention, e.g., where a larger or smaller deposition head is necessary to reach some part of the lamina geometry, or to observe rule sets 1006 for different parts of the layer (e.g., walls, interior perimeter, fills). Toolpaths are generated per internal algorithms that determine offsets, scales, and cellular decomposition for complete coverage approaches of the various contours. Some parameter control may be applied to the rules 1006 (e.g., an adjustable 1-5 thicknesses of deposited plastic for an outer perimeter forming rule).

An FFF toolpath may have variables including extrusion width (relating to the nozzle size, nozzle height from build surface, and extrusion speed). Other deposition toolpaths in additive manufacturing may have variables similarly relevant to the physics and chemistry of the individual process.

As shown in FIGS. 5 and 6, a customizer routine 2008 (permitting one or both of automated and manual editing) may permit changes to the generated toolpaths, regions or subcontours, contours, layers, and mesh. Some customizations may require merely re-pathing, others may create new regions, others may create new geometry model sections— these changes may be done as they are entered by a user, or may be batched and redone. Optionally, after all customizations are done, the process is returned to the earliest practical phase with all changes protected to be re-meshed, re-sliced, or re-pathed.

As sent to the 3D printer 2000, the toolpaths are used to create an instruction file for actuation, conventionally called a "G-code" file or stream 1102. The toolpath generator 2006 generates toolpaths and may also serve as the G-code generator 2010 by interpreting the toolpaths into a machine-specific code. The G-code is sequenced including all starting and finishing times, control or command variables (e.g., speed for a motor, current for a heater), and the like, to arrange the actuator instructions sufficient for a job to complete. The G-code 1002 file, because it is dependent upon physical arrangement of the printer itself, is typically printer specific.

This process—slicing, then generating toolpaths, then generating G-code—whether used for conventional additive or subtractive manufacturing, may or may not include any provision for, the unique characteristics of embedded and/or reinforcing continuous or semi-continuous fiber—i.e. anisotropic characteristics including stress, strain, thermal conductivity, load and support direction specific design, or the like.

FIGS. 5A, 5B and 6, for the purpose of reference terms throughout, show a series of steps in the data structure, each of which is optionally combined with an adjacent step. As shown in FIGS. 5A, 5B and 6, a reference part as stored in a CAD geometry file includes a definition of exterior walls, upward facing "floors" and downward facing "ceilings", interior "roofs", interior through-holes, and interior "solid" spaces.

As shown in FIGS. 5A, 5B and 6, when converted into an STL, the 3D data structure is transformed into a geometry mesh defining only the exterior perimeter, but retains all of the characteristics of the more complex CAD representation. As noted, this is optional, as the mesh representation is easier to "slice". Defective, non-"watertight" or non-manifold STLs may be repaired such that all vertices are properly connected, but the representation as a mesh remains essentially similar.

As shown in FIGS. 5A, 5B and 6, "slicing" the STL includes two conceptual steps, which are often done together. First, at each height increment, a cross-section must be taken through the STL parallel to the anticipated build platen orientation. Second, necessary toolpaths are expressed as G-code for a deposition head to deposit material along the exterior and interior perimeters of the slice and also to create any interior structures (such as fills). The toolpaths and G-code may be generated at each slicing operation, such that these steps are merged. For the purpose of this discussion, "slicing" will be discussed as a set of merged steps in which cross-sectional slices are taken and path planning and G-code are generated for uniform material fill.

As shown in FIGS. 5A, 5B and 6, slicing operations identify and use toolpaths to surround exterior and interior lateral walls (e.g., optionally 1-3 fused polymer rows at each); fill interior volumes with dense, packed, sparse, cellular or lattice structures; form ceilings, floors, and roofs optionally with slower print speeds; and create temporary, removable or soluble support structures used during the print cycle. In addition, toolpaths for moving tools from origin to print start to print stop, and for feeding and retracting filament to start and stop extrusion, are created.

Customizations may be associated with a layer and recorded in a rule/parameter database e.g., as a toolpath with trajectory data. Additionally or in the alternative, with reference to FIG. 10B, the regions created by the change (a changed concentric fiber region R08, as well as a yet smaller interior region R10) may be recorded in a file or database as regions protected versus global operations as well as layer operations and region operations.

As noted above, arrangements are considered within the scope of, and expressly described by, a drive system or drive or motorized drive that may relatively move a print head and a build plate supporting a 3D printed part in at least three degrees of freedom (i.e., in four or more degrees of freedom as well), such as a delta robot or robot arm drive permitting four or higher degrees of freedom among the print head and build plate. Accordingly, as used herein, "layers" and "shells" deposited by the print head(s) or deposition head(s) or solidification head(s) may mean any layer or stratum or shell that may be formed in three degrees of freedom or higher (i.e., in four or more degrees of freedom as well), as appropriate, which may be planar layers in the case of three translation degrees of freedom (although shallowly curved layers may be formed even with three translation degrees of freedom), or curved, cupped, convex, concave, or topologically or topographically complex layers, shells, or layers or shells following two dimensional manifolds (and/or "sliced" in such shapes). Although the Figures and examples herein often show planar layers or shells, the present description and claims expressly contemplate that a layer or shell may be curved (and/or "sliced" in such curved shapes), and the orientation of print head(s), deposition head(s) or solidification head(s) driven such that such head(s) are normal or near-normal to the surface being printed and tracking along such surface in 3D space, or otherwise appropriately oriented to deposit the layer or surface.

Figure 7:
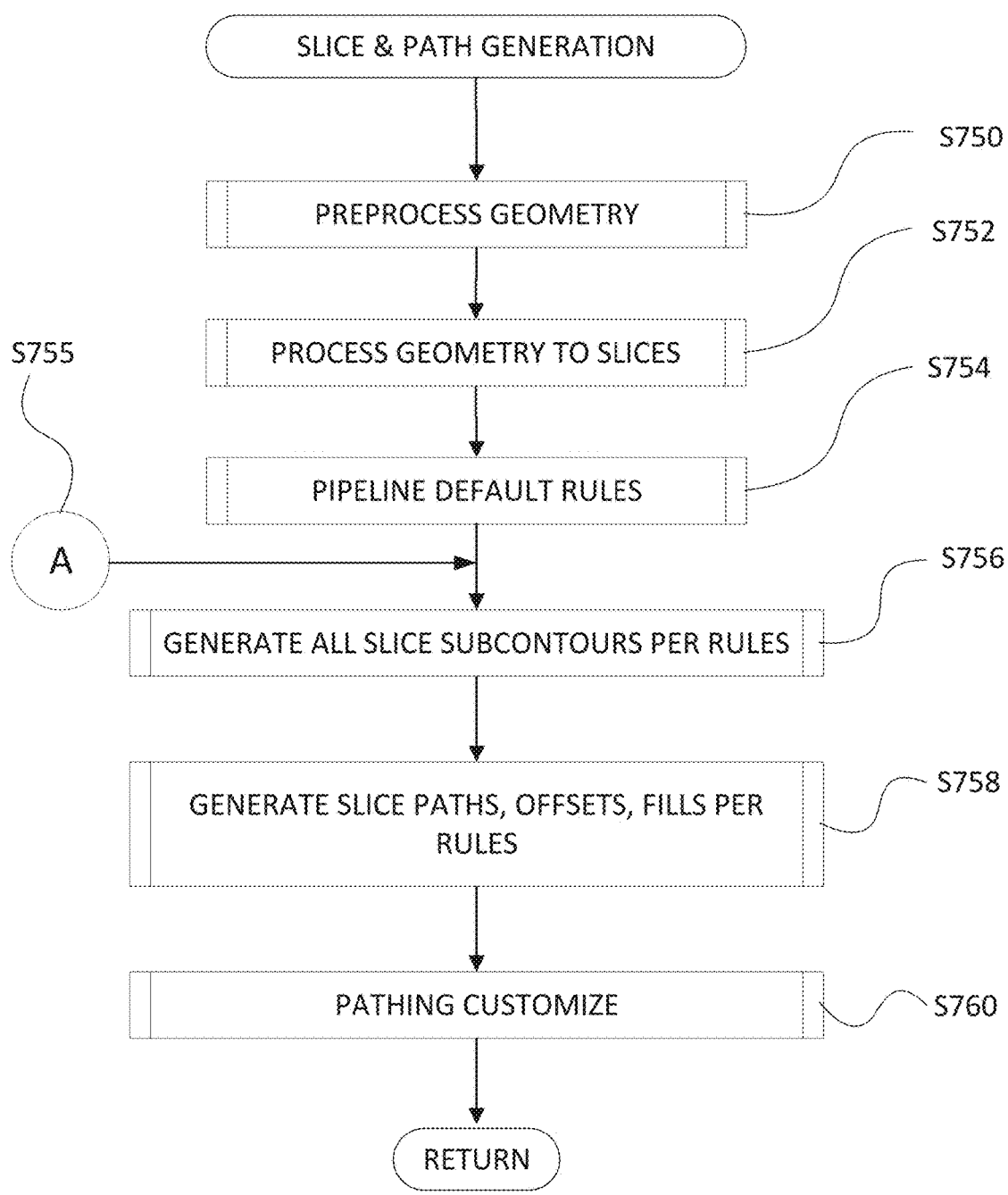
FIG. 7 is a flow chart describing the overall operation of the slicer and path generator of FIG. 4.

FIG. 7 is a flow chart describing the overall operation of a path planner, i.e., the slice, contour, subcontour (region) and path generator and planners depicted in FIGS. 5 and 6. The fiber path planner of FIG. 7 receives as an input a "sliced" database of layers from the slicer. This sliced stack database may be in the form of, per layer, topological information (contours, defined as a solid or a hole via the conventional right hand rule), and/or toolpath information (trajectories), metadata, and/or G-code or an equivalent. For example, one form of subset would include the "SLC" file format or an equivalent, which includes only the geometry of the contours. A superset could include the STL file, or analyses or parameters recognized from the STL file (e.g., a label for a through hole that is shared by code segments generating that through hole in G-Code).

It is a distinction from either or both of conventional additive manufacturing and conventional subtractive manufacturing that the fiber path planner may work with individual layers or slices, but also with a few, several, or many at a time.

It should be noted that the initial input for a first pass on a 3D part to be printed, where no layer-by-layer fiber path generation has yet been performed that could be repathed, the "slices and contours" discussed herein. It is an optional object of the present disclosure to subsequently deal with re-pathing on a database of layers rather than with the 3D model geometry, to thereby only repath those contours and those layers that should be changed. However, the present disclosure further contemplates that in some situations, repathing from an earlier stage may be beneficial (e.g., for Boolean and/or parametric operations supported at the region level, in addition to or in the alternative to at the layered level).

It should be noted that the process of creating toolpaths for ordinary additive manufacturing may not conventionally require repathing, nor may be comparison to any but one or two adjacent layers conventionally necessary. In toolpaths generated for depositing fill material only, toolpaths/G-code are built up from a platen assumption; material is not extruded in the same location twice; and the tool need not be moved back in the Z direction opposite to the direction of build, even for the case of multi-material or multi-part STLs. Should changes need to be made, the process of generating new tool-paths is generally to redo the part in CAD, create a new STL, and reslice/repath the entire geometry file (STL).

However, in order to edit the interior structure of the part to be printed, including the placement for fiber, at least some repeated operation in toolpath generation is preferred, to accommodate manual or new automatic changes in fiber placement performed by the path planner, or to provide the freedom of designing reinforcing fiber within a part designed on a CAD system with no provision for anisotropic materials.

Accordingly, as noted below, the process of FIG. 7 can be entered with its own output, i.e., the process of FIG. 7 is intended to analyze and change both data sets having only layers and contours, as well as the "slices, contours, regions, and toolpaths" set generated by the toolpath generator and modified in customization, and there are cases in which it may be beneficial to do so (e.g., in case incremental processes are interdependent).

In step S750, the process, in a mesh pre-processing step, corrects the STL file for various errors, including at least one of: correcting face normal orientation; self-intersections; non-manifold geometry and manifold errors; vertices not incident to any edge; edges without any incident triangles; edges with more than two incident triangles; vertices with a non-disc neighborhood; disconnected, or unwanted handles, tunnels, components, or cavities; erroneous holes or cavities; triangles with near-zero or zero area. Techniques include merging vertices within a prescribed distance; merging or stitching adjacent boundary edges; clipping then merging overlapping patches; hole filling by inserting vertices; and converting mesh into point cloud and remeshing. This step may generate a simplified, more robust, mesh in which each vertex and edge is uniquely defined, and faces are generated from defined vertices and edges.

In step 752, the process slices the (pre-processed or corrected) geometry (e.g., triangle) mesh in to layers, strata, or slices (these terms used interchangeably). Techniques include checking all triangles or groups of proximate triangles vs. all cutting planes for intersections; checking all edges vs. all cutting planes for intersections (sweep plane slicing); or checking all planes for intersections with intervals representative of each triangle. This generates a set of two dimensional slices at a fixed height or variable height (either may be recorded as metadata for a particular slice). The fixed or variable height may be of any thickness/resolution printable by the target 3D printer, e.g., 0.02", 0.01", 0.005", 0.001", 0.1 mm and multiples of these, or even of a lesser thickness/resolution useful for inter or intra-layer insertions. Each slice includes at least one positive contour (e.g., an outer perimeter) and may include one or more negative contours (e.g., a hole or holes). A positive contour may also create a proxy for a hole, e.g., by specifying a perimeter that loops to touch (e.g., meld with) itself to create such hole proxies(s).

Figure 8:
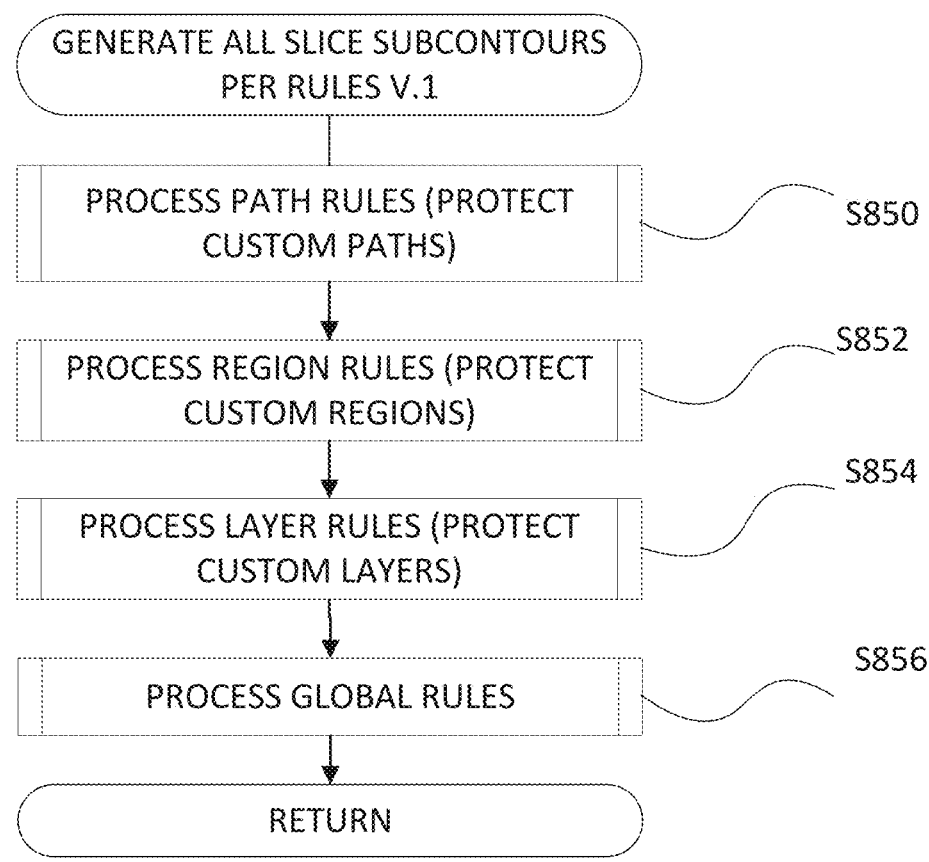
FIG. 8 is a flow chart describing the overall operation of a subcontour or region generator of FIG. 7.
Figure 9A:
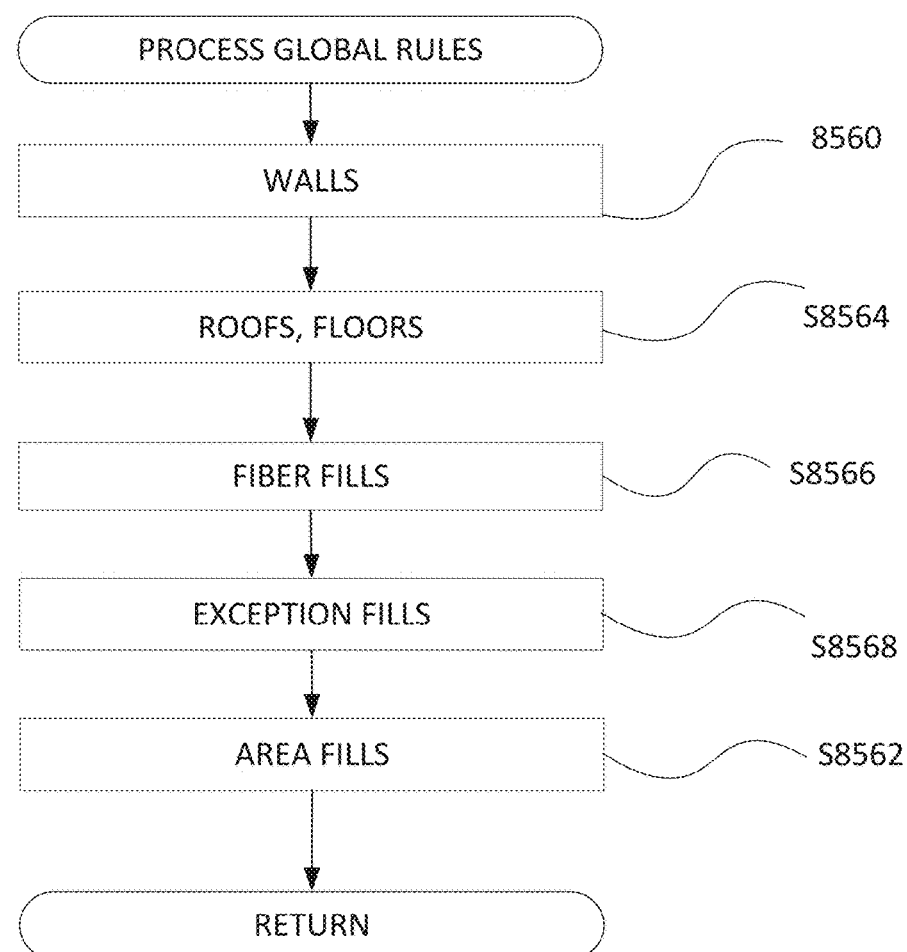
FIG. 9A is a flow chart describing processing of global rules in FIG. 8.

In step S754, the process inventories the state of default rules for FFF and fiber printing selected for automated contours and toolpaths, and sets an order of operations for the default rules selected. An exemplary state of such rules are shown in FIGS. 8 and 9A and described with reference thereto. The order of operation of rules may be linear, recursive, or otherwise arranged. A predetermined overall order of operations may interrelate all possible operations. It should be noted that a change in rules (e.g., changing or adding or subtracting a rule) any time during the process may, by interrupt, trigger, commit or otherwise, restart the process at step S755 (entry point "A") to accommodate the change. The user may be afforded an opportunity to modify these default rules before the first execution of step S756 (e.g., skip to step S760).

It should be noted that the creation of internal contours or regions for the operation of a particular rule or application of a particular internal design structure within can take place before, after, or during the operation of the rule or design. Some rules are more amenable to defining a boundary as they operate (e.g., contour-following fills); other rules are more amenable to working with a certain perimeter (e.g., patterned fills such as honeycomb or triangle); still other rules are more amenable to including a required bounding contour as part of their definition (e.g., hole-reinforcing patterns, insert-reinforcing patterns).

In step S756, the process applies the ruleset, layer by layer, according to the order of operations, to determine sub-contours, i.e., two dimensional topological sub-areas and/or holes within a positive contour, as new dependent positive and/or negative contours. Again, negative contours may form holes, or positive contours may form proxies for holes. In addition, positive contours may be created by ruleset to trigger or force a desired pathing or filling of fiber or material. Sub-contours may have perimeters coincident with an enclosing or neighboring contour, and a positive sub-contour may form a wall of a hole in the layer). FIGS. 8 and 9A-9C include further detail on sub-contour generation.

In step S758, the process applies the ruleset, contour by contour, according to the order of operations, to generate desired toolpaths for filling of fiber or material, as well as transitions therebetween, for one or more fiber laying tools and for one or more material deposition tools. When all paths are generated, the initial printing strategy is complete. At this point the toolpaths may be translated to G-code and the part may be printed, and an end-user may be offered the opportunity to review and/or print the toolpath state or the part (e.g., at the beginning of the customization process).

As discussed herein, a segment, toolpath or path is a sequence of trajectories and contours. A trajectory is a connected sequence of path commands Toolpath commands may include line segments and partial elliptical arcs, and optionally Bezier curve segments. Each path command may have path coordinates, and a pair of path coordinates may be an X, Y location that is a control point. A contour is a closed trajectory with the same start and end point. Toolpaths are executed (e.g., by a deposition printhead, by laser or UV curing, by flash DLP curing) or rendered (e.g., to display upon a review panel) by "stroking" the path. In the case of a toolhead, the "stroking" may be depositing material or curing material as swept out by a fixed-width deposition centered on the trajectory that travels along the trajectory orthogonal to the trajectory's tangent direction. Stroking may be by area or accumulated (an entire area may be flashed by DLP as a toolpath).

With respect to offsetting of or contours toolpaths discussed herein, parallel or offset toolpaths may be created using offset generation for non-Bezier base paths and offset stroking for Bezier (e.g., cubic or quadratic control point) base paths. Optionally, because offset stroking for Bezier paths may be difficult to render, FFF material or fiber paths may be non-Bezier approximations. Resolution-independent path rendering may be performed by via vector graphic libraries for GPU accelerated path rendering (e.g., OpenVG) even to calculate toolpaths and offsets of physical continuous fiber paths.

In step S760, the process permits the customization, layer by layer, contour by contour, and/or path by path, of the completed toolpath and printing strategy. The customization process is optional, as is each type of customization.

As shown in FIGS. 8 and 9A-9C, subcontours (or "regions") and in some cases toolpaths are generated layer by layer in a priority or order of precedence. Global rules are optionally of lowest precedence, as they are most likely to be overridden by direct user changes (actual design decisions) or indirect user changes (results of design decisions).

The process of FIG. 8 is carried out both initially and in later editing stages. In an initial pass, no user changes of fiber paths or regions/subcontours will have been recorded, so there will be no user edited fiber paths or subcontours to process at highest priority. In this initial pass, the highest priority may be global rules.

Within and among each set of processed rules, higher priority rules, once defining a toolpath and/or region, are generally protected as the next, lower priority set of rules are processed. In the case of a conflict, the user may be given a warning and opportunity to elevate the priority of a nominally lower priority rule. The priority stack may also be considered an order of operations. Higher priority actions are optionally not disturbed by later actions unless a failure mode rule is broken.

While the actual order of priorities may be dependent upon implementation, in one implementation, the general order of rules is: failure mode rules (e.g., limits of the platen or of the tool heads, of unsupported spans of a particular material, etc.); toolpath rules; then subcontour rules; then layer rules; then global rules. In each step, direct edits are or were preferably only permitted in a manner which does not violate (optional) failure mode rules (e.g., another failure mode rule may be that an unsupported spans of isotropic fill material can extend, e.g., no more than 1 cm in length, or other length specified as a property of the material).

In step S850 initially, in any layer in which a toolpath was edited, any manual or automated operation in which a toolpath is or was directly edited by a user is processed by first plotting the related toolpath (and any dependencies) and then defining the envelope which the toolpath occupies, protecting the envelope as a region or subcontour. An example toolpath edit operation is changing the position of control points or waypoints of a curve defining a toolpath.

In optionally subsequent step S852, among all the layers, the regions or subcontours protected in step S850 are now "off limits". Manual or heuristic operations in which a subcontour is or was directly edited by a user are processed by protecting the region or subcontour. Toolpaths may be generated at a later time. An example subcontour edit operation is specifying a void volume (e.g., an solid model to be overmolded) that extends through several layers.

In optionally subsequent step S854, layer rules (i.e., rules that have been set for an entire layer) are processed. Regions or subcontours protected in prior steps are now "off limits". Manual or heuristic operations in which a layer is or was directly edited by a user are processed by protecting all remaining regions or subcontours in the layer. Toolpaths may be generated at a later time. An example layer edit operation is specifying that fiber fill will be used on a particular layer that had not by toolpath, subcontour or global rules otherwise been defined as a fiber layer.

In step S856, global rules (i.e., rules that have been set for the entire part) are processed. Typical global rules are shown in a priority stack in FIG. 8C, e.g., with wall thicknesses of highest priority and infill of lowest priority. Some or all global rules may optionally or alternatively take precedence over other rules.

FIG. 9A is a flow chart in which different types of global rule are executed. As noted, although FIG. 9A may take place after the other routines of the slicing and path planning process (or at lower priority), the user may be presented with the results of FIG. 9A's processing of default and global rules before any customizations are made or processes. As noted, a later path, region, layer, or volume customization that deposits fiber or other second material at a wall, floor, roof, fiber fill region, exception fill region, or area fill region may optionally (e.g., set by a parameter) override the global wall thickness setting; and each successive toolpaths generation defines regions in each layer which are nominally protected vs. later toolpath generation.

In step S8560, the process of FIG. 9A refers to database settings for wall thicknesses and generates toolpaths corresponding to the walls of the part. Walls may be the perimeters of contours, subcontours, or regions. A typical global setting may be from 2-4 bonded ranks; inner walls (holes) and outer walls (shells) may have different global or default settings.

In step S8562, the routine generates "roofs" and "floors" according to a set parameter (e.g., independently settable at a default 3 layers of any of 1-5 layers, or as a thickness for variable thickness layers). A roof is an external surface facing "up" (i.e., the direction in which layers are built), a floor is an external surface facing "down" (opposite to up).

In step S8562, the routine generates fiber fills according to global rules discussed herein with respect to FIGS. 10 through 11C.

Figure 9B:
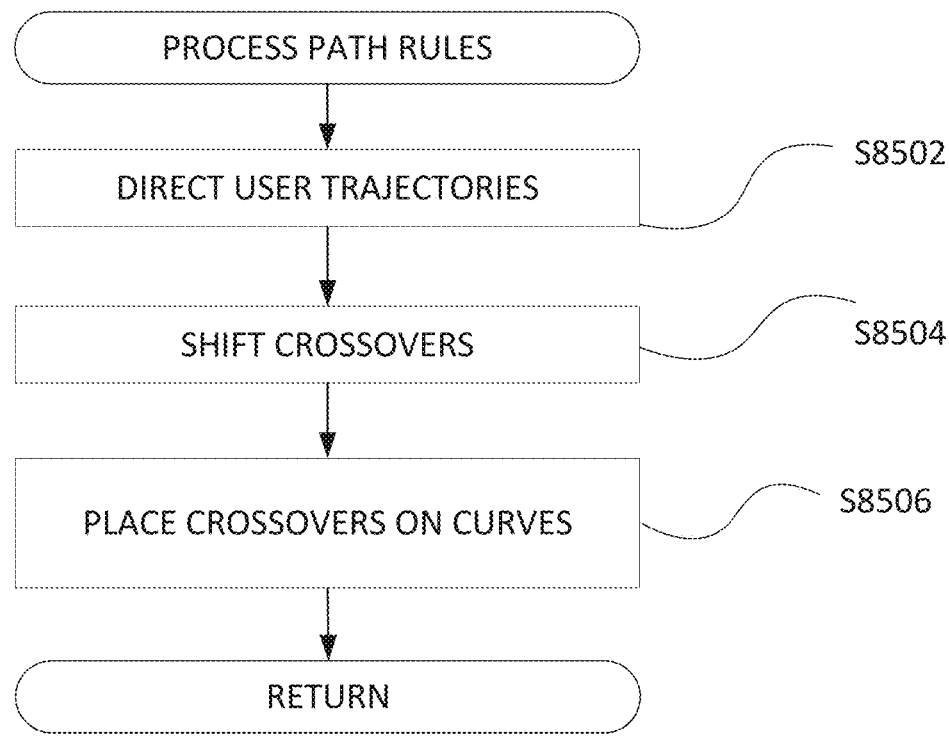
FIG. 9B is a flow chart describing processing of path rules in FIG. 8.

FIG. 9B is a flow chart in which different types of path rule are executed. As noted, direct editing toolpaths, or heuristic or algorithmic determination of toolpaths, takes precedence in one embodiment. As noted, a path customization that deposits fiber or polymer at a wall, floor, roof, fiber fill region, exception fill region, or area fill region may optionally override the global, layer, or regional rules or settings.

In step S8502, the process of FIG. 9B refers to any recorded direct edits (again, which may be manual or automated operations) that were recorded, and generates the corresponding toolpaths, protecting the region surrounding those toolpaths from region, layer, or global operations. The discussion of FIG. 13 below will describe exemplary direct edits.

In step S8504, groups of crossovers (e.g., "crossover" including S-shaped-bends switching a fiber path from one offset to an adjacent offset, L-shaped-bends switching a fiber path from one direction to a transverse direction, and/or U-shaped-bends or folds switching a fiber path from one direction to a substantially opposite but parallel direction) in the same directed to be shifted, or required to be shifted by operation of heuristic or other rule, are shifted. In this context, as shown in FIG. 11D, the crossover toolpaths L22 (TP06, TP08, TP10) are "shifted" by—even were they placed by global rule in a default position—staggered or relatively migrated about the track of the concentric band. In this manner, stress concentration and/or slight reduction in tensile strength is distributed among layers, rather than stacked up among layers.

In step S8504, groups of crossovers directed to be shifted, or required to be shifted by operation of heuristic or other rule, are shifted. In this context, as shown in FIG. 11D, the crossover toolpaths L22 (TP06, TP08, TP10) are "shifted" by being staggered or relatively migrated about the track of the concentric band. In this manner, stress concentration and/or slight reduction in tensile strength is distributed among layers, rather than stacked up among layers. As a layer operation, the shifting of crossovers may override crossovers placed by global rule in a default or enabling position (e.g., as shown in FIG. 10C at location TPO, in a location that permits the continuous fiber to remain an uncut track).

In step S8504 of FIG. 9B, groups of crossovers directed to be placed on curves, or required to be placed on curves by operation of heuristic or other rule, are so pathed. In this context, as shown in FIG. 11D, the crossover toolpaths L22 (TP06, TP08, TP10) are located on a curve rather than on a straight section. In general, straight sections may be intended to bear tension or compression load, and placement of crossovers on a curve, minimizes the stress concentration and nominally lower strength along the fiber. As shown in FIG. 11D, the curve connects the straightaways and may be a superior location for the crossovers. The placement of crossovers on curves is by example a path operation, but may be a global, layer or region operation.

Figure 9C:
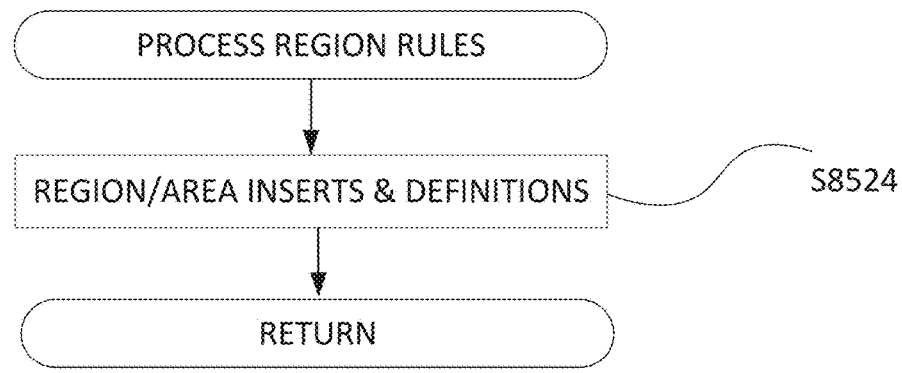
FIG. 9C is a flow chart describing processing of region rules in FIG. 8.

FIG. 9C is a flow chart in which different types of region rule are executed. In one embodiment, direct editing toolpaths, or heuristic or algorithmic determination of toolpaths, takes precedence over the region rules. In step S8524, the process of FIG. 9C refers to any recorded direct region edits (again, which may be manual or automated operations) that were recorded, and generates the corresponding toolpaths, protecting the region surrounding those toolpaths from layer or global operations.

Figure 9D:
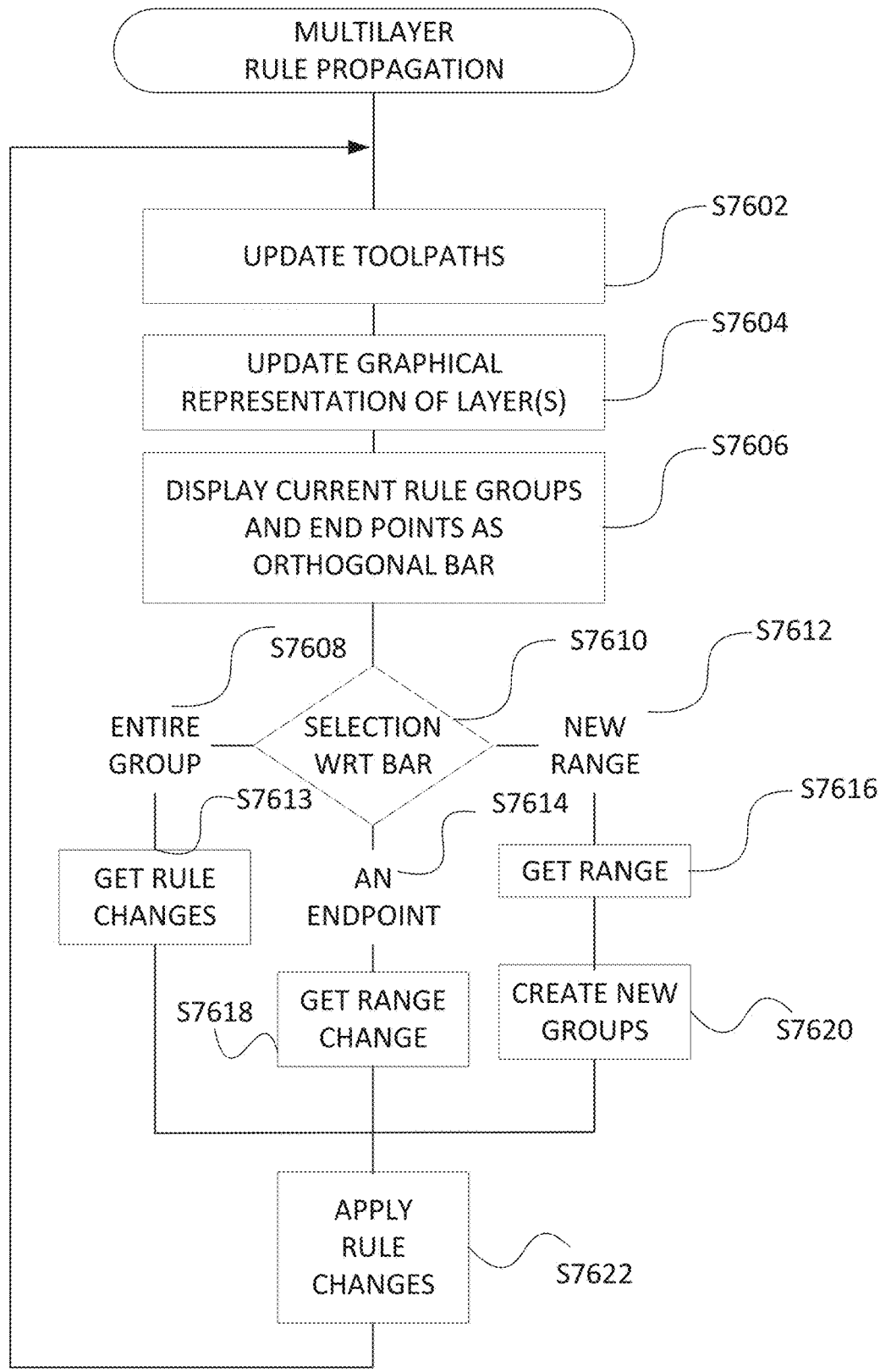
FIG. 9D depicts a flowchart for configuring 3D printer controller and/or slicer controller operations to permit multi-layer rule handling, e.g., setting rules for groups of layers or regions and changing the members of the rule groups.

FIG. 9D depicts a flowchart for configuring 3D printer controller and/or slicer controller operations to permit multi-layer rule handling, i.e., setting rules for groups of layers or regions and changing the members of the rule groups. In step S7602, updating or re-slicing of toolpaths from any toolpath, region, or layer setting change is carried out. In step S7604, as necessary, any changes in the currently displayed graphical representation resulting from an updated toolpath (e.g., change of a layer, group of layers, or volume) are processed and displayed. In step S7606, as shown in FIGS. 10E-10I, graphical representations of rule groups and end points of the rule groups are rendered as orthogonal bar(s) parallel to an edge of a display. In step S7610, the display area of the orthogonal bar is monitored for a pointer P01 action selecting, an entire group, an endpoint of a group, or a new range within and/or adjacent an existing group, and the input handled according to the particular case.

When an entire group is selected and retaining focus, in step S7613, one or more interface elements (e.g., a drop down menu, slider, text or number box, radio button, check box or other user interface control type) are monitored for input reflecting a change in the rule applied to the selected entire group, and the rule change is captured from the input. When an endpoint of a group (e.g., a group will have at least two endpoints, but may have any number for non-contiguous groups) is selected per step S7614 and retains focus, in step S7618 one or more interface elements (e.g., a drop down menu, slider, text or number box, radio button, check box) are monitored for input reflecting a change in the position of the endpoint, and therefore a change in the members in the set of layers or regions of the group, and the rule change is captured from the input. When a new range is formed or is selected per step S7612 and retains focus, in step S7616 one or more interface elements (e.g., a drop down menu, slider, text or number box, radio button, check box) are monitored for input reflecting a change in the rule applied to the selected entire group, and the rule change is captured from the input and the new group created in step S7620. If the new group is within a previously existing group, three new groups may be created (e.g., the new group selected as well as one or two fractional remainder groups reflecting that part of the previously existing group which was not changed). In each case, in step S7622, the rule change is applied and the process proceeds back to step S7602 to update the toolpaths per the rule change or range change, as well as the graphical representation (7604) and representation on the orthogonal bar (S7606).

Figure 10A:
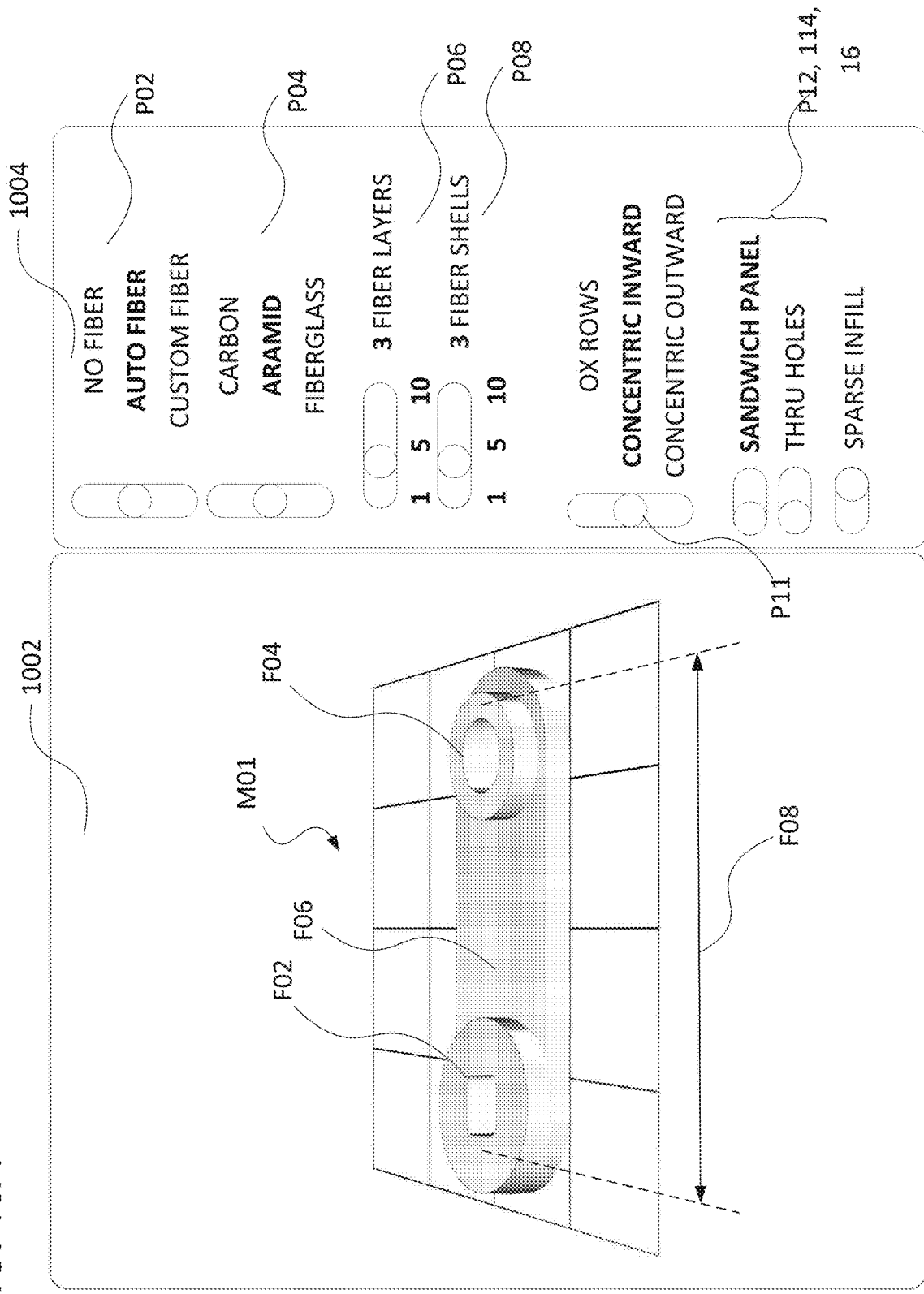
FIG. 10A shows an exemplary on-screen part rendering and logic structure for the rule processing of FIG. 9A for global operations.

As shown in FIG. 10A, at the global level, the user may choose to "use fiber" as a parameter P02, where a "use" (automatic) setting permits global, path, layer, and region fiber reinforcement, a "no fiber" setting suppresses all fiber reinforcement, and a "custom" setting permits only path, layer, or region determined fiber reinforcement. The user may specify a parameter P06 as a number of immediately adjacent fiber layers, and a parameter P08 as a number of immediately adjacent fiber shells or ranks, for global fiber operations (which optionally becomes the initial setting for any path, layer, or regions setting). The user may set a parameter P04 as a type of fiber (e.g., carbon fiber, aramid fiber, or fiberglass).

The exemplary model M01 shown in FIG. 10A to receive the operations of the rulesets and ultimately to be printed is a connecting rod including a torque transmitting feature F02 including a polygonal hole/spline surrounded by a large reinforcing circular mount, a slip fit feature F04 including a cylindrical through hole surrounded by a smaller reinforcing circular mount, and an arm feature F06 spanning the two features F02 and F06. "Spanning" herein means extending beyond the lateral or lengthwise extent of one or two features, e.g., a span length F08 extends past the edges of the hole features F02 and F04, is longer than the outer edge-to-edge length.

Detail settings that may be set at a global level also include (i) a parameter for false/dense/lean migrate or stagger for sets of fiber crossovers, which for adjacent layers moves the location of a group of crossovers between adjacent offsets so that crossovers are concentrated in zones or spread out as desired; (ii) a parameter for curves/straightaways for the preferred location of fiber crossovers; or (iii) a parameter for higher or lower moment of inertia, to concentrate fiber to the perimeters or center of a part.

FIG. 10A shows an exemplary on-screen part rendering and logic structure for the rule processing of FIGS. 8 and 9A-9C. A view panel 1002 includes an on-screen rendering of a geometry file retained in memory or other database. The geometry file rendered in the view panel 1002 may be shown in different views (e.g., isometric, perspective, orthogonal), and/or in different sections, and/or with or without layers, contours, regions or toolpaths rendered within. Examples include an isometric model shown in FIG. 10A or 10K; an exploded view of layers shown in FIG. 11A, a "layer at a time" plan view with a layer number control slider shown in FIGS. 10B-10I, 11B and 11C. In each view, occluded toolpaths or surfaces may be hidden or shown, and rendered lines and surfaces may be rendered with selective color and transparency as set by the user. Contour, region, layer, fill, material, and other metadata corresponding to a characteristic may be rendered in outline and/or highlighted with selective color and transparency as set by the user.

A selection panel 1004 includes a set of user interface elements that correspond to command flags, arrays, and lists stored in memory or other database (e.g., as shown in FIG. 5B). As disclosed herein, whether or not particularly disclosed separately in discussion of data structures, each on-screen rendering corresponds to that data structure discussed herein necessary to render the view, and each view panel and selection panel user interface element corresponds to a respective flag, array, or list retained in a database in like form to those particularly detailed.

Exemplary global rules that control path planning for each layer that are available to the path planner, and also available to a display renderer for the view panel and a controls renderer for the selection panel, are shown in the view panel 1004. Numbering for features rendered in the view panel 1004 may reference any of FIGS. 10A-10I (display, interface), FIG. 8 or 9A-9D (process control), FIGS. 5A, 5B (rule sets and data structures), as each are related as the data structures defining operations and the part are created and changed by process control according to rule sets and priorities, and the results of the changes displayed to the user. Several available choices are not depicted in FIG. 10A, although these would appear in an available view panel. For example, the user may select (and the path planner thereby execute) the thickness of and/or number of bonded ranks forming inner and/or outer walls or shells, the thickness and/or number of bonded layers for floors and/or roof dense or watertight fills; whether or not to use peelable and/or soluble supports for printing overhangs; and/or a fill pattern (triangle, hex, square, cellular) for infill of inner areas for weight reduction. Generally, many more parameters may be set by presenting a configuration file (e.g., layer thickness and/or bonded row width; variable feedrate for curves, bends, or outer/inner walls; bridging (printing unsupported spans) lengths for neat plastic or fiber; or limitations for printing spurs (single walled sections).

Figure 10B:
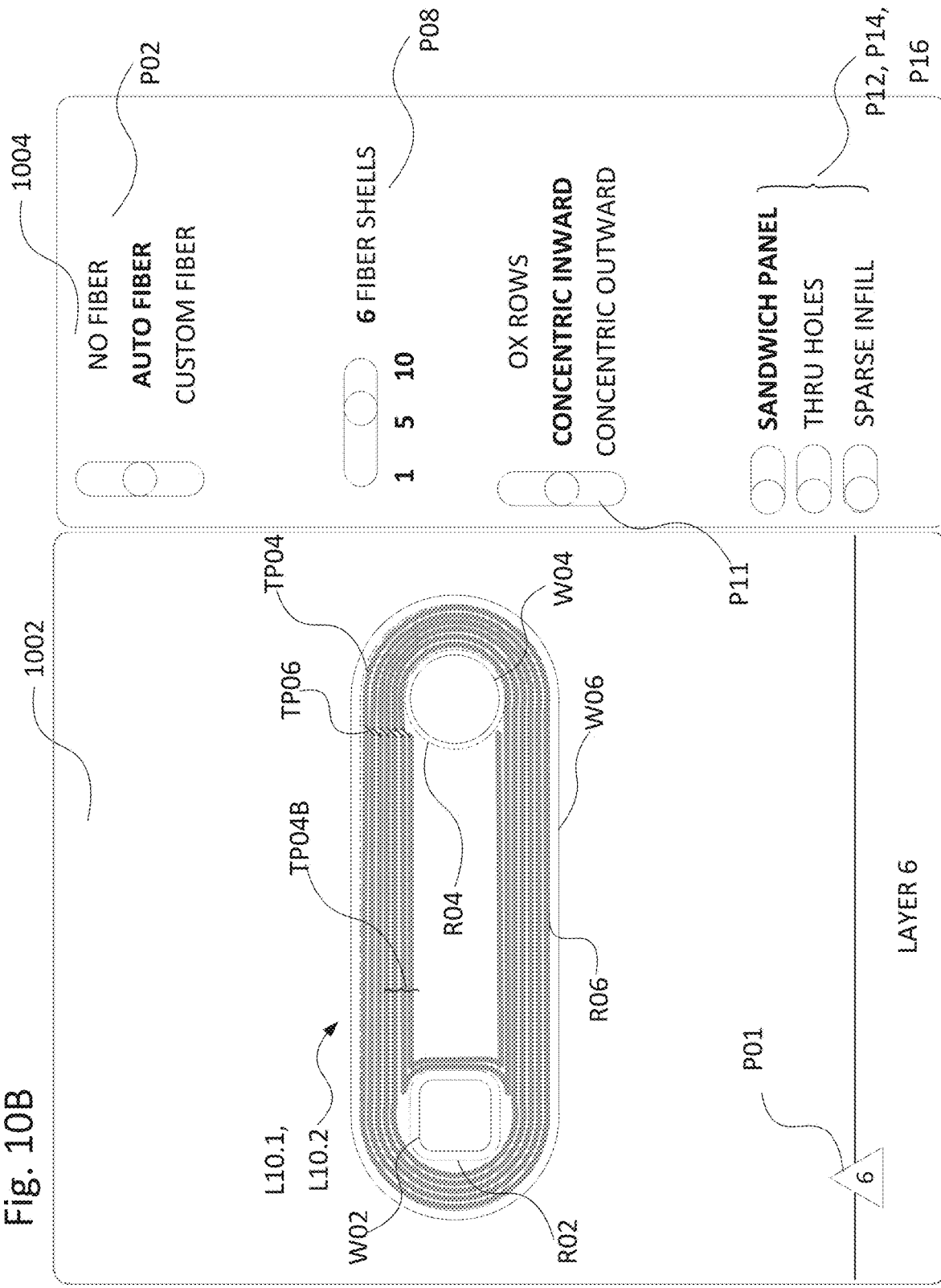
FIG. 10B shows an exemplary on-screen part rendering and logic structure for the rule processing of FIG. 9B for layer operations.

FIG. 10B shows an exemplary display for layer rule operations on a view panel 1002, and is again generated by rendering to screen 2D definitions (optionally presented in 3D) of contours, subcontours, and toolpaths, with optional processing for occlusion and showing and hiding particular feature types. An alternative plan view per layer is shown in the view panel 1002, set to the sixth layer (of an exemplary approximately 200 layers). An end user may optionally return to another view (e.g., semi-transparent isometric), but retain the same controls and layer number slider P01.

As an example, a scenario is carried out in FIG. 10B in the per-layer editing method (a combination of pathing customization step S760, which presents different interfaces for implementation of rules, and rule processing and region protection step S854, which processes and protects user changes on a layer by layer basis). A user wishes to directly generate a structure similar to that of FIG. 19F by doubling the amount of fiber reinforcement in an outermost layer, or at least in a layer distant from the centroid, to improve the effective moment of inertia. If roofs and floors are set to be a low number of layers, e.g., five as in FIG. 11A, and the roof and floor global setting is protected versus user edits, then the target layers for direct editing of globally automated operations be in this example layers 6 and 101.

As shown in FIG. 10B, for layer 6 the user has specified 6 fiber shells instead of the 3 fiber shells consistent with the global rules, and moreover has turned off "sparse infill". Accordingly, three additional offsets are generated, and fiber pathed (toolpath TP04B) to follow those offsets and rendered to screen. With reference to FIG. 5B, these customizations may be associated with layer 6 and recorded in a rule/parameter database as shown, e.g., "Layer 6-Concentric Rings 6-Fill Pattern off". Additionally or in the alternative, with reference to FIG. 5B, the regions created by the change (a larger concentric fiber region R08, as well as a smaller interior region R10, now no longer to be sparsely filled) may be recorded in a file or database as protected versus global operations, i.e., protected subcontours. Note, in the present embodiment, the layer change is not protected versus region or path change by the user.

Additionally as shown in FIG. 10B, the last two offsets generated for fiber fill no longer loop about the hole and interior negative contours. This operation generates a potential exception fill, as well as a potential stress concentration in the fiber cusps on the inboard side of the negative contour. While a smoothing operation may be applied as a global rule, or as a layer rule that may be set per layer, to remove the cusp and/or stress concentration, for the purpose of this disclosure the cusps will be used as an example for user editing of paths and/or regions. FIG. 10C shows an exemplary on-screen part rendering and logic structure for the rule processing of FIG. 9B. Parameters for crossover migration or placement are not shown, but could be available in this structure. The view panel 1002 includes an on-screen rendering of a target layer of the geometry file retained in memory or other database. The selection panel 1004 includes a set of user interface elements that correspond to command flags, arrays, and lists stored in memory or other database (e.g., as shown in FIG. 5B).

Exemplary tools and rules that control path planning for the current layer are available to the path planner, to a display renderer for the view panel 1002 and to a controls renderer for the selection panel 1004, are as shown in the view panel 1004. Numbering for features rendered in the view panel 1004 may reference any of 10A-10I (display, interface), FIG. 8 or 9A-9D (process control), FIGS. 5A, 5B (rule sets and data structures), each inter-related as the data structures defining the operations and the part are created and changed by process control according to rule sets and priorities, and the results of the changes displayed to the user.

As shown in FIG. 10C, at the pathing level, the user may choose a subset of the same changes available at the layer level (e.g., the number of shells or the pathing strategy). A set of direct editing tools are available, and the implementation thereof via mouse or touch driven interface connected to record selections and move graphical indicia representative of screen location would be understood by one of ordinary skill in the art. A lock for editing permits the user some protection from inadvertent edits, although an undo function is operative for FIG. 10C and would also help. The toolset includes (i) a fiber selection cursor, for choosing one or more entire trajectories, segments, or toolpaths; (ii) control point selection, addition, and deletion cursor, for selecting, moving, adding, and deleting control points of fiber trajectories/toolpaths rendered in FIG. 10C as NURBS or Bezier curves; (iii) segment joining and splitting cursors, for combining and splitting toolpaths (especially should heuristic or algorithmic path generation at the global, layer, or regional level be an obstacle to the designer's intent); (iv) a move crossover cursor, for selecting and moving a group of related (i.e., adjacent to one another in parallel offsets) crossovers, e.g., along the track or to a curved portion of the track as discussed herein; and (v) an add new offset cursor, which will generate a new offset from a selected trajectory or toolpath, and fill the offset with a reinforced fiber toolpath (adding a crossover as necessary).

Again, as with FIG. 10B, an example scenario is carried out in FIG. 10C in the per-path editing method, a combination of pathing customization step S760, which presents the interface of FIG. 10C for the implementation of toolpath-level rules, and rule processing and region protection step S850, which processes and protects user changes on a toolpath-by-toolpath basis). A user wishes to directly remove the cusps generated in the explanation of FIG. 10B, continuing the design intent to implement a structure similar to that of FIG. 19F.

As shown in FIG. 10C, for layer 6 the user has used the control point cursor to select the innermost fiber loop, and has already deleted control points to render a semicircle instead of the cusps. This edit is complete. As shown, the user has used the control point cursor to activate a ghost loop having NURBS or Bezier control points, and has plotted a curved, lesser stress path (outlined as a dual line ghost path). Upon execution of this design, the new toolpaths are recorded and protected versus coarser changes. Accordingly, one complex fiber toolpath is repathed (toolpath TP04B) to follow the new path and be rendered or stroked display.

Accordingly, the operation of the toolpath level rule set, in the form of executable code or parameters controlling parameterized executable code, permits semi-automated toolpath customizations. As noted, although the toolpath rule set is in one embodiment of higher priority over region, layer or global customizations, this priority may be otherwise arranged.

Figure 10D:
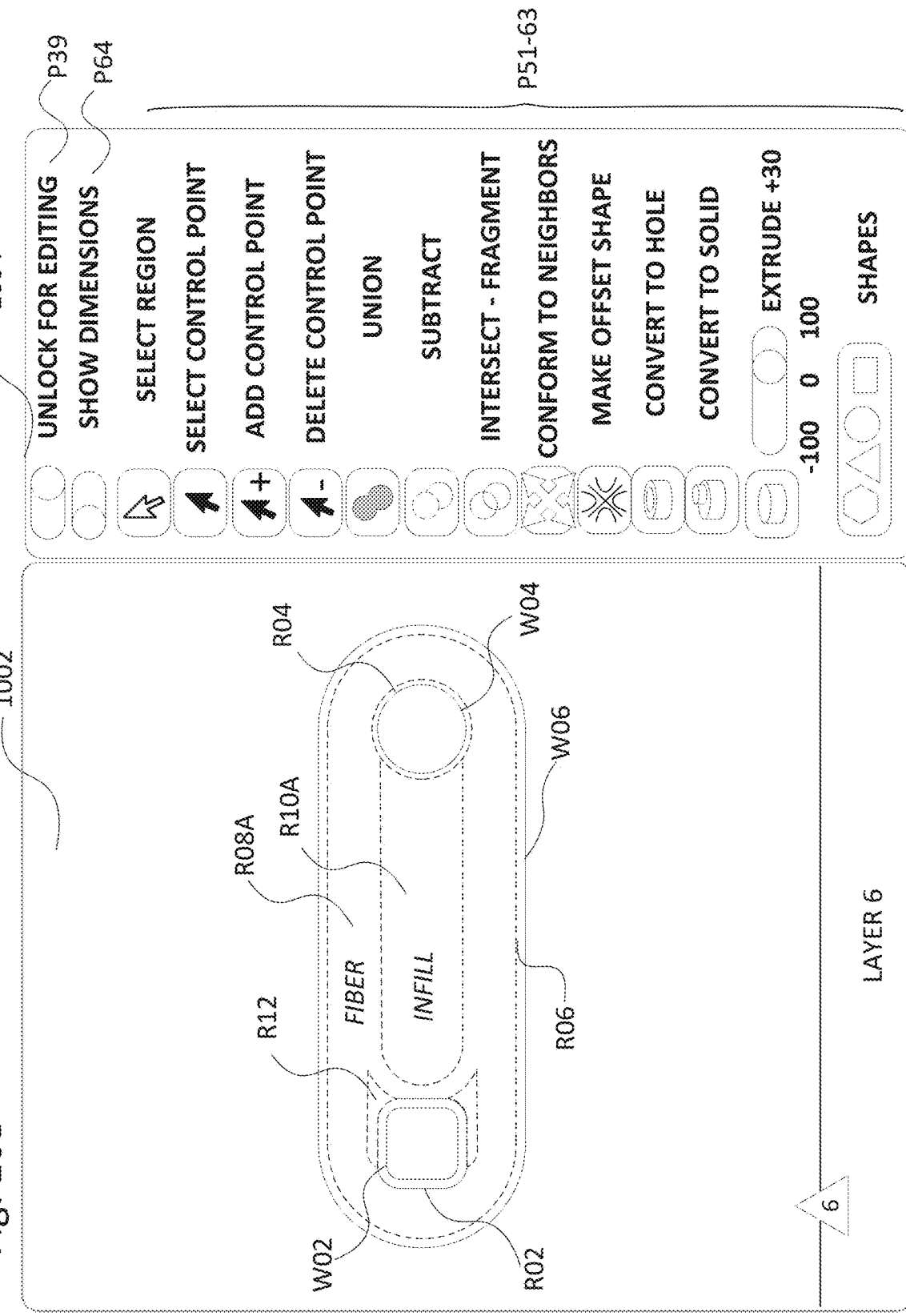
FIG. 10D shows an exemplary on-screen part rendering and logic structure for the region and/or rule processing of FIG. 9C, 9D.

FIG. 10D shows an exemplary on-screen part rendering and logic structure for the rule processing of FIG. 9C. Parameters for global or layer fill rules applicable to regions are not shown, but could be available in this structure. The view panel 1002 includes an on-screen rendering of a target layer and target regions of the geometry file retained in memory or other database. The selection panel 1004 includes a set of user interface elements that correspond to command flags, arrays, and lists stored in memory or other database (e.g., as shown in FIGS. 20 and/or 21).

Exemplary tools and rules that control region generation and planning for the current layer and current regions are available to the path planner, to a display renderer for the view panel 1002 and to a controls renderer for the selection panel 1004, are as shown in the view panel 1004. Numbering for features rendered in the view panel 1004 may reference any of 10A-10I (display, interface), FIG. 8 or 9A-9D (process control), FIGS. 5A, 5B (rule sets and data structures), each inter-related as the data structures defining the operations and the part are created and changed by process control according to rule sets and priorities, and the results of the changes displayed to the user.

At the region level, the user may choose a subset of the same changes available at the layer level (e.g., the number of shells or the pathing strategy), although this is not shown in FIG. 10D. A set of direct editing tools are available, as with FIG. 10C the implementation thereof via mouse or touch driven interface as understood by one of ordinary skill in the art, with a functionally similar lock for editing and an undo function. The toolset includes (i) a region selection cursor, for choosing one or more entire regions; (ii) control point selection, addition, and deletion cursor, for selecting, moving, adding, and deleting control points of region contours rendered in FIG. 10D as NURBS or Bezier curves; (iii) Boolean region joining and splitting operators, for combining and splitting regions selected with the selection cursor (again, especially should heuristic or algorithmic region generation at the global, layer, or regional level be an obstacle to the designer's intent); (iv) a conform to neighbor operator, for incrementally expanding a region boundary to fully conform to neighboring regions, to avoid, e.g., gaps, overlaps, non-watertight, and/or non-manifold errors in creation of regions; (v) a make offset shape operator, for creating a new region that is an offset of an existing region (a dialog may ask how wide the offset should be); (vi) a convert to hole operator, for converting a region into a negative contour; (vii) a convert to solid operator, for converting a region into a solid and/or positive contour; (viii) an extrude operator, for replicating a region up or down a specified number of layers, inclusive; and (vii) a shape primitive operator, for creating primitive shapes that may be combined with one another or with existing regions using the Boolean region tools.

Toolpath appearance has been hidden in FIG. 10D for the sake of explanation and visibility of regions, but operation of the region direct editing tools would include the ability to show or hide toolpaths within the regions, regenerate such toolpaths, select new toolpath rules (e.g., change the fill type of a region). For example, upon creation of a shape, solid, or a Boolean operation between dissimilar filled shapes, the user would be required to specify a fill (solid, sparse infill, or fiber infill; of whatever type).

The extrusion operator, as a region level tool, takes precedence over layer and global rules, but not over paths. In other words, a region extruded from a present layer in the region editing mode will "punch through" global or layer defaults, but will not "punch through" a user-tuned toolpath. While shown with a range slider control from −100 to +100 layers from the present layer, the extrusion operator would permit extrusion to all layers (as with all slider controls disclosed herein, by direct entry or otherwise, e.g., by continuing to increment or decrement at the end of the slider range). One example use of the extrusion tool is to extend a particular fiber toolpath design or complex sparse in-fill region internally within the part. Another is to create a new solid feature or hole. For example, a solid infill (by default) hexagon shape may be created with the shape tool, placed in a desired position according to its displayed size and location from contours of the part (e.g., "show dimensions" toggle "on" or measureable with a measuring tool), extruded through the part, then punched through with the convert to hole operator. It should be noted that automatically created regions can be, of course, operated on in the region editing window. For example, a protected boundary region created by a customized toolpath design using the toolset and rules of FIG. 10C would be available for editing, replication, or extrusion in the end-user interface of FIG. 10D or otherwise to programmatic operation. In such cases, where a higher priority toolpath-surrounding, toolpath-generated, and/or toolpath level protected region is edited, the end-user may receive a dialog or other warning and authorize editing, extruding, or replicating of the protected toolpath-region.

In FIG. 10D, as with FIGS. 10B and 10C, in a per-region editing method, a combination of pathing customization step S760, which presents the interface of FIG. 10D for the implementation of region-level rules, and rule processing and region protection step S852, which processes and protects user changes on a region-by-region basis. In this scenario, the user wishes to designate and propagate a small area as an exceptional fill.

As shown in FIG. 10D, for layer 6 the user may use the select region cursor to select two small remainder regions R12, which absent algorithmic detection or user intervention will be filled with the same area infill of region R10A. In the described scenario, remainder regions R12 were created as cutouts from the expansion and subsequent manual rerouting of carbon concentric fill, creating and modifying region R08A. After selecting both regions R12 (e.g., with conventional mouse or touch multi-object selection techniques), the user may extrude them up and down to the extent they will fill in poorly with area fill, then convert to solid, where upon the user will be given a choice of fill—and would select either solid fill or a dense fill for such exceptions. Accordingly, the exceptional regions would be printed with solid fill rather than a poor infill. In this particular case, the user's edit of region content changes the automatic area infill such that torque transmitting feature F02 is reinforced along two polygonal sides to transmit force through solid polymer to the concentric fiber fill surrounding it.

FIGS. 10E-10I shows an exemplary on-screen part rendering and logic structure for the rule propagation procedure of FIG. 9D. The view panel 1002 may be the same or similar as in FIGS. 10A-10D, and includes an on-screen rendering of the geometry file retained in memory or other database, which may be shown in different views, as previously described. In the interest of focusing description on the features of the rule propagation procedure and interface, the selection panel 1004 is not shown, but a selection panel 1004 in FIGS. 10E-10K would often be associated with the view panel 1002 of FIGS. 10E-10K during rule propagation operations, e.g., to show detailed rule descriptions and/or annotations descriptive of rules being propagated, as discussed, each rule and user interface element corresponding to a respective flag, array, or list.

As discussed in FIG. 9D, rule propagation or rule "extrusion" permits users to define one or more rule formulations for one or more layers, and selectively propagate the rule(s) to other layers (or limit the layer range of a pre-existing rule propagation). Rules may be propagated on a per-region or per-layer basis, and may be propagated in a continuous, recurring, interval-based or regular fashion. In one embodiment, rules are adjacent and propagated in an exclusive fashion (a layer may have only one rule per region or per rule), and in another embodiment rules are overlapping and propagated in a priority based fashion (a layer or region may have inconsistent rule definitions, but these are prioritized in the same or similar fashion as is shown in FIG. 8, e.g., (custom rules>default rules, path rules>region rules>custom layer rules>global rules). These embodiments are not mutually exclusive and may be combined.

Figure 10E:
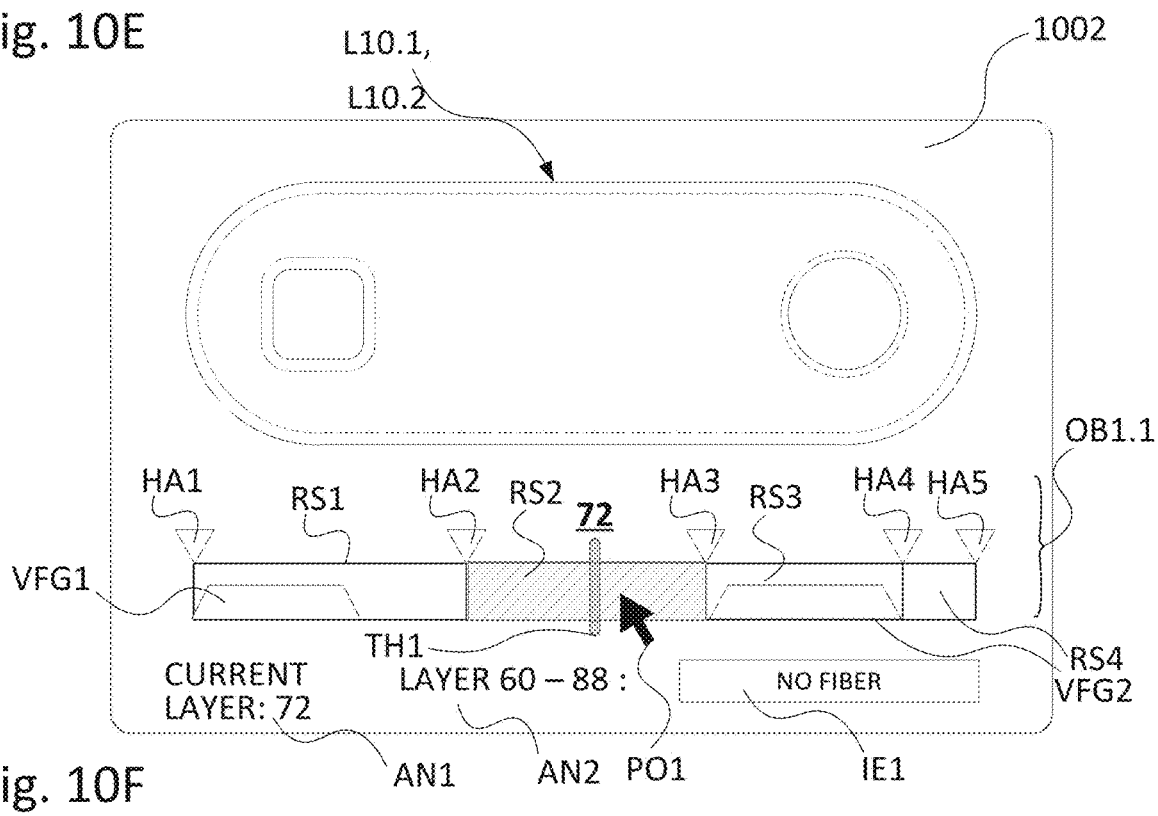
FIGS. 10E-10K shows an exemplary on-screen part rendering and logic structure for the rule propagation procedure of FIG. 9D.

As shown in FIG. 10E and set forth in FIG. 9D, a database of rules as depicted in FIG. 5B may be represented as an orthogonal slider or track bar OB1.1 having integrated representations for current index location (e.g., thumb TH1), rule propagation extent (e.g., area rule sections RS1-RS4 and/or rule adjustment handles HA1-HA5 as grouping indicators), and optionally for fiber fill amount (e.g., fiber volume fill graph sections VFG1, VFG2). Associated with the orthogonal bar OB1.1 are annotations reflecting the current index location among the layers AN1, the extent of the currently selected dataset or graphic element representing the rule to be propagated AN2, and the selectable or changeable rule selection interface element IE1. As shown in FIG. 10E, a pointer P01 (which may be a mouse pointer for a mouse based system or a tracked finger location for a touch based system) is used to manipulate the interface elements of the display shown in FIG. 10E and their associated data sets in a database as in FIG. 5B.

In particular, FIG. 10E shows an orthogonal layer topography bar OB 1.1 extending across a lower part of the display 1002, representing four (4) rule sets extending across approximately 150 layers. The orthogonal layer topography bar 1.1 includes the first through fourth rule sections RS1-RS4 extending from layer 1-59, layer 60-88, layer 88-140, and layer 141-150. As shown by the position of the thumb TH1, the currently displayed layer is layer 72 within rule section RS1, within which layers 1-35 include approximately 50% fiber fill as shown by the volume fill graph section VFG1, but the current layer includes no fiber fill (as reflected by the displayed layer L10.1 or L10.2). Rule section RS2 is selected via pointer P01, and is highlighted between rule adjustment handles HA2 and HA3, with annotation AN1 indicating that the common range of the rule of the selected rule section is layers 60 through 88, and annotation AN2 indicating that the rule selectable is a "NO FIBER" rule (from among fiber fill types, with the selectable rule itself being changed, e.g., via the selection panel 1004). "NO FIBER", "CONCENTRIC FILL", and "ISOTROPIC FILL" (i.e., a recurring or repeating grouping of two to six adjacent layers with distributed rotations of boustrophedon fills, each group creating a quasi-isotropic multi-layer wafer) are available. "ISOTROPIC FILL" as noted herein is commonly known as "quasi-isotropic", and approaches "isotropic" reinforcement when multiple anisotropic layers in with different dominant directions are combined in a laminate, such that the laminate's extensional stiffness matrix behaves substantially like an isotropic material. In the present description, a quasi-isotropic laminate pattern of 2-6 layers of composite deposition may be repeatedly printed in immediately adjacent laminate pattern stacks, in wafer-like stacks separated by plastic, in sandwich panels, or in other patterns (e.g., logarithmic or other progressive distribution).

Rule 10F shows the step S7608, S7613 of FIG. 9D, in which the pointer P01 has been used with the interface element IE1, a drop-down list in this case, to select rule "CONCENTRIC FILL" to apply to selected layers 60 through 88. After the rule is applied to each of layers 60 through 88 and any necessary recalculations applied, the fiber volume metering graph updates to show approximately 20% as a newly appearing volume fill or metering graph section VFG3. The current layer "Layer 72" displayed as a graphical, 2D representation updates to show the now-changed fiber fill (from NO FILL to CONCENTRIC FILL) as three concentric fill loops (e.g., three loops, optionally set pursuant to a corresponding setting or parameter adjustable in the selection panel 1004).

Figure 10F:
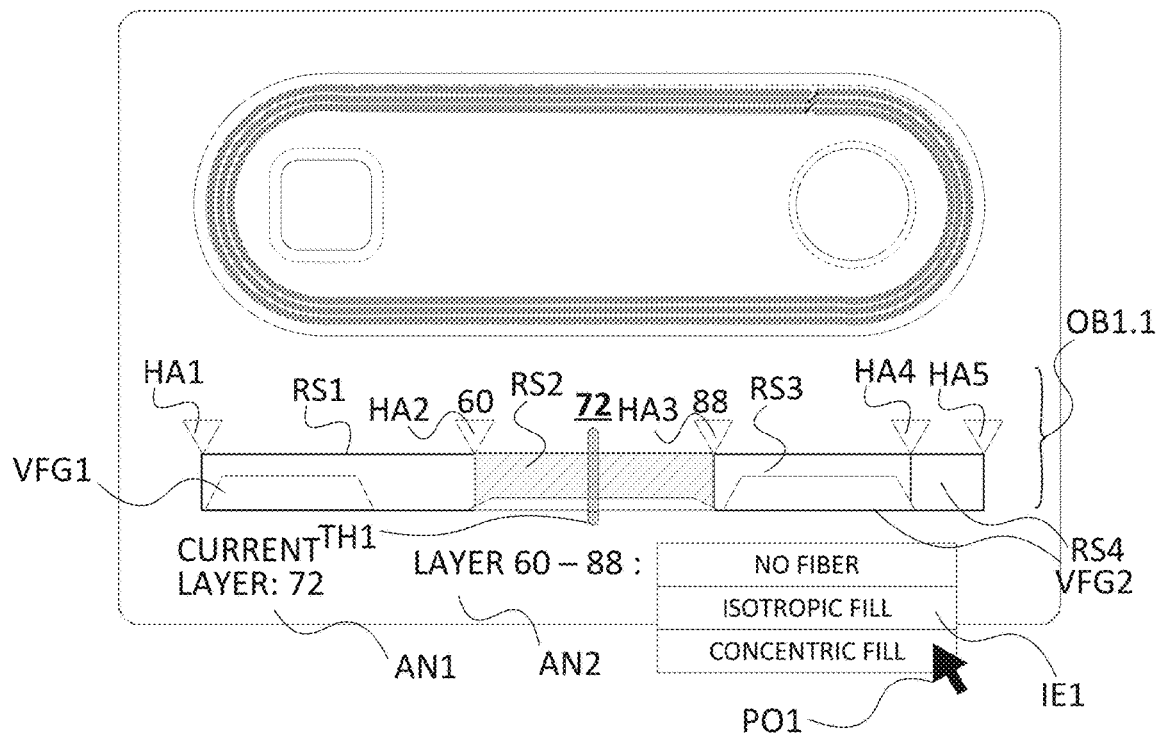
Figure 10G:
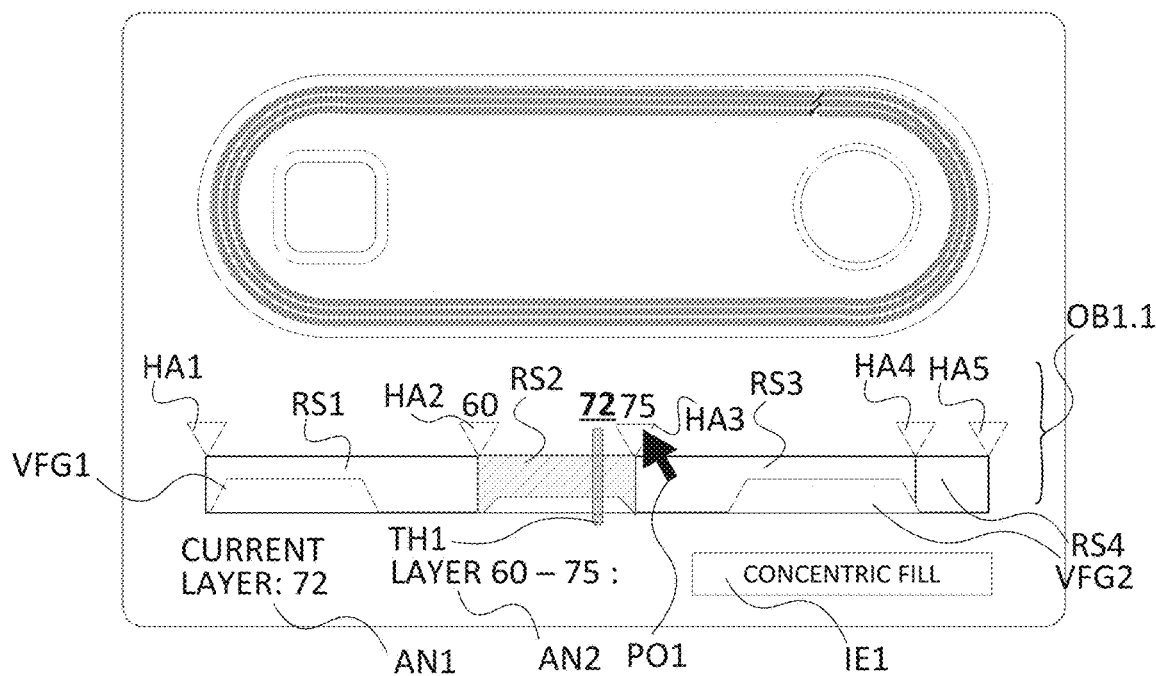

FIG. 10G shows the step S7614, S7618 of FIG. 9D, in which the pointer P01 has been used with the rule adjustment handle AH3 to alter the end point of the CONCENTRIC FILL rule from layer 88 as shown in FIG. 10G down to layer 75. The highlighting of the rule section RS2 is updated for the smaller extent, the extent of the volume fill graph is updated to reflect this application of a CONCENTRIC FILL rule only applies from layer 60 to layer 75, and the 2D depiction of layer 72 at the current index position remains the same. In an equivalent manner, were rule adjustment handle AH3 moved to the right to enlarge the size of the rule section RS2 and raise the end point, the corresponding display elements update to reflect the change.

Figure 10H:
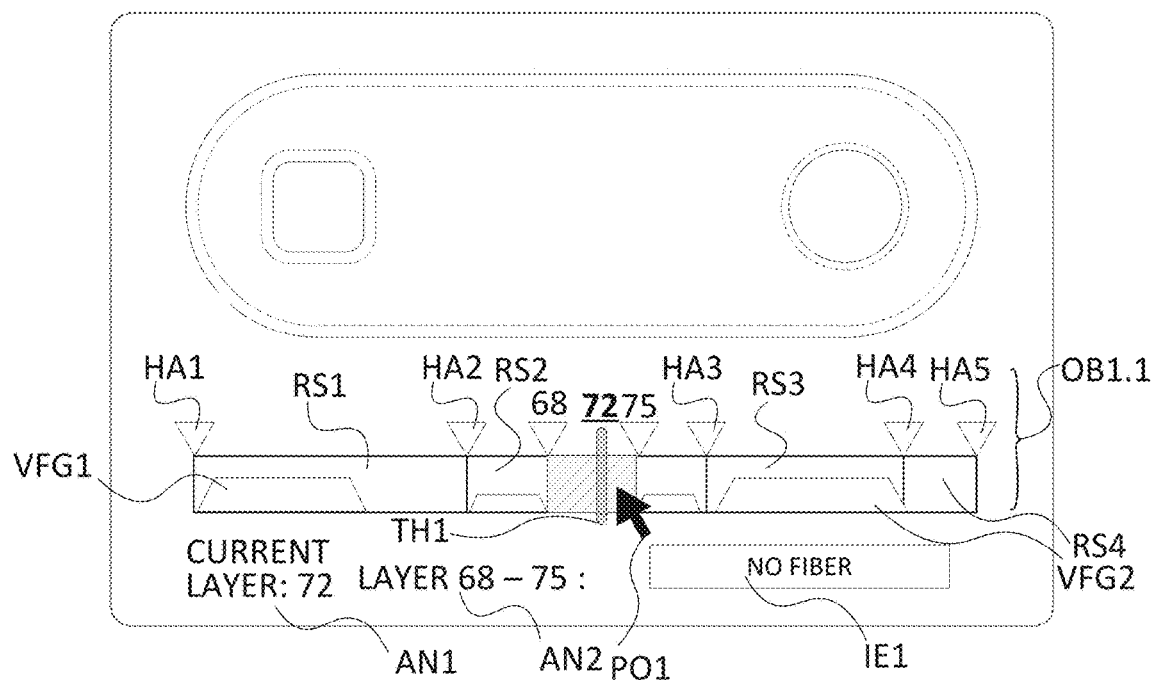

FIG. 10H shows the step S7612, S7616, S7620 of FIG. 9D, in which the pointer P01 has been used following FIG. 10F instead of (not necessarily in addition to) the step shown in FIG. 10G. As shown, the pointer has defined and selected new range RS5 within the rule section RS2, and the rule has been changed for this new range RS5 to "NO FIBER", splitting former rule section RS2 into new sections RS2-1 and RS2-2. The highlighting of the rule section RS5 is updated, the extent of the volume fill graph within rule section RS5 is updated to reflect the application of a NO FIBER rule only from layer 68 to layer 75, and the 2D depiction of layer 72 at the current index position is updated to reflect the NO FIBER change.

Figure 10I:
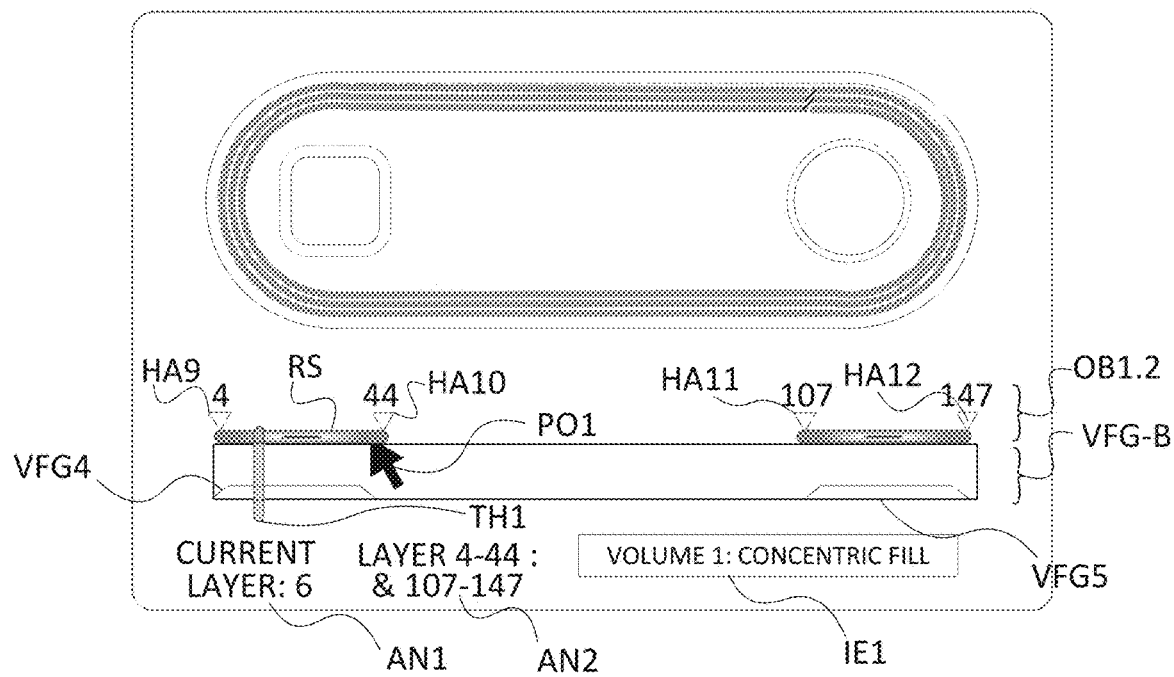
Figure 10J:
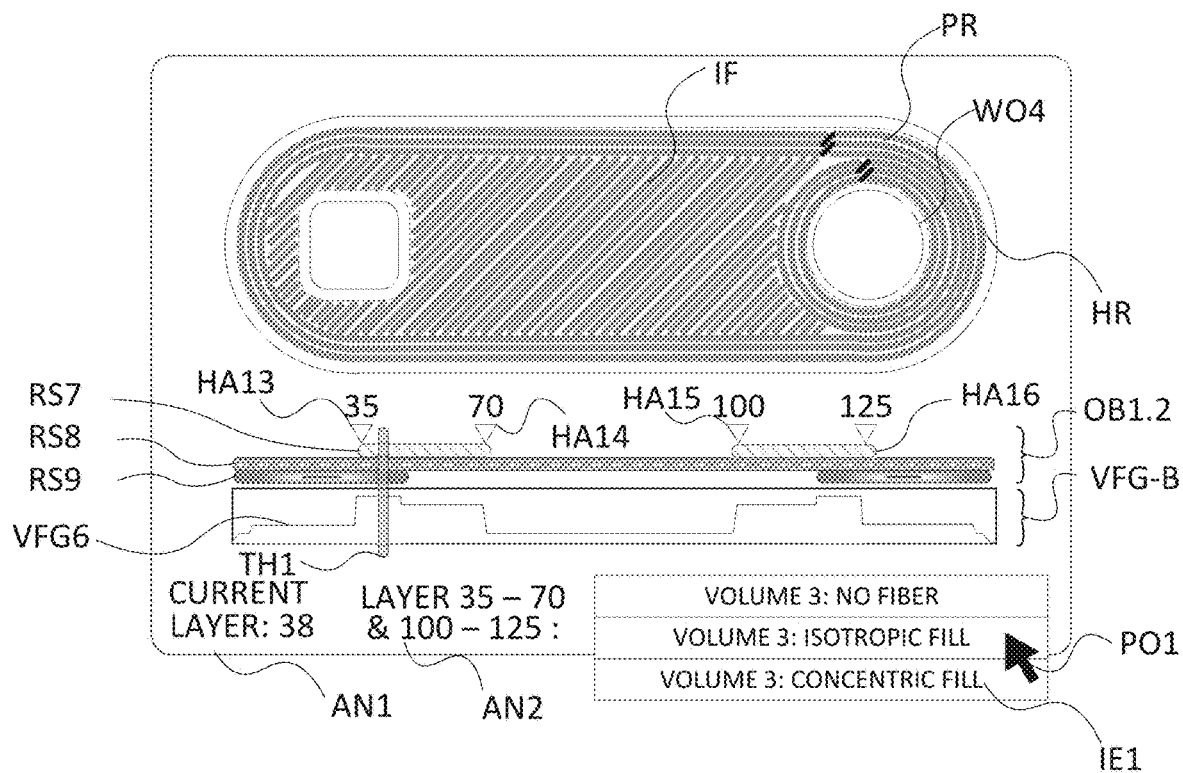

FIGS. 10I and 10J show an alternative embodiment of the orthogonal layer topography bar OB 1.2a-OB1.2c, an alternative approach to the orthogonal layer topography bar OB 1.1 of FIG. 10E. As shown and described, like elements throughout the figures are often like numbered, but some numbers may be omitted in these views. The description of elements of substantially identical appearance in other drawings generally applies to FIGS. 10I and 10J, including the described associations among displays, processes, and databases. The orthogonal layer topography bar OB 1.1 of FIG. 10E is described in the context of exclusive rule sections RS1-RS4 (although it may be used with non-exclusive rule sections), FIGS. 10I and 10J are described in a context of rule sections RS7-RS9 which may overlap. As shown in FIGS. 10I and 10J, the orthogonal layer topography bar OB1.2 is formed as a set of independent orthogonal subbars OB1.2a/RS7 through OB1.2c/RS9, each subbar OB1.2a through 1.2c or rule section RS7 through RS9 being associated with adjustment handles at each end of each section.

As shown in FIG. 10I, extending across a lower part of the display 1002, the volume fill graph section VFG-B display element is a topography representation of approximately 150 layers, the same as or similar to the volume fill graphs of FIGS. 10E-10H. As shown by the position of the thumb TH1, the currently displayed layer is layer 6 within rule section RS9, within which layers 4-44 and 107-147 include approximately 25% fiber fill as shown by the volume fill graph section VFG4, VFG5. As shown, rule section RS9 is non-contiguous in two parts, i.e., the display, interface, and database may record and apply customized or default rules (toolpath, region, or layer) to non-contiguous but associated ranges of toolpaths, regions, or layers. Rule section RS9 is selected via pointer P01, and is highlighted between rule adjustment handles HA9 and HA10, and again between handles HA11 and HA12, with annotation AN2 indicating that the common ranges of the rule of the selected rule section is layers 4-44 and 107-147, and annotation AN3 indicating that the rule selectable for an associated "Volume 1" (e.g., a volume formed by the height of the layers 4-44 and 107-147 and either an entire layer or a region within a layer) is a "CONCENTRIC FILL" rule (from among fiber fill types, with the selectable rule itself being changed, e.g., via the selection panel 1004). Reflecting the current index layer, the depicted model shows concentric fill of about 25 percent fiber content in layer 6 within the rule ranges.

FIG. 10J shows a set of changes from the state of FIG. 10I of the display state as well as corresponding processes and databases. In particular, FIG. 10J shows the addition of two additional rule sections RS8 and RS7 to the displays, processes, and databases. Rule set RS8, for example, is a rule applicable from layer 3 to 150, in this case, for example, a rule prescribing the concentric, inner negative contour following hole wall reinforcement pattern HR, surrounding the through-hole W04 which passes through the part in each layer. Rule set RS7, for example, is a rule applicable in layers 35 through 70 and 100 through 125, in which isotropic fill is prescribed for a particular defined region or volume, or for example for any area which is not otherwise subject to a higher priority rule (not that the priority of the rules could be adjusted, e.g., by restocking (rearranging) the rule layers RS7, RS8, RS9 such that the priority order is the order of the stack). As shown in FIG. 10J, the position of the thumb TH1 is shifted to layer 61. The currently displayed layer is layer 50 spanning rule sections RS7, RS8, and RS9, within which the displayed layers includes the 25% volume outer perimeter following concentric fill of rule RS9, the 10% volume circular negative contour perimeter following concentric fill of rule RS8, and the 75%+ volume isotropic fill IF, at this level a 45 degree boustrophedon fill, of rule RS7. As noted, an isotropic fill IF will have a different angle depending on the level (e.g., rotating among 0, +45, −45, and 90 degrees to form repeating quasi-isotropic wafers). As shown by the volume fill graph section VFG6, the 10%, 25%, and 75% volume fill are additive on layers where rules overlap, indicating the simultaneous operation of the rules. Interface element IE1 is selected via pointer P01, and is shown in a configuration in which the layers indicated by annotation AN2, i.e., layers 35-70 and 100-125, may have a common rule selected for them, in this case isotropic fill. Similarly to the FIG. 10J, annotation AN2 indicates that the rule is selectable for an associated "Volume 3" (e.g., a volume formed by the height of the layers 35-70 and 100-125, and either an entire layer or a region within a layer) is an "ISOTROPIC FILL" rule (from among fiber fill types, with the selectable rule itself being changed, e.g., via the selection panel 1004).

In the case where rules may "overlap" per layer, this may occur in at least two forms. First, within a layer, different regions may have independent rules (e.g., as shown in FIG. 10J, each of three regions—outer perimeter of three fiber rings, hole reinforcement of three fiber rings, and boustrophedon fill of the remainder—may be defined by region). Second, for any path, region, layer, or volume, rules may take precedence by a predetermined priority. As described with reference to FIG. 8, one possible priority for rule category precedence is toolpath rules being of highest priority, followed by region rules, then layer rules, then volume or global rules. Within each category, as described with reference to FIG. 8, user customizations are of higher priority than default rules, other than safety or minimum functionality defaults.

Figure 10K:
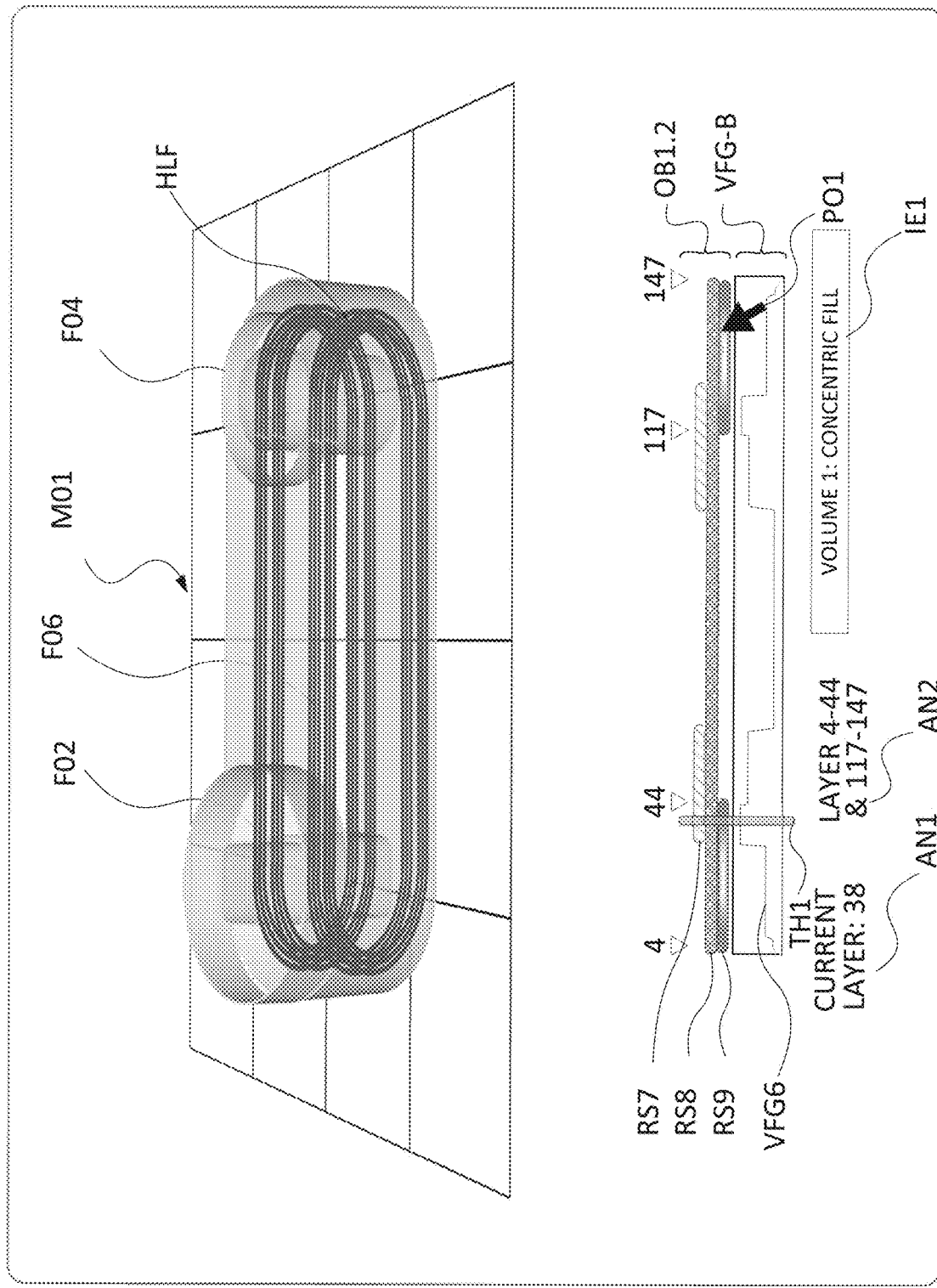

FIG. 10K shows an alternative display approach to that of FIG. 10E-10J. The bottom portion of the display 1002 is similar to that of FIG. 10I, with the volume fill graph section VFG-B display element as a topography representation of approximately 150 layers, the same as or similar to the volume fill graphs of FIGS. 10E-10H. As shown by the position of the thumb TH1, the currently displayed layer is layer 38 within rule section RS9, within which layers 4-44 and 107-147 include approximately 25% fiber fill as shown by the volume fill graph section VFG4, VFG5. A 3D rendering of the accumulated layers of the part is shown instead of a 2D layer plan view. Optionally, the 3D rendering is more transparent with respect to fill material, walls; and comparatively less transparent for fiber material; optionally with additional luminance for highlighted sections of fiber material. As shown, section RS9 is selected via pointer P01, and a fiber highlight FHL corresponding to the fiber tracks of rule section RS9 is arranged and/or highlighted within the 3D rendering of the part.

Accordingly, a machine implemented method for displaying 3D printable model shells on a display 1002 may include displaying a multidimensional shell of a sliced model (such as the 2D additive manufacturing layer representations of FIGS. 10E through 10J, or the 3D rendered additive manufacturing model, mesh, or accumulation of layers representation of FIG. 10K) on the display. An orthogonal bar OB1.1, OB1.2 is displayed together with the displayed shell(s) parallel to an edge of the display. A first proportional grouping bar RS1~RS9 is displayed relative to a first range, similarly/respectively RS1~RS9 of the orthogonal bar OB1.1, OB1.2, the first proportional grouping bar RS1~RS9 representative of a first toolpath rule (e.g., no fiber, concentric, isotropic) common to a first range of shells at index positions within the range. A movement of a pointer P01 in a direction relative to the display and/or an actuation of the pointer is detected (e.g., a mouse click; a touchscreen tap; a button press associated with pointer). In response to detecting the movement and/or the actuation of the pointer P01, one or both of the toolpath rule or the range is changed. For example, in response, the printer or its slicer processing may be configured to change the first toolpath rule common to the first range of shells to a different, second toolpath rule common to the first range of shells. In the alternative or in addition, the printer or its slicer processing may be configured to change the first range of shells to a different, second range of shells having the first toolpath rule common thereto. Subsequently or simultaneously, the printer or its slicer processing may be configured to change the displayed multidimensional shell of the sliced model so that the change of the toolpath rule and/or the change of the range of shells is one of highlighted or displayed.

FIGS. 11A-11D show an exemplary display on the view panel 1002, and each is generated by rendering to each display 2D definitions (optionally presented in 3D) of contours, subcontours, and toolpaths, with optional processing for occlusion and showing and hiding particular feature types. In FIGS. 11A-11D and in like representations described in this specification, regions/subcontours may be shown with dotted lines; fiber toolpaths with grayscale, wider lines; and matrix or resin fill toolpaths with solid lines (excepting short, dark segments extending between fiber toolpaths, which represent crossovers in S, L, or U shape). In some a toolpath may represent either resin/material fill or fiber (e.g., for honeycomb, triangular, or other volumetric sparse fill).

Figure 11A:
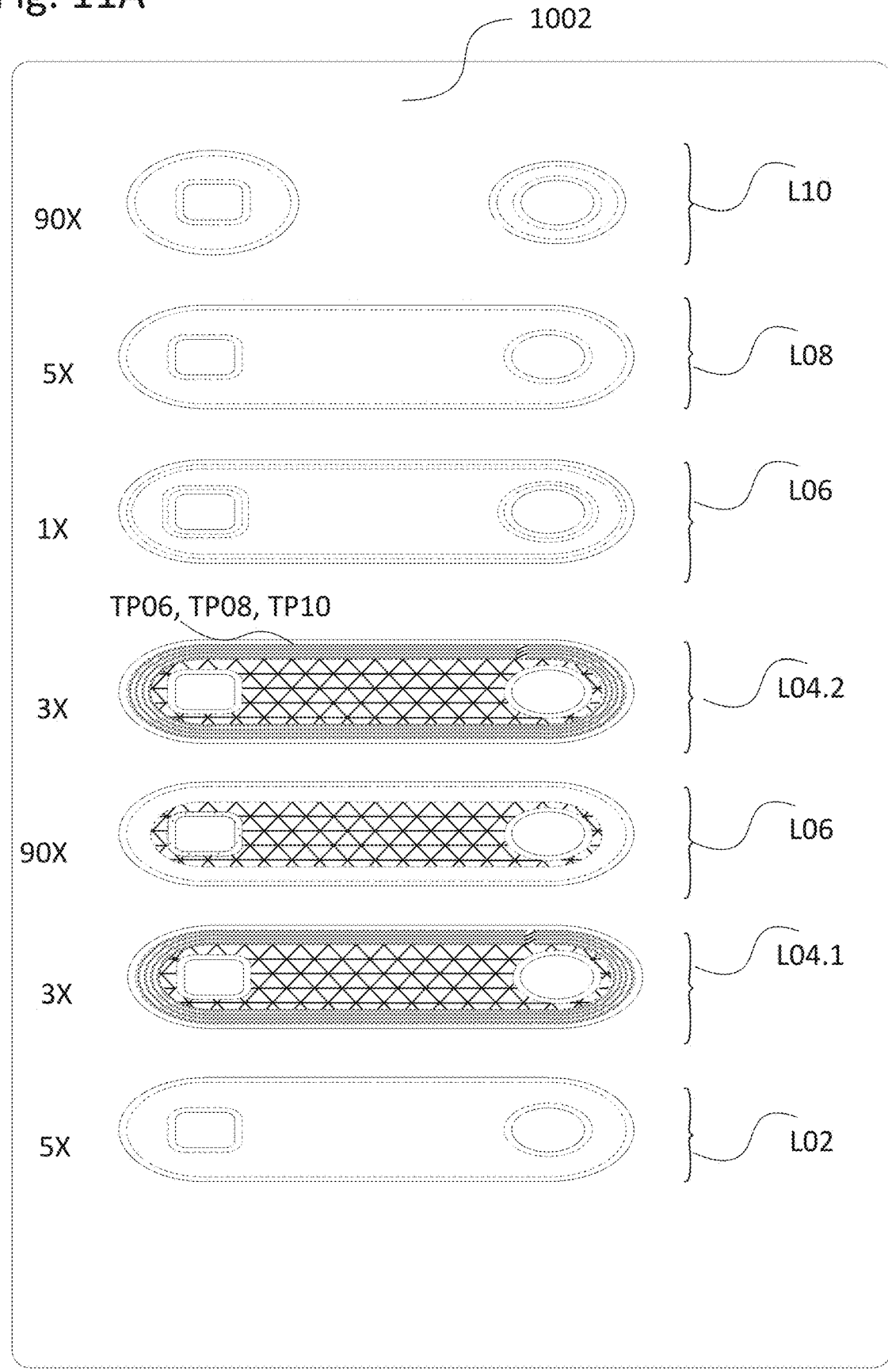
Figure 11D:
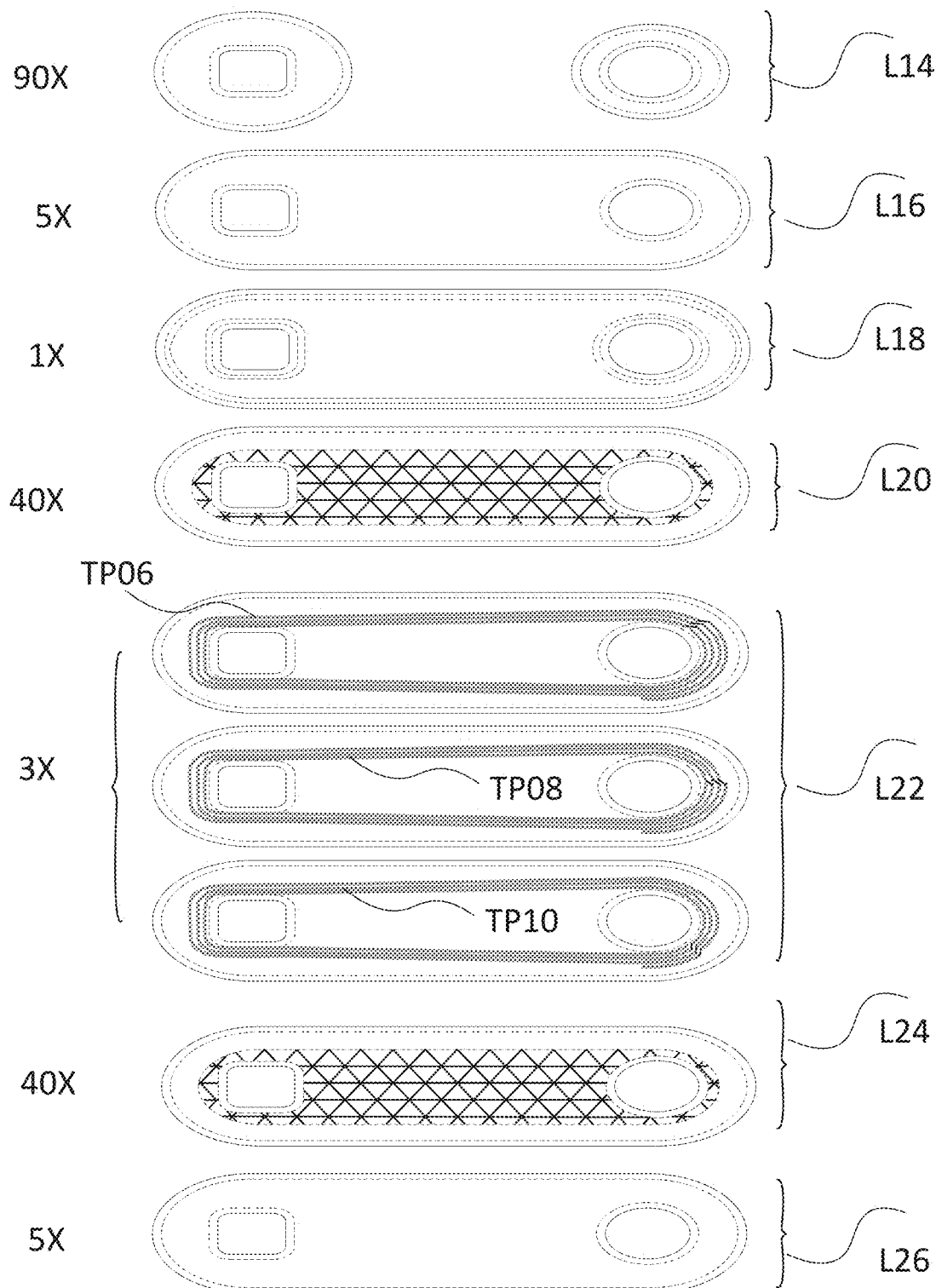

FIGS. 11A-11D also corresponds to the toolpaths generated by the operation of FIG. 10A-10I (display), FIGS. 8 through 9A-9D (process control), FIGS. 5A, 5B (rule sets and data structures). As defined by contours, subcontours, and toolpaths, the exemplary part as initially configured to be printed represents a layer definition of slicing to the path generator, a display on the view panel; a definition of contours, subcontours/regions; and a definition of a subset of toolpaths. In FIG. 11A and similar figures, a notation with "X" indicates a layer is repeated, e.g., a number of times, (possibly through a cycle of complementary layer patterns) that number of times, e.g., "90×" means 90 adjacent layers forming a set.

Fiber reinforcement strategies, which may in some cases be used in combination and which may have sub-strategies, include Concentric Inward, Boustrophedon (ox rows, also known as raster, or as isotropic, or quasi isotropic when the direction of rows is rotated or alternated in adjacent layers), Concentric Outward, or Sandwich Panel.

Concentric fill is performed within a layer by first obtaining 80-105% (preferably 85-99%) fiber-width offsets from an outer perimeter of a region of the layer. That is, the offsets form concentric paths that are 80-105% (preferably 85-99%) of the fiber-width as laid. One advantageous globally set region is the non-wall region adjacent a shell or wall thickness region (e.g., 1-3 bonded ranks thick). Fiber is deposited by controlling the deposition head to stroke the center of the concentric fiber fill offsets. When the offset has been looped, an S-shaped, L-shaped or U-shaped crossover or bend lays fiber into the neighboring offset. Concentric fill is suitable for bending and tension loads in particular, and is efficient (fewer turns) as well as inherently strong (no fiber separation permits more force to be transmitted and distributed along the fiber length). As a global setting, concentric fiber fill may be set to be adjacent a floor and or a roof, and/or at a set number of layers from the top and/or bottom of the part. In the alternative, spiral or concentric fill may have no particular orientation, as its direction depends on the perimeter of the part. Optionally, the concentric fill algorithm may be used for other strategies (e.g., for surrounding holes or hole splines for reinforcement). As noted, other settings can be used in combination to, e.g., migrate the crossover or bend between layers, locate crossovers in a particular place, or repeat or vary concentric fill patterns.

Ox-row fill or Raster fill is performed in back and forth rows. U.S. Pat. No. 6,934,600, herein incorporated by reference in its entirety, discloses various implementations of raster fill for nanotube impregnated three dimensional printing. Ox-row fill is performed by specifying an orientation of rows (e.g., lengthwise, widthwise, or at a specified angle) and a region. One advantageous globally set region is again a non-wall region adjacent a shell or wall thickness region. Parallel straight rows, offset by 80-105% (preferably 85-99%) of the fiber width as laid, are calculated side by side traversing the region. If a cutter is available sufficiently close to the tip of the deposition head, the fibers may be cut at each turn, alternating turns, every 3 turns, according to a desired fiber length, and so on. However, a boustrophedon path is optional. Boustrophedon paths can be connected at end rows by 180 degree curved fiber paths of the same diameter as the offset, and/or by folded paths of two right angles (these may alternate). Fiber is again deposited by controlling the deposition head to stroke the center of the concentric fiber fill offsets. When the offset has been looped, an S-shaped crossover lays fiber into the neighboring offset. As a global setting, ox-row fiber fill may be set to be adjacent a floor and or a roof, and/or at a set number of layers from the top and/or bottom of the part. Ox-row fill may be set to substantially repeat a direction of fill (for increased cumulative strength in that direction, or to provide arbitrary or predetermined patterns of two, three, four or more varying directions to increase multi-directional strength (e.g., 90-90 would represent two adjacent 90 degree perpendicular layers; 60-60-60 three adjacent layers each rotated 60 degrees, 45-45-45-45 or 90-45-90-45 four layers following a repeating pattern of reinforcing crisscrossing layers).

Figure 11E:
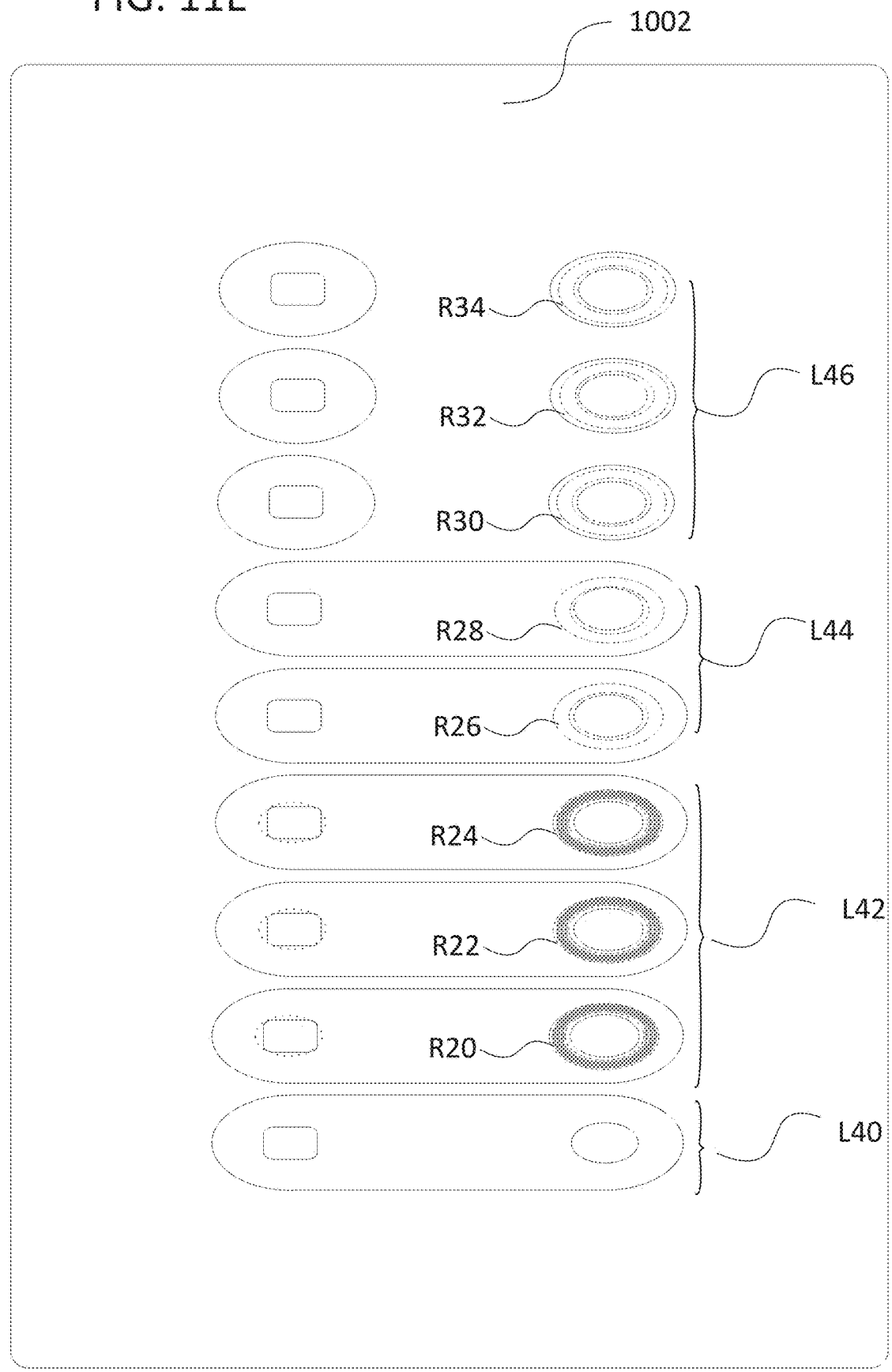
Figure 11H:
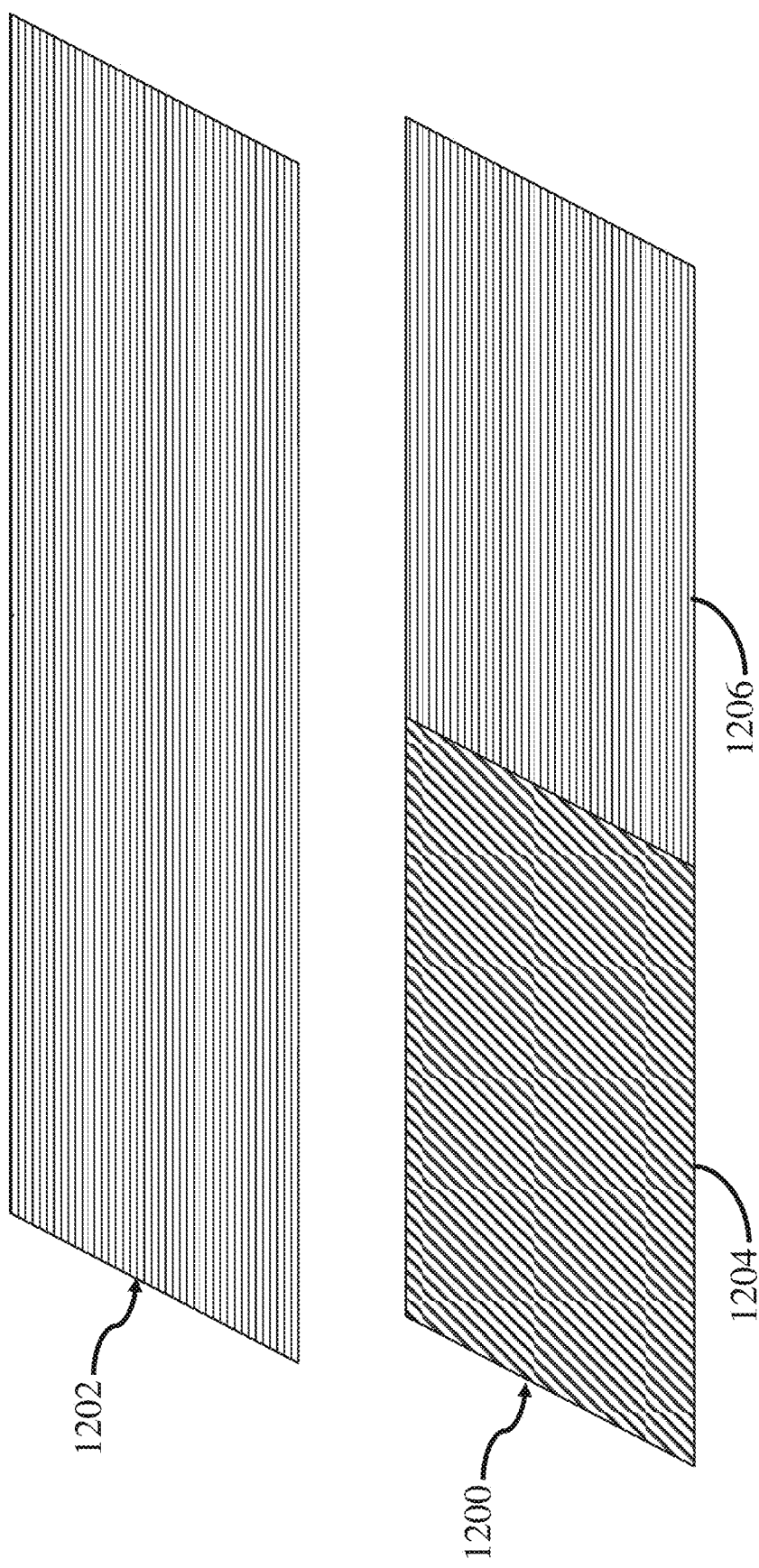
FIG. 11H shows exemplary composite layup via 3D printing of composite fibers as disclosed herein in contrasting directions.

In this regard, successive layers of composite may, like traditional lay-up, be laid down at 0°, 45°, 90°, and other desired angles to provide part strength in multiple directions and to increase the strength-to-weight ratio. The controller 20 may be controlled to deposit the reinforcing fibers with an axial alignment in one or more particular directions and locations. The axial alignment of the reinforcing fibers may be selected for one or more individual sections within a layer, and may also be selected for individual layers. For example, as depicted in FIG. 11H a first layer 1200 may have a first reinforcing fiber orientation and a second layer 1202 may have a second reinforcing fiber orientation. Additionally, a first section 1204 within the first layer 1200, or any other desired layer, may have a fiber orientation that is different than a second section 1206, or any number of other sections, within the same layer.

Concentric fiber outward fill is distinct in from concentric fill in that (i) the fiber loops are offset from an inner perimeter formed by an envelope about features or parts to be spanned, rather than outside in. Otherwise, the description with respect to concentric fill applies as would be understood by one of ordinary skill in the art. Fill is performed within a layer by first determining an interior region to be surrounded, e.g., first obtaining an envelope about two features to be circled. Offsets are generated at 80-105% (preferably 85-99%) fiber-width from an outer perimeter of the envelope. Fiber is deposited by controlling the deposition head to stroke the center of the concentric fiber fill offsets. Any S-shaped, L-shaped or U-shaped crossovers may be concentrated on the lengthwise ends, i.e., the curves. of the loops. Alternatively, as with concentric, a "spiral" offset of linearly increasing offset distance may be used to avoid crossovers, but a spiral offset typically does not fully wrap features such as holes. Optionally, the envelope generation and inner perimeter start may be used for other strategies. Through-hole fill, as an example, may treat each hole as an envelope, and extend the fill from top to bottom of the part, lining a hole along greater than 80 percent of its top-to-bottom length. As noted, other settings can be used in combination to, e.g., migrate the crossover between layers, locate crossovers in a particular place, or repeat or vary concentric fill patterns.

As an example, the embodiment of a part rendered and processed as shown in FIGS. 11A-11D include, but are not limited to, the operation of the following rules:

(i) concentric fiber fill in the region R08 between the outermost wall region R06 and the neighboring region R10;

(ii) pure polymer, fill material, or fiber triangular infill in the region R10, which may be a remainder region (set after the other regions are defined) extending between the limits of the fiber fill region R08 and the negative contour W02, W04 outlining wall regions R02, R04.

(iii) a sandwich panel, outer shell, inner shell, outer/inner shell, or cellular rule as discussed below; and (iv) a rule to outline or reinforce holes as discussed below, among other rules.

It should be noted that although similar regions in FIGS. 11A-11D and figures of similar appearance are similarly labeled for the purpose of discussion, a region is in most cases recorded a per-layer entity, and may be encoded as associated with other regions, as part of a set, or otherwise.

As defined in a data structure and rendered in FIGS. 11A-11D, beginning at the first printing surface (shown at the bottom in FIG. 11A, but which may be at the top for printing techniques which build down), a layer set L02 includes multiple slices (e.g., 5× slices at 0.1 mm for a 0.5 mm height) through the torque transmitting feature F02 and slip fit feature F04 shown in FIG. 10A. Each layer of set L02 is shown with four regions: three wall regions R02, R04, R06 at each of outer positive contour W06 and two inner negative contours W02, W04, as well as a dense or solid fill region. Layer set L02 includes successive layers of "floor" following the number of floors set as a parameter, and may be "solid" filled (e.g., having a toolpath for unreinforced material or plastic that fills in the entire layer, either by tight raster/ox row fills or offsets).

Layer set L04.1 is generated by various rules, and includes, but is not limited to, six regions in each layer: the three wall regions R02, R04, R06 of lower layer set L02 reproduced and/or extended, a sparse fill region of triangular cells R10, and a fiber concentric fill region R08. The concentric fill region R08 as a "fiber fill" would be generated after the walls R02, R04, and R06, but before the sparse fill region R10 (e.g., per steps S8562-8560 of FIG. 9A). As shown in FIGS. 11A-11D, the concentric fill rule observes the precedence of the wall or shell rule (e.g., contour walls are 3 shells thick, as set and recorded by default or by parameter entry similar to FIG. 10A), and generates three successive offsets (per, e.g., parameter P06 of FIG. 10A). As discussed herein, a "rule" may take the form of a subroutine, class, object, script, state machine, or other executable code; and/or of a set of sequential primitive operations. Crossover toolpaths TP06 are shown in an exemplary default position. Three fiber layers are set as parameter P06 in FIG. 10A (from an exemplary available 1-10, but fiber layers may be set up to and including the entire set of layers).

Layer set L04.2 is similar to layer set L04.1 (may be identical, or may be complementary). The operation of a sandwich panel rule as set by parameter P12 in FIG. 10A creates two layers sets L04.1 and L04.2 separated by a sparse infill layer set L06. A sandwich panel rule or fill may be considered a special case or combination of other fills, under operation of a combination rule. In the case of sandwich panel fill, two sets of multi-layer fiber fills (such as concentric, ox-row or ox-row in four 45-45-45-45 angled layers) are separated in the direction of printing. Between these two sets, a cell-based infill provides a web connecting the strong layers. Different processes may be used to arrange the sandwich panel. In one embodiment, a rectangular prism nucleus is expanded to fill the interior space available (e.g., until abutting exterior shells/walls, floors, and or/roofs), and at least one top and bottom layers of the prism are fiber filled with the selected fiber pattern (e.g., concentric, ox-row or 4 layers of ox-row at 45-45-45-45 angles), with the intervening layers being filled with a cellular infill (optionally with fiber cellular infill, as discussed herein). In another embodiment, a start layer having a substantial interior region is filled with fiber (e.g., a layer adjacent a floor or roof occupying more than 50% of the layer area, or a layer having the greatest area), and if the substantial interior region is repeated in parallel for a certain number of layers (e.g., 100 layers), then the sparse polymer infill is again filled.

The sandwich panel rule set by parameter P12 is shown in combination in FIG. 11A, optionally in FIGS. 19D-19E with the concentric fill or a quasi-isotropic fill rule, and operation of other rules are complementary. In some cases, the additional rule will act as a parameter of the sandwich panel rule and change the operation of that rule. For example, if parameter P11 is set to ox-row fill, the fill in layers L04.1 and L04.2 may be carried out in a tight "raster" pattern as discussed in U.S. Pat. No. 6,934,600, or collectively rotating angle quasi-isotropic pattern, but would remain several layers with fiber fill L04.2 separated by many more sparse infill layers L06 from another set of complementary layers L04.1 to complete a part particularly strong in bending because of the increase effective moment of inertia of the sandwich panel form. In other cases, the additional rule would operate separately in a predetermined priority or order of operation. For example, when the "reinforce through holes" rule of parameter P14 is set, either or both of the holes through torque transmitting feature F02 and slip fit feature F04 would be surrounded and reinforced by generating offsets about higher priority protected regions, extending from top to bottom (L02 . . . L10), as modified by other parameters. FIG. 11E shows a reinforced through hole of this type, although in the case of FIG. 11E the hole is reinforced by a region extrusion operation rather than a global rule.

In addition, the sandwich panel rule or fill may incorporate shells in the manner shown and describe with respect to FIGS. 19D-19J, in part or in whole, and embedded within a part or extending to the outer shell. The structure of FIG. 19E may be created with the operation of a sandwich panel rule in which, similar to layers L04.1, L04.2, and L05, concentric fill creates offsets from the outermost protected region (in the case of FIG. 19E, without an outermost protected unreinforced resin wall). The structure of FIGS. 19F and 19G may be created with the operation of a sandwich panel rule in the case of FIG. 19F in which the concentric fill is set to a higher number of fiber shells toward the perimeter of the (e.g., twice as many as outer layers on the centroid side, which could be carried out herein at least as a global rule, a region edit, a layer edit, or a dropped library object), or in the case of FIG. 19G in which a higher number of fiber layers is set. Similarly, the structures of FIGS. 19H-19J may be created with the operation of a quasi-isotropic set sandwich panel rule for pattern 1352-QI, an outer concentric rule for pattern 1352-O.CON, an inner concentric rule for pattern 1352-I.CON and/or 1350-IF. A wafering rule may create the succession of separated quasi-isotropic sets 1352-QI as in FIG. 19J, and a cellular fiber infill rule may create the cellular fiber infill walls 1352-CLW and/or 99Z as shown in FIG. 19J.

Continuing with FIGS. 11A-11C, layer set L06 is generated by a roof parameter variation which specifies that additional walls L06B must be surround the inner and outermost walls of outer and inner contour walls regions L06A, in order to provide anchor points for the solid or dense fill in the lowermost roof region (in this case, the initially formed anchor walls may be overrun by the toolpath of the sparse fill to provide the anchor). Layer set L06 is generated by a roof rule similar to the floor rule of layer set L02, and layer set L10 completes the torque transmitting feature F02 and slip fit feature F04 with dense fill (e.g., 90 layers at 0.1 mm, for 0.9 cm height).

Any exception fill (e.g., per step S8568 of FIG. 9A) may be of second lowest priority and conducted before the remainder sparse infill, optionally with special control parameters. For example, should any interstitial distance between bonded ranks formed between borders of regions R02, R04 and the fiber fill region R08 be smaller than the width of the nominal width of fiber printing, a slower extrusion, higher temperature, slower feed speed, slower curing speed, or the like of pure resin fill may be tuned to inject or deposit fill into the interstitial area before the remainder pattern fill is used to sparsely reinforce the interior. An exemplary interstitial, exception fill is shown as region 12 of FIG. 10D. In this situation, changes made to fiber pathing via the tools of FIG. 10C may create an interstitial area between a fiber region and negative contour wall region, which is optionally treated as an exception to the sparse infill region R10A.

Accordingly, the operation of the global rule set, in the form of executable code or parameters controlling parameterized executable code, permits automated path generation, and global customizations. As noted, although the global rule set is in one embodiment of lesser priority than path, region, or layer customizations, it may be the first sequential rule set that conducts toolpath generation.

In one embodiment, the per-layer operation rule set and order of operations includes a subset or superset of the global operations shown in FIG. 9A, but is essentially similar. The user (or an automated overriding function) may change many of the global rules on a layer by layer basis. Layers are, or are optionally, each processed in the order shown in FIG. 9A.

FIG. 11E shows a second exemplary region select and extrude operation per FIGS. 9C and 10D. As defined in a data structure and rendered in FIG. 11E, beginning at the first printing surface, a layer set L40 of "floor" layer includes one representative slice (although more floors would be used in practice, this layer is not used in the example). By prior operation—for example a layer rule and/or, a toolpath rule and/or edit, or a prior region rule and/or edit, layer set L42 includes three regions R20, R22, R24 having concentric hole reinforcement, extending through three layers.

Using the tools of FIG. 10D and the operations of the processes of FIG. 9C, the user sets the current layer to the top layer of layer set L42, and selects the region R24 with the region selection tool. The region is extruded, using the region extrusion operator, up five layers, through layer sets L44 (roof layers of similar contour) and L46 (circular mounts of much smaller contour). Should the region R24 not extrude well into the smaller contour, it can be shaped using the tools and operators. For the present example, the region R24 replicates unchanged in form as an extrusion, now regions R26-34. The user receives a warning that a global rule is in conflict (i.e., a global rule requirement of a roof in the topmost layer of the part, of layer set L46), and declines to overrule the global rule. Having committed the extrusion, the user is prompted with a choice of fills (e.g., selectable from (i) the same identical fill as the parent region, (ii) a newly pathed fill of the same type as the parent region, or (iii) a new fill of any compatible type). The user selects identical fill, which is propagated (contingent on any overriding global rules) to the penultimate layer of layer set L46.

Accordingly, the operation of the region level rule set, in the form of executable code or parameters controlling parameterized executable code, permits automated region generation, and region customizations. As noted, although the region rule set is in one embodiment of lesser priority than path, but greater priority than layer or global customizations, this priority may be otherwise arranged.

The controller 20 of the printer 1000, may, as described herein, supply a multi-strand core reinforced filament 2 including a flowable matrix material 4a and a plurality of substantially continuous reinforcing strands 6a. The strands are preferably of a material having an ultimate or tensile strength of greater than 300 MPa (e.g., see Materials table). The substantially continuous reinforcing strands 6a extend in a direction parallel to a length of the filament 2. The controller 20 of the printer 1000 controls the actuators and heaters to deposit a first consolidated composite swath 2c of a height less than ½ the width of the filament 2 in a first reinforcement formation, e.g., 99A-99Z, including at least one straight path 991 and at least one curved path 992. Curved paths include both (i) curves in which the corner radius is greater than 2 times the composite swath 2c width—as deposited—as well as, or in the alternative (ii) sharp corners, as unfolded or folded corners, having a corner radius from 0 to twice the composite swath 2c width. The controller 20 of the printer 1000 controls the actuators and heaters to flow the matrix material 4a and applying an ironing force that spreads the reinforcing strands 6a within the filament 2a against a deposition surface 16, 14, or 2d (once spread, the material may be considered a bonded rank or consolidated swath 2c).

The controller 20 of the printer 1000 controls the actuators and heaters to deposit a second consolidated composite swath 2c, optionally also of a height less than ½ the width of the filament, in a second reinforcement formation 99A-99Z including at least one straight path 991 and at least one curved path 992, by flowing the matrix material 4a and applying an ironing force to spread the reinforcing strands 6a within the filament 2 and/or second consolidated swath 2c-2 against the first consolidated composite swath 2c.

Yet further alternative or additionally, the controller 20 of the printer 1000 controls the actuators and heaters such that the first consolidated composite swath 2c and second consolidated composite swath 2c are deposited in a location adjacent to and reinforcing a negative subcontour. In this case, "reinforcing" means following or tracing along a perimeter, wall, load line, stress concentration, or a trajectory drawn between the same. "Adjacent" means immediately adjacent, and also separated by a small number (e.g., 1-5) of coating, smoothing or compliant neat material 18a walls, floors, or ceilings. A negative subcontour may be a hole, or an embedded material or object or set-aside for same, or a second object with surfaces intruding into the layer or a set-aside for the same, or an overmolding, or in some cases a touching loop surrounding a hole, embedded object, or intruding object. In this technique, alternatively or additionally the first consolidated composite swath 2c and second consolidated composite swath 2c may be deposited in respective (adjacent) first and second layers $LA_n$, $LA_{n+1}$ in locations adjacent to and reinforcing a negative subcontour extending through each of the respective first and second layers $LA_n$, $LA_{n+1}$.

In some embodiments, a core reinforced filament 1854 is used to form a hole directly in a part, see FIGS. 11F and 11G. More specifically, the core reinforced filament 1854 comes up to the hole, runs around it, then exits from the direction it came, though embodiments in which the filament exits in another direction are also contemplated (e.g., FIGS. 13A-13C). A benefit associated with this formation method is that the hole is reinforced in the hoop direction by the core in the core reinforced filament. As illustrated in FIG. 11F, the core reinforced filament 1854 enters the circular pattern tangentially. Entering tangentially is good for screws that will be torqued in. In another version illustrated in FIG. 11G, the core reinforced filament 1854 enter the circular pattern at the center of the circle. Of course, it should be understood that other points of entering the pattern are also possible. In one embodiment, the entrance angle may be staggered in each successive layer. For example, if there are two layers, the entering angle of the first layer may be at 0 degrees while the entering angle for the second layer may be at 180 degrees. This prevents the buildup of a seam in the part. If there are 10 layers, the entering angle may be every 36 degrees (e.g., staggering the entering angle by 360 degrees/10 layers) or any other desired pattern or arrangement.

Still further alternative or additionally, with reference to FIG. 20, the controller 20 of the printer 1000 may control the actuators and heaters such that depositing the first consolidated composite swath 2c and the second consolidated composite swath 2c as a continuous composite swath 2c spanning (e.g., via inter-layer continuous traverse SP30-A, SP30-B) two shells $LA_n$, $LA_{n+1}$ of an additive manufacturing process.

Still further alternative or additionally, the controller 20 of the printer 1000 may control the actuators and heaters such that the first consolidated composite swath 2c is deposited in a first reinforcement formation 99A-99Z that has a higher strength in tension between a first negative contour (or hole $H_a$) and a second negative contour (or hole $H_b$) than the second reinforcement formation 99A-99Z.

The secondary print head 18 prints fill material to form walls, infill, protective coatings, and/or support material on each layer, and as described herein, to smooth over protrusions into neighboring layers.

Consolidation, Compression and/or Flattening of Composite Swaths

A preferred technique for depositing a core-reinforced filament to become a fused composite swath includes compressing a core reinforced filament exiting a conduit nozzle to form a flattened shape (as discussed in the CFF patent applications).

The flattened shape is of variable height-to-width proportion, e.g., in cross-section from 1:2 through about 1:12 proportion. Preferably, the height of a compressed composite swath 2c substantially corresponds to the fill material layer height in the same layer $LA_1$, so that neighboring composite swaths 2c in the vertical direction can be tightly packed, yet be built up as part of the same or adjacent layers as the surrounding, complementary and/or interstitial fill material 18a.

Inter-layer interaction among composite swaths 2c and fill material 18a may be more involved than interlayer interaction among layers of fill material 18a. In most cases, an optional requirement for adjacent layers of fill material 18a is that they are satisfactorily fused in the vertical direction to avoid delamination, and in many cases the fill material 18a is fused (melted, or cured) under ambient or room pressure.

A core-reinforced multi-strand composite filament 2 may be supplied, for example, as a circular to oval cross section, and/or of approximately ⅓ mm in diameter and/or "13 thou" diameter.

As shown in Table 1 below, a circular cross-section filament 2 compressed during deposition becomes a progressively wider composite swath 2c. The table uses an example dimensionless diameter of 3 units for "round numbers".

As shown in the table, for any size of substantially circular cross section core reinforced filament 2, flattening to about ⅓ of its diameter becomes about 2.2~2.5 times as wide as its original diameter, and if flattened to about ½ its diameter becomes about 1.4~1.7 times its original diameter.

TABLE 1

Example Diameter (Circle): 3 units
Rectangle Compression

| | H | W |
|---|---|---|
| ⅔ D height | ~2 | ~3½ |
| ½ D height | ~1½ | ~4½ |
| ⅓ D height | ~1 | ~7 |
| ¼ D height | ~¾ | ~9½ |

For example, to complement an additive manufacturing layer height of 0.1 mm, a ⅓ mm diameter core reinforced filament 2 may be flattened to a composite swath 2c of roughly rectangular shape of proportion 1:6 through 1:12 (herein "highly compressed"), e.g., about 0.7~1.1 mm wide by about 0.07-0.12 mm high. One preferred ratio is roughly 1:9. Even higher compression may be possible, e.g., 1:12 to 1:20, but may demand significant system stiffness in the printer 100.

In contrast, to complement an additive manufacturing layer height of 0.2 mm, a ⅓ mm diameter core reinforced filament 2 may be flattened to a composite swath 2c of roughly rectangular shape of proportion 1:1.5 to 1:4 (herein "lightly compressed"), e.g., about a roughly rectangular shape of about 0.4-0.6 mm wide by about 0.2 mm high.

However, a fiber-embedded rectangular cross section of 1:1.5 to 1:3 is not as compressed or consolidated as one of 1:6 to 1.12 proportion, and in many cases, an relatively higher amount of consolidation is preferable to reduce voids and improve mingling of fibers in adjacent ranks 2c-2c or 2c-2d.

It should be noted that a supplied fiber reinforced filament 2 may have a constant cross-sectional area as supplied and as deposited (unless coextruded or supplemented); while a supplied FFF filament 18a has both a very different cross-sectional area as supplied and as deposited (having a much larger diameter as supplied), as well as variable cross-sectional area as deposited (having a bead size depending on extrusion rate). Given that a highly compressed composite swath is preferable to a lightly compressed one, combining a larger FFF extrusion rate layer height (e.g., 0.3 mm) with a highly compressed composite swath (e.g., 1:9 ratio) may be challenging. Accordingly, when a fill material height is such that the amount of compression is unacceptably reduced, more than one layer of fiber may be arranged per layer of fill material (e.g., 2 or 3 1:9 sublayers of 0.1 mm composite swath 2c per one respective 0.2 or 0.3 mm layer of fill material 118a). In this case, most or all fill material 18a is deposited after the composite swaths 2c; although in an alternative mode self-collision detection may be used to avoid contacting the nozzles to the part and the order of deposition thereby varied. In addition, in a modification of this process, the fill material height and compression amount may be selected to match stacks of 1:6-1:12 "highly compressed" composite swaths 2c (e.g., for a fiber of ⅓ mm diameter, the matching fill material 18a layer height capped at approximately 0.24 mm, because the highest acceptable "highly compressed" stack of two fibers is 1:6 ratio×2, or 0.12 mm×2).

It should be noted that the cross-sectional representation of reinforcing strands 4a within filament 2a and deposited swaths 2c are schematic only. In most cases, the reinforcing strands are in the hundreds to thousands of parallel strands within the filament 2a or swaths 2c.

Linkage Arm: Layer Toolpaths

FIGS. 12A-12J show composite swaths and/or path planning for layers of linkage arms or base plates. Herein, "linkage arm" or "base plate" includes e.g., any member having at least two holes H1, H2; H3, H4; H5, H6 which may link two additional members or support the connecting plate at two locations to a supporting member, inclusive of linkages, brackets, and the like. The linkage arms or connecting plates shown include hexagonal holes H1, H2, square holes H3, and round holes H4, H5 therethrough, and different combinations of these. In each case, a top down view presents a single layer view of an additive manufactured or 3D printed part, and in each case a few (three or four) cycles of outlining, following, or tracing approach for the composite swaths 2c and/or toolpaths, while in many cases the pattern of spiraling, offsetting, rastering, or sparse fill honeycomb may be continued to the limits of a cross-section, contour, or a neighboring section of spiraling, offsetting, rastering, or sparse fill honeycomb. As discussed herein, a typical vertical pitch or layer height for a 3D printed part is 0.1-0.3 mm (although coarser and finer layer heights may be used, as well as different layer heights within the same part). Accordingly, for a 0.1 mm layer height, a 1 cm high part would have 100 layers, and a 30 cm high part would have 3000 layers. In each case, two holes H1-H5 are shown although the same principles extend to multiple holes, negative, embedded or overmolded contours.

Figure 12A:
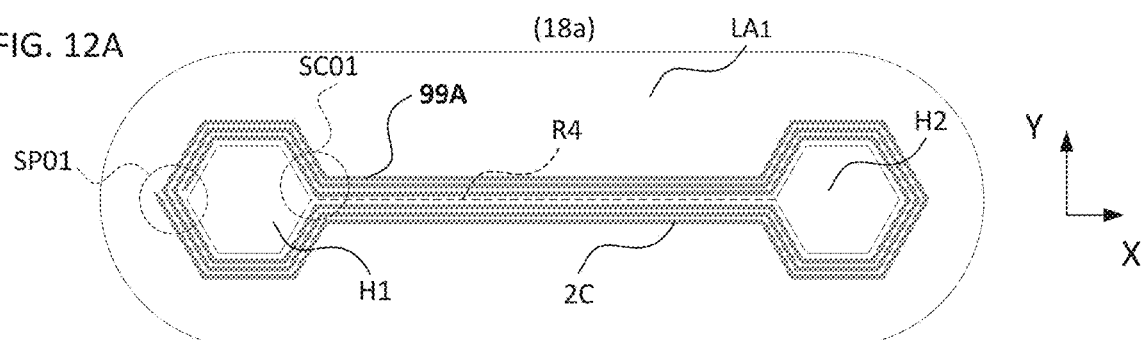

FIG. 12A shows a single layer of a connecting plate having two hexagonal holes $H_a$, $H_b$ (here labeled H1, H2). In several figures, including FIG. 12A, as shown, contours or region followed by the strategy are coincident with the hole wall. Alternatively, the contour or region followed may be offset from the hole wall (e.g., representing wall thicknesses of fill material 18a). In FIG. 12A, a reinforcement formation 99A having a spiral tracing strategy is used to follow the two internal contours of the hexagonal holes H1, joined by a shortest possible line (linking H1 and H2). As shown in FIG. 12A, the spiral tracing strategy begins B1 the toolpath on a side of a hexagonal hole opposite to the swaths extending between the two holes H1, H2, and is "anchored" on that side (i) against the hole wall (ii) by the angled curve about the hole wall and/or (iii) by surrounding composite swaths in the second and subsequent cycles/loops. The swaths 2c extending between the two holes H1, H2 may be expected to carry load in a tension mode, and the swaths 2c closely surrounding the holes H1, H2 may be expected to reinforce the walls of the holes H1, H2, in a combined tension-compression mode. The spiral toolpath ends E1 on the same side as it began in a proximate position, on a side of a hole H1 opposite the tension-bearing swaths, but may optionally be further "wound" about the hole H1 to improve "anchoring" (e.g., increase that length of fiber fused in matrix material and fill material that directly bears tension loads at the interfaces between fiber surface, matrix material, and fill material). While this strategy is of a toolpath spiraling outward from internal contours H1, H2, a very similar toolpath can be built in an inward direction (i) in the case where the outer contour of the part 14, $LA_1$ is shaped similarly to an offset of the holes H1, H2 and joining line or (ii) where a region bounding toolpath generation is set as a shape similar to an offset of the holes H1, H2 and joining, shortest distance line. For example, a composite swath 2c reinforcement formation 99S or toolpath may be generated by defining an internal region of the part 14, $LA_1$ as an origin for offset tracing starting from an outer contour and offsetting inwards.

Figure 12B:
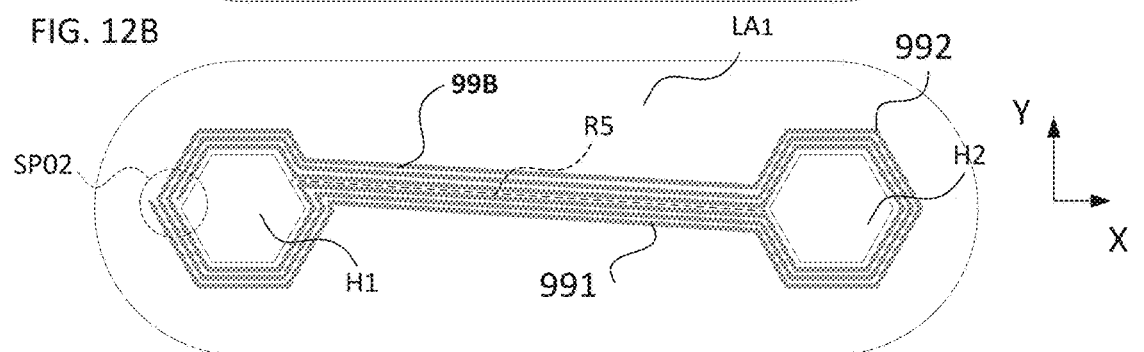

FIG. 12B shows a toolpath, composite swath, or reinforcement formation 99B similar to FIG. 12A, a single layer $LA_1$ of a connecting plate having two hexagonal holes, H1, H2 with a spiral tracing strategy is used to follow the two internal contours of the hexagonal holes H1, H2. In this case, in order to shift the stress concentration and Y-shape at which paths meet to a different location in at least one orthogonal direction and/or along the perimeter of a hole H1, the shortest line from which spiral tracing is offset or spiraled is shifted up along a hole boundary to a position displaced from the former stress concentration location in at least two orthogonal directions (e.g., in the X and Y directions as shown, and also in the Z direction as the displaced stress concentration is in a the next layer). FIG. 12H shows four superpositions, i.e., layers of this pattern, mirrored vertically and horizontally, to distribute the stress concentrations variously among the four layers. As discussed, the pattern or reinforcement formation of FIG. 12A may be combined with that of FIG. 12B for further combinations. It should be noted that for illustration purposes, each of the hexagonal, circular, and square holes represented throughout are generally of similar diameter or width, and the patterns can be variously combined as disclosed herein when not inconsistent with a hole shape or width (and with adjustment that would be readily understood by those of skill in the art). As an example, the patterns of FIGS. 12C and 12D are shown with both circular and hexagonal internal regions or contours at the hole locations (hexagonal holes and circular outline regions), and these patterns are suitable for surrounding and reinforcing hexagonal and circular holes.

Figure 12C:
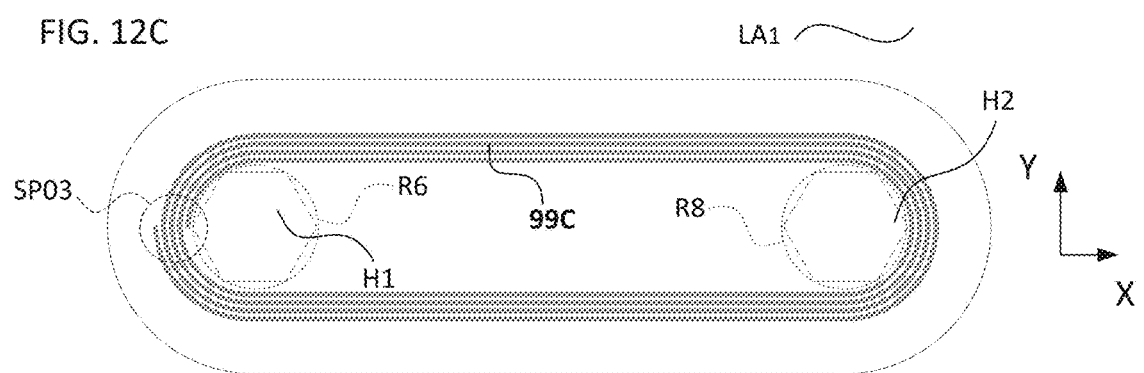

FIG. 12C shows a looped toolpath with minimum corners and gentle turns, formed with a spiral building outward from an envelope about circle regions R6, R8 surrounding respective hexagonal holes H1, H2 (optionally circular holes), a minimum composite swath length path that surrounds both holes H1, H2. This reinforcement formation is suitable for (i) tension loads between the two holes because of the several well-anchored and continuous loops. This reinforcement formation 99C is also suitable for (ii) transmitting torque about the holes, as rather than following the hexagonal hole walls, the circular regions circumscribing the hexagonal holes are reinforced with composite swaths along the direction of hoop stress encircling the holes. However, this toolpath/composite swath/reinforcement formation 99C as deposited does not particularly reinforce the straight walls of a hexagonal hole, and could therefore be used in combination with, e.g., a toolpath of FIG. 12A or 12B, or as in FIG. 12F or 12G in order to reinforce such walls.

Figure 12D:
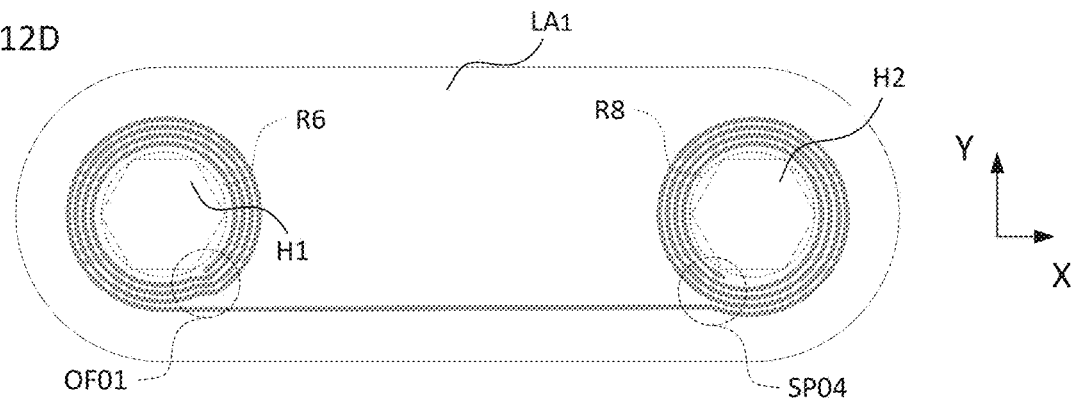

FIG. 12D shows a toolpath, fiber or composite swath pattern, or reinforcement formation 99D which reinforces in a loop about each of two hexagonal holes H1, H2 (or circular holes or regions R6, R8). FIG. 12D, which generally does not place a majority of composite swaths in a tension arrangement between the two holes H1, H2, may be more suitable for repeating throughout the entire height of a part, or together with an interior sandwich panel honeycomb portion of a part 14, in order to provide each hole H1, H2 with a solid tube of fiber reinforcement from top to bottom, to provide compression resistance vs. tightening of bolts or the like through the holes H1, H2. FIG. 12D also demonstrates that offset toolpath generation (left, e.g., see offset crossovers at OF1) and spiraling toolpath generation (right, e.g., see spiral start and finish at SP1) can be used in the same part, layer, or even toolpath, and FIG. 12I, which repeats the reinforcement formation 99D in differing orientations throughout several layers, shows that the stress concentrations/gaps in different kinds of toolpath strategy/ reinforcement formation and different locations can be varied. Varying can be accomplished, for example, by mirroring horizontally and vertically, and again, optionally by varying, regularly or randomly, the location of pattern crossovers, overlaps, starts, finishes, and/or gaps and about the periphery of the surrounded hole, feature, internal contour, embedded contour, negative contour, or overmold contour).

Figure 12E:
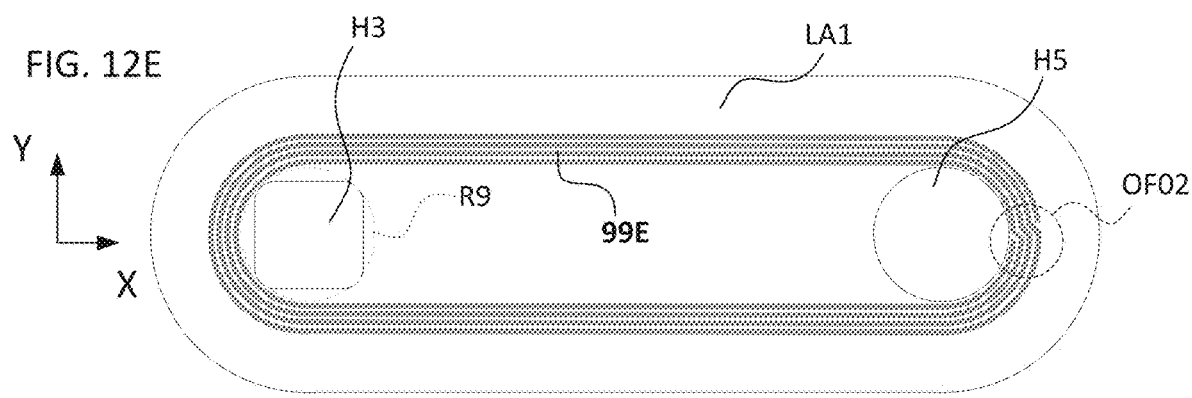
Figure 12F:
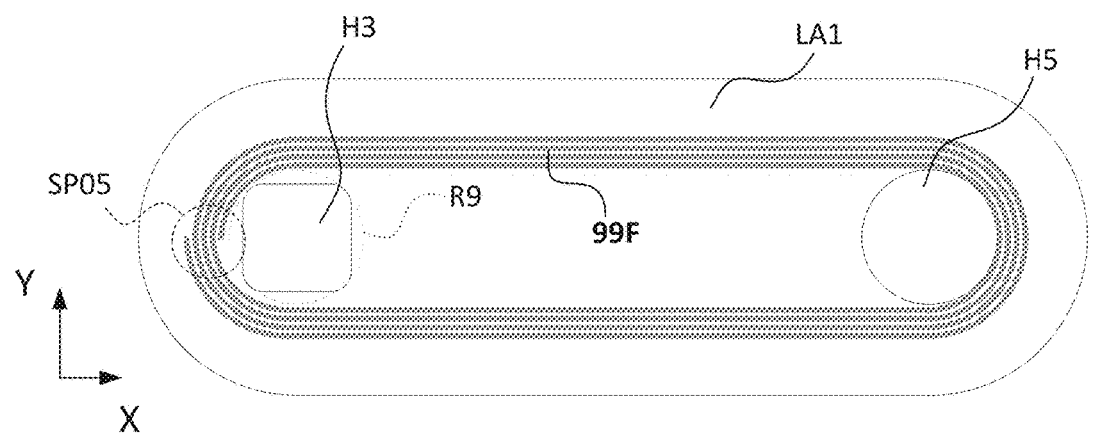

FIG. 12E shows a variation of FIG. 12F in which the toolpath, composite swath pattern, or reinforcement formation 99E is of offset approach, with crossovers OF02 at the opposite side of the part from the spiral start and end of the spiral strategy toolpath of FIG. 12F. FIG. 12F shows a toolpath, composite swath strategy or reinforcement formation 99F similar to FIG. 12C, as a spiral strategy, excepting that FIG. 12F shows a paired square hole H2 and circular hole H5 (e.g., for a torque arm application, alternatively replacing the square hole H3 with a circular fitted hole corresponding to region/contour R9) FIG. 12J shows the superposition of these toolpaths or composite swath depositions or reinforcement formations 99E, 99F of FIGS. 12E and 12F over two layers, placing the stress concentrations and/or gaps of the offsets and/or spiral start and end in positions displaced from one another in at least two orthogonal directions (here, substantially the X direction as well as the Z direction between layers). The controller 20 of the printer 100 causes the actuators and the heaters to turn the first fused composite swath 2c-1 according to the first reinforcement formation 99A-99Z toward a different direction at a first location, e.g., OF2. In printing the second reinforcement formation 99A-99Z, the printer 100 turns the second consolidated composite swath 2c-2 according to the second reinforcement formation toward a different direction at a second location e.g., SP05 displaced from the first location OF2 in at least two orthogonal directions (in this case, by example, in X and Z directions).

Figure 12G:
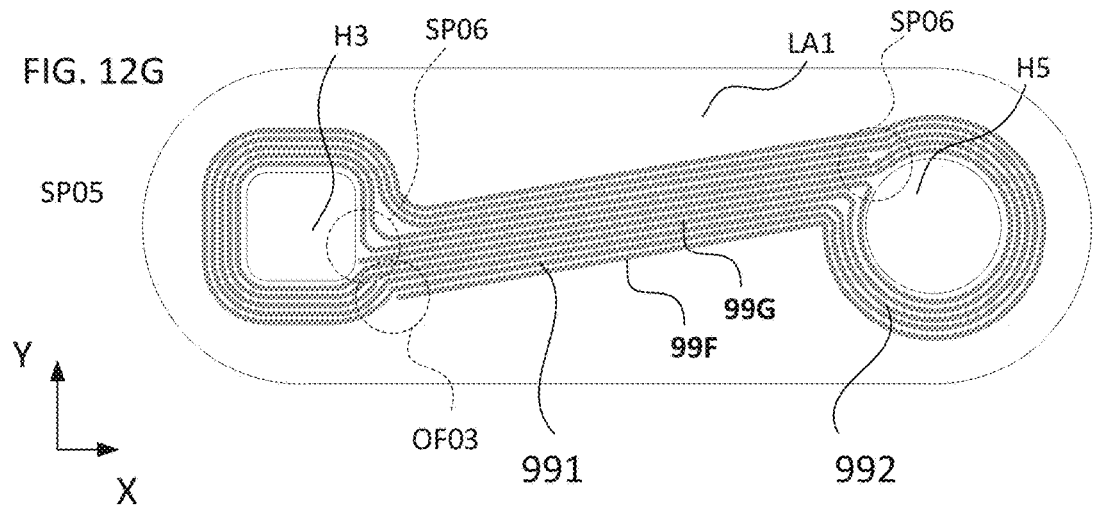
Figure 12I:
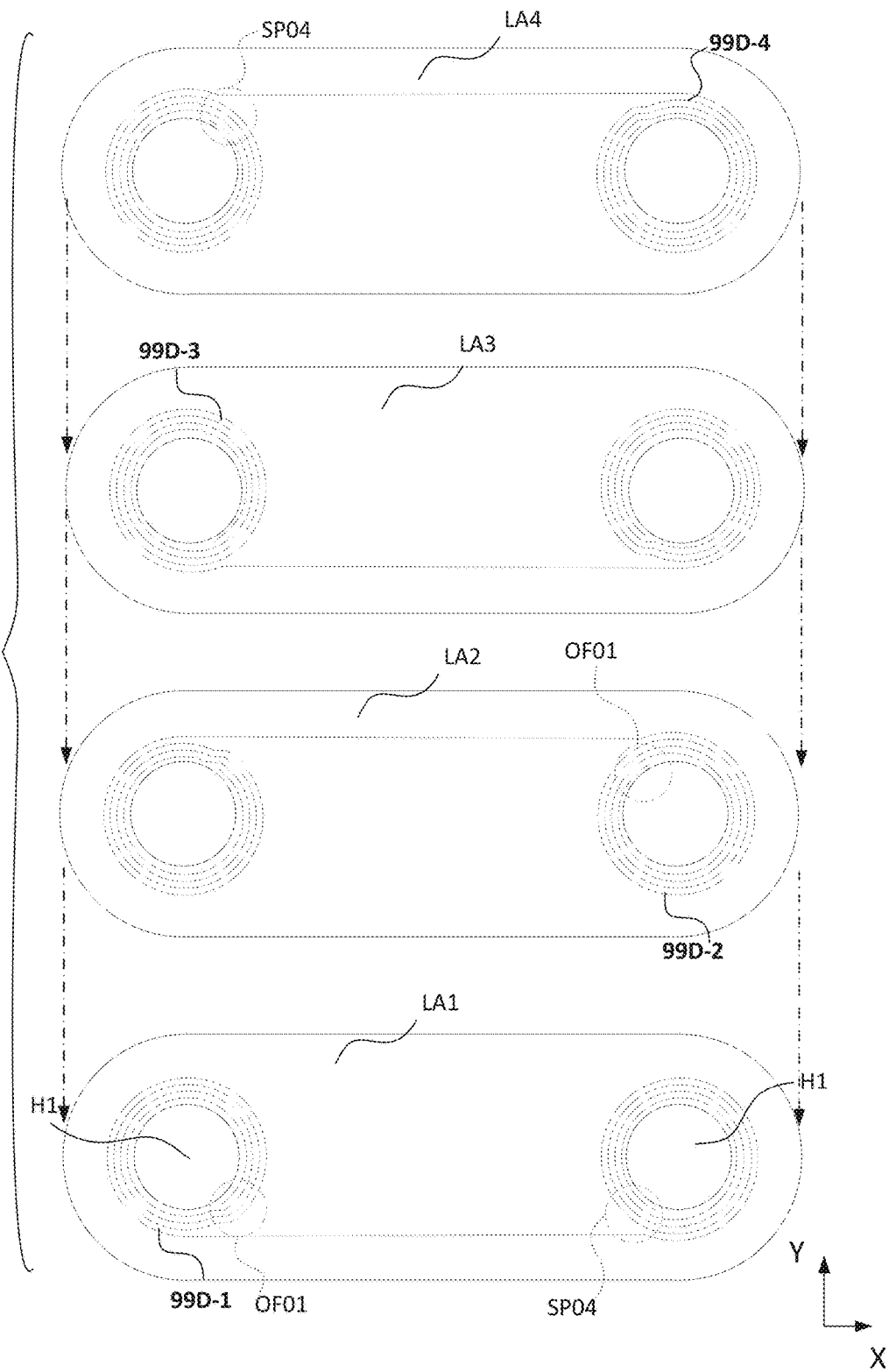

FIG. 12G shows two concentrically located toolpaths or composite swath strategies or reinforcement formations 99G, 99H surrounding the same holes $H_a$, $H_b$ (here labeled H3, H5), in order to relatively displace or distribute gaps, seams and stress concentrations to limit propagation of cracks or other modes of failure from nucleation at a gap, seam, or stress concentration. In addition, the patterns 99g, 99H are biased to angle between the holes, so that it may be mirrored or varied to provide a variety of different and complementary fiber orientations among layers, especially in a direction complementing the loading profile. For example, mirroring the patterns 99G, 99H among layers about the X axis will provide added tensile strength along the X axis, and should the layers containing such patterns be distributed to outer layers in the Z direction, provide added bending strength versus bending about the Y axis. The inner pattern or reinforcing formation 99H is an offsetting pattern with offset crossovers OF03 located at the corner or junction between the longer swath segments between holes and the circular hole H5 (e.g., at the upper left hand side of the round hole); and the outer pattern or reinforcement formation 99G is a spiral pattern with the start of the spiral OF03 abutting a corner or junction formed in the previous pattern (e.g., at the lower right hand side of the pattern previously formed about the square hole H3).

Complementary Reinforcement Formations

Disclosed herein are complementary toolpaths, composite swath deposition strategies, or reinforcement formations 99A-99Z—first, second, and other formations—for both composite swaths 2c and fill material 18a within layers and in adjacent layers, was well as overlaps within a layer, such as same-layer crossing turn overlaps and same-layer parallel overlaps. In addition, "smoothing over" and "attenuation" strategies within or adjacent reinforcement formations 99A-99Z avoid accumulation of, in particular, fiber material overlap protrusions over several or many layers. Such strategies can also be used to ameliorate accumulation of tolerance stack among many composite swath layers.

Using different formations may also permit horizontal repositioning of stress concentrations, gaps, or seams arising from fiber routing in the horizontal plane, as they may permit varying of positioning of start position, end positions, runout accumulation or shortfall, and sharp turns in the composite swath 2c. This is especially the case near contour boundaries, holes $H_a$, $H_b$, $H_c$, etc. or negative contours, as well as channels and island contours, as localized reinforcement in many cases means various sharp turns in the surrounding toolpath. Accordingly, a purpose of using different reinforcement formations within a layer and among layers is to distribute gaps, seams, and stress concentrations to positions that are different from locations in adjacent or nearby layers, and/or in distributed positions among layers; as well as to permit different kinds of reinforcements for different stresses to be distributed among layers.

For example, taking FIG. 12A as an example, the walls of hexagonal holes 2A are to be reinforced by an inner-contour following spiral path of reinforcement formation 99A. An inner-contour, outwardly spiraling toolpath as part of reinforcement formation 99A may be synthesized to reinforce both holes H1, H2 and maintain continuity of long lengths of continuous composite swath 2c as much as possible, and/or provide lengthwise reinforcement in entire part 14. A minimum area, minimum distance connection (i.e., a zero thickness line "hole" negative contour R4) is synthesized between them. A spiral path—i.e., a path that gradually changes offset distance from the contour being outlined or traced, so as to continue in a spiraling fashion—is selected to form the reinforcing toolpath of reinforcement formation 99A. The spiral is begun at a position prioritizing the strength along the center of the part $LA_1$, 14 (e.g., at a position to the left side of the left hole H1, as shown). As shown in FIG. 12A, the walls of the left hexagonal hole H1 are traced, then a path is taken directly paralleling the zero-thickness contour R4 to the right hexagonal hole H2, which is followed. The toolpath returns along the line of the zero-thickness contour R4 (on the opposite side, not overlapping in this case), and spirals about the left hexagonal hole H1 and the previously placed toolpath, and so on, for approximately three "laps" of the "track".

As shown in FIG. 12A, while the walls of the hexagonal hole H1 are reinforced, various gaps, seams, and stress concentrations may be created in the composite swath direction changes and corners. In particular, the entrance/exit zone includes a corner SC01 that is not reinforced by fiber, and which includes various stress concentration at the Y-shaped junction of the two track sections at the corner. If this pattern 99A is repeated for many layers of an additive manufacturing part, the "seam" of stress concentration SC01 and lack of direct corner reinforcement may be continued along this corner (that of the gap/seam/stress concentration SC 01) in the vertical direction (e.g., extending for tens or even hundreds of layers). This may, for example, be addressed by maintaining a similar reinforcement formation 99B as in FIG. 12B, but moving or changing the junctions or turning locations of the "laps" among layers. For example (without overlapping within a layer), the location of a different but similar stress concentration and Y-junction SCO2 may be moved along the side of the hexagonal hole H1, as shown in FIG. 12B. This stress concentration location may be "moved" from SC01 to substantially to anywhere along the inner two sides of the hexagonal hole on either side, and may be thereafter throughout the layers arranged in an organized, repeated, or randomized fashion. For example, FIG. 12H shows a repeating pattern over 4 layers in which the arrangement of FIG. 12B is mirrored horizontally, then vertically, providing 4 changed seam locations SC01, SCO2, SC03, SC04 on four different layers. Similarly, the location of the spiral origin SP02 is moved to 2 changed locations. Non-symmetric arrangements may be similarly varied (by varying the entry/exit location along a particular path, contour, or guide) regularly or randomly.

Different contour following strategies or reinforcement formations without internal overlaps or composite swath crossings within a layer may be layered among different layers. For example, the following strategy or reinforcement formation 99C of FIG. 12C is a (i) spiral following of (ii) an inner contour, taking a (iii) shortest possible path (iv) including the two hexagonal holes. H1, H2 while (iii) making no sharp corners (a "sharp corner" is an unfolded or folded corner having a corner radius from 0 to twice the composite swath 2c width). The strategy of FIG. 12C transmits hoop stress and longitudinal tension stress with a smaller stress concentration than other strategies, and may be combined with FIGS. 12A, 12B (primarily strategies for strengthening walls of the holes together with resisting tension).

FIG. 12D is an exemplary strategy that could be mirrored in two directions. The strategy of FIG. 12D uses (i) spiral following for one side and (ii) offset following to the remaining side, both following the contour of the hexagonal holes while (iii) making no corners, and only connecting the two hole reinforcing zones by an single composite swath extending between. The connecting swath generally benefits if one of the following patterns about the holes must spiral or connect to neighboring offsets in an outward direction, and the following pattern on the connected hole must spiral/offset inwards. The strategy of FIG. 12D uses reinforces in a hoop stress direction more than FIGS. 12A-12C, but leaves most tension reinforcement to other layers. Alternatively, FIG. 12D, if repeated or repeated in a mirrored fashion from top to bottom of a part, would reinforce the holes in compression vs. overtightening (e.g., as shown with circular holes in FIG. 12I).

As noted, individual reinforcement formations 99A-99Z may be varied to vary distribution of isolated gaps, starting positions, end positions, and/or stress concentrations. Crossing points PR (i.e., crossing composite swaths within a same layer $LA_n$) may provide more flexibility in the design of toolpaths of reinforcement formations 99A-99Z, permitting more locations for seams to be distributed, as well as additional forms should seams tend to stack among layers $LA_n$, $LA_{n+1}$, etc., or. Overlaps PR of composite swaths 2c within a layer $LA_n$ may create stress concentrations as relatively sharp turns in the composite swath 2c upward and then downward are made, but with sufficient remelting, reduction in printing speed, feeding at a faster rate than the printing speed to provide, or compression in overprinting, these path changes or turns may permit added horizontal repositioning of stress concentrations arising from path planning in the horizontal plane, as well as avoiding turns in the composite swath leftward and rightward as the composite swath 2c is permitted to continue in a straight path 991. This is especially the case at crossing turns PR about holes and negative contours $H_a$, $H_b$, $H_c$, etc., as reinforcement of a hole in most cases has an entrance and exit to the surrounding toolpath of fiber/composite swath 2c or reinforcement formation 99A-99Z, and the use of crossing turns can permit more freedom in locating that entrance/exit. Accordingly, a purpose of such crossing turns is to distribute gaps, starting and stopping positions, and stress concentrations to positions that are different from locations in adjacent or nearby layers $LA_{n-1}$, $LA_{n+1}$, and/or in distributed positions among layers $LA_1$ ... $LA_m$; as well as to permit different reinforcements for different stresses to be distributed among layers. "Location" may mean in 2D or 3D location, along contours, or along stress or load lines or fields.

In an alternative, for a second type of material, the controller 20 of the printer 1000 has uses one or more of higher than straight path printing speed, higher than straight path nozzle tip compression, and/or slower than printing speed filament feed rate.

Complementary Formations in 3D Core Reinforced Printing Vs. Laminates or FDM

Continuous carbon fiber composite laminates may be formed up in a "quasi-isotropic" (QI) four-ply or three-ply construction at 0, +/−45 degrees, and 90 degrees. Anisotropically biased layups (e.g., 0, +/−30 degrees, 90 degrees) are also used. The laminae are cut at the row ends. The reinforcement formations discussed herein for 3D printed composite swaths 2c may optionally be used in combination with QI construction.

FDM or FFF layers may be formed in orthogonal layers at +/−45 degrees of alternating raster formation. Generally raster formation is preferred in order to extrude hot, flowing plastic next to still-warm extrudate from the immediately previous row to improve bonding, with only minor consideration for directional strength. The +/−45 degree raster formation gives a multi-directional and satisfactory workable middle range of tensile strength, +/−25% from the best and worst rastering patterns (e.g., 20 MPa UTS for ABS in 45-45 pattern, vs. about +5 MPa for longitudinal raster and about −5 MPa for transverse or diagonal raster). Note also that the better rastering patterns per load direction, which may place the direction of most of the extrudate roads in the same direction as the load, may approach injection molding strength (e.g., about 95% of injection molding).

In 3D printing in a stranded-filament-to-ironed swath 2c technique, both negative and positive contours may be reinforced beyond the matrix or fill material strength with continuous composite swaths looping about the contour without severing the fiber. This in-plane looping is impossible with composite layup, which cannot make turns within the plane without breaking the materials; and of different character and limited effect with extrudate.

Different Modes of Reinforcement-Load Dependent

In the case of one, two, or more holes, negative contours, embedded contours, or overmolded contours in an actual part, in many cases different kinds of reinforcement will be possible. For example:
(1) Reinforcement of inner walls and hole walls may closely follow the walls, with or without layers of fill material shielding the innermost wall to prevent print-through of fiber, e.g., FIG. 12A, 12D, 12F. "Holes" include negative contours and embedded (e.g., overmolded) contours.
(2) Reinforcement of outer walls may closely follow the walls, with or without layers of fill material shielding the innermost wall to prevent print-through of fiber, e.g., FIGS. 5A-5D "outer" reinforcement formations.
(3) Reinforcement may extend along load lines or stress lines, e.g., FIG. 5C outer reinforcement formation.
(4) Reinforcement for tension load purposes may include multiple straight composite swaths between the sites at which the tension load is supported, e.g., FIG. 12C, 12E, 12F.
(5) Reinforcement for torsion, torque, or pressure load purposes may include multiple circular composite swaths along directions of hoop stresses, e.g., FIGS. 12C, 12D.
(6) Reinforcement for compression load purposes may include multiple neighboring composite swaths to provide low aspect ratio cross sections and/or squat structures, and/or anchors at ½, ⅓ fractional, e.g. harmonic lengths to guard vs. buckling; and/or e.g., more composite swaths for compression struts than for tension struts.
(7) Reinforcement for twisting may include angular cross bracing in triangle or X shapes, e.g., FIG. 12H, or quasi-isotropic sections in 2-6 differing dominant angle layers as discussed herein
(8) Reinforcement for bending or combination load purposes may include embedded high moment of inertia (cross section) structures such as sandwich panels, tubes, boxes, I-beams, and/or trusses formed from embedded composite swaths. These may be made in layers spaced from the centroid of the part cross section, or in outer toolpaths spaced from the centroid of the part cross section, depending on the load and the orientation of the part during printing.

Complementary Composite Swath Routing Between Two Layers

Figure 13A:
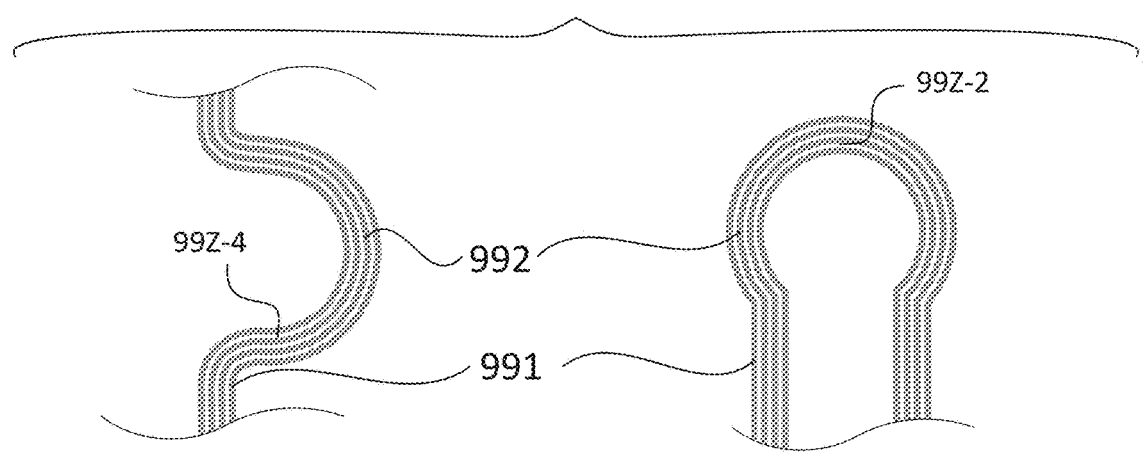
FIGS. 13A-13C show complementary paths for reinforcing a hole, distributed between 2, 3, or 4 layers.
Figure 13B:
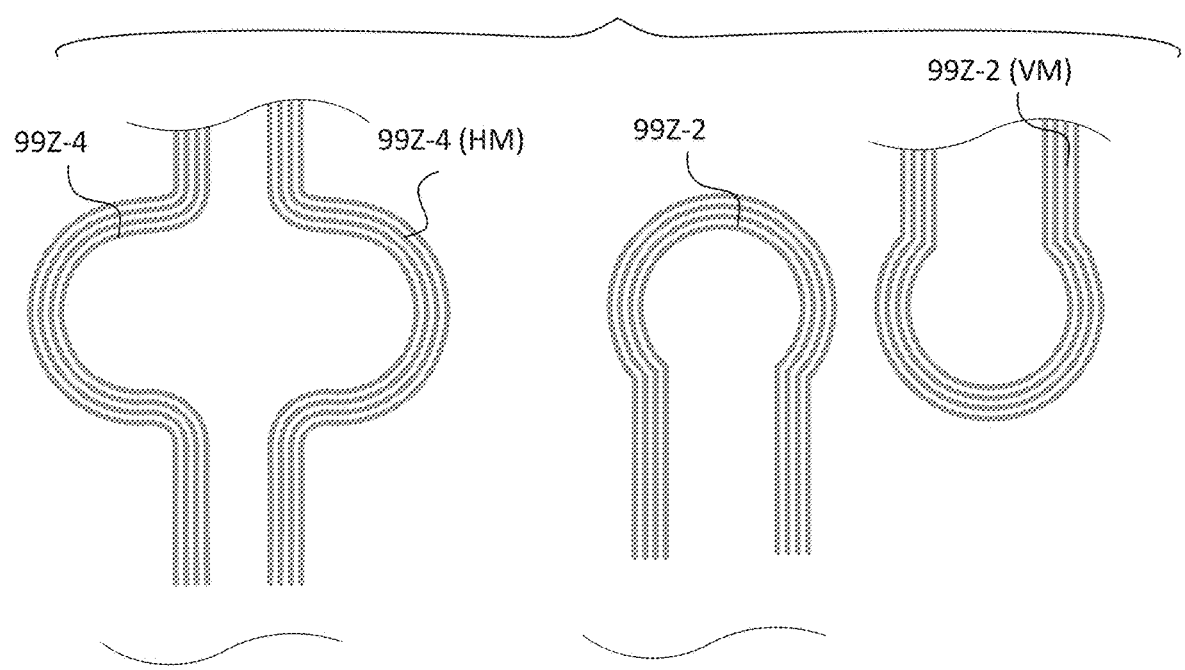
Figure 13C:
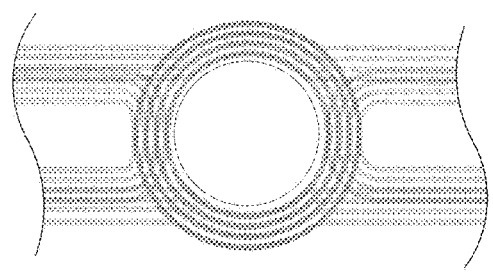

FIGS. 13A-13C show complementary paths for reinforcing a hole, distributed between 2, 3, or 4 layers. FIG. 13C shows the reinforcement formations 99Z-4, 99Z-2, mirrored horizontally (HM) and vertically (VM) e.g., in 4 layers, overlaid.

It should be noted that complementary patterns between two layers need not include a crossing point, jump, or crossing turn to have the benefits of the use of complementary patterns, or to maintain the amount of stacking at 2 composite swath thicknesses among 2 layers. The discussion herein of beneficial stacking of complementary patterns applies even to layers which do not cross composite swaths within the layer. For example, FIGS. 13A-13C show superimpositions of the complementary paths in 4 alternations over 4 layers. As shown, the hole H0 is reinforced on all sides, with gaps, stress concentrations and/or seams being distributed to different locations among layers (and within layers when reinforcement formations are formed within a same layer). Using crossing turns may have various benefits, among them additional freedom in determining the location of gaps, starts, stops, and stress concentrations; additional freedom in orienting gaps, starts, stops, and stress concentrations in different directions and in different forms; and resisting shear and layer and road delamination by creating inter-layer bonding and shear resistance (e.g., vertical, horizontal, and other binding surfaces). Note a "gap" may be an area within a layer $LA_n$ at the beginning, ending, or other location of a fiber or composite reinforcement formation that is filled with fill material 18a, e.g., because the shape of the region or contour within which the reinforcement formation is determined may not have sufficient space for fiber to be laid.

Three, Four, and More "Sided" Parts

Figure 14D:
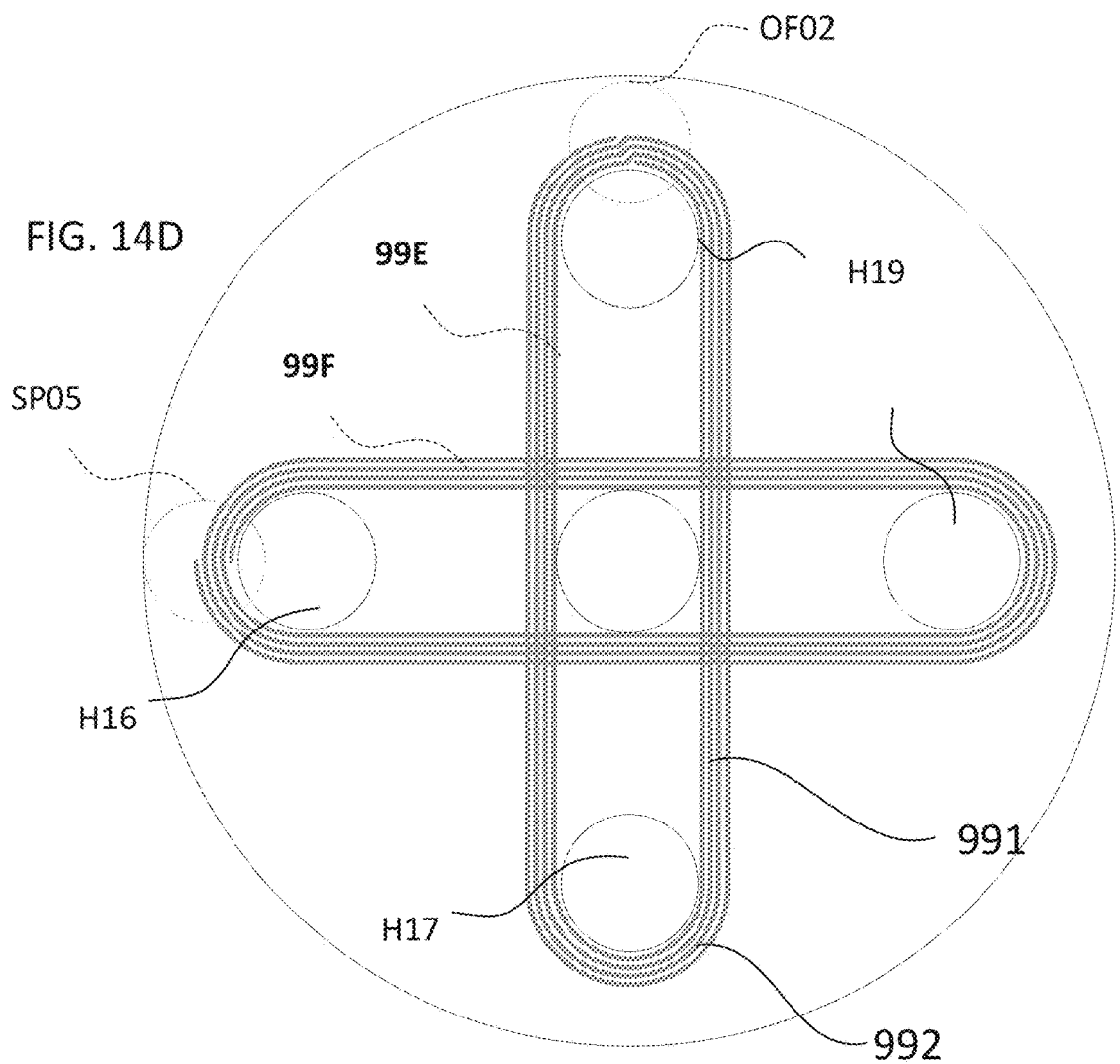
FIGS. 14D-14E in a four sided context.
Figure 14E:
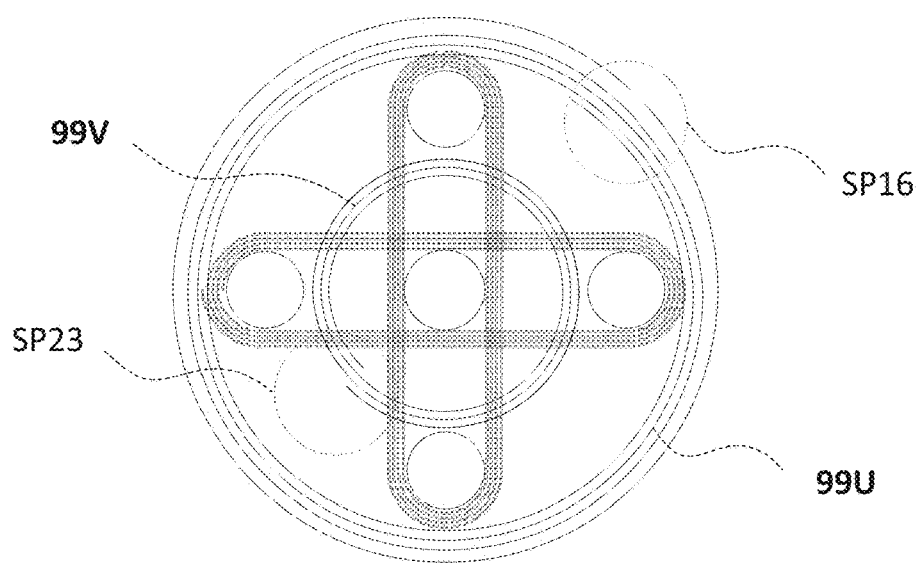

FIGS. 14A-14C show the principles of complementary toolpaths in a trilaterally symmetric (three sided) context; FIGS. 14D-14E in a four sided context; and FIGS. 14G-14I in a second example of a three sided context.

FIG. 14A shows a single layer of a rotating or three-point contact connecting plate having three circular holes $H_a$, $H_b$, $H_c$ (here labeled H9, H10, H11). In FIG. 14A, as shown, contours or region followed by the strategy are coincident with the hole wall but may be offset from the hole wall (e.g., representing wall thicknesses of fill material 18a). In FIG. 14A, a reinforcement formation 99T having a spiral tracing strategy is used to follow the three negative contours of the hexagonal holes H1, outlined (linking H10, H11, H12). As shown in FIG. 14A, the spiral tracing strategy begins/ends at SP15 the toolpath surrounding 300 degrees of a round hole H9 and is "anchored" on that side (i) against the hole wall (ii) by the 300 degree curve about the hole wall and/or (iii) by surrounding composite swaths in the second and subsequent cycles/loops. As shown, the start/stop of a spiral SP15 toolpath do not necessarily start/stop at the same precise location, but may have additional or added length to surround negative contours or holes so that the lengths of fiber in tension are well anchored. The swaths 2c extending between the three holes H10, H11, H12 may be expected to carry load in a tension mode, and the swaths 2c closely surrounding the holes H10, H11, H12 may be expected to reinforce the walls of the holes H1, H2, in a combined tension-compression mode. FIG. 14B shows the superposition of three toolpaths or composite swath depositions or reinforcement formations 99T of FIG. 14A over one, two, or three layers, rotated from one another or trilaterally mirrored, placing the stress concentrations and/or gaps of the offsets and/or spiral start and end in positions displaced from one another in at least two orthogonal directions (here, substantially the X direction as well as the Z direction between layers). FIG. 14C shows the further superposition of a circular spiral toolpaths or composite swath depositions or reinforcement formation 99U over the same layers or an additional layer, two, or three two layers, carrying or reinforcing versus hoop stresses about the part.

FIG. 14D shows a single layer of a rotating or four-point contact connecting plate having four circular holes $H_a$, $H_b$, $H_c$, $H_d$ (here labeled H16, H17, H18, H19). In FIG. 14D, as shown, contours or region followed by the strategy are coincident with the hole wall but may be offset from the hole wall (e.g., representing wall thicknesses of fill material 18a). In FIG. 14D, reinforcement formations 99E and 99F, substantially similar to those depicted in FIGS. 12E and 12F, are used to follow the four negative contours of the holes, with the offset strategy of 99E beginning and ending at OF02, and the spiral strategy of 99F beginning and ending at SP05. The reinforcement formations are substantially as described with respect to FIGS. 12E and 12F, but are orthogonally arranged about different holes and deposited in one or two layers. The swaths 2c extending between the three holes H16, H17, H18, H19 may be expected to carry load in a tension mode, and if printed in the same layer may create protrusions. FIG. 14E shows the superposition of four toolpaths or composite swath depositions or reinforcement formations 99E, 99F, 99V, 99U or reinforcement formations 99T of FIG. 14A over one, two, three, or four layers, with the further superposition of two circular spiral toolpaths or composite swath depositions or reinforcement formations 99U, 99V carrying or reinforcing versus hoop stresses about the part.

Figure 14G:
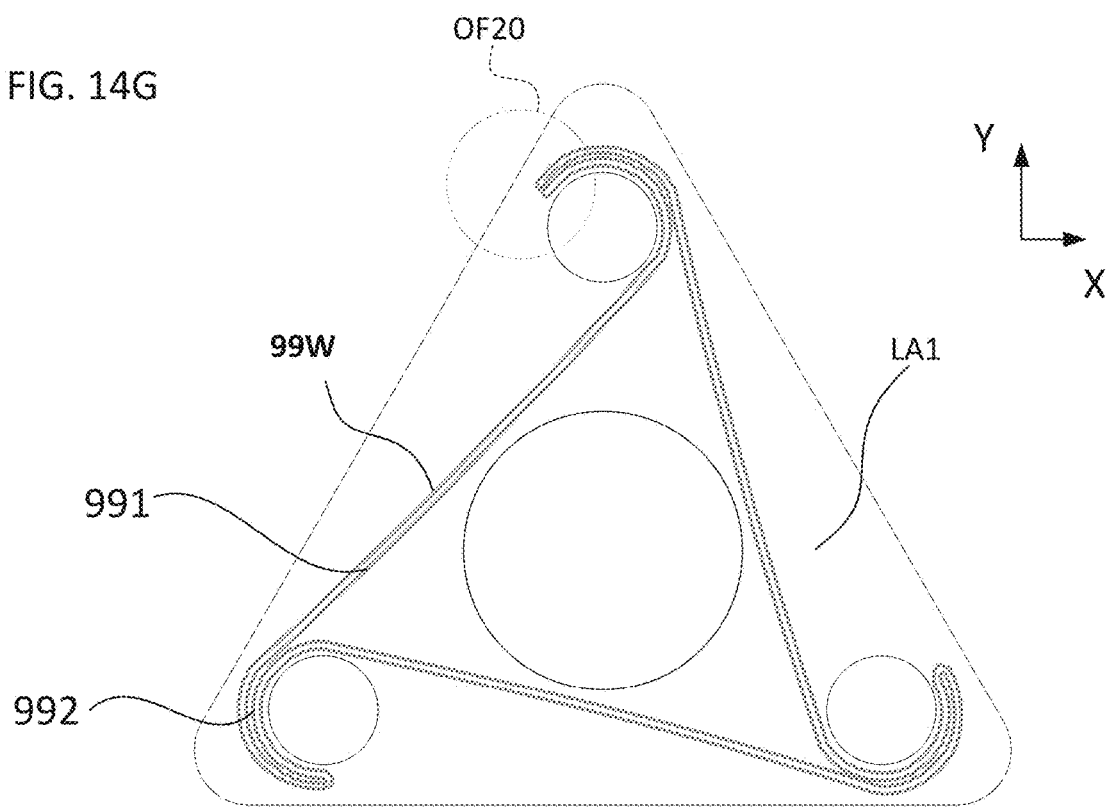
FIGS. 14G-14I in a second example of a three sided context.
Figure 14H:
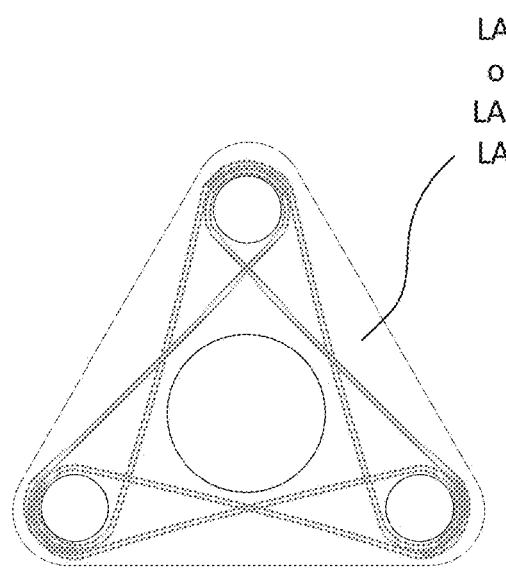
Figure 14I:
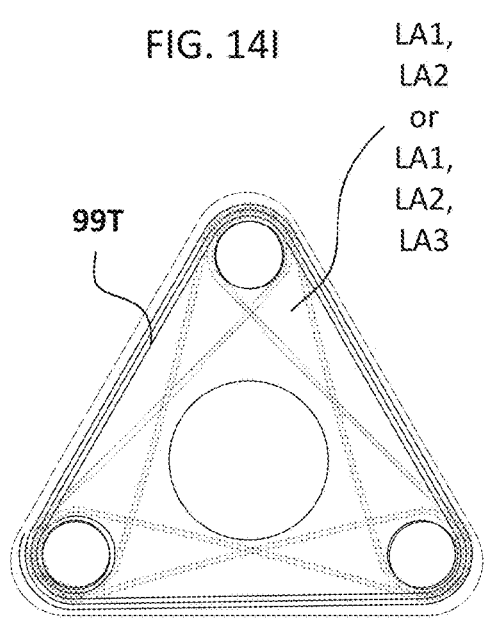

FIG. 14G shows another example of a three-point contact (in this case triangular) connecting plate having three circular holes $H_a$, $H_b$, $H_c$. In FIG. 14G, as shown, contours or region followed by the strategy are coincident with the hole wall but may be offset from the hole wall (e.g., representing wall thicknesses of fill material 18a). In FIG. 14G, a reinforcement formation 99W having an offset tracing strategy of an angle offset triangle tangent to the three holes is used to follow the three negative contours of the hexagonal holes. As shown in FIG. 14G, the spiral offset triangle tracing strategy begins/ends at OF20 and is "anchored" by the 180 degree curve about the hole wall and/or by surrounding composite swaths in the second and subsequent cycles/loops. The swaths 2c extending between the three holes are angled with respect to hoop stress and tension, to be mirrored and form cross-bracing and/or X shapes to resist twisting of the plate of the connecting plate. FIG. 14H shows the superposition of two toolpaths or composite swath depositions or reinforcement formations 99U of FIG. 14A over one or two layers, left-right mirrored and rotated, placing the stress concentrations and/or gaps of the offsets and/or spiral start and end in positions displaced from one another in at least two orthogonal directions (here, substantially the X direction as well as the Z direction between layers). FIG. 14C shows the further superposition of the spiral toolpath of FIG. 14A to add further resistance to tension and hoop stresses about the part.

Figure 15A:
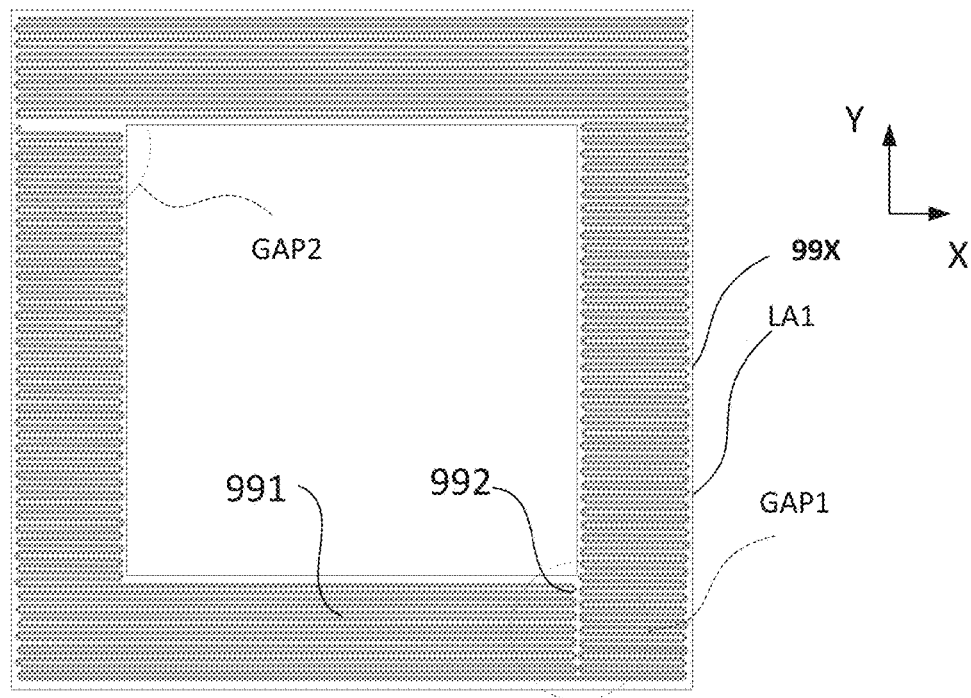
FIG. 15A shows a single layer of a densely filled square plate of four long side members, with a hole or negative contour in the middle.
Figure 15B:
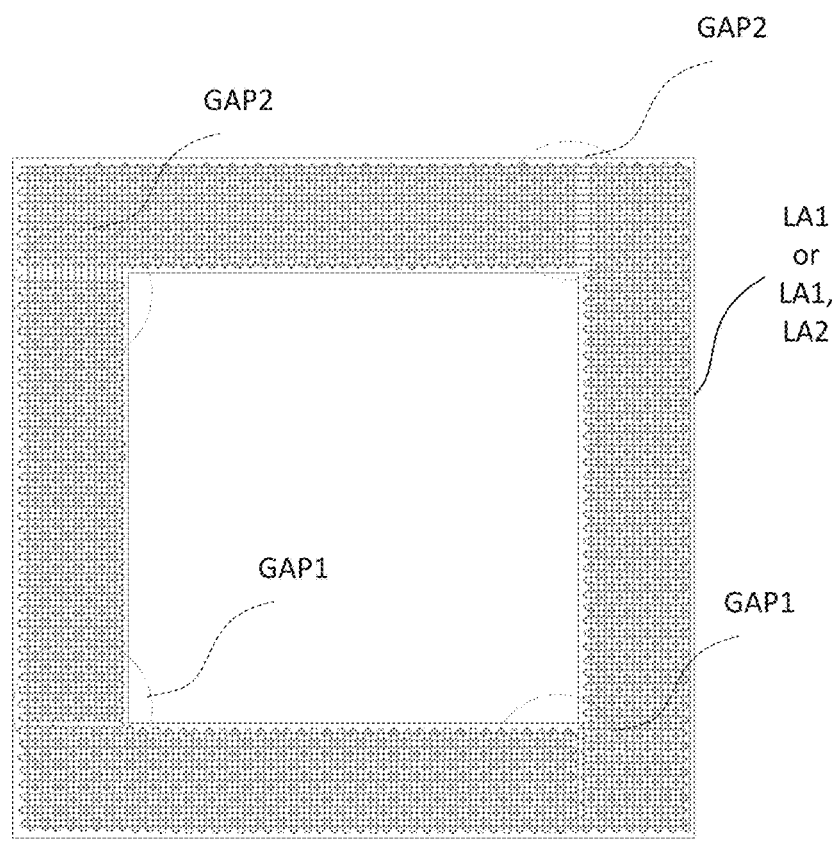
In FIG. 15B, two superimposed reinforcement formations 99X, 99X layers are shown, where the reinforcement formation 99X is rotated by 90 degrees, optionally in the subsequent layer.

FIG. 15A shows a single layer of a densely filled square plate of four long side members, with a hole or negative contour in the middle. In FIG. 15A, as shown, a lengthwise raster fill reinforcement formation 99X surrounds the contour or region in the middle. There are many turns in the raster pattern, and two gaps GAP1 and GAP2 (which may also be stress concentrations, starts, or stops are formed. GAP1 is formed where the pattern changes regional groups, and GAP 2 is formed at the end of the composite swath 2c. These gaps may also occur if the composite swath 2c length is not perfectly predicted or measured. Within the layer, the gaps may be filled with (i) fill material 18a, (ii) lengths of composite swath 2c which do not continue the raster fill (e.g., gap filling patterns, which may be concentric, wall or region following), (iii) and/or with overlapping composite swath 2c or protrusion PR. E.g. in order to fill the GAP1 or GAP2 in FIG. 15A with overlapping composite swath 2c, each raster pattern would be widened to overlap (e.g., FIG. 15B, wherein the gaps are closed with protrusions PR, which may be varied in position among layers as discussed herein). In FIG. 15B, two superimposed reinforcement formations 99X, 99X layers are shown, where the reinforcement formation 99X is rotated by 90 degrees, optionally in the subsequent layer. The reinforcement formation 99X may be rotated at 90 degrees, then again, in an additional two layers to continue to change the position of the gap, stress concentration, starts, or stops. Optionally, the pattern is rotated by 45 degrees in some intervening layers.

Sparse Fill In or with Complementary Formations

As shown in FIGS. 16A-16D, complementary formations can be used in sparse fill approaches, e.g., generally honeycombs and tessellations for filling internal volumes of a part 14. In this case, as described herein, some approaches are suitable for honeycomb regions of layers $LA_n$, $LA_{n+1}$, $LA_{n+2}$, etc. including either or both of consolidated composite swaths 2c and fill material 18a. In the case of consolidated composite swaths 2c, more attention may be given to stacking of protrusions from an underlying layers $LA_n$ to layer(s) above $LA_{n+1}$, etc.

Each of FIGS. 16A-16D again shows reinforcement formations 99 within single or multiple layers $LA_n$, $LA_{n+1}$, $LA_{n+2}$, etc.

Figure 16D:
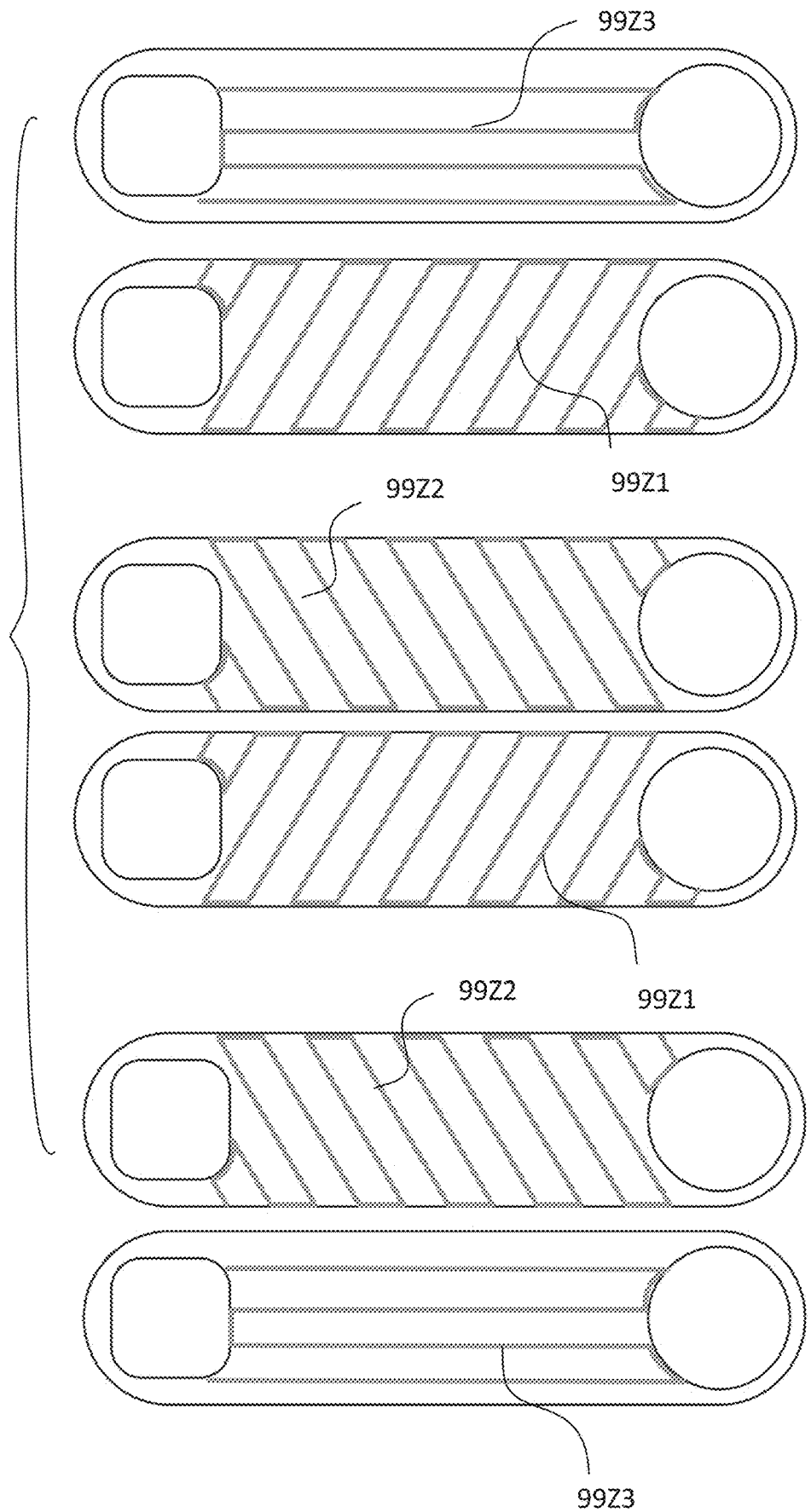

The controller 20 of the printer 1000, may, as described herein, supplying a multi-strand core reinforced filament 2 including a flowable matrix material 4a and a plurality of substantially continuous reinforcing strands 6a of a material having a tensile strength of greater than 300 MPa. The substantially continuous reinforcing strands 6a extend in a direction parallel to a length of the filament. As shown in FIG. 16A, within a first layer $LA_n$, the printer 1000 deposits a first consolidated composite swath 2c of a height less than ½ the width of the filament 2 in a first reinforcement formation 99Z1 (although the printer 1000 could begin with any of 99Z1, 99Z2, 99Z3) including a first plurality of parallel lengths each extending in a first direction by flowing the matrix material 4a and applying an ironing force that spreads the reinforcing strands 6a within the filament against a deposition surface 14 or 2d. In the case of FIGS. 16A-16D, the parallel lengths of reinforcement formations 99Z1, 99Z2, 99Z3, 99Z3-1 are attached to one another by further lengths following an outline, offset, or wall of the part 14, but this is optional. In this case, the first formation 99Z1 deposited is a reference formation, and the remaining formations in the sparse fill set are angled with reference to the parallel lengths of the first formation 99Z1.

Optionally, within the same first layer $LA_n$, the printer 1000 deposits a second consolidated composite swath 2c of a height less than ½ the width of the filament 2 in a second reinforcement formation 99Z2 including a second plurality of parallel lengths each extending a second direction angled from the first direction by sixty degrees, by flowing the matrix material 4a and applying an ironing force to spread the reinforcing strands 6a within the filament 2 against the first plurality of parallel lengths of the first consolidated composite swath 2c of the formation 99Z1. Subsequently, in a second layer $LA_{n+1}$ above the first layer $LA_n$, the printer 1000 may deposit a third consolidated composite swath 2c of a height less than ½ the width of the filament 2 in a third reinforcement formation 99Z3 including a third plurality of parallel lengths each extending a third direction angled from the first and second directions by sixty degrees, by flowing the matrix material 4a and applying an ironing force to spread the reinforcing strands 6a within the filament 2 against both the first and second pluralities of parallel lengths of the first and second consolidated composite swaths 2c, 2c of the formations 99Z1, 99Z2. The angle from the first formation of the second, third formations may alternatively be 120 degrees, 90 degrees, or other angles which divide evenly into 360 degrees.

Further optionally, as shown in FIG. 16B, the printer 1000 for may deposit the third consolidated composite swath 2c of the third formation 99Z3 is deposited with the third plurality of parallel lengths each crossing (e.g., triangle honeycomb, tessellation, or network) an intersection of the first and second consolidated composite swaths 2c, 2c of the first and second formations 99Z1, 99Z2. Alternatively or in addition, as shown in FIG. 16C, the printer 1000 for may deposit the third consolidated composite swath 2c of the third formation 99Z3 is deposited with the third plurality of parallel lengths each offset (e.g., Star-of-David honeycomb, tessellation, or network) from an intersection of the first and second consolidated composite swaths 2c, 2c of the first and second formations 99Z1, 99Z2.

Alternatively, even in the case of fill material 18a only, the controller 20 of the printer 1000, may, supplying a filament including a flowable polymer material, and within a first layer $LA_n$, deposit rows of the flowable polymer material 18a in a first reinforcement formation 99Z1 including a first plurality of parallel lengths each extending in a first direction by flowing the flowable polymer material 18a against a deposition surface 14, and within the same first layer $LA_n$, deposit rows of the flowable polymer material 18a in a second reinforcement formation 99Z2 including a second plurality of parallel lengths each extending in a second direction angled from the first direction by sixty degrees, by flowing the flowable polymer material 18a against the deposition surface (at least in part the prior bead from formation 99Z1) and to thin out when the second plurality of parallel lengths crosses the first rows of the flowable polymer material. Within the same first layer $LA_n$, the controller 20 may deposit rows of the flowable polymer material 18a in a third reinforcement formation including a third plurality of parallel lengths each extending in a third direction angled from the first and second directions by sixty degrees, by flowing the matrix material against the first rows of the flowable polymer material and to thin out when the third plurality of parallel lengths crosses the first and second pluralities of parallel lengths of the first two rows of the flowable polymer material.

This technique for fill material 18 also applies to composite swaths, e.g., in the case where supplying a filament further comprises supplying a multi-strand core reinforced filament 2 including a flowable polymer matrix material 4a and a plurality of substantially continuous reinforcing strands 6a of a material having a tensile strength of greater than 300 MPa as discussed herein, where each row of flowable polymer material is deposited as a consolidated composite swath 2c as discussed herein, and advantageously as the third plurality of parallel lengths is deposited with each parallel length offset from an intersection of the first and second consolidated parallel lengths.

The interaction of the reinforcement formations may be implemented on the slicer or toolpath planner. In this case, a computer or workstation executes instructions for generating three-dimensional toolpath instructions for a three dimensional printer. The computer receives a three-dimensional geometry such as a solid model, NURBS model, mesh or STL file. The computer slices the three-dimensional geometry into layers $LA_1 \ldots LA_m$, and generates toolpath instructions to deposit consolidated composite swaths 2c by ironing strand reinforced composite filament 2 to form consolidated composite swaths 2c having reinforcing strands 6a spread out against a surface 14 or 2d. The computer generates toolpath instructions to deposit a first consolidated composite swath 2c according to a first single layer toolpath or reinforcement formation 99Z1 within a first layer of the layers $LA_1 \ldots LA_m$; (note a layer designated $LA_1$ herein need not be the first layer of the part; $LA_1$ is rather the first layer of the set of layers under discussion, which may begin or end anywhere within the part 14. The computer may generate toolpath instructions to deposit a second consolidated composite swath 2c according to a second single layer toolpath or reinforcement formation 99Z2 within the same first layer, the second consolidated composite swath having a crossing point with the first consolidated composite swath within the same first layer $LA_1$, and generate toolpath instructions to iron the second consolidated composite swath 2c to spread against the first consolidated composite swath 2c within the same first layer $LA_1$.

With reference to FIG. 16A and the preceding discussion, all of reinforcement formations 99Z1-99Z3, together forming a honeycomb, may be deposited in one layer $LA_n$. If all three reinforcement formations 99Z1-99Z3 are formed from composite swaths 2c and the pattern 99Z1-99Z2-99Z3 of FIG. 16B is constructed, each intersection of three composite swaths will form a double-height protrusion which will tend to accumulate, and the neighboring layer $LA_{n+1}$ may be deposited with only fill material 18a (in the same reinforcement formations). Alternatively, the double-height protrusion that is an intersection of three paths 2c may be smaller than other protrusions as the intersection is entirely surrounded by air space into which the paths 2c may flatten. Alternatively, if all three reinforcement formations 99Z1-99Z3 are formed from composite swaths 2c and the pattern 99Z1-99Z2-99Z3-1 of FIG. 16C is constructed, all intersections are a protrusion of only one additional layer of swath 2c-2. Again, the neighboring layer $LA_{n+1}$ of honeycomb may be deposited with only fill material or again with fiber or composite swaths 2c, although in the case of the reinforcement formation set of FIG. 16C, the accumulation of overlaps is less than with FIG. 16B.

Further, with reference to FIG. 16D, the reinforcement formations 99Z1, 99Z2, 99Z3 may be arranged in permutation pairs per layer. E.g. if the first pair of reinforcement formations 99Z1, 99Z2 is printed in a first layer $LA_n$, an array of protrusions PR occurs at the intersections of the reinforcement formations. If the second pair of reinforcement formations 99Z2, 99Z1 is printed in a first layer $LA_{n+1}$, a second array of protrusions PR occurring at the intersections of the reinforcement formations are in a different coordinate locations (without interfering with those from the first pair), and if the third pair of reinforcement formations 99Z2, 99Z3 is printed in a first layer $LA_{n+2}$, a third array of protrusions PR occurs at the intersections of the reinforcement formations in this layer $LA_{n+2}$, and different from both of the first two layers $LA_n$, $LA_{n+1}$. Accordingly, if these three layers $LA_n$, $LA_{n+1}$, $LA_{n+2}$ as described are repeatedly laid next to one another, no more than one protrusion PR height is generated per layer. With this strategy, the third complementary pattern (e.g., for 99Z1, 99Z3 pair, the third complementary pattern would be 99Z2) may be printed with fill material 18a in the same layer.

Extrusion Toolpaths and/or Extrudates

In general, in the "FFF" or "FDM" extrusion method of additive manufacturing, extrusion beads in adjacent layers $LA_n$, $LA_{n+1}$ may be arranged to run either parallel or transverse to one another, without crossing while within a layer. A "retract" may be performed in the filament feed path to stop nozzle flow and move from one isolated area to another to restart extrusion, but the active printing beads tend to remain uncrossed. This is reasonable, because continuing to extrude while crossing a previously printed bead may cause extrudate to jet out horizontally and unpredictably as the nozzle is partially blocked. Additionally, any time spent extruding with a blocked nozzle reduces the amount of active deposition of extrusion. Slicing software generally avoids creating extrusion toolpaths which cross one another.

However, in the FFF printer discussed herein, extrusion toolpaths may cross one another in the same manner as described with respect to core reinforced fiber toolpaths, partially enabled by a fast-response clutching in the filament supply for the extrusion head 18, e.g., a low motor current or other slippable drive. In such a case, crossing extrusion toolpaths should cross at a high angle (e.g., from 45-90 degrees) and/or limited to short periods of time or narrow existing beads (e.g., for $\frac{1}{10}$ to $\frac{1}{100}$ of a second, e.g., for a printing extrusion speed of 300 mm/s, crossing no more than 1 mm of previously solidified extrudate, and preferably $\frac{1}{4}$ to $\frac{1}{2}$ mm of solidified extrudate). This is particularly advantageous in the case of honeycomb fills of patterned lines (e.g., triangular tessellation, e.g., of 60-60-60 degree crossing straight paths, either with all paths intersecting (e.g., triangular honeycomb or two paths intersecting with one path offset (e.g., Star of David network or honeycomb).

Generally, even the fast-response buffered crossing of a newly extruded bead or road of fill material 18a across a previously printed extrusion bead or toolpath may not change the layer height of the current layer $LA_n$ either on top of the solidified bead crossed or in the currently deposited row, i.e., neat plastic does not generally vertically accumulate as beads are crossed. Rather, fluidized fill material 18a tends to find a least resistance direction to escape horizontally or downward when the extrusion nozzle 18 is blocked by a previously deposited bead.

A schematic representation of a composite structure is depicted in FIG. 17 which shows a sandwich panel composite part. The top section 1900, and bottom section 1902, are printed using a continuous core reinforced filament to form relatively solid portions. In contrast, the middle section 1904 may be printed such that it has different properties than the top section 1900 and the bottom section 1902. For example the middle section 1904 may include multiple layers printed in a honeycomb pattern using a continuous core reinforced filament, a pure resin, or even a three dimensionally printed foaming material. This enables the production of a composite part including a lower density core using a three dimensional printer. Other composite structures that are not easily manufactured using typical three dimensional printing processes may also be manufactured using the currently described systems, materials, and methods.

In addition to using the continuous core reinforced filaments to form various composite structures with properties in desired directions using the fiber orientation, in some embodiments it is desirable to provide additional strength in directions other than the fiber direction. For example, the continuous core reinforced filaments might include additional composite materials to enhance the overall strength of the material or a strength of the material in a direction other than the direction of the fiber core. For example, FIG. 18 shows a scanning electron microscope image of a carbon fiber core material 2000 that includes substantially perpendicularly loaded carbon nanotubes 2002. Without wishing to be bound by theory, loading substantially perpendicular small fiber members on the core increases the shear strength of the composite, and advantageously increases the strength of the resulting part in a direction substantially perpendicular to the fiber direction. Such an embodiment may help to reduce the propensity of a part to delaminate along a given layer.

FIGS. 19A-19C depict various parts formed using the printer head(s) depicted in FIGS. 1A-1C and/or 2A-2G. FIG. 19A shows a part including a plurality of sections 1322 deposited as two dimensional layers in the XY plane. Sections 1324 and 1326 are subsequently deposited in the ZY plane to give the part increased strength in the Z direction. FIG. 19B show a related method of shell printing, where layers 1328 and 1330 are formed in the XY plane and are overlaid with shells 1332 and 1334 which extend in both the XY and ZY planes. As depicted in the figure, the shells 1332 and 1334 may either completely overlap the underlying core formed from layers 1328 and 1330, see portion 1336, or one or more of the shells may only overly a portion of the underlying core. For example, in portion 1338 shell 1332 overlies both layers 1328 and 1330. However, shell 1334 does not completely overlap the layer 1328 and creates a stepped construction as depicted in the figure. FIG. 19C shows an alternative embodiment where a support material 1340 is added to raise the part relative to a build platen, or other supporting surface, such that the pivoting head of the three dimensional printer has clearance between the part and the supporting surface to enable the deposition of the shell 1342 onto the underlying layers 1344 of the part core.

The above described printer head may also be used to form a part with discrete subsections including different orientations of a continuous core reinforced filament. The orientation of the continuous core reinforced filament in one subsection may be substantially in the XY direction, while the direction in another subsection may be in the XZ or YZ direction.

The path planning and printing processes may utilize a fill pattern that uses high-strength composite material in selected areas and filler material (e.g., less strong composite or pure resin such as nylon) in other locations, see FIGS. 19D-19G, which depict stacks of layers in cross section. As discussed with reference to the sandwich panel global or region rule, in some cases, reinforcement is conducted by identifying an internal volume or volumes in the shape of simplified beams or panel, e.g., an interior prism or volume spanning and extending beyond bending load and/or support points. In addition, the part may be oriented during planning for deposition such that layers within the volume span the anticipated load and/or support points. Fiber may be fiber added within the interior prism volume remote from a centroid of a cross section of the volume, to increase effective moment of inertia (particularly for bending or compression loads). Fibers may be deposited in multiple adjacent bonded ranks and/or layers, to increase fiber rank interaction and reinforcement of neighbors (particularly for compression and tension loads). Through holes or mounts through which or into which load members are expected to be inserted may each be smoothly looped by fiber, optionally directly at the wall of such mount (particularly for tension and torsion loads, looping may permit fewer stress concentrations and the transmission of tension through smooth paths).

Especially for beam and panel bending, the strength to weight performance of a beam is optimized by placing fiber ranks as far as possible (i.e., at the farthest position both within the part and that does not violating any higher priority rules in effect at the boundary of the part) from the centroid of a cross-section to increase effective moment of inertia. A part formed completely from the fill material 1350 is depicted in FIG. 19D. In FIG. 19E, a composite material 1352 is deposited at the radially outward most portions of the part and extending inwards for a desired distance to provide a desired increase in stiffness and strength. The remaining portion of the part is formed with the fill material 1350. A user may extend the use of composite versus filler either more or less from the various corners of the part as illustrated by the series of figures FIGS. 19D-19G. For example, a control algorithm controlled by controller 20 may use a concentric fill pattern that traces the outside corners and wall sections of the part, for a specified number of concentric infill passes, the remainder of the part may then be filled using a desired fill material.

FIGS. 19H-19J depict further parts formed using the printer head(s) depicted in FIGS. 1A-1C and/or 2A-2G.

Where FIGS. 19E through 19G do not expressly show outer walls of the part formed from fill material 1350 (e.g., the parts in FIGS. 19E-19G may have outer wall(s) of fill material 1350 or outer walls of composite material 1352), FIGS. 19H through 19J show cross sections of parts with the outer wall 1350-OW specifically shown.

Specifically, in FIG. 19H, a part is built up from the lowest layer or down from the highest layer, depending on the printing type or approach. In FIG. 19H, an outer layer of fill material 1350 is formed by a floor layer of fill material 1350 (the outer layer may be 1-3 or more successive floor layers). As in FIGS. 19E-19G, an internal sandwich panel is built of composite material 1352, in this case as two quasi-isotropic sets 1352-QI separated by infill material 1350-IF. In this case, a quasi-isotropic set 1352-QI is formed by four parallel shells or layers of anisotropic fill or composite fiber swaths, in which the dominant direction of the fiber swaths is rotated by 45 degrees (in a known manner for quasi-isotropic laminates of four layers) between each layer (as noted herein, a quasi-isotropic set of layers or shells tends be composed of 3 or more layers, the layers together having a substantially isotropic stiffness behavior as a laminate). As discussed, the quasi-isotropic sets 1352-QI are deposited adjacent or proximate the top and bottom of the part to provide a higher moment of inertia and bending stiffness. The quasi-isotropic sets 1352-QI also provide twisting or torsion stiffness. As shown, in contrast to FIGS. 19E-19G, in FIG. 19H outer walls 1350-OW (including 1-3 or more beads of isotropic fill material) optionally surround the sets 1352-QI of quasi-isotropic layers so that the outer surface of the part is fill material 1352.

Further in contrast to FIGS. 19E-19G, the middle fill material section 1350-IF is surrounded by outer concentrically deposited anisotropic composite fiber swaths 1352-CON (e.g., as shown in single layer form in FIG. 10F, 10G, or 10I; or layers L04.2 or L04.1 of FIG. 11A). Each concentric fiber swath fill section 1352-CON may be any number of concentric loops, e.g., 1-10 or higher. Again, optionally, outer walls 1350-OW (including 1-3 or more beads of isotropic fill material) optionally surround the sets 1352-CON of quasi-isotropic layers and fill material 1352 so that the outer surface of the part is fill material 1352. In addition, the upper quasi-isotropic layer set 1352-QI is additionally covered by a roof fill of fill material 1350-R (again, 1-3 or more layers of isotropic fill material 1350). In this manner, the entire outer surface of the part is optionally sheathed in fill material 1352, but immediately adjacent the fill material 1352 outer surfaces and displaced outwardly from a centroid of the part, composite material 1352 is deposited to increase effective moment of inertia in either anisotropically deposited quasi-isotropic sets 1352-QI, and/or concentrically deposited layers 1352-CON. Accordingly, outer contours, perimeters, roofs, and floors of the 3D geometry, whether formed from layers or shells of the 3D printing process or formed from walls, beads, or swaths within a respective layer or shell of the 3D printing process, are surrounded by an inner shell of composite material 1352.

It should be further noted that one exemplary fill approach for the concentrically deposited outer layers 1352-CON is concentric loops, spirals, or offsets starting at an outer region perimeter or contour and spiraling inward 1352-O.CON (outer concentric fill).

In a variation of the part of FIG. 19H of a part having a through-hole TH-H as shown in FIG. 19I, the general approach of FIG. 19H may be followed. In contrast, in FIG. 19I, the negative contours or holes found in each layer having anisotropically deposited and/or oriented fiber fill, quasi-isotropic sets of layers 1350-R, and also found in each layer having anisotropically deposited and/or oriented fiber fill, outer concentric layers 1352-CON, are surrounded by these respective fills as well as isotropic, resin or fill material infill 1350-F. However, immediately adjacent the negative contour, a reinforcing column formed from an optional inner wall of isotropic, resin or fill material 1350-IW and an inner wall of anisotropically deposited and/or oriented fiber fill, inner fill concentric layers 1352-I.CON (e.g., a tube of concentric fiber and/or concentric fill material surrounding the through hole TH-H). A non-through, terminating hole may be similarly structured (e.g., the sides of the hole being similarly concentric inner fill of fiber 1352-I.CON and/or inner wall resin or fill material fill 1350-IW, and the bottom of the hole being terminated with, as permitting, a quasi-isotropic set 1352-QI and/or a roof layer 1350-R). As shown, the reinforcing column may extend through the infill 1350-IF, the outer concentrically reinforced layers 1352-O.CON or 1352-CON, as well as the quasi-isotropic sets of layers 1352-QI, such that two or three or more regions, fill patterns, or toolpath generation approaches are used in these layers, either in exclusive regions or in overlapping regions with a set priority among generation rules. As an example, a layer depicted in FIG. 10J includes an outer concentric fiber fill surrounding both of an anisotropically deposited and oriented infill IF that is one layer of a quasi-isotropic set, as well as an inner concentric fiber fill surrounding a negative contour. The reinforcing column formed from inner wall resin fill 1350-IW and/or inner concentric fiber fill 1352-I.CON may surround more than one hole or negative contour in each layer, e.g., in a manner as shown in FIGS. 12A-12J (two holes) or 14A (three holes), or may be a reinforcing structure distributed among different layers in a set or laminate (e.g., as shown in FIGS. 13A-13C). In this manner, negative contours, through-holes, and similar structures, whether formed from layers or shells of the 3D printing process or formed as walls within a layer or shell of the 3D printing process, also are surrounded by an inner shell of composite material.

In a further variation of the part of FIG. 19H of a part having an internally dense fiber infill pattern, as shown in FIG. 19J, the general approach of FIG. 19H may again be followed. In contrast, in FIG. 19J, a matrix or cellular arrangement of concentrically filled anisotropic material walls (of anisotropically deposited and oriented fiber material) 1352-CLW is arranged within the part to provide increasing fiber density and/or stiffness and/or crushing resistance. The pattern of cell walls 1352-CLW may be a honeycomb, for example as discussed with reference to FIGS. 16A-16D, e.g., formed from reinforcement formations 99Z1-4. Further, the pattern of cell walls of anisotropically deposited and oriented fiber material 1352-CLW may be formed by crossing or non-crossing outer concentric or inner concentric fills 1352-O.CON or 1352-I.CON. The pattern of cell walls of anisotropically deposited and oriented fiber material 1352-CLW may be a mirroring, repeating, orthogonally varying, or complementary arrangement as shown, e.g., in FIGS. 14G-14I and/or FIGS. 15A, 15B. The cells are filled with infill material 1350-IF, in a dense or sparse arrangement. Additionally in contrast, in FIG. 19J, one or more intervening sets of quasi-isotropic fill 1352-QI (of anisotropically deposited and oriented fiber material) may be formed as an inner wafer other than at the top and bottom regions remote from the centroid. As shown in FIG. 19J, in contrast to FIG. 19H, the one or more intervening sets of quasi-isotropic fill 1352-QI (of anisotropically deposited and oriented fiber material) may be further surrounded by an outer concentric fill 1352-O.CON (in order to provide a consistent outer shell) or may instead fill a layer to an outer wall of resin material 1350-OW (as with the upper and lower sets of quasi-isotropic fill 1352-QI.

It should be further noted that the structures of FIGS. 19I and 19J may be combined by using exclusive regions or regions having a priority among them, e.g., through-holes TH-H may penetrate through or partially through a matrix or cellular arrangement of fiber fills 1352-CLW and/or 1352-QI combined with fill material 1350-IF and be nonetheless surrounded by wall-reinforcing tubes of fiber and/or fill material, e.g., as shown in FIG. 10J.

As shown in each of FIGS. 19H-19J, at least one (e.g., 1-3 or more) roof layer of resin or isotropic material or infill material 1350-R, solid, filled or densely filled in ox-row or other packed fashion, may be printed above a set of resin or fill material infill 1350-IF. The infill 1350-IF may in some cases be a sparse honeycomb pattern, and the solid, filled or densely filled roof layer(s) 1350-R provide a complete shell or layer surface upon which the anisotropic fiber swaths may be compressed and fused.

As shown in FIGS. 19A-19J, the three-dimensional geometry of the parts shown in FIGS. 19A-19J may be sliced into shells or layers as described herein with reference to FIGS. 4-10. For each of a set of shells or layers defining a portion of a 3D printed part, first isotropic fill tool paths such as 1322, 1328, 1330, 1344, 1350, 1350-R, 1350-OW, and/or 1350-IW may be generated for controlling an isotropic solidifying head (e.g., head 18 or 1800 or 1616) to solidify, along the isotropic fill tool paths, a substantially isotropic fill material such as (e.g., material 18a or 1604). For each of an anisotropic fill subset of the set of shells or layers defining the portion of the 3D printed part (e.g., the different fiber fills throughout a part), first anisotropic fill tool paths (e.g., 1352-QI or 1352-O.CON or 1352 I.CON) may be generated for controlling an anisotropic solidifying head to solidify, along the anisotropic tool paths, a substantially anisotropic fill material having an anisotropic characteristic oriented relative to a trajectory of the anisotropic fill tool path. As shown with reference to FIGS. 10A-10K, particularly 10E-10K, from among the set of shells or layers defining the portion of the 3D printed part, a selection of an editing subset of shells or layers may be received, the editing subset including at least part of the anisotropic fill subset. For each shell or layer of the editing subset, one of second isotropic fill toolpaths different from the first isotropic fill toolpaths and second anisotropic fill toolpaths different from the first anisotropic fill toolpaths may be regenerated.

Similarly, a printer for additive manufacturing of a part may include an anisotropic solidifying head (e.g., head 10, or 199) that solidifies, along anisotropic fill toolpaths, fiber swaths from a supply of anisotropic fiber reinforced material including a plurality of fiber strands extending continuously within a matrix material, the fiber swaths having an anisotropic characteristic oriented relative to a trajectory of the anisotropic fill tool paths. An isotropic solidifying head (e.g., head 18 or 1800 or 1616) may solidify, along isotropic fill toolpaths, a substantially isotropic material from a supply of solidifiable isotropic material. A motorized drive as shown in FIGS. 1 and 2 (all suffixes inclusive) may relatively move at least the anisotropic deposition head and a build plate supporting a 3D printed part in three or more degrees of freedom. A controller 20 may be operatively connected to and configured to control the motorized drive, the anisotropic solidifying head and the isotropic solidifying head, and may control these to build the 3D printed part by solidifying the isotropic material along the isotropic fill tool paths, and/or solidifying the anisotropic fill material in fiber swaths tracking a non-concentric set (e.g., quasi-isotropic set 1352-QI, or any of the non-concentric complementary sets in FIGS. 12-14, all suffixes inclusive) of the of anisotropic fill tool paths for at least a first sequence of parallel shells. Further, the controller may control these elements to solidify the anisotropic fill material in fiber swaths tracking an outer concentric set (e.g., 1352-CON, or any of the concentric layer types shown in FIGS. 12-14, all suffixes inclusive) of anisotropic fill tool paths for at least a second sequence of parallel shells. Each of the non-concentric set and the outer concentric set of anisotropic tool paths may be located at least partially radially outward from the centroid of the 3D printed part, as shown in FIGS. 19H-19H.

As shown in FIG. 20, the controller 20 of the printer 1000 may control the actuators and heaters such that depositing the first consolidated composite swath 2c and the second consolidated composite swath 2c as a continuous composite swath 2c spanning (e.g., via inter-layer continuous traverse SP30-A, SP30-B) two shells $LA_n$, $LA_{n+1}$ of an additive manufacturing process.

The currently described three dimensional printing methods using continuous core reinforced filaments also enable the bridging of large air gaps, the deposition of tensioned continuous core reinforced filaments including a non-molten, i.e. solid, continuous core enables the deposited material to be held by the print head on one end and adhesion to the printed part on the other end. The print head can then traverse an open gap, without the material sagging. Thus, the printer can print in free space which enables the printer to jump a gap, essentially printing a bridge between two points. This enables the construction of hollow-core components without the use of soluble support material.

For example, as shown in FIGS. 19A-19C, one or more 2D toolpaths defining fill material flat shell(s) 1322, 1328, 1330, 1344, may be received by the controller 20 of the printer, as may be one or more 2D toolpaths defining a support material flat shell(s)1340. A 3D toolpath defining a long fiber composite material curved shell 1342 may also be received, the long fiber composite material including a filament having a matrix embedding fibers having a length longer than two times a diameter of the filament, but ideally longer (e.g., 2-10 times the diameter, or semi-continuous, or continuous). The toolpaths include paths interpretable to actuator instructions, or include actuator instructions and/or G-code, which are interpreted by the controller 20 to control actuators—such as motors, heaters, or sources of curing energy—to move deposition heads along the paths (i.e., "trace") and/or build platforms and/or feed material and/or melt or solidify material. The fill material deposition head 1800, 1616 may trace the fill material 2D toolpath to deposit fill material to substantially parallel a flat printing substrate 16, 1602, 1340, and actuate a support material deposition head 1408 or 1420 to trace the second 2D toolpath to deposit support material 1340 substantially parallel the flat printing substrate 16, 1602. A long fiber deposition head 10 may be actuated to trace the first 3D toolpath at least partially non-parallel to the flat printing substrate 16, 1602, 1340 (e.g., in a direction including a Z component, when the flat printing substrate is parallel to an X-Y plane) to deposit the long fiber composite material to enclose the fill material flat shell, e.g., as shown in FIG. 19C. In this manner, a high-strength composite outer shell can surround a cavity or tube (left behind when support material is dissolved or removed), and various features and internal honeycomb or lattice structures may be built of fill material within and without the composite outer shell.

Optionally, the long fiber deposition head 10 may be actuated to trace the first 3D toolpath at least partially non-parallel to the flat printing substrate to deposit the long fiber composite material to enclose the support material flat shell (e.g., enclosing support material 1340). The flat printing substrate may be or include a flat build platform, but as shown in FIGS. 19B and 19C, one of the support material deposition head and/or the fill material deposition head may be actuated to deposit the flat printing substrate (e.g., 1328 or 1340) upon a build platform. The long fiber composite material may include a semi-continuous prepreg filament including a matrix embedding fibers aligned along the lengthwise direction of the filament when the filament is in one of solidified, melted, or re-solidified form.

The long fiber deposition head 10 may include an anisotropic solidifying head that solidifies, along anisotropic fill toolpaths, fiber swaths from a supply of anisotropic fiber reinforced material including a plurality of fiber strands extending continuously within a matrix material. As shown in FIGS. 23A-24D, the fiber swaths may have an anisotropic characteristic oriented relative to a trajectory of the anisotropic fill tool paths. The fill material deposition head 1800, 1616 may include an isotropic solidifying head that solidifies, along isotropic fill toolpaths, a substantially isotropic material from a supply of solidifiable isotropic material. Isotropic material may include random direction and distribution chopped fiber or particulate composite reinforcement within a polymer, metal, or ceramic matrix.

Alternatively, the fill material toolpaths interpreted by the controller 20 may define curved shells, and the support material toolpaths may define flat shells. The support material may be deposited in a succession of substantially flat shells 1340. The long fiber deposition head 10 may be actuated to trace 3D toolpaths at least in part non-parallel to a printing substrate to deposit the long fiber composite material curved shells to enclose at least a portion of the fill material curved shells.

As shown in FIGS. 19A-19C, 25A-25B, and 26, deposition heads such as head 1310 and may be actuated to deposit material upon a build platform, and/or the build platform may be rotated in at least one degree of freedom additional to degrees of freedom of a deposition head such as head 1310. For example, the build platform may separately rotate a spindle or mandrel build surface or printing substrate, in one or two degrees of rotational freedom, and/or be moved in 1-3 degrees of translational freedom, even as the deposition heads such as 1310 may themselves be independently movable in 1-3 degrees of translational freedom and 1-3 degrees of rotational freedom. Optionally, the build platform may be rotated (e.g., by actuator 1312) through 180 degrees or more in at least one degree of freedom additional to degrees of freedom of a deposition head to form substantially rotationally symmetric printed material.

Optionally, as shown in 11H, 19A-19C, 19H-19J, 25A-25B, 26, and 27A-27C, 3D toolpaths defining a first long fiber composite material curved quasi-isotropic laminate (e.g., in 3, 4, or more plies) may be also received by the controller 20. 3D toolpaths defining a second long fiber composite material curved quasi-isotropic laminate may also be received by the controller 20. A support material deposition head may be actuated to deposit support material 1340 upon a build platform to generate at least a portion of a printing substrate. The long fiber deposition head 10 can be actuated to trace the first set of 3D toolpaths at least partially parallel to the printing substrate to deposit the first curved quasi-isotropic laminate. A fill material deposition head 18 may be actuated to trace the first toolpath to deposit a fill material sandwich core (solid, honeycomb, foamed, or the like) adjacent the first curved quasi-isotropic laminate. The long fiber deposition head 10 can be actuated to complete the high moment of inertia sandwich structure by tracing the second set of 3D toolpaths adjacent the fill material sandwich core to deposit a second curved quasi-isotropic laminate displaced from the first curved quasi-isotropic laminate.

The sandwich structure may be a true panel (with the laminates parallel to one another and separated by a constant separation core) or a different structure such as an airfoil, in which the first and second laminates form a more complex shape and the core supports them separated from one another.

The matrix material may include a thermoplastic resin having an unmelted ultimate tensile strength of approximately 10 through 100 MPa and a melted ultimate tensile strength of less than 10 MPa, and the fibers are formed from includes a stranded material having an ultimate tensile strength of approximately 200-100000 MPa. Optionally, the long fiber composite material may be supplied as a filament having a cross sectional area greater than 1×10E-5 square inches and less than 2×10E-3 square inches, and including includes, in any cross-sectional area, between 100 and 6000 parallel continuous axial strands. The long fiber composite material may include a prepreg filament including a matrix embedding fibers having a length of between 0.6-15 mm, and between two and ten times longer than a diameter of the prepreg filament.

In addition, the controller 20 may interpret toolpaths defining curved contour shells of a long fiber composite material. The support material deposition head can be actuated to trace toolpaths to deposit the support material shells 1340 to support a surface of a part, and a fill material deposition head to trace toolpaths to deposit the fill material shells 1328, 1330, 1344 partially forming the part. The long fiber deposition head 10 may trace 3D toolpaths to deposit long fiber composite material shells at least partially tracing non-parallel to a printing substrate 16, 1602, 1340 (e.g., in a trajectory or succession of trajectories including a Z component, where the build platform or printing substrate are in an X-Y plane, or in a trajectory or succession of trajectories including a component normal to a surface of the build platform or an outermost surface of a printing substrate) and at least partially enclosing the support material shells.

As noted herein, the support material shells may be deposited to support a surface of the part with reference to one of a direction of gravity or a direction of ironing of the depositing of the long fiber composite material shells by an ironing surface (such as near tip 726, or roller 2138 n FIG. 22) moved together with the long fiber deposition head 10 or 2102, and/or the support material shells may be deposited to support a contour of an interior wall of the part.

The build plate may be a plate; or a ball; or a rod, or a ring or tube or other geometric shape, connected to actuators and/or motorized drives to be articulated in 2-6 degrees of freedom. A printing substrate may be deposited on a build plate that is a plate; or a ball; or a rod, ring or tube; and may be built up of support material and/or fill material to form a printing substrate formed as a plate; or a ball; or a rod, ring or tube.

FIGS. 21A and 21B depict free-space printing enabled by the continuous core reinforced filament. With the continuous core reinforced filament 2b attached to the part at point 44, and held by the print head at point 46, it is possible to bridge the gap 48. In typical FFF printers, the extruded material will sag, and fall into the gap 48 because it is molten and unsupported. However, having a continuous core of non-molten material supporting the molten polymer enables printing in free-space, advantageously enabling many new types of printing. For example, a closed section box shown in FIG. 9 is formed by a section 50 which is bridges gap 48 and is affixed to opposing sections 52 and 54. While this example shows a closed section bridge, the free-space printing could also be used to produce cantilevers, and unsupported beams, that cannot be printed with typical unsupported materials.

In some embodiments, a cooling mechanism such as a jet of cooling air may be applied to the extruded material to further prevent sagging by solidifying the polymer material surrounding the core. The extruded material may either be continuously cooled while building a component with sections over gaps. Alternatively, in some embodiments, the extruded material might only be cooled while it is being extruded over a gap. Selectively cooling material only while it is over a gap may lead to better adhesion with previously deposited layers of material since the deposited material is at an elevated temperature for a longer period which enhances diffusion and bonding between the adjacent layers.

When desirable, a precision roller set can be used to maintain a constant thickness along a relatively wider width of material output from a print head 2102. Such an embodiment may be of use when dealing with wider materials such as flat towpregs. FIG. 22 shows a print head 2102 translating in a first direction. A nozzle 2136 of the print head is attached to a trailing compression roller 2138. The roller imparts a compressive force to the material deposited on to the onto print bed 2140. Depending on the embodiment, the trailing roller 2138 can articulate around the Z axis using any number of different mechanisms. For example, in one embodiment, the print head 2102 is free-rotating on a bearing, such that the roller always trails the direction of travel of the print head. In another embodiment, the entire print head 402 is constructed to rotate. Alternatively, the print bed 2140 may be rotated to achieve the desired trailing and displacement.

FIGS. 23A-24D depict various embodiments of a long fiber or semi-continuous core filament being deposited from a nozzle, or continuous core filament 2 in some cases. As depicted in the FIG. 23A, a semi-continuous core filament 1000 including a first strand 1002 and a second strand 1004 located within the matrix material 1006. The semi-continuous core filament 1000 enters a cold feeding zone 712 of a nozzle which is advantageously below the glass transition temperature of the matrix material. The semi-continuous material 1000 subsequently flows through heated zone 714, sometimes referred to as a melt zone. The matrix material 1006 present in the semi-continuous material 1000 is melted within the heated zone 714 prior to deposition. Upon exit from the nozzle, semi-continuous core filament 1000 is attached to a part or build platen 16 at anchor point 1005. The severance procedure can then occur in a number of ways. In one embodiment, severance occurs by moving the print head forward relative to the anchor point 1005, without advancing the semi-continuous core filament 1000. Alternatively, the print head may remain stationary, and the upstream semi-continuous core filament 1000 is retracted to apply the desired tension. Again by appropriately sizing the strand length to a length of the heated zone to ensure that an entire length of the strand located within the nozzle is in the heated zone 714, the tension provided by the anchor point 1005 permits the remaining portion of the second strand 1004 located within the nozzle to pull the remnant of the embedded strand from the heated nozzle.

While FIG. 23A showed two individual strands, FIGS. 23B and 24B show a semi-continuous core filament 1008 including a distribution of similarly sized strands 1010 embedded in a matrix material 1006 and located in a printer head similar to that described above. While three strands are shown in a staggered line, it should be understood that this is a simplified representation of a random, or staggered, distribution of strands. For example, material may include about 1,000 strands of carbon fiber (a 1k tow). While a distribution of strand lengths 1015 and positioning of the individual strands is to be expected, the strands 214 may be sized and distributed such that there are many overlapping strands of substantially similar length. By ensuring that heated zone 714 is proportional to a strand length 1015, the fiber remnant can be more easily pulled from the nozzle. For example, strands that are located further downstream, i.e. mostly deposited within a part, will pull out from the nozzle easily. The strands that are mostly located in the nozzle will most likely remain within the nozzle. The strands that are half in the nozzle, and half out, will stochastically stay in the nozzle or get pulled out by the anchor point 1005 due to the roughly equivalent forces being applied to roughly equivalent lengths of the strands contained within the deposited material and the nozzle. The various parameters of the nozzle design such as the design of the cold feeding zone 714 and the nozzle outlet transition as well as the viscosity of the polymer melt, the degree of cooling of the printed semi-continuous core filament upon exit from the nozzle outlet, as well as other appropriate considerations will determine how the semi-continuous core filament is severed when a tension is applied to the material.

FIGS. 23C and 24C shows an indexed semi-continuous core filament 1012 where the termination of the core material is substantially complete at each section, thereby enabling clean severance at an integer distance. As depicted in the figures, the material includes individual sections of one or more core segments 1014 embedded within a matrix material 1006. The individual sections of core material are separated from adjacent sections of core material at pre-indexed locations 1016. Such an embodiment advantageously permits the clean severance of the material at a prescribed location. This is facilitated by the individual strands in different sections not overlapping with each other. This also enables the use of strand lengths that are larger than a length of the associated heated zone 714 of the nozzle. This also permits use of the smaller heated zone 714 in some embodiments. However, in addition to the noted benefits, since the individual strands in different sections do not overlap, the material will exhibit a reduced strength at these boundary locations corresponding to the pre-indexed locations 1016 depicted in the figures. In a long fiber or semi-continuous core filament, multiple strands 1100 may be deposited onto a part or build platen. The strands 1100 are deposited such that they form turns 1102 as well as other features until the print head makes it final pass and severs the material at 1104 as described above. Since the individual strands are longer than the remaining distance on the part, the remaining distance 1106 may either be left as a void or filled with a separate material such as a polymer.

FIG. 24D shows an example of a hybrid approach between a long fiber or semi-continuous core filament and a continuous core filament. In the depicted embodiment, a material 1018 includes multiple discrete sections including one or more core segments 1014 embedded within a matrix 1006 that are located at pre-indexed locations similar to the embodiment described above in regards to FIG. 24C. The material also includes a continuous core 1020 embedded within the matrix 1006 extending along a length of material. The continuous core 1020 may be sized such that it may be severed by a sufficient tensile force to enable severing of the material at the pre-indexed locations simply by the application of a sufficient tensile or shear force.

The description of long fiber or semi-continuous core materials been directed to materials that may be severed without the use of a cutting mechanism, but long fiber or semi-continuous core filaments may also be used with three dimensional printing systems including a cutting mechanism.

In traditional composite construction successive layers of composite might be laid down at 0°, 45°, 90°, and other desired angles to provide the part strength in multiple directions, and certain combinations are considered nearly isotropic or "quasi-isotropic". Quasi-isotropic means having isotropic properties in-plane and in this specification generally means fibers oriented such that substantially equal strength is developed all around the plane of the part. Quasi-isotropic laminates are most often a laminate of four plies of 0°, 90°+45° and −45°, with at least ⅛ of the plies in each of these four directions, but can also be achieved with 0°, 60° and 120° oriented unidirectional plies. A laminate is symmetric when the plies above the mid-plane are a mirror image of those below the mid-plane (whether the plane is flat or curved), and balanced when it has equal numbers of − and + angled plies. This ability to control the directional strength of the part enables designers to increase the strength-to-weight ratio of the resultant part. Therefore, in another embodiment, a controller of a three dimensional printer may include functionality to deposit the reinforcing fibers with an axial alignment in one or more particular directions and locations. The axial alignment of the reinforcing fibers may be selected for one or more individual sections within a layer, and may also be selected for individual layers. A first layer 1200 may have a first reinforcing fiber orientation and a second layer 1202 may have a second reinforcing fiber orientation. Additionally, a first section 1204 within the first layer 1200, or any other desired layer, may have a fiber orientation that is different than a second section 1206, or any number of other sections, within the same layer.

FIG. 25A shows a three dimensional printer capable of rotating the part 1300 as well as the printer head 1310 about one or more axes. As depicted in the figure, part 1300 is held in place by a rotating axis 1312, which sets and controls the orientation of plane A. In FIG. 25B, rotating axis 1312 has been rotated by 90° to form subcomponent 1308 in a direction that is perpendicular to subcomponent 1302. Conversely, printer head 510 could be pivoted about the XT and/or YT axes to achieve a similar result. As FIGS. 25A-25B show, there are many ways to achieve anisotropic printing. Namely, the part may be moved and rotated, the printer head may be moved and rotated, or a combination of both may be used to print an anisotropic part. It should be understood, that additional degrees of freedom could be added to either the rotation and movement of the part 1300 or the printer head 1310 based on the machine objectives, and part requirements. For example, in an automotive application, rotating axis 1312 may correspond to a rotisserie, enabling rotation of the vehicle frame about the YT axis to enable continuous fibers to be laid in the X-Y plane, the Z-Y plane, or any plane in between. Alternatively, a fluid rotation following the external contours of the vehicular body might be used to continuously deposited material on the vehicle as it is rotated. Such a three dimensional printer might optionally add the XT axis to the printer head to enable full contour following as well as the production of both convex and concave unibody structures.

In addition to rotating the part 1300 and the printer head 1310, in some embodiments, a table 1314 supporting the part 1300 could be rotated about the ZT axis to enable spun components of a given fiber direction. Such an embodiment may provide a consistent print arc from the print head to the part for core materials that have unique feeding and deposition head requirements that prefer directional consistency.

In another embodiment, the core of a part may be built up as a series of two dimensional planes. The three-dimensional printer may then form, out of plane three dimensional shells over the interior core. The core supports the shells which enables the shells to be constructed on the outside of the core and may run up the sides of the part, over the top, and/or down the back sides of the part, or along any other location. Such a deposition method may aid in preventing delimitation and increase torsional rigidity of the part due to the increased part strength associated with longer and more continuous material lengths. Further, running the continuous fiber reinforced materials out of plane provides an out-of-plane strength that is greater than a typical bonded joint.

FIG. 26 shows a three dimensional printer head 1310 that can be used to form a part including a three dimensionally printed shell. The printer head 1310 deposits any appropriate consumable material such as a continuous core reinforced filament 2 onto the built platen 1314 in a series of layers 1320 to build a part. The printer head 1310 is capable of articulating in the traditional XYZ directions, as well as pivoting in the XT YT and ZT directions. The additional degrees of freedom to pivot the printer head 1310 allow the printer to create shells, and other contiguous core reinforced out of plane layers, as well as two dimensional layers.

When determining an appropriate fill pattern for a given level of strength and stiffness, a control algorithm starts with a concentric fill pattern that traces the outside corners and wall sections of the part, for a specified number of concentric infill passes, the remainder of the part may then be filled using a desired fill material. The resultant structure maximizes the strength of the part, for a minimum of composite usage. It should be understood that while the above process is described for a two dimensional plane, it is also applicable to three dimensional objects as well.

FIGS. 27A-27C show the cross-sections of various embodiments of an airfoil with different fiber orientations within various subsections. It should be understood that while an airfoil as described below, the described embodiments are applicable to other applications and constructions as well.

FIG. 27A shows a method of building each section of the three dimensional part with plastic deposition in the same plane. Specifically, sections 1350, 1352 and 1354 are all constructed in the same XY planar orientation. The depicted sections are attached at the adjoining interfaces, the boundary of which is exaggerated for illustration purposes. In another embodiment, and as depicted in FIG. 27B, a part is constructed with separate sections 1362, 1364, and 1366 where the fiber orientations 1368 and 1372 of sections 1362 and 1366 are orthogonal to the fiber orientation 1370 of section 1364. By orthogonally orienting the fibers in section 1364 relative to the other sections, the resulting part has a much greater bending strength in the Z direction. Further, by constructing the part in this manner, the designer can determine the relative thickness of each section to prescribe the strength along each direction.

FIG. 27C depicts a shell combined with subsections including different fiber orientations. In this embodiment, sections 1374, 1376, and 1378 are deposited in the same direction to form a core, after which a shell 1386 is printed in the orthogonal direction. The shell 1386 may be a single layer or a plurality of layers. Further, the plurality of layers of shell 1386 may include a variety of orientation angles other than orthogonal to the underlying subsections of the core, depending on the design requirements. While this embodiment shows the inner sections with fiber orientations all in the same direction 1380, 1382, and 1384, it should be obvious that subsections 1374, 1376, and 1378 may be provided with different fiber orientations similar to FIG. 27B as well.

In other embodiments, the continuous core reinforced filament, or other appropriate consumable material, may require a post-cure, such that the part strength is increased by curing the part. Appropriate curing may be provided using any appropriate method including, but not limited to, heat, light, lasers, and/or radiation. In this embodiment, a part may be printed with a pre-preg composite and subject to a subsequent post-cure to fully harden the material. In one specific embodiment, continuous carbon fibers are embedded in a partially cured epoxy such that the extruded component sticks together, but requires a post-cure to fully harden. It should be understood that other materials may be used as well.

Section headings used herein are dependent upon following content which they describe, and can only broaden the content described.

Terminology

A "composite swath" or "composite swath" may refer to a deposited fiber-reinforced composite filament, having been compressed, consolidated and widened by ironing during deposition. Extending within the composite swath are a plurality of individual fibers, from 50-5000, preferably 100-2000, within a matrix material.

A "multi-swath track" may refer to a set of parallel swaths that generally follow parallel paths, although individual swaths may deviate to avoid obstacles or achieve reinforcement goals.

A "fold" may refer to a composite swath which folds, twists, or bunches over itself along a curved segment of composite swath (such as a corner). A "fold" is not limited to sheet-like or tape-like folds, but includes path changes in which different fibers within the composite swath may cleanly switch sides of a swath, but may also cross, twist, or bunch along the curved or angled segment (such as a corner).

"Fill material" includes material that may be deposited in substantially homogenous form as extrudate, fluid, or powder material, and is solidified, e.g., by hardening, crystallizing, transition to glass, or curing, as opposed to the core reinforced filament discussed herein that is deposited as embedded and fused composite swaths, which is deposited in a highly anisotropic, continuous form. "Substantially homogenous" includes powders, fluids, blends, dispersions, colloids, suspensions and mixtures, as well as chopped fiber reinforced materials.

"Honeycomb" includes any regular or repeatable tessellation for sparse fill of an area (and thereby of a volume as layers are stacked), including three-sided, six-sided, four-sided, complementary shape (e.g., hexagons combined with triangles) interlocking shape, or cellular.

A "Negative contour" and "hole" are used herein interchangeably. However, either word may also mean an embedded contour (e.g., an embedded material or object) or a moldover contour (e.g., a second object with surfaces intruding into the layer).

"Outwardly spiraling" or "outwardly offsetting" meaning includes that a progressive tracing, outlining, or encircling is determined with reference to an innermost, generally negative or reference contour, not necessarily that the composite swath mush begin next to that contour and be built toward an outer perimeter. Once the toolpath is determined, it may be laid in either direction. Similarly, "inwardly spiraling" or "inwardly offsetting" means that the progressive tracing is determined with reference to an outer, generally positive contour.

"3D printer" meaning includes discrete printers and/or toolhead accessories to manufacturing machinery which carry out an additive manufacturing sub-process within a larger process. A 3D printer is controlled by a motion controller 20 which interprets dedicated G-code (toolpath instructions) and drives various actuators of the 3D printer in accordance with the G-code.

"Extrusion" may mean a process in which a stock material is pressed through a die to take on a specific shape of a lower cross-sectional area than the stock material. Fused Filament Fabrication ("FFF"), sometimes called Fused Deposition Manufacturing ("FDM"), is an extrusion process. Similarly, "extrusion nozzle" shall mean a device designed to control the direction or characteristics of an extrusion fluid flow, especially to increase velocity and/or restrict cross-sectional area, as the fluid flow exits (or enters) an enclosed chamber.

A "conduit nozzle" may mean a terminal printing head, in which unlike a FFF nozzle, there is no significant back pressure, or additional velocity created in the printing material, and the cross sectional area of the printing material, including the matrix and the embedded fiber(s), remains substantially similar throughout the process (even as deposited in bonded ranks to the part).

"Deposition head" may include extrusion nozzles, conduit nozzles, and/or hybrid nozzles. "Solidifying head" may include the same, as well as laser melting and solidifying, laser curing, energy curing. A material need not be liquified to be solidified, it may be cured, sintered, or the like.

"Filament" generally may refer to the entire cross-sectional area of an (e.g., spooled) build material, and "strand" shall mean individual fibers that are, for example, embedded in a matrix, together forming an entire composite "filament".

"Alternating", with respect to reinforcement regions, generally means in any regular, random, or semi-random strategy, unless the pattern is described, specified, or required by circumstances, for distributing different formations within or among layers. E.g., simple alternation (ABABAB), repeating alternation (AABBAABB), pattern alternation (ABCD-ABCD), randomized repeating groups (ABCD-CBDA-CDAB), true random selection (ACBADBCABDCD), etc.

"Shell" and "layer" are used in many cases interchangeably, a "layer" being one or both of a subset of a "shell" (e.g., a layer is an 2.5D limited version of a shell, a lamina extending in any direction in 3D space) or superset of a "shell" (e.g., a shell is a layer wrapped around a 3D surface). Shells or layers may be nested (within each other) and/or parallel (offset from one another) or both. Shells or layers are deposited as 2.5D successive surfaces with 3 degrees of freedom (which may be Cartesian, polar, or expressed "delta"); and as 3D successive surfaces with 4-6 or more degrees of freedom. Layer adjacency may be designated using descriptive notations "$LA_1$", "$LA_2$" or $LA_n$, $LA_{n+1}$", etc., without necessarily specifying unique or non-unique layers. "$LA_1$" may indicate the view shows a single layer, "$LA_2$" indicating a second layer, and "$LA_1, LA_2$" indicating two layers superimposed or with contents of each layer visible. For example, in a top down view, either of "$LA_1, LA_2, LA_3$" or "$LA_n, LA_{n+1}, LA_{n+2}$" may indicate that three layers or shells are shown superimposed. "$LA_1, LA_2 \ldots LA_m$" may indicate an arbitrary number of adjacent layers (e.g., m may be 2, 10, 100, 1000, or 10000 layers).

Some representative Ultimate/Tensile Strength and Tensile/Young's Modulus values for reinforcing fibers, core reinforced fiber matrix materials, fill materials, and comparative materials are as follows:

| MATERIAL | Ultimate Strength MPa | Young/Tensile Modulus GPa |
|---|---|---|
| reinforcing strands - UHMWPE- Dyneema, Spectra | 2300-3500 | 0.7 |
| reinforcing strands - Aramid or Aramid Fiber - Kevlar, Nomex, Twaron | 2000-2500 | 70.5-112.4, 130-179 |
| reinforcing strands - Carbon Fiber | 4000-4500 | 300-400 |
| reinforcing strands - Glass Fiber (E, R, S) | 3500-4800 | 70-90 |
| reinforcing strands - Basalt fiber | 1300-1500 | 90-110 |
| Carbon Fiber reinforced plastic (70/30 fiber/matrix, unidirectional, along grain) | 1600 | 170-200 |
| Glass-reinforced plastic (70/30 by weight fiber/matrix, unidirectional, along grain) | 900 | 40-50 |
| Steel & alloys ASTM A36 | 350-450 | 200 |
| Aluminum & alloys | 250-500 | 65-80 |
| matrix, fill material, solidifiable material - Epoxy | 12-30 | 3.5 |
| matrix, fill material, solidifiable material - Nylon | 70-90 | 2-4 |

The invention claimed is:

1. A method for depositing a 3D printed part with a composite material 3D printer, comprising:
   receiving a first 3D toolpath defining a fill material curved shell;
   receiving first 2D toolpaths defining support material flat shells;
   receiving a second 3D toolpath defining a long fiber composite material curved shell, the long fiber composite material curved shell including a filament having a matrix embedding fibers having a length longer than two times a diameter of the filament;
   actuating a fill material deposition head to trace the first 3D toolpath to deposit the fill material curved shell at least in part non-parallel to a printing substrate;
   actuating a support material deposition head to trace the first 2D toolpaths to deposit support material in a succession of substantially flat shells; and actuating a long fiber deposition head to trace the second 3D toolpath at least in part non-parallel to the printing substrate to deposit the long fiber composite material curved shell to enclose at least a portion of the fill material curved shell.

2. The method according to claim 1, further comprising:
actuating one of the support material deposition head and the fill material deposition head to deposit the printing substrate upon a build platform.

3. The method according to claim 2, further comprising:
actuating the build platform to rotate in at least one degree of freedom additional to degrees of freedom of one of the support material deposition head and the fill material deposition head.

4. The method according to claim 2, further comprising:
actuating the build platform to rotate through 180 degrees or more in at least one degree of freedom additional to degrees of freedom of one of the support material deposition head and the fill material deposition head to form at least one of a substantially rotationally symmetric printing substrate and a substantially rotationally symmetric fill material deposition.

5. The method according to claim 1, further comprising:
actuating the support material deposition head to trace the first 2D toolpaths to deposit a separable or dissolvable material in a succession of shells forming a curved printing substrate.

6. The method according to claim 1, wherein the filament of the long fiber composite material curved shell includes a prepreg filament including the matrix embedding fibers having a length of between 0.6-15 mm, and between two and ten times longer than a diameter of the prepreg filament.

7. The method according to claim 1, wherein the printing substrate includes at least one rotationally symmetric portion.

* * * * *